United States Patent
Kim et al.

(10) Patent No.: US 8,053,316 B2
(45) Date of Patent: Nov. 8, 2011

(54) METHOD OF FABRICATING VERTICAL CHANNEL TRANSISTOR

(75) Inventors: Kang-Uk Kim, Seoul (KR); Yongchul Oh, Suwon-si (KR); Hui-Jung Kim, Seongnam-si (KR); Hyun-Woo Chung, Seoul (KR); Hyun-Gi Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/953,785

(22) Filed: Nov. 24, 2010

(65) Prior Publication Data
US 2011/0143508 A1 Jun. 16, 2011

(30) Foreign Application Priority Data
Dec. 16, 2009 (KR) .................... 10-2009-0125624

(51) Int. Cl.
*H01L 21/336* (2006.01)
(52) U.S. Cl. .................... 438/272; 257/E21.41
(58) Field of Classification Search .............. 438/270, 438/272; 257/E21.41
See application file for complete search history.

(56) References Cited

U.S. PATENT DOCUMENTS

| 7,531,412 | B2 | 5/2009 | Yoon et al. |
| 2006/0097304 | A1 | 5/2006 | Yoon et al. |
| 2006/0113587 | A1* | 6/2006 | Thies et al. .................... 257/328 |
| 2008/0296671 | A1 | 12/2008 | Takaishi |
| 2009/0189217 | A1 | 7/2009 | Yoon et al. |

FOREIGN PATENT DOCUMENTS

| JP | 2009-10366 | 1/2009 |
| KR | 10-0618875 | 8/2006 |
| KR | 10-2009-0026658 | 3/2009 |

* cited by examiner

*Primary Examiner* — N Drew Richards
*Assistant Examiner* — Daniel Shook
(74) *Attorney, Agent, or Firm* — Onello & Mello, LLP

(57) ABSTRACT

A method of fabricating a vertical channel transistor includes: forming a line type active pattern on a substrate so as to extend in a first horizontal direction; forming a vertical channel isolating the active pattern in a second horizontal direction intersecting the first horizontal direction and extending vertically on the substrate; forming a buried bit line extending in the first horizontal direction on the substrate; and forming a word line extending in the second horizontal direction along at least one side surface of the vertical channel.

20 Claims, 136 Drawing Sheets

METHOD OF FABRICATING VERTICAL CHANNEL TRANSISTOR

CROSS-REFERENCE TO RELATED APPLICATIONS

This U.S. non-provisional patent application claims priority under 35 U.S.C. §119 of Korean Patent Application 10-2009-0125624, filed in the Korean Intellectual Property Office on Dec. 16, 2009, the entire contents of which are hereby incorporated by reference.

BACKGROUND

Embodiments of the inventive concept relate to a method of fabricating a transistor, for example, to a method of fabricating a vertical channel transistor.

In the semiconductor industry, bit lines are generally formed by various fabricating methods. One of the fabricating methods is a method of fabricating a MOS field-effect transistor which includes a horizontal channel. The fabricating method has advanced to improve integration of semiconductor devices with a decrease in a design rule of the semiconductor devices and to improve operational speed and yield. There has been suggested a transistor that includes a vertical channel to improve integration, resistance, and current driving capability over the transistor that includes a known horizontal channel.

SUMMARY

The present inventive concept provides a method of fabricating a vertical channel transistor having excellent electrical characteristics.

In the method of fabricating the vertical channel transistor according to embodiments of the inventive concept, reproducibility of a channel length can be ensured. According to the embodiments of the inventive concept, current driving capability is improved by sufficiently utilizing a vertical channel. According to the embodiments of the inventive concept, operation speed is improved by lowering the resistance of a buried bit line.

According to one aspect, the inventive concept is directed to a method of fabricating a vertical channel transistor. The method includes: forming an active pattern having a line type on a substrate so as to extend in a first horizontal direction; forming a vertical channel isolating the active pattern in a second horizontal direction intersecting the first horizontal direction and extending vertically on the substrate; forming a buried bit line extending in the first horizontal direction on the substrate; and forming a word line extending in the second horizontal direction along at least one side surface of the vertical channel.

In some embodiments, the forming of the active pattern may include: forming a first trench extending in the first horizontal direction on the substrate; and filling the first trench with a first insulating layer to form an active bar extending in the first horizontal direction In some embodiments, before the vertical channel is formed, the forming of the buried bit line may include: forming a buried bit line pattern offset with at least one side surface of the active bar by cutting the first insulating layer in the first horizontal direction; forming a liner on an inner sidewall of the buried bit line pattern; forming a damascene buried bit line pattern in the buried bit line by removing a part of the active bar which is not protected by the liner; and forming a metal buried bit line extending in the first horizontal direction in the damascene buried bit line pattern and connected electrically to at least one side surface of the active bar.

In some embodiments, the forming of the word line includes: forming a word line pattern offset with at least one side surface of the active bar by cutting the first insulating layer in the second horizontal direction and defining the vertical channel by isolating the active bar in the second horizontal direction; forming a gate insulating layer coming into contact with at least one side surface of the vertical channel in the word line pattern; and forming the word line facing at least one side surface of the vertical channel with the gate insulating layer interposed therebetween in the word line pattern.

In some embodiments, after forming the buried bit line, the forming of the vertical channel may include: forming a second trench extending in the second horizontal direction on the substrate; and filling the second trench with a second insulating layer and isolating the active bar in the second horizontal direction to form the vertical channel isolated by the first and second insulating layers.

In some embodiments, after forming the vertical channel, the forming of the word line may include: forming a word line pattern offset with at least one side surface of the vertical channel by cutting the first and second insulating layers in the second horizontal direction; forming a gate insulating layer coming into contact with at least one side surface of the vertical channel in the word line pattern; and forming the word line facing at least one side surface of the vertical channel with the gate insulating layer interposed therebetween in the word line pattern.

In some embodiments, before forming the buried bit line, the forming of the vertical channel may include: forming a second trench extending in the second horizontal direction on the substrate; and filling the second trench with a second insulating layer and isolating the active bar in the second horizontal direction to form the vertical channel.

In some embodiments, after forming the vertical channel, the forming of the buried bit line may include: forming a buried bit line pattern offset with at least one side surface of the vertical channel by cutting the first and second insulating layers in the first horizontal direction; forming a liner on an inner sidewall of the buried bit line pattern; forming a damascene buried bit line pattern in the buried bit line pattern by removing a part of the vertical channel which is not protected by the liner; and forming a metal buried bit line extending in the first horizontal direction and connected electrically to at least one side surface of the vertical channel in the damascene buried bit line pattern.

In some embodiments, the method may further include forming, in the vertical channel, an upper junction region and a lower junction region, which are vertically spaced from each other by the word line.

In some embodiments, the lower junction region may be formed simultaneously with the buried bit line.

According to another aspect, the inventive concept is directed to a method of fabricating a vertical channel transistor. The method includes: forming an active bar by cutting a semiconductor substrate in a first horizontal direction and extending in the first horizontal direction; cutting the semiconductor substrate in a second horizontal direction intersecting the first horizontal direction to isolate the active bar as a vertical channel; forming a buried bit line pattern offset with at least one side surface of the vertical channel and extending in the first horizontal direction on the semiconductor substrate; forming a damascene buried bit line pattern extending in the first horizontal direction by removing a part of the vertical channel exposed by the buried bit line pattern; forming a buried bit line extending in the first horizontal direction by filling the damascene buried bit line pattern with metal; forming a word line pattern offset with at least one side surface of the vertical channel by cutting the semiconductor substrate in the second horizontal direction to extend in the second horizontal direction; and forming a gate insulating layer and a word line on at least one side surface of the vertical channel exposed by the word line pattern.

In some embodiments, the forming of the active bar may include: forming a first trench extending in the first horizontal direction with a first depth in the semiconductor substrate; and burying the first trench with a first insulating layer to isolate the active bar.

In some embodiments, the forming of the vertical channel may include: forming a second trench with a second depth, which is the same as or smaller than the first depth, in the semiconductor substrate so as to extend in the second horizontal direction; and burying the second trench with a second insulating layer to form a device-isolating layer by the first and second insulating layers. The active bar may be isolated into the vertical channel by the second insulating layer.

In some embodiments, the forming of the bit line may include: one of siliciding the vertical channel exposed by the damascene buried bit line pattern; depositing a polysilicon layer doped with impurities on the damascene buried bit line pattern and siliciding the polysilicon layer; and depositing metal on the damascene buried bit line pattern.

In some embodiments, the method may further include: forming an upper junction region and a lower junction region vertically spaced from each other by the word line in upper and lower portions of the vertical channel, respectively. The lower junction region may be formed simultaneously with the buried bit line by siliciding the polysilicon layer.

In some embodiments, the forming of the gate insulating layer may include: depositing an insulating layer on at least one side surface of the vertical channel exposed by the word line pattern; or subjecting at least one side surface of the vertical channel exposed by the word line pattern to thermal oxidation.

According to another aspect, the inventive concept is directed to a method of fabricating a vertical channel transistor includes: forming an active bar by cutting a semiconductor substrate in the a horizontal direction and extending in the first horizontal direction; forming a buried bit line pattern offset with at least one side surface of the active bar and extending in the first horizontal direction on the semiconductor substrate; forming a damascene buried bit line pattern extending in the first horizontal direction by removing a part of the active bar exposed by the buried bit line pattern; forming a buried bit line extending in the first horizontal direction by filling the damascene buried bit line with metal; forming a word line pattern by cutting the semiconductor substrate in a second horizontal direction intersecting the first horizontal direction to isolate the active bar as a vertical channel and extending in a second horizontal direction; and forming a gate insulating layer and a word line on both side surfaces of the vertical channel exposed by the word line pattern to utilize both side surfaces of the vertical channel as channels.

In some embodiments, the forming of the word line may include forming a word line pad electrically connecting two word lines formed in the word line pattern to each other.

In some embodiments, the method may further include forming an insulating pillar covering the buried bit line and coming into contact with the side surface of the vertical channel by forming an insulating layer in the buried bit line pattern.

In some embodiments, the method may further include: forming a recess pattern between the insulating pillar and the vertical channel; and forming a gate insulating layer and a word line in the recess pattern to utilize three side surfaces of the vertical channel as channels, after forming the word line pattern.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

FIG. 35A is a plan view illustrating a method for forming a gate insulating layer according to an embodiment of the inventive concept; FIG. 35B is a cross-sectional view taken along the line A-A' line of FIG. 35A; and FIG. 35C is a cross-sectional view taken along the line B-B' of FIG. 35A.

DETAILED DESCRIPTION OF THE EMBODIMENTS

Figure 1A:
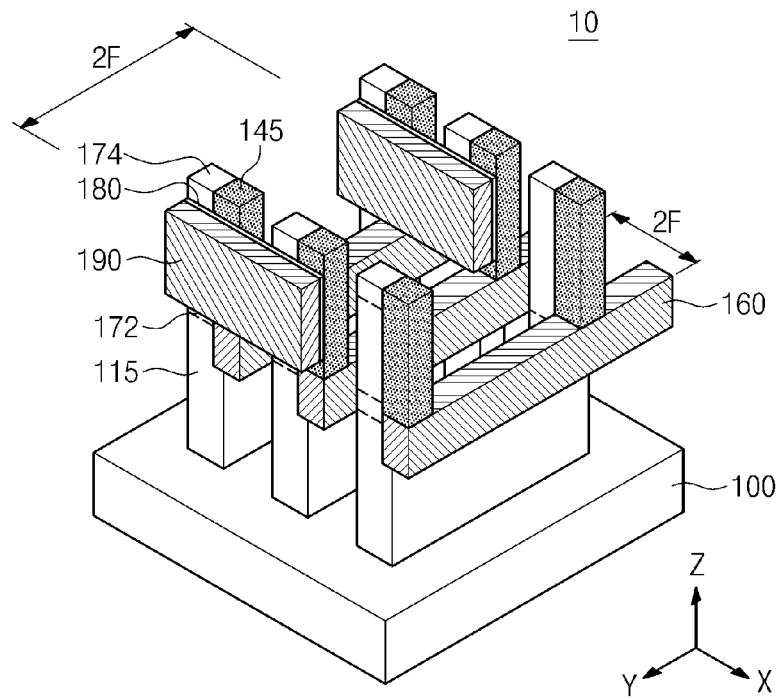
FIG. 1A is a perspective view illustrating a vertical channel transistor according to an embodiment of the inventive concept.

Hereinafter, a method of fabricating a vertical channel transistor according to embodiments of the inventive concept will be described with reference to the accompanying drawings.

Advantages of the inventive concept obtained in comparison with a known technique will be apparent by the following detailed description of preferred embodiments by reference to the accompanying drawings and the appended claims. In particular, the embodiments of the inventive concept will only be defined and claimed by the appended claims. However, this disclosure of the inventive concept will be understood by reference to the following detailed description. In the drawings, like reference numerals refer to like elements throughout the specification.

Example of Vertical Channel Transistor with One-Channel Structure

Figure 1B:
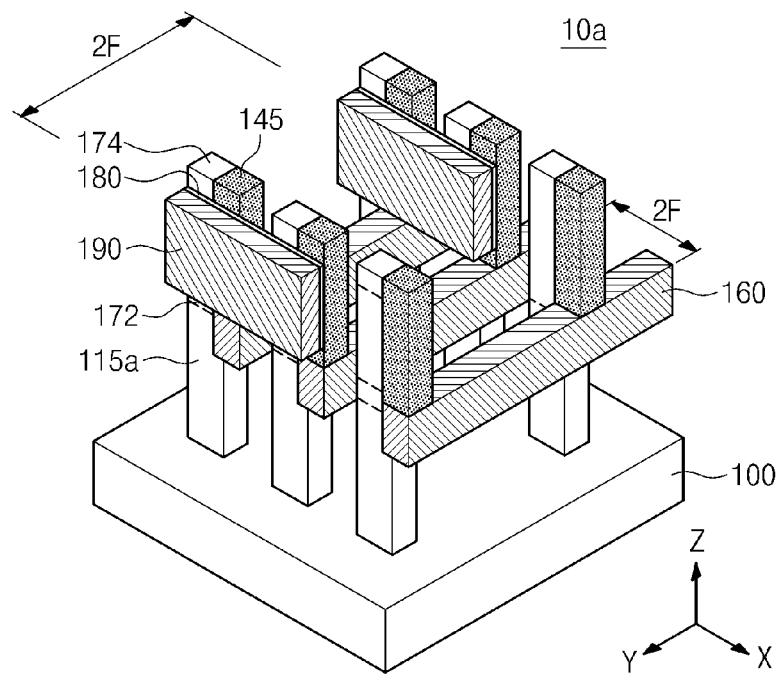
FIG. 1B is a perspective view illustrating a vertical channel transistor according to another embodiment of the inventive concept, which is a modification of the embodiment of FIG. 1A.

FIG. 1A is a perspective view illustrating a vertical channel transistor according to an embodiment of the inventive concept. FIG. 1B is a perspective view illustrating a vertical channel transistor according to another embodiment of the inventive concept, which is a modification of the embodiment of FIG. 1A.

Referring to FIG. 1A, a vertical channel transistor 10 according to the embodiment of the inventive concept may include a vertical channel 115 protruding in a Z direction from a semiconductor substrate 100, a word line 190 extending in an X direction, and a bit line 160 extending in a Y direction. The bit line 160 may be disposed in a buried form at a position lower than the word line 190. The vertical channel 115 may include an upper portion and a lower portion which may be divided by the bit line 160. The upper portion of the vertical channel 115 may be a pillar structure protruding in the Z direction. The lower portion of the vertical channel 115 may a line connected to the upper portion of the vertical channel 115 in the Y direction and may have a substantially tetragonal cross-sectional. A gate insulating layer 180 may be interposed between the word line 190 and the vertical channel 115. The gate insulating layer 180 may extend in the X direction or may be restricted by the vertical channel 115. In the vertical channel 115, a lower junction region 172 may be formed at the position corresponding to a lower portion of the word line 190. Moreover, an upper junction region 174 may be formed at the position corresponding to an upper portion of the word line 190. An insulating pillar 145 formed of an insulating layer may be disposed on a side surface of the vertical channel 115.

According to the inventive concept, the vertical channel transistor 10 may be a vertical channel transistor with a one-channel structure in which one of four side surfaces of the vertical channel 115 facing the word line 190 is utilized as a channel. On the assumption that a pitch between two adjacent word lines 190 is 2F and a pitch between two adjacent bit lines 160 is 2F, the area of one cell is $4F^2$.

Referring to FIG. 1B, a vertical channel transistor 10a according to a modified exemplary embodiment may be similar to the vertical channel transistor 10 in FIG. 1A. Unlike the vertical channel transistor in FIG. 1A, however, the vertical channel transistor 10a may include a vertical channel 115a protruding in the Z direction from the semiconductor substrate 100 and having a substantially tetragonal cross-section.

Example of Method of Fabricating Vertical Channel Transistor with One-Channel Structure FIGS. 2A, 3A, 4A, 5A, 6A, 7A, 8A, and 9A are plan views illustrating the method of fabricating the vertical channel transistor with the one-channel structure according to the embodiment of the inventive concept. FIGS. 2B, 3B, 4B, 5B, 7B, 8B, and 9B are cross-sectional views taken along the line A-A' of FIGS. 2A, 3A, 4A, 5A, 6A, 7A, 8A, and 9A, respectively. FIGS. 2C, 3C, 4C, 5C, 6C, 7C, 8C, and 9C are cross-sectional views taken along the line B-B' of FIGS. 2A, 3A, 4A, 5A, 6A, 7A, 8A, and 9A, respectively.

Figure 2A:
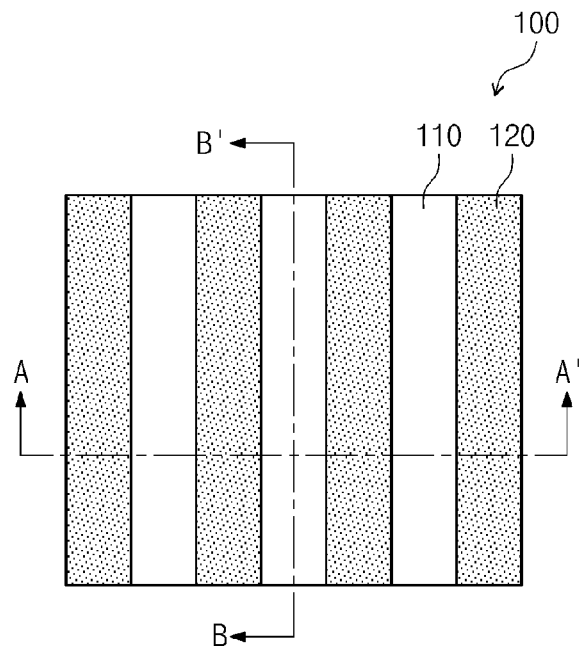
FIGS. 2A, 3A, 4A, 5A, 6A, 7A, 8A, and 9A are plan views illustrating a method of fabricating the vertical channel transistor according to the embodiment of the inventive concept.
Figure 2B:
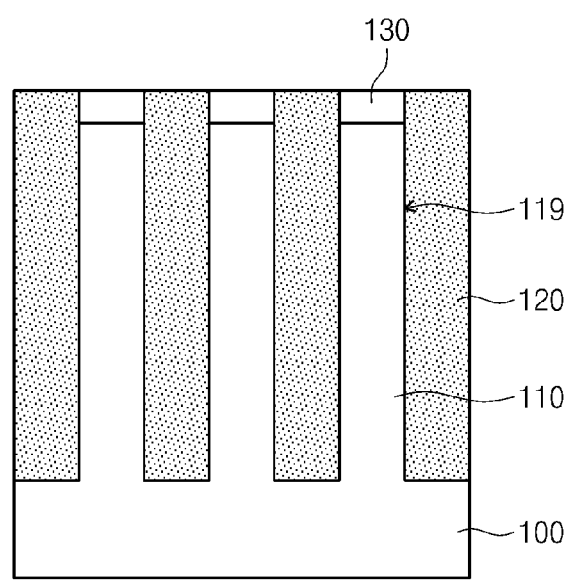
FIGS. 2B, 3B, 4B, 5B, 6B, 7B, 8B, and 9B are cross-sectional views taken along the line A-A' of FIGS. 2A, 3A, 4A, 5A, 6A, 7A, 8A, and 9A, respectively.
Figure 2C:
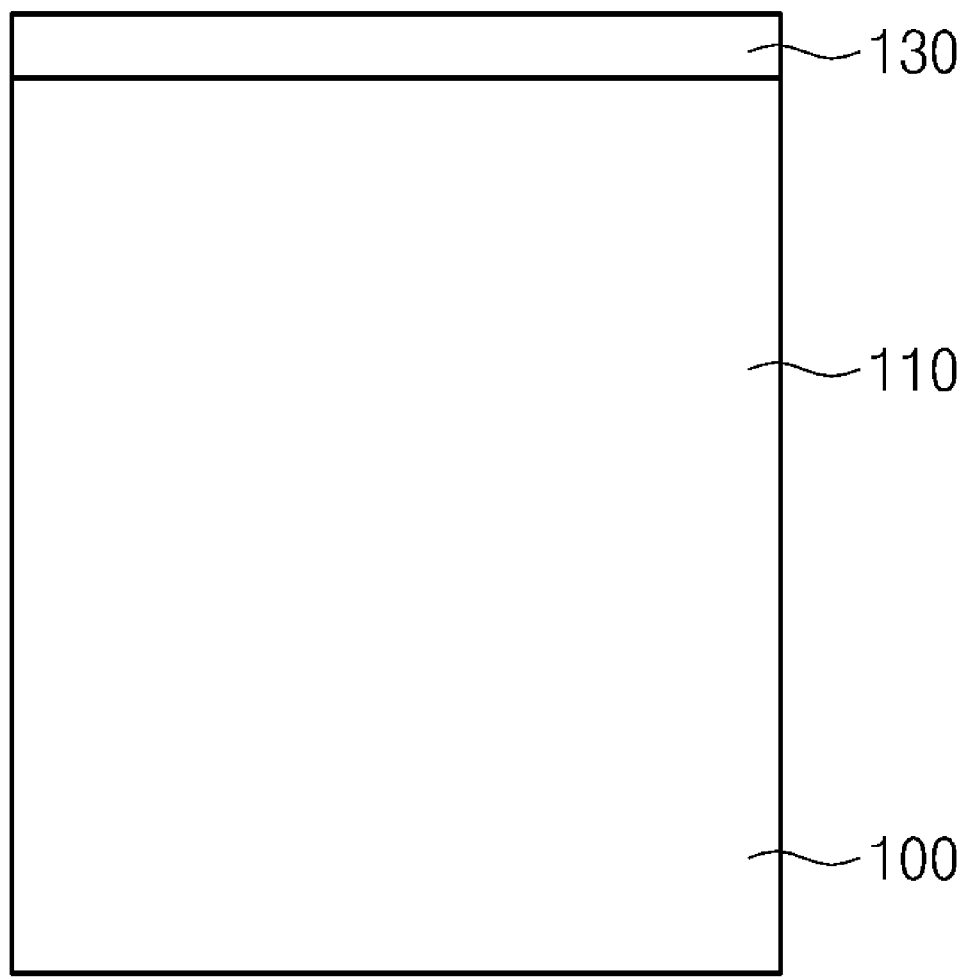
FIGS. 2C, 3C, 4C, 5C, 6C, 7C, 8C, and 9C are cross-sectional views taken along the line B-B' of FIGS. 2A, 3A, 4A, 5A, 6A, 7A, 8A, and 9A, respectively.

Referring to FIGS. 2A through 2C, a first trench 119 is formed so as to cut the semiconductor substrate 100 in a B-B' line direction (the Y direction in FIG. 1) and extend in the Y direction. In the Y cutting, dry etching may be performed such that a hard mask 130 extending in the Y direction is formed on the semiconductor substrate 100, and then etching may be performed using the hard mask 130 as an etching mask. In the Y cutting, an active bar 110 may be formed in the shape of a wall or a pin extending in the Y direction. The semiconductor substrate 100 may be a single-crystal silicon wafer or a SOI wafer. The active bar 110 may be formed of single-crystal silicon. The semiconductor substrate 100 may be doped with first conductive impurities such as P-type impurities. The first trench 119 may be filled with a first insulating layer 120. The first insulating layer 120 may be a silicon nitride layer (for example, SiN), a silicon oxide layer (for example, $SiO_2$), or a combination thereof. For example, the first insulating layer 120 may be a silicon oxide layer.

Figure 3A:
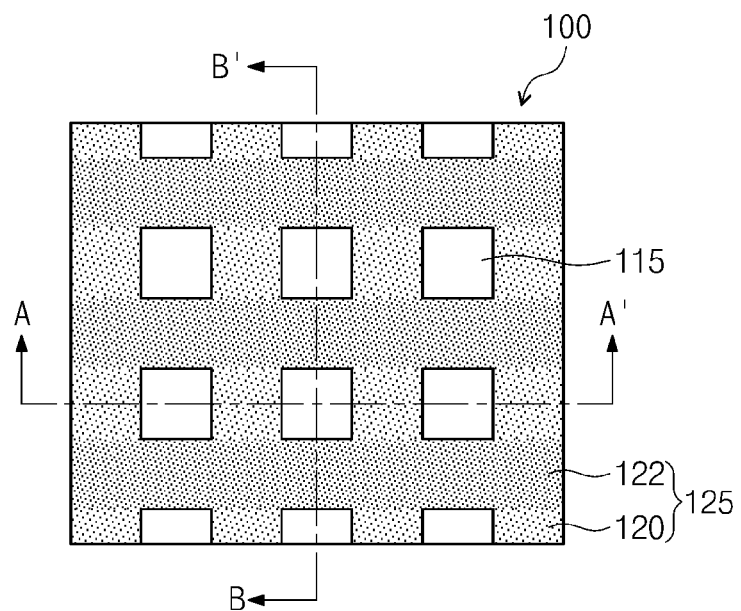
Figure 3B:
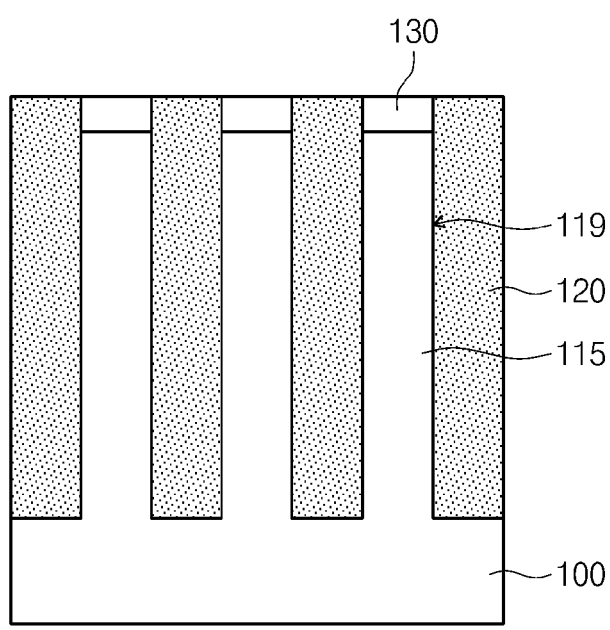
Figure 3C:
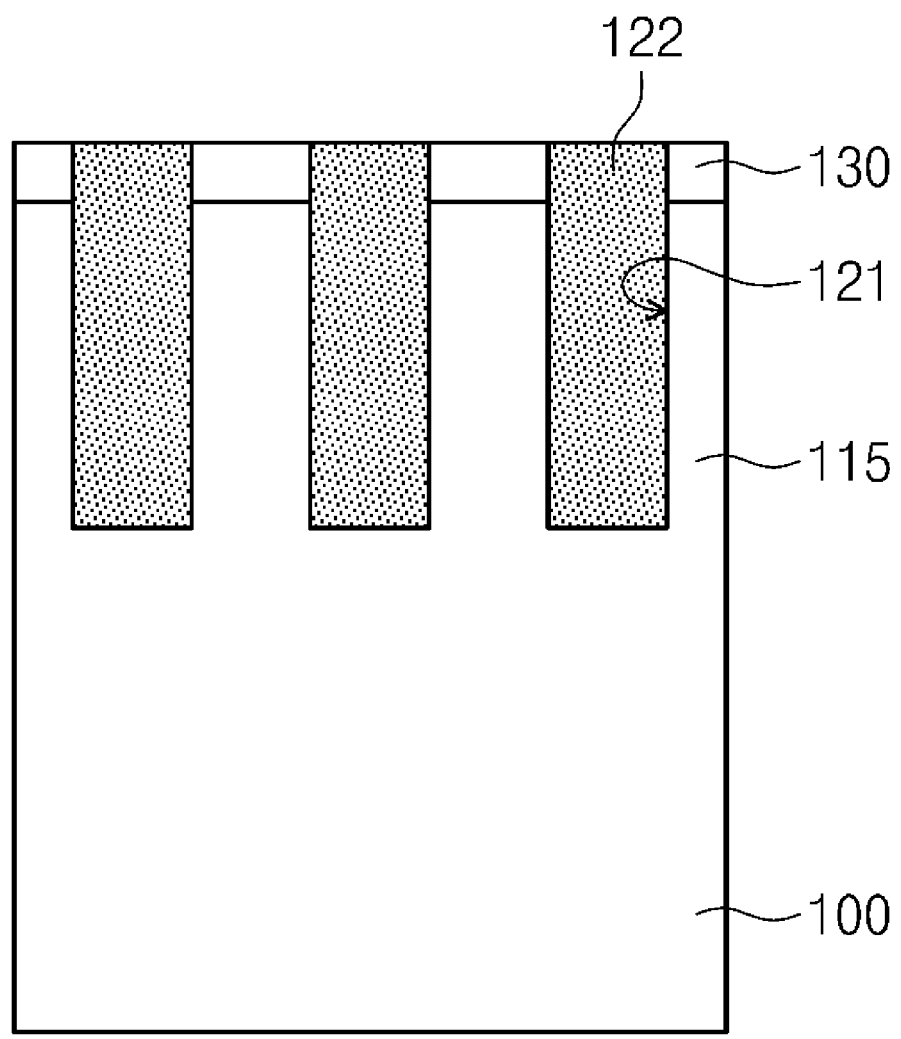

Referring to FIGS. 3A through 3C, a second trench 121 is formed so as to cut the semiconductor substrate 100 in an A-A' line direction (the X direction in FIG. 1) and extend in the X direction. In the X cutting, a wall-shaped bar 110 may be realized as the vertical channel 115 rising vertically (the Z direction in FIG. 1). The second trench 121 may be filled with a second insulating layer 122. The second insulating layer 122 may contain the same material as that of the first insulating layer 120. For example, the second insulating layer 122 may be a silicon oxide layer. The first insulating layer 120 and the second insulating layer 122 may form a device-isolating layer 125 isolating the vertical channels 115 from each other. The second trench 121 may be substantially shallower than the first trench 119.

Figure 4A:
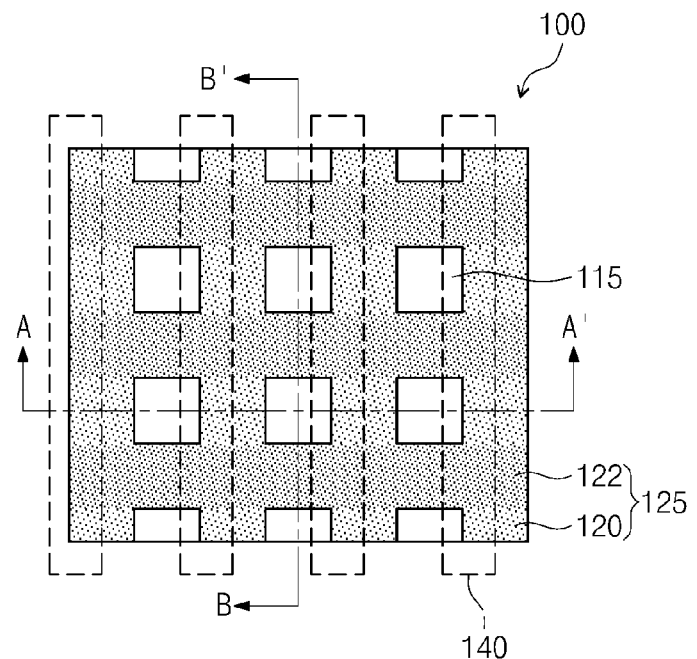
Figure 4B:
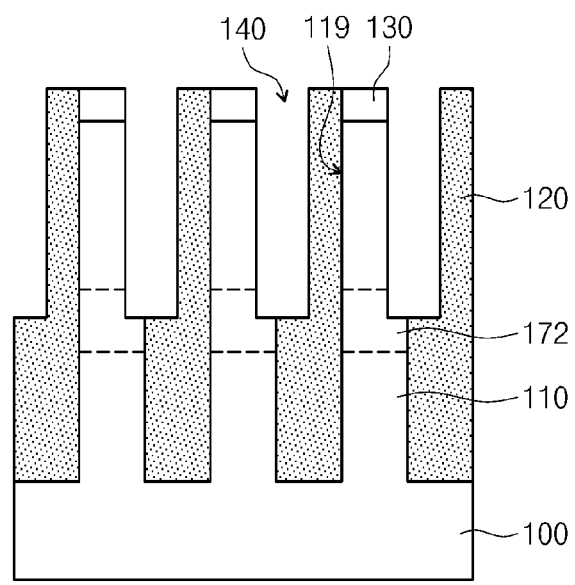
Figure 4C:
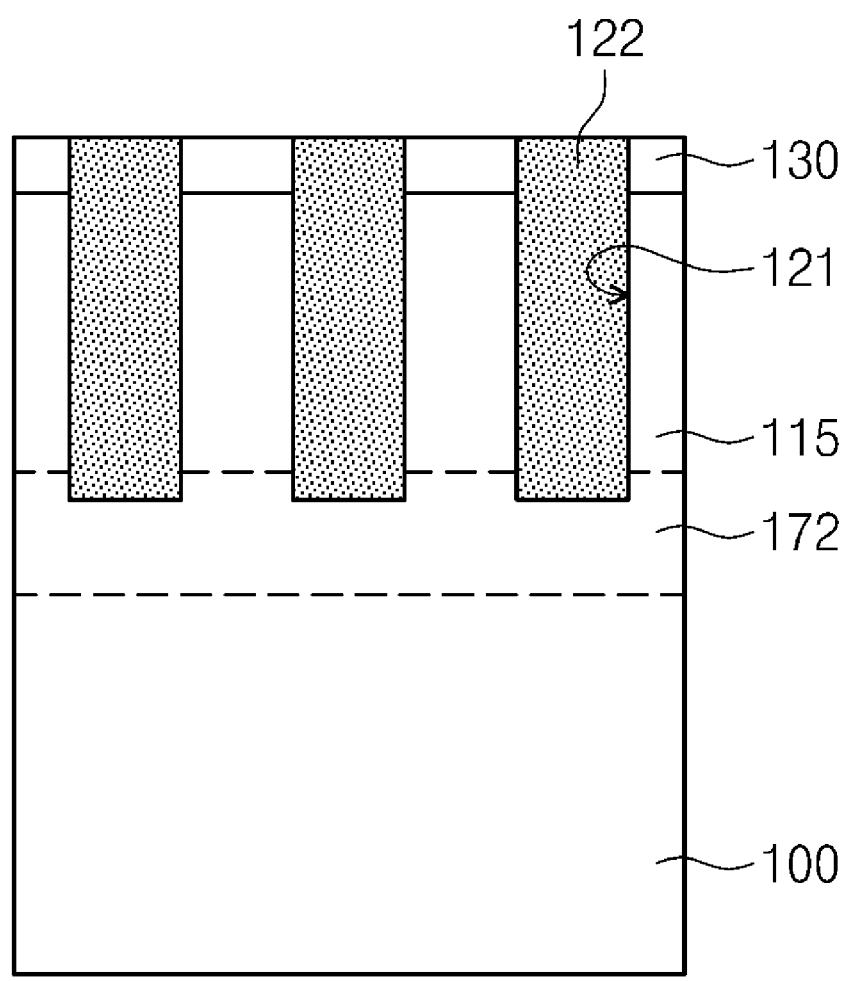

Referring to FIGS. 4A through 4C, a buried bit line pattern 140 (hereinafter, referred to as a BBL pattern) is formed in the semiconductor substrate 100 so as to extend in the Y direction. The BBL pattern 140 may cut the device-isolating layer 125 in the Y direction and may be offset with one side surface of the vertical channel 115. Accordingly, the one side surface of the vertical channel 115 may be removed, when the BBL pattern 140 is formed. A depth of the BBL pattern 140 may be shallower than that of the first trench 119. The depth of the BBL pattern 140 may be the same as or nearly similar to that of the second trench 121. By implanting impurities into the vertical channel 115 exposed by the BBL pattern 140, the lower junction region 172 may be formed selectively. The lower junction region 172 may be doped with second impurities such as N-type impurities. Alternatively, the lower junction region 172 may not be formed in this step, but may be formed in a subsequent step (for example, a step of forming a buried bit line in FIGS. 6A through 6C).

Figure 5A:
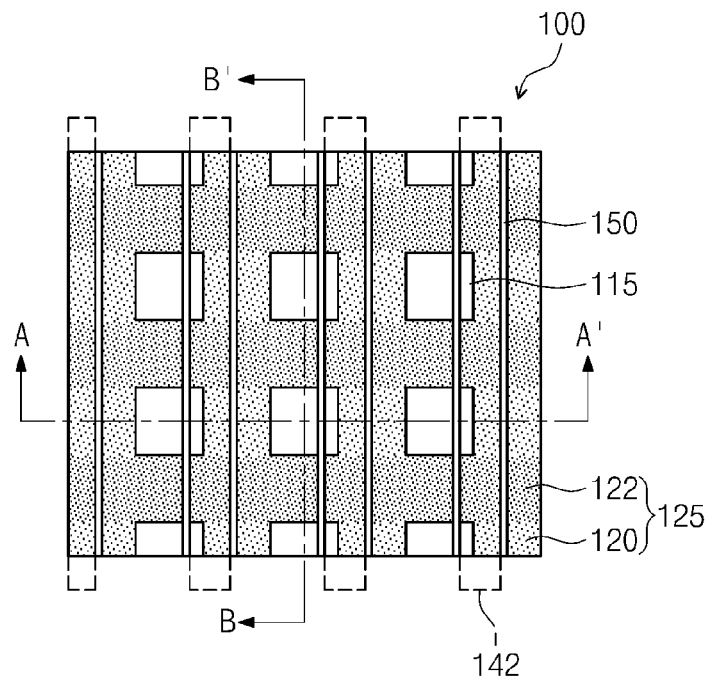
Figure 5B:
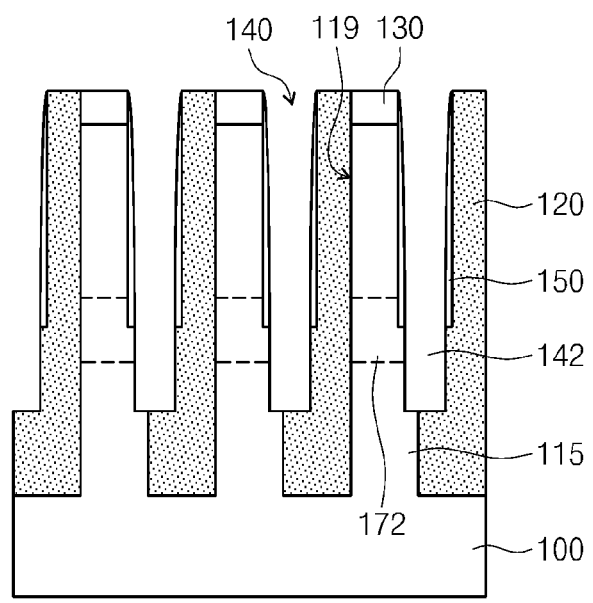
Figure 5C:
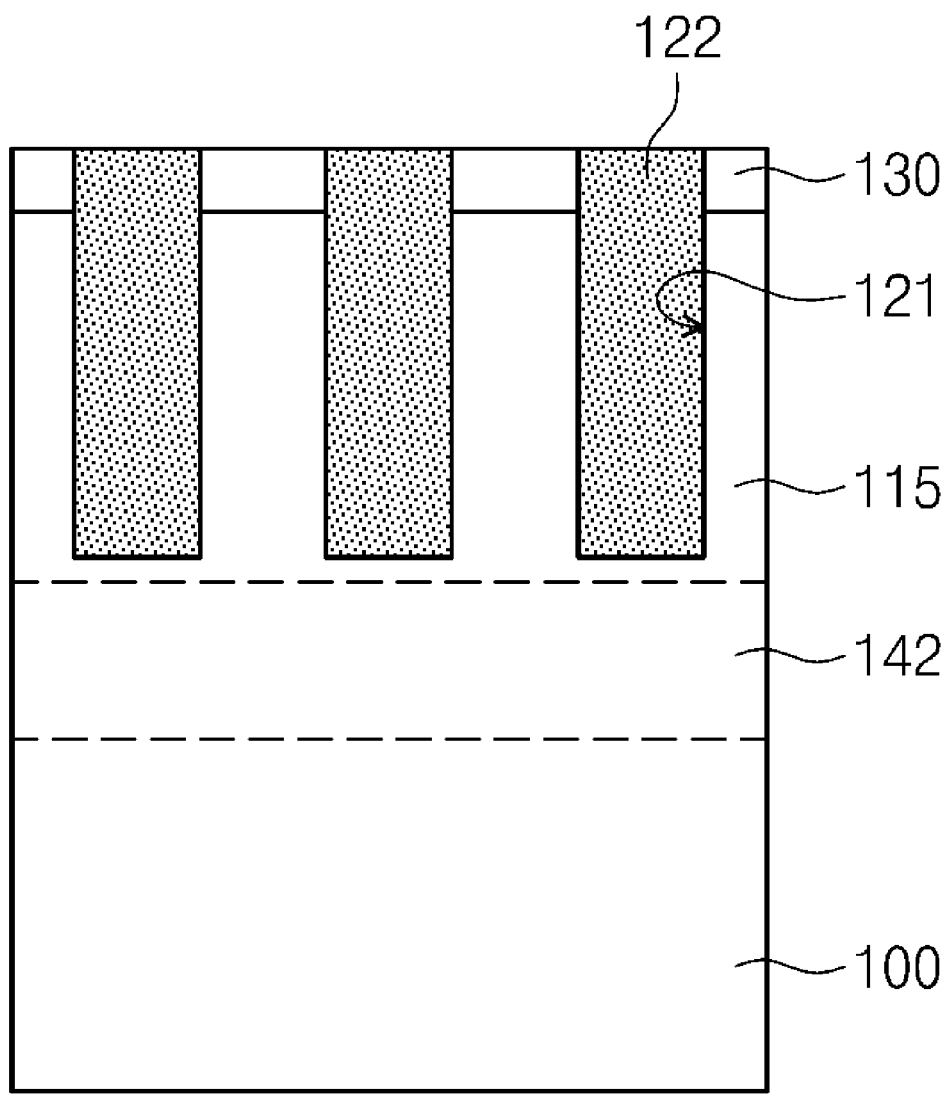

Referring to FIGS. 5A through 5C, a BBL pattern 142 (hereinafter, referred to as D-BBL pattern) is formed in the semiconductor substrate 100 so as to extend in the Y direction. The D-BBL pattern 142 may be formed below the BBL pattern 140. For example, the D-BBL pattern 142 may be formed by forming a liner 150 on the inner sidewall of the BBL pattern 140, and then performing dry etching on the vertical channel 115 and the device-isolating layer 125 in the Y direction. The D-BBL pattern 142 may be formed by etching the vertical channel 115 without selectivity to the device-isolating layer 125. The D-BBL pattern 142 may be deeper than the second trench 121. The liner 150 may be formed by deposition of an insulating material different from that of the device-isolating layer 125, and etch-back. For example, the device-isolating layer 125 may be a silicon oxide layer (for example, $SiO_2$) and the liner 150 may be a silicon nitride layer (for example, SiN). The liner 150 may protect the vertical channel 115 from etching damage when the D-BBL pattern 142 is formed.

Figure 6A:
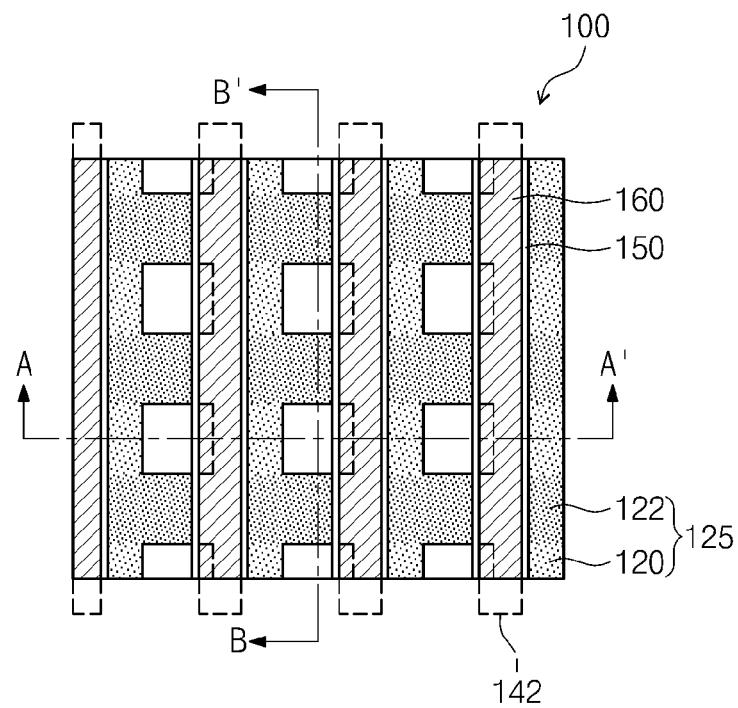
Figure 6B:
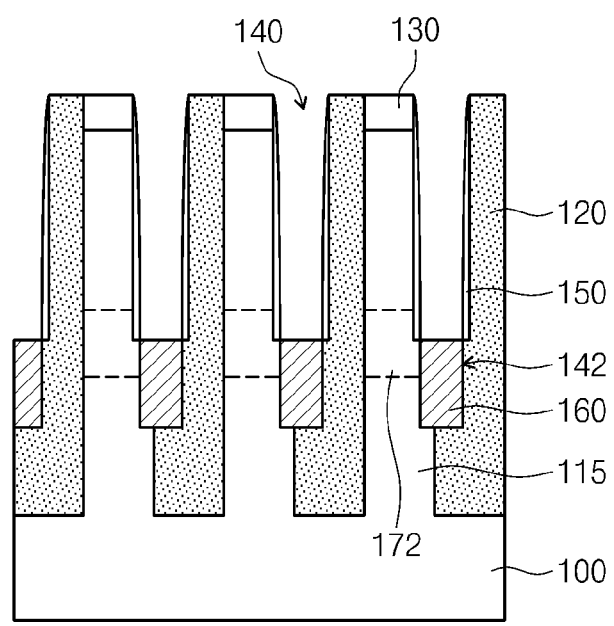
Figure 6C:
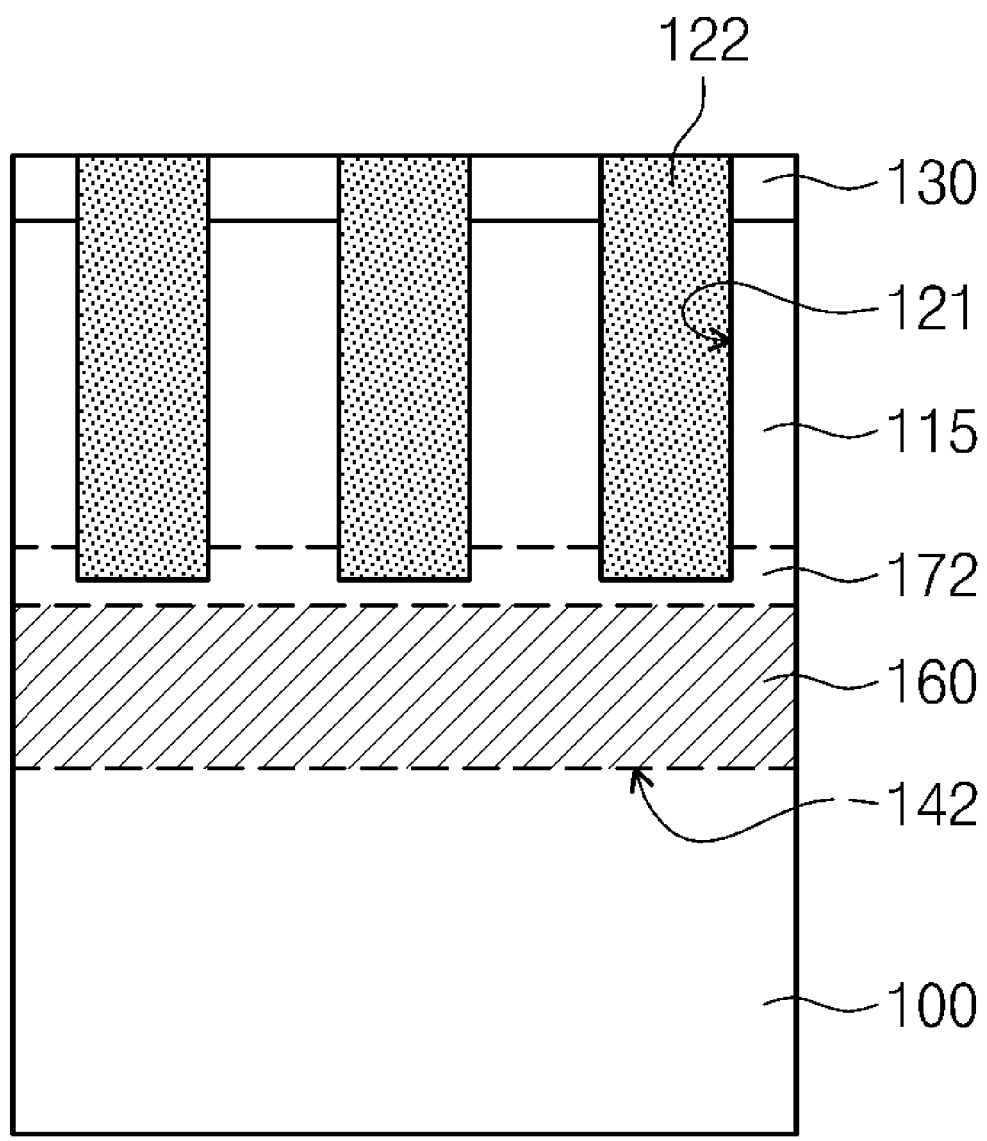

Referring to FIGS. 6A through 6C, the buried bit line 160 is formed in the D-BBL pattern 142. For example, the buried bit line 160 may be formed of metal (for example, $CoSi_x$) by siliciding the vertical channel 115 exposed by the D-BBL pattern 142. As another example, the silicided buried bit line 160 may be formed by depositing a silicon layer doped with impurities in the D-BBL pattern 142 and subjecting the deposited silicon layer (for example, $CoSi_x$) to silicide reaction. The impurities doped in the silicon layer in the silicide reaction may move to the vertical channel 115 to form the lower junction region 172. As still another example, the lower junction 172 is formed by ion-implanting impurities into the vertical channel 115 exposed by the D-BBL pattern 142, and then the buried bit line 160 may be formed in the D-BBL pattern 142 by deposition of a metal layer (for example, TiN) and etch-back. As still another example, when the lower junction region 172 is formed with a low concentration in the step of FIGS. 4A through 4C, the lower junction region 172 may be realized with an LDD structure by high-concentration doping in this step. According to the embodiment of the inventive concept, since the buried bit line 160 contains metal, the buried bit line 160 is able to lower the resistance, compared to the buried bit line formed of polysilicon.

Figure 7A:
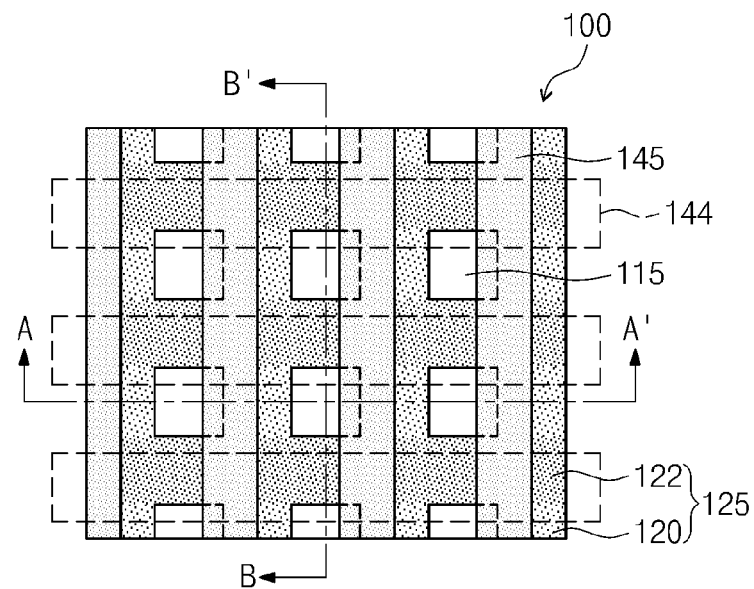
Figure 7B:
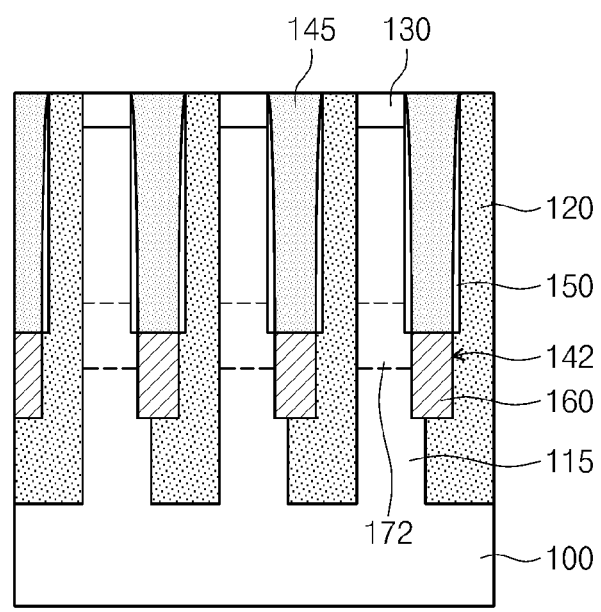
Figure 7C:
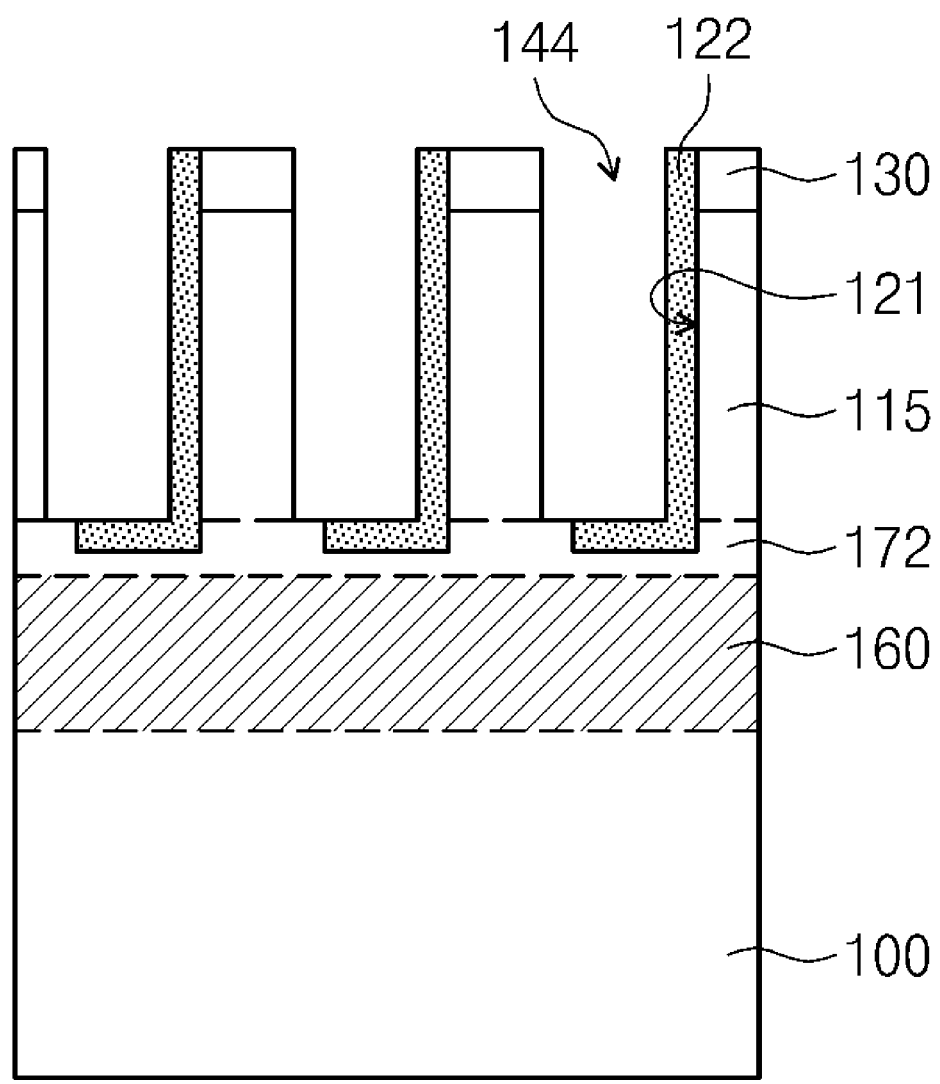

Referring to FIGS. 7A through 7C, the insulating pillar 145 is formed in the shape of a wall or a pin extending in the Y direction, by filing the BBL pattern 140 with an insulating material. For example, the insulating pillar 145 may be formed of a silicon nitride layer (for example, SiN). Subsequently, a word line pattern 144 (hereinafter, referred to as a WL pattern) is formed in the semiconductor substrate 100 so as to extend in the X direction. The WL pattern 144 may cut the device-isolating layer 125 in the X direction and may be offset with the other side surface of the vertical channel 115. Accordingly, a part of the vertical channel 115 may be removed, when the BBL pattern 140 is formed. Moreover, a part of the vertical channel 115 may be further removed, when the WL pattern 144 is formed.

The height of the WL pattern 144 may be the same as or lower than that of the second trench 121. The insulating pillar 145 may be isolated in the shape of an island by the WL pattern 144. In the following drawings including FIG. 7A, the liner 150 is not illustrated for simplicity.

Figure 8A:
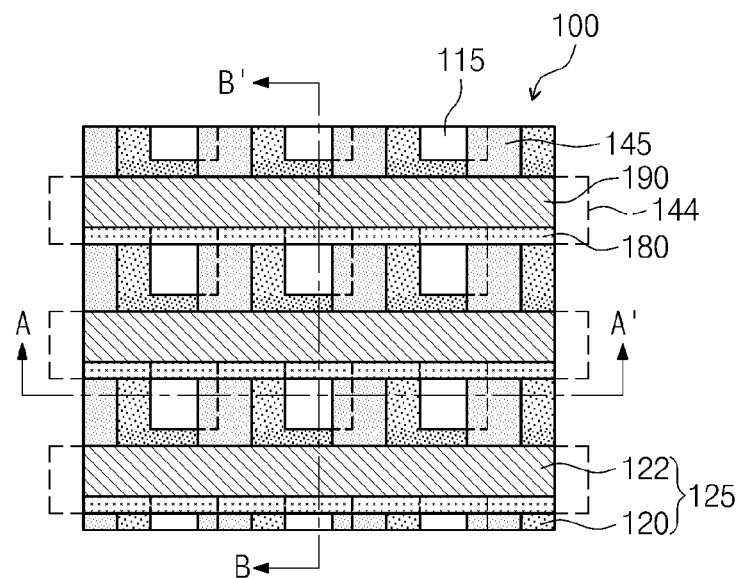
Figure 8B:
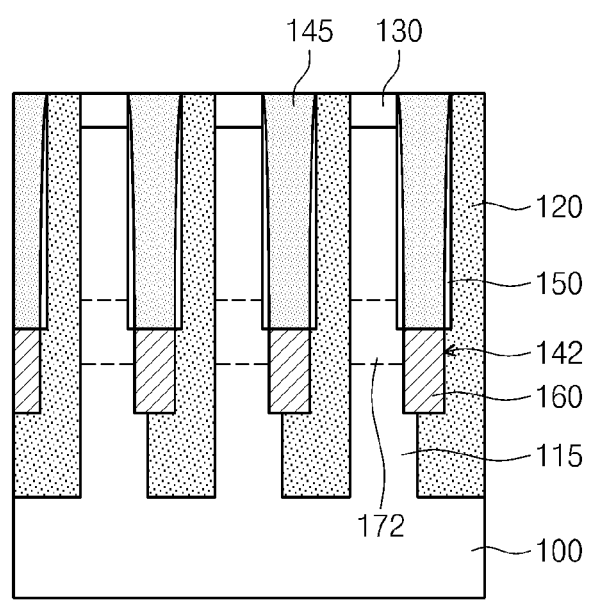
Figure 8C:
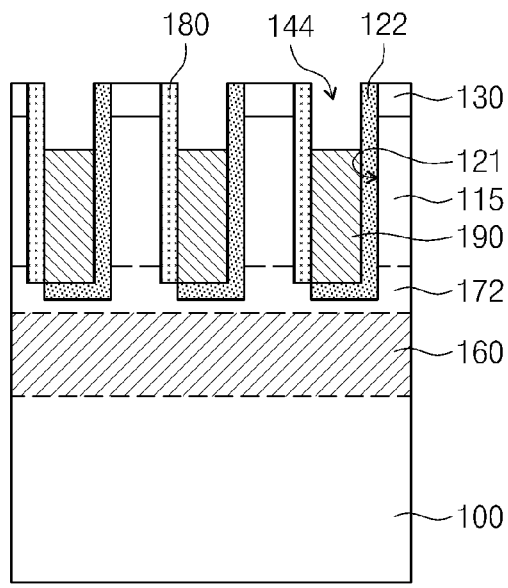

Referring to FIGS. 8A through 8C, the gate insulating layer 180 and the word line 190 are formed in the semiconductor substrate 100 so as to extend in the X direction. The gate insulating layer 180 may be formed in the WL pattern 144 by depositing a silicon oxide layer (for example, SiO$_2$). The gate insulating layer 180 may be formed restrictively on the sidewall of the vertical channel 115.

Figure 8D:
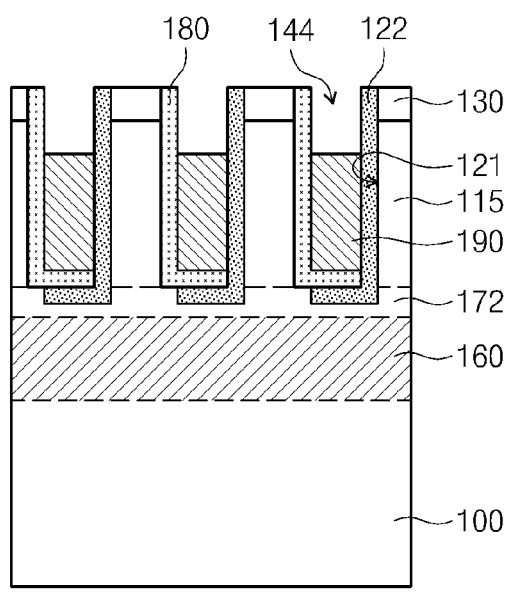
FIG. 8D is a cross-sectional view illustrating a dynamic random-access memory (DRAM) device according to another embodiment of the inventive concept taken along the line B-B' of FIG. 8A.
Figure 8E:
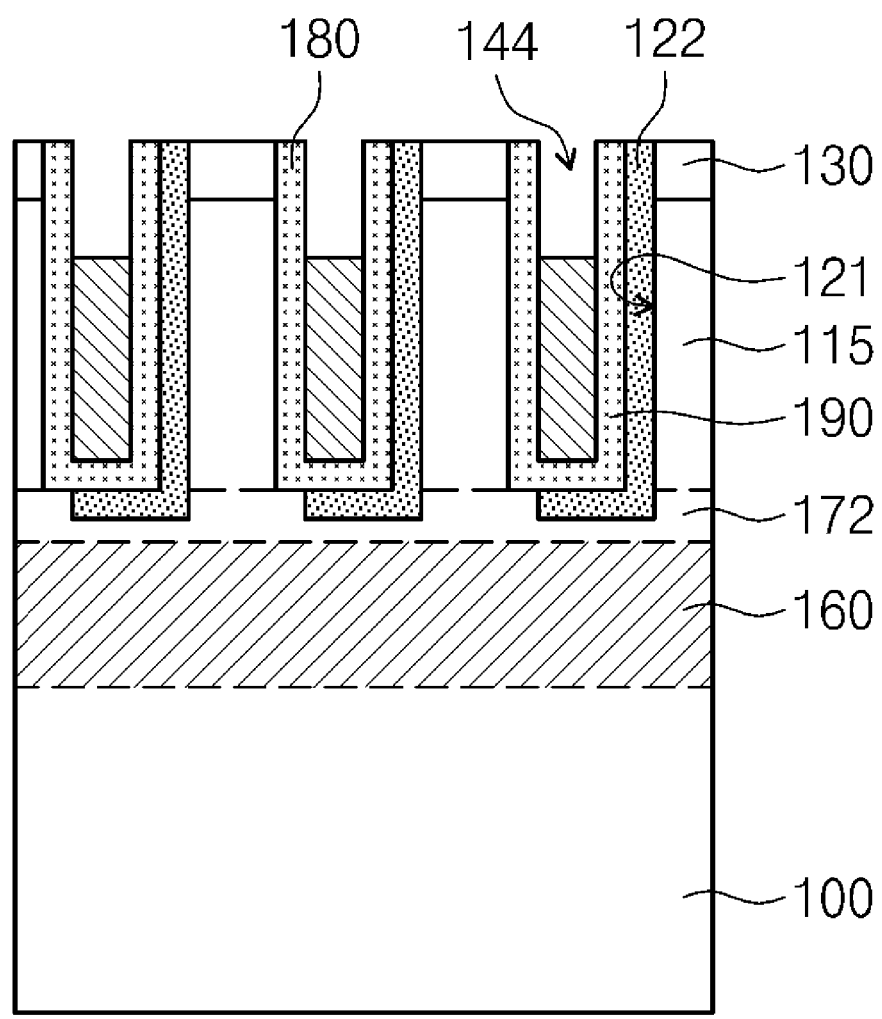
FIG. 8E is a cross-sectional view illustrating a DRAM device according to still another embodiment of the inventive concept taken along the line B-B' of FIG. 8A.

FIG. 8D is a cross-sectional view illustrating a dynamic random-access memory (DRAM) device according to another embodiment of the inventive concept taken along the line B-B' of FIG. 8A, and FIG. 8E is a cross-sectional view illustrating a DRAM device according to still another embodiment of the inventive concept taken along the line B-B' of FIG. 8A.

As another example, as illustrated in FIG. 8D, the gate insulating layer 180 may be formed on the sidewall of the vertical channel 115 and the bottom surface of the WL pattern 144. Alternatively, as illustrated in FIG. 8E, the gate insulating layer 180 may be formed on the entire inner sidewall of the WL pattern 144. The word line 190 may be formed in the WL pattern 144 by deposition of polysilicon layer or metal layer (for example, TiN) and etch-back. The word line 190 may be lower than the upper surface of the WL pattern 144. According to the embodiment of the inventive concept, the width (vertical length) of the word line 190 may be formed with a desired size, thereby realizing reproducibility of the channel length.

Figure 9A:
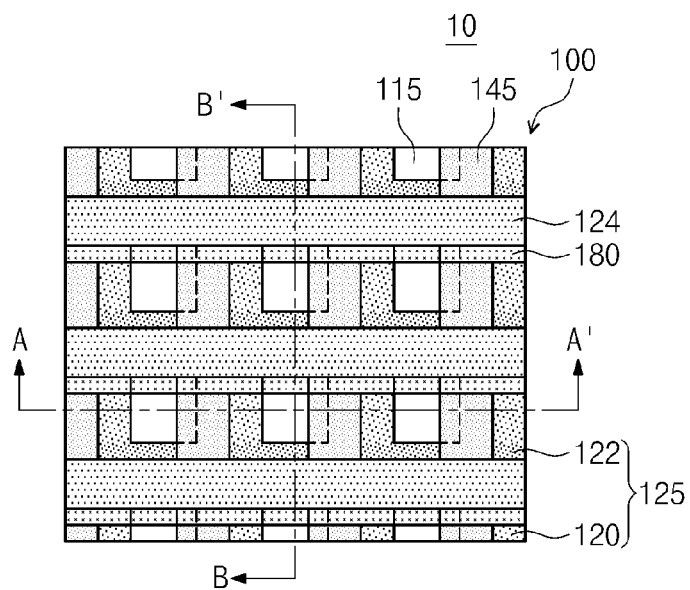
Figure 9B:
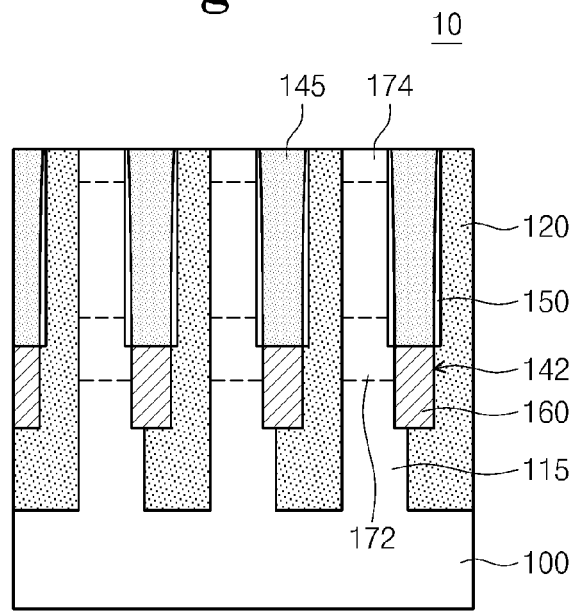
Figure 9C:
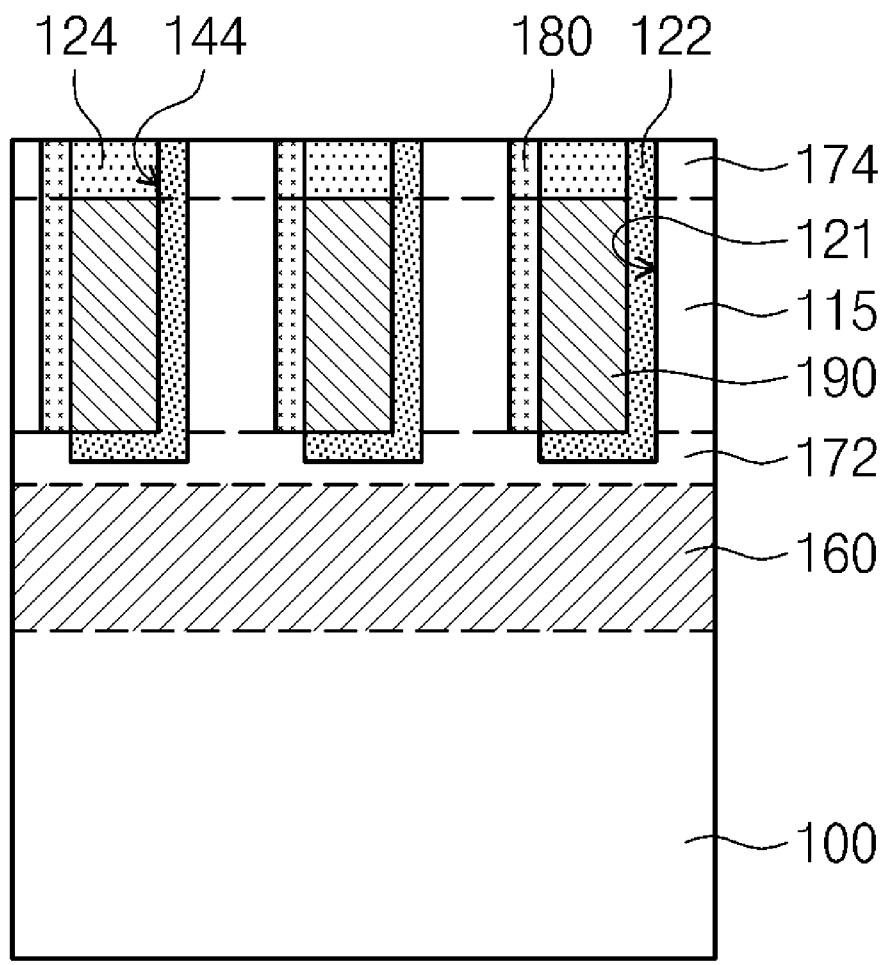

Referring to FIGS. 9A through 9C, the WL pattern 144 is filled with a third insulating layer 124. The third insulating layer 124 may be a silicon oxide layer, a silicon nitride layer, or a combination thereof. The vertical channel 115 is exposed by removing the hard mask 130 by etch-back, CMP, or the like. The upper junction region 174 is formed by implanting impurities into the vertical channel 115. In the embodiment of the inventive concept, since only the vertical channel 115 is exposed, the impurities may be implanted in a self-alignment manner. The upper junction region 174 may be formed with an LDD structure by low-concentration doping and high-concentration doping.

According to the above-described series of steps, the active bar 110 is formed by the Y cutting, the vertical channel 115 is formed in the Z direction by isolating the active bar 110 in the X cutting, the buried bit line 160 is formed in the Y direction, and the word line 190 is formed in the X direction. In this way, it is possible to form the vertical channel transistor 10 with a one-channel structure, as illustrated in FIG. 1A.

The vertical channel transistor 10 may be utilized in either a cell region or a peripheral-region of a memory device. The vertical channel transistor 10 may widely be utilized in either a memory device or a logic device. For example, the vertical channel transistor 10 may be utilized as the DRAM device, as described below.

Figure 10A:
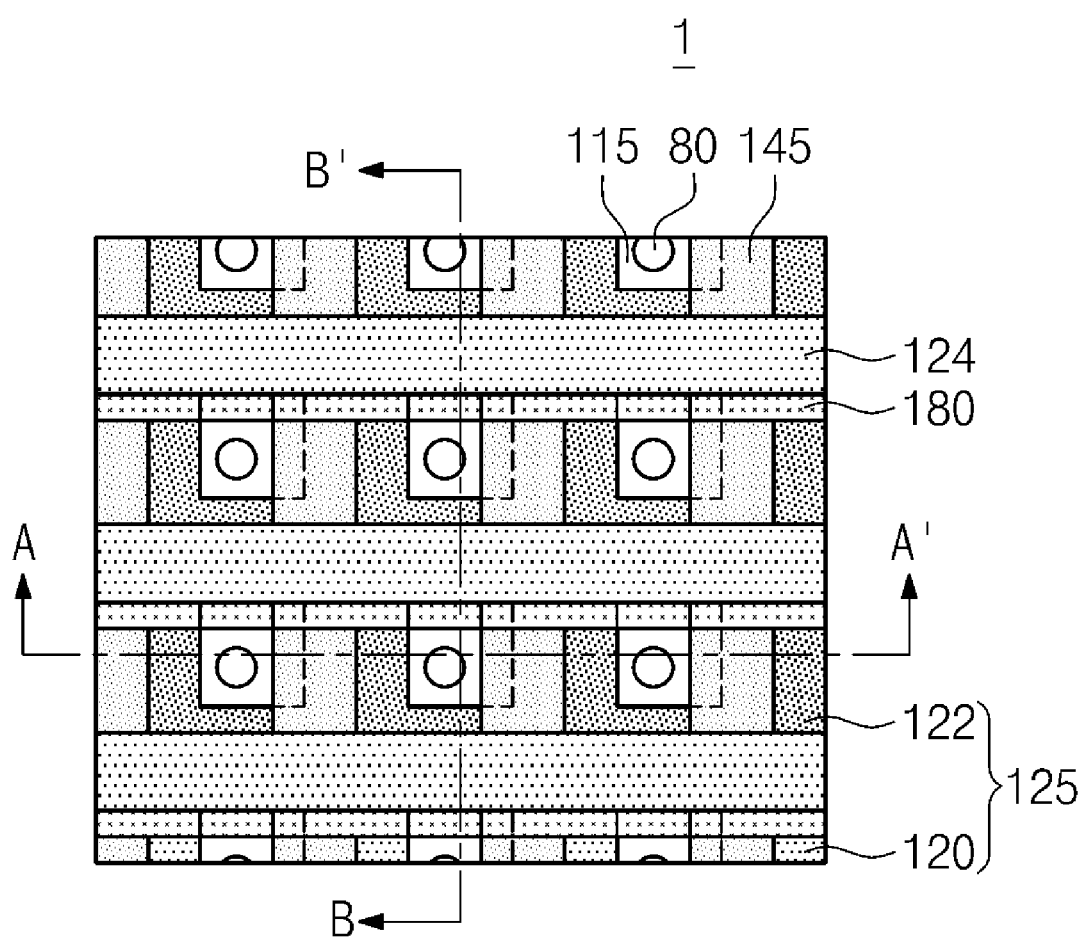
FIG. 10A is a plan view illustrating a DRAM device including the vertical channel transistor according to an embodiment of the inventive concept.
Figure 10B:
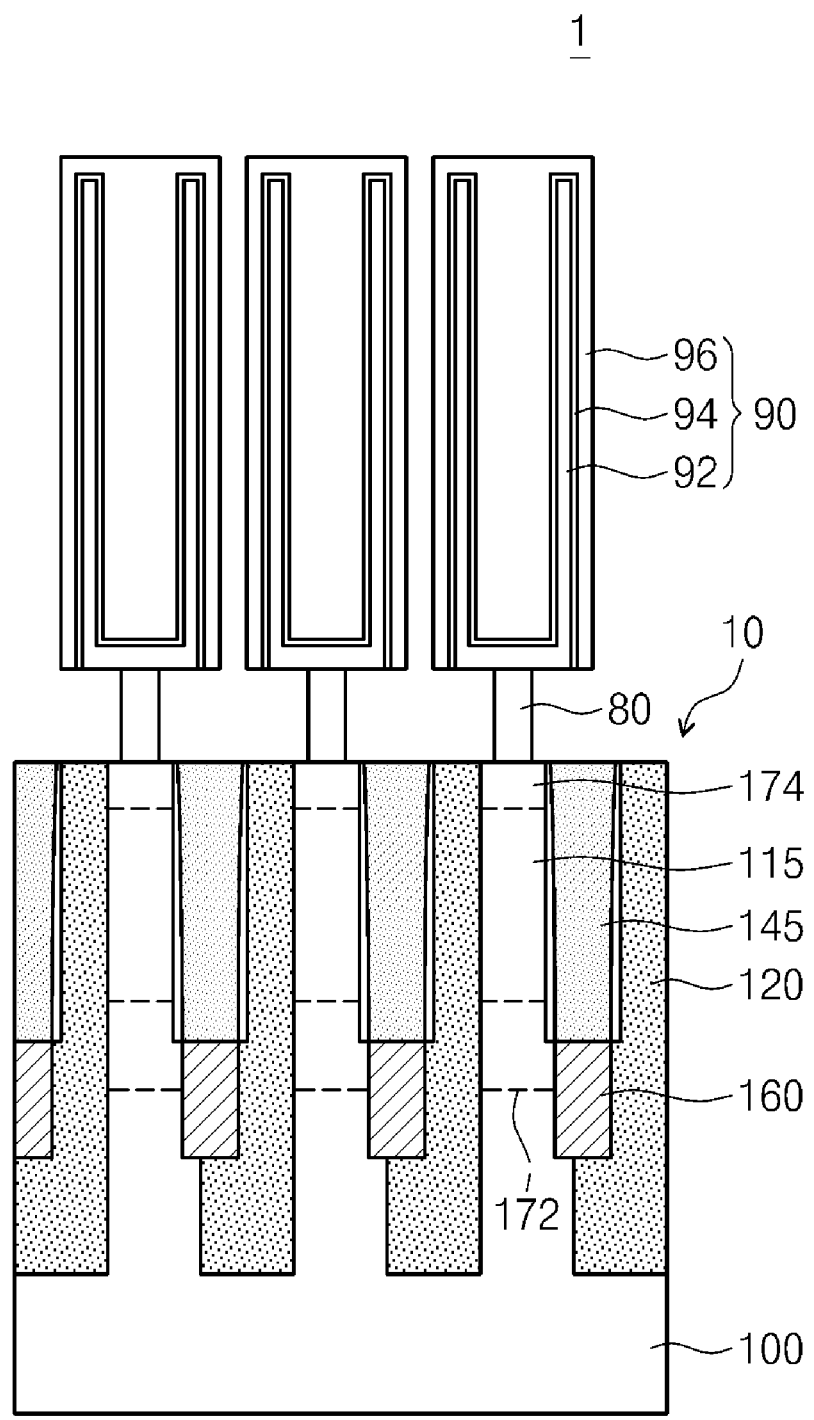
FIG. 10B is a cross-sectional view taken along the line A-A' line of FIG. 10A.
Figure 10C:
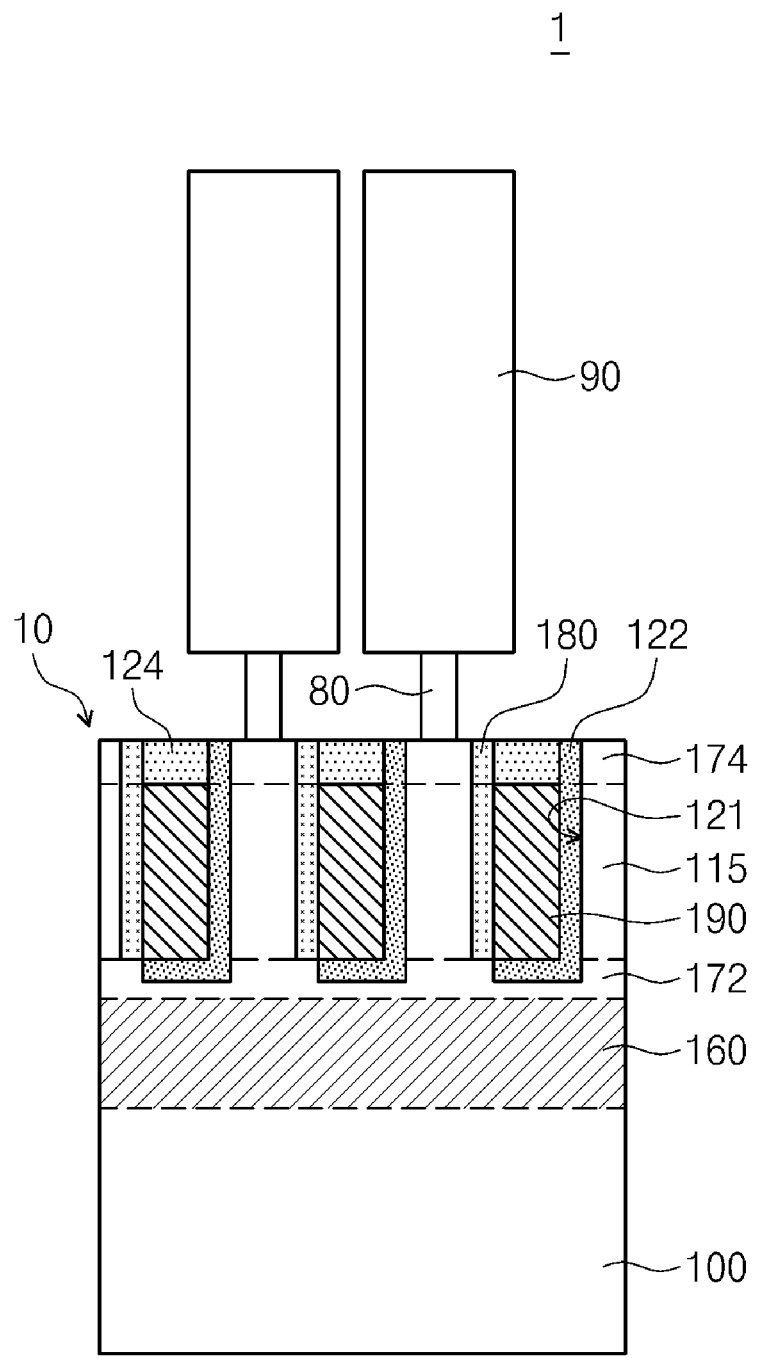
FIG. 10C is a cross-sectional view taken along the line B-B' of FIG. 10A.

FIG. 10A is a plan view illustrating a DRAM device including the vertical channel transistor according to an embodiment of the inventive concept. FIG. 10B is a cross-sectional view taken along the line A-A' line of FIG. 10A. FIG. 10C is a cross-sectional view taken along the line B-B' of FIG. 10A.

Referring to FIGS. 10A through 10C, a DRAM device 1 may include the vertical channel transistor 10 and a capacitor 90. In the vertical channel transistor 10, a memory cell may be defined at an intersection of the word line 190 and the buried bit line 160. The capacitor 90 may have a cylindrical structure in which a dielectric layer 94 is sandwiched between a lower electrode 92 and an upper electrode 96. The lower electrode 92 may be connected electrically to the upper junction region 174 of the vertical channel 115 via a contact 80.

As another example, the vertical channel transistor 10 may be utilized as a non-volatile memory device by substituting the gate insulating layer 180 with an ONO layer capable of trapping carriers. As still another example, the vertical channel transistor 10 may be utilized as a phase change memory device (PRAM) by forming a phase change material layer between the word line 190 and the buried bit line 160.

Modified Method for Forming Buried Bit Line

Figure 11A:
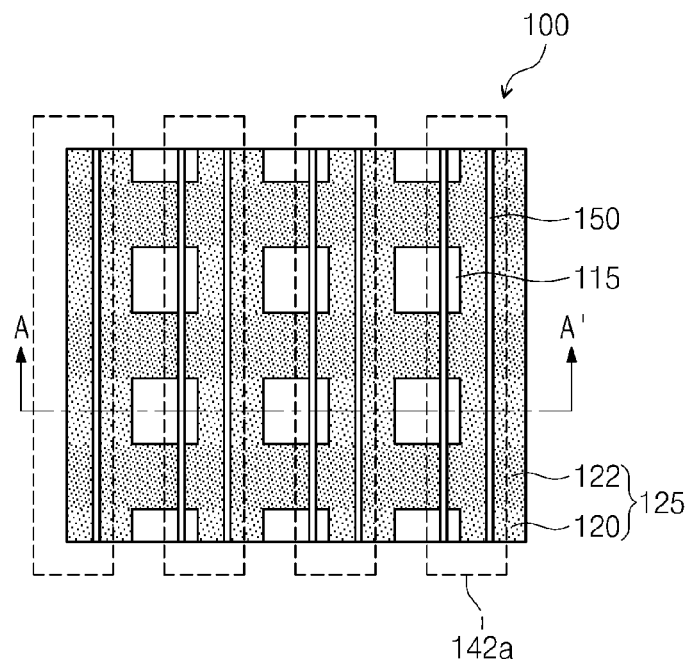
FIGS. 11A and 11C are plan views illustrating a method for forming a buried bit line according to an embodiment of the inventive concept.
Figure 11B:
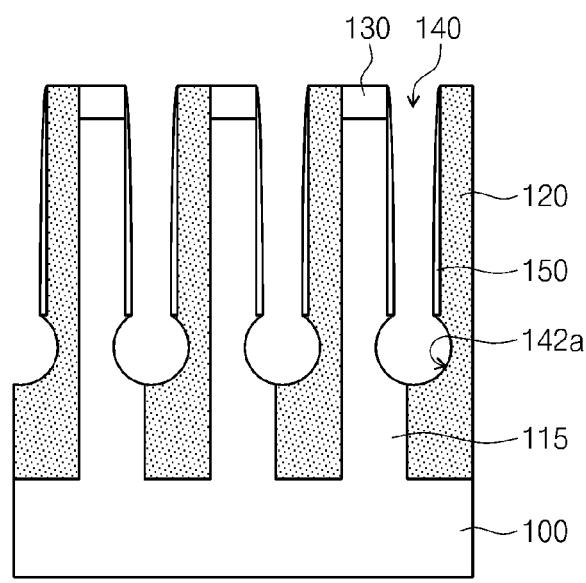
FIGS. 11B and 11D are cross-sectional views taken along the line A-A' of FIGS. 11A and 11C, respectively.
Figure 11C:
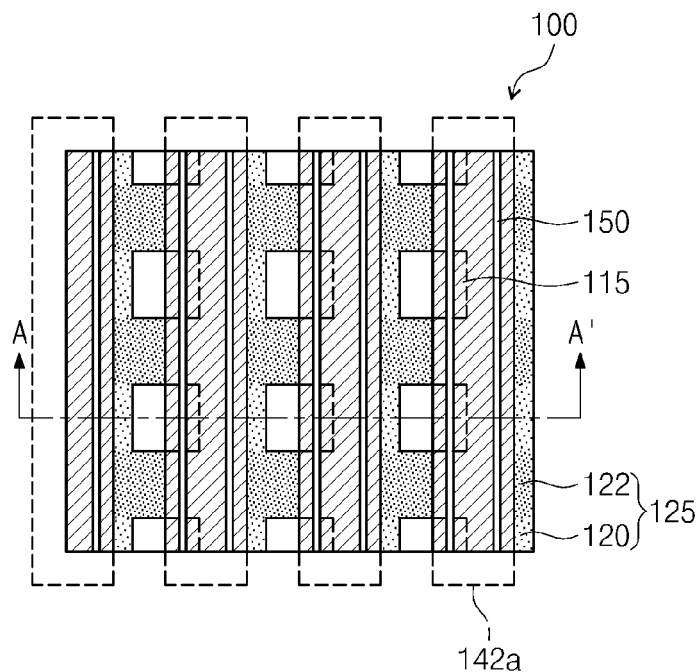
Figure 11D:
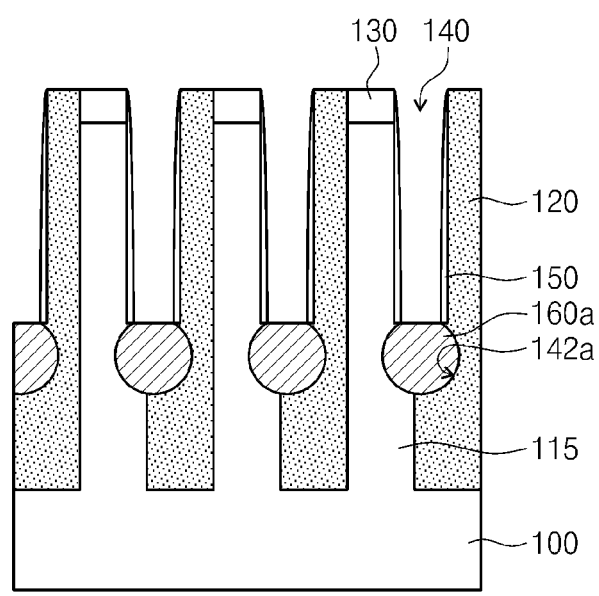

FIGS. 11A and 11C are plan views illustrating a method for forming a buried bit line in the method of fabricating the vertical channel transistor with the one-channel structure according to a modified example of the embodiment of the inventive concept. FIGS. 11B and 11D are cross-sectional views taken along the line A-A' of FIGS. 11A and 11C, respectively.

Referring to FIGS. 11A and 11B, a circular D-BBL pattern 142a may be formed. For example, the circular D-BBL pattern 142a may be formed by forming a liner 150 with a silicon nitride layer in the inner sidewall of the BBL pattern 140 and performing wet etching on the vertical channel 115 that is not protected by the liner 150. The vertical channel 115 may be removed by wet etching having no selectivity to the device-isolating layer 125. As another example, the D-BBL pattern 142a may be formed in a semicircular shape, as illustrated in FIG. 18D. In this case, the vertical channel 115 may be removed by etching having selectivity to the device-isolating layer 125 to form the semicircular D-BBL pattern 142a.

Referring to FIGS. 11C and 11D, a circular buried bit line 160a may be formed in the D-BBL pattern 142a. The buried bit line 160a may be formed by siliciding the vertical channel 115 exposed by the D-BBL pattern 142a or deposition of metal layer (for example, TiN) and etch-back.

Another Modified Method for Forming Buried Bit Line

Figure 12A:
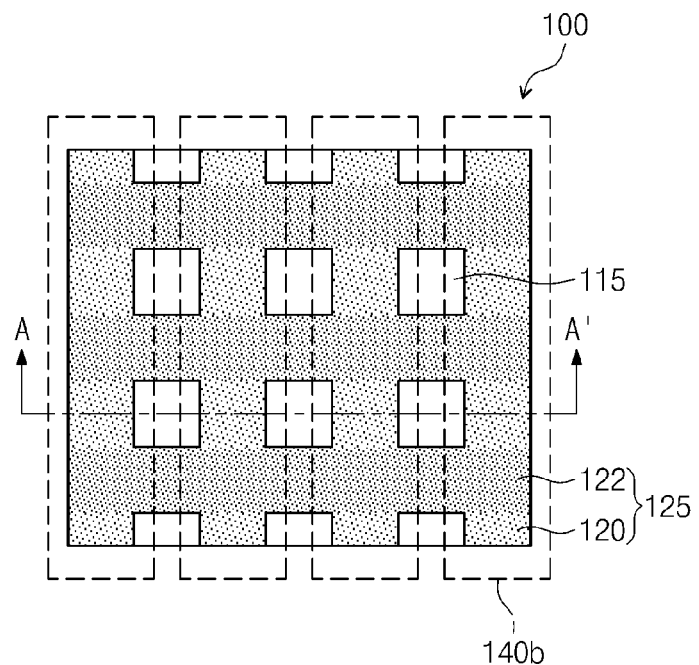
FIGS. 12A, 12C, and 12E are plan views illustrating a method for forming a buried bit line according to a modified example of the embodiment of the inventive concept.
Figure 12B:
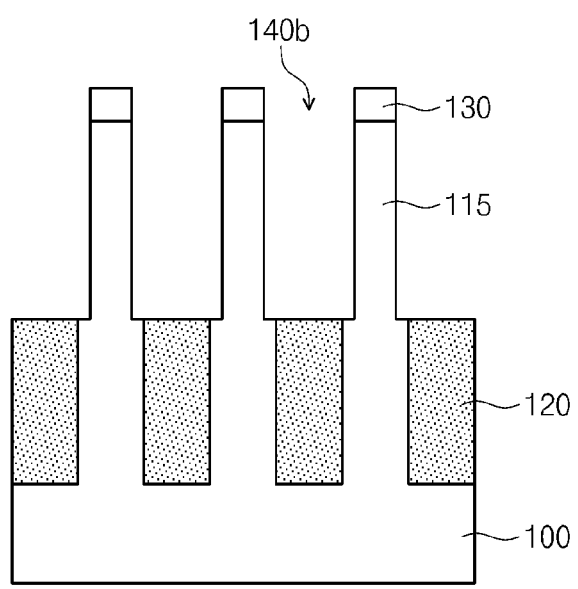
FIGS. 12B, 12D, and 12F are cross-sectional views taken along the line A-A' of FIGS. 12A, 12C, and 12E, respectively.
Figure 12C:
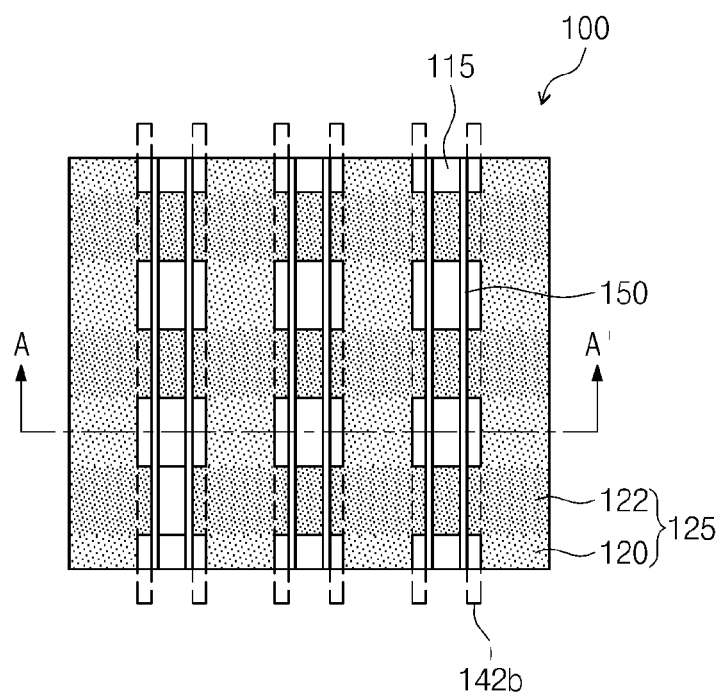
Figure 12D:
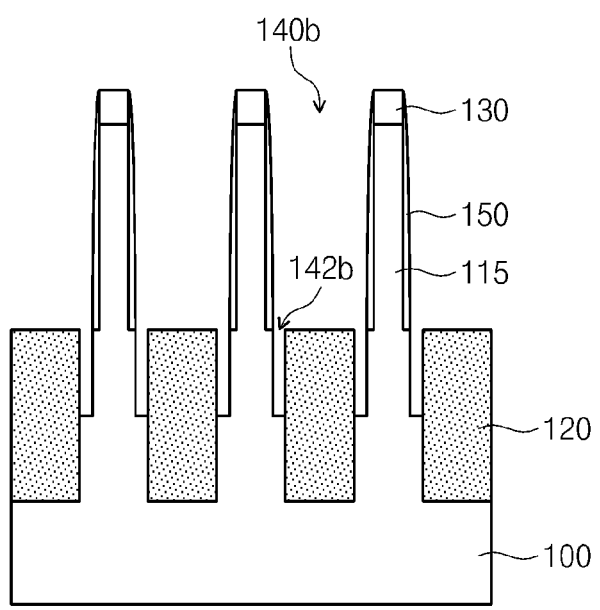
Figure 12E:
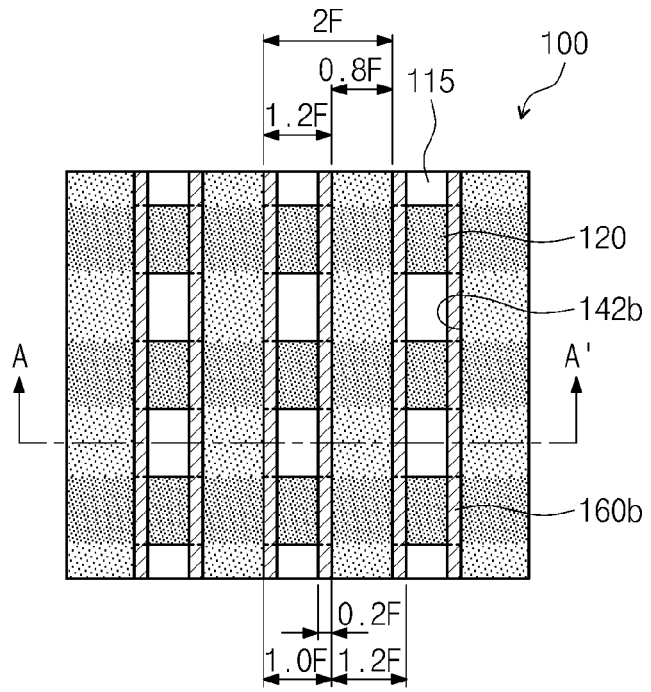
Figure 12F:
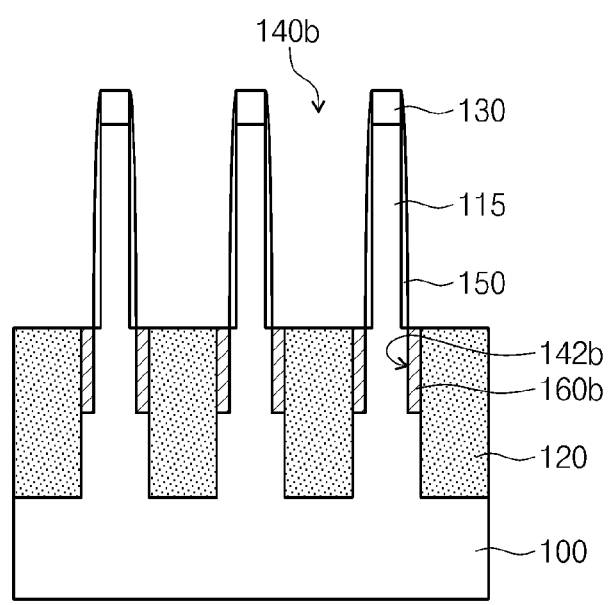

FIGS. 12A, 12C, and 12E are plan views illustrating a method for forming a buried bit line in the method of fabricating the vertical channel transistor with the one-channel structure according to a modified example of the embodiment of the inventive concept. FIGS. 12B, 12D, and 12F are cross-sectional views taken along the line A-A' of FIGS. 12A, 12C, and 12E, respectively.

Referring to FIGS. 12A and 12B, a BBL pattern 140b is formed in the semiconductor substrate 100 so as to extend in the Y direction. The BBL pattern 140b may cut the device-isolating layer 125 in the Y direction and may be offset with both side surfaces of the vertical channel 115. Accordingly, parts of the both side surfaces of the vertical channel 115 may be removed, when the BBL pattern 140b is formed.

Referring to FIGS. 12C and 12D, a D-BBL pattern 142b is formed in the semiconductor substrate 100 so as to extend in the Y direction. The D-BBL pattern 142b may be formed by forming the liner 150 in the inside surface of the BBL pattern 140b, and then subjecting the vertical channel 115 to etching having selectivity to the device-isolating layer 125. According to the modified example, two D-BBL patterns 142b may be formed below the BBL pattern 140b so as to be spaced from each other by the device-isolating layer 125.

Referring to FIGS. 12E and 12F, a buried bit line 160b is formed in the D-BBL pattern 142b so as to extend in the Y direction. The buried bit line 160b may be formed by depositing and siliciding polysilicon layer, by siliciding the vertical channel 115, or by deposition of metal layer and etch-back. In the modified example, on the assumption that a pitch of the vertical channel 115 is 2F and a pitch size of the vertical channel 115 is 1.2F, the offset size of the vertical channel 115 and the buried bit line 160b is 0.2F.

Modified Method for Forming Gate Insulating Layer

Figure 13A:
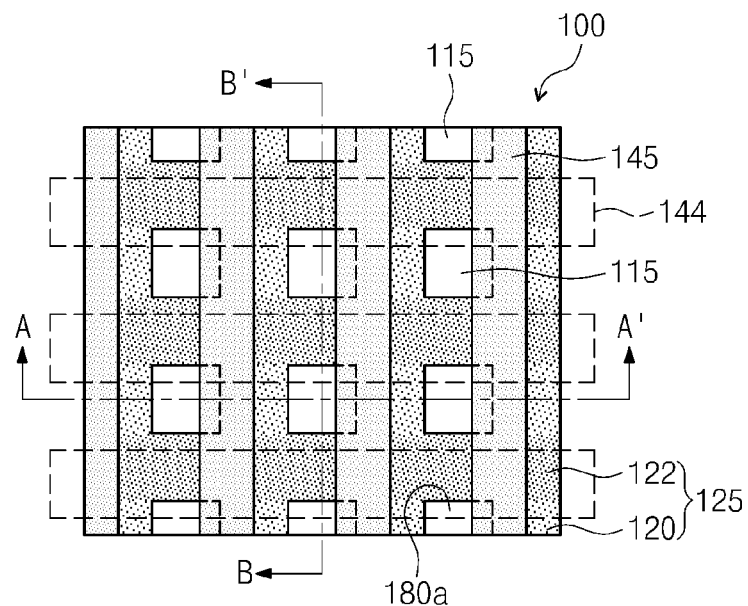
FIGS. 13A, 14A, and 15A are plan views illustrating a method for forming a gate insulating layer according to an embodiment of the inventive concept.
Figure 13B:
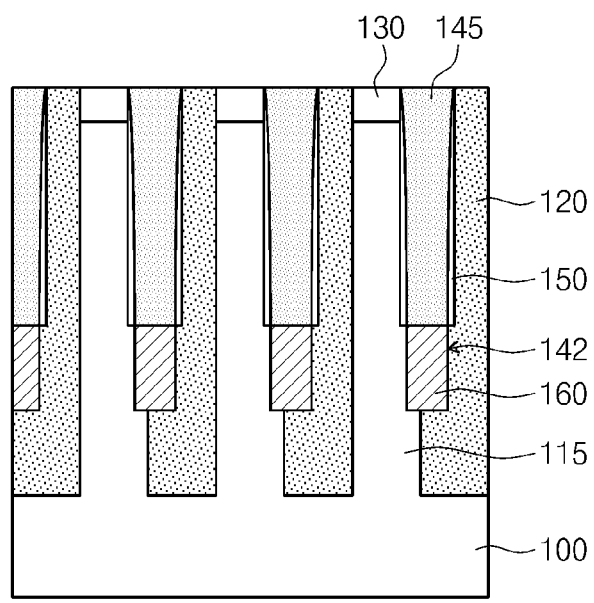
FIGS. 13B, 14B, and 15B are cross-sectional views taken along the line A-A' of FIGS. 13A, 14A, and 15A, respectively.
Figure 13C:
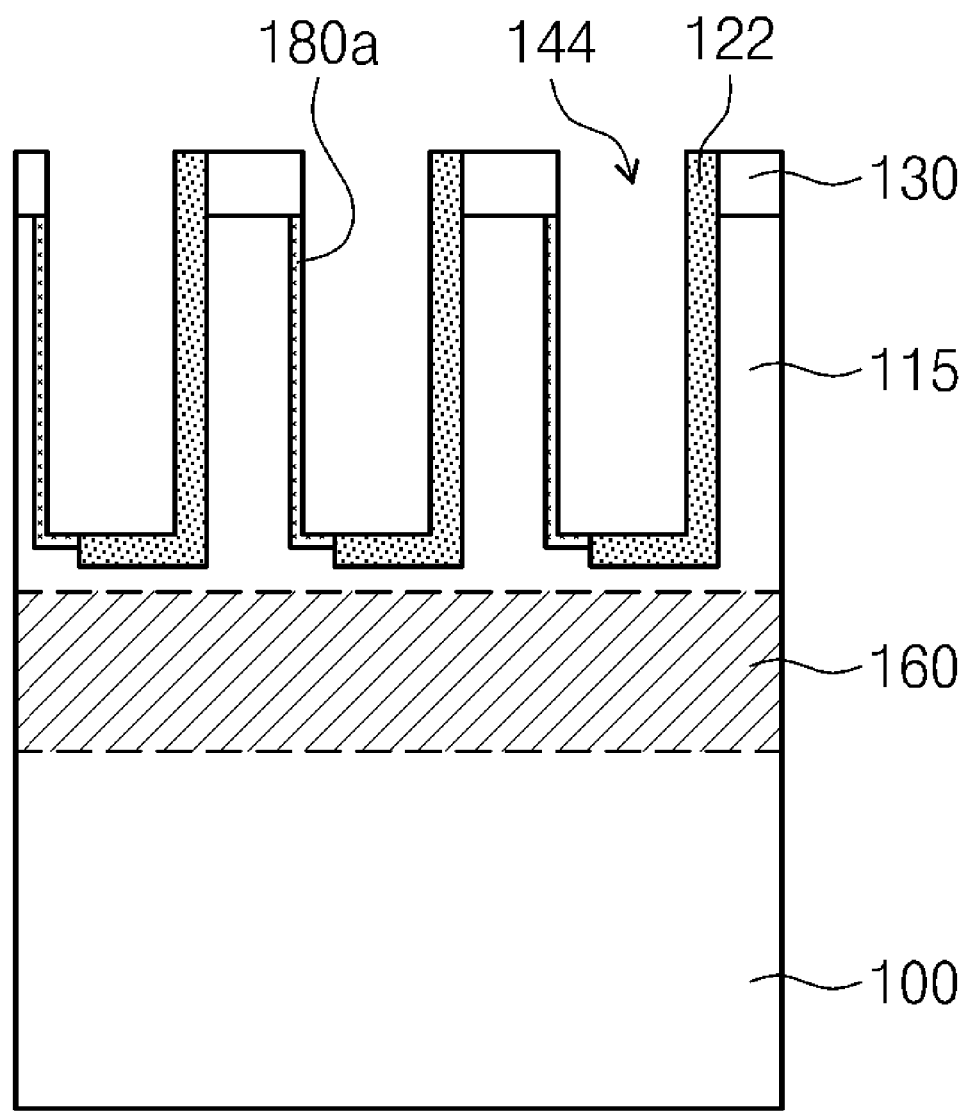
FIGS. 13C, 14C, and 15C are cross-sectional views taken along the line B-B' of FIGS. 13A, 14A, and 15A, respectively.
Figure 14A:
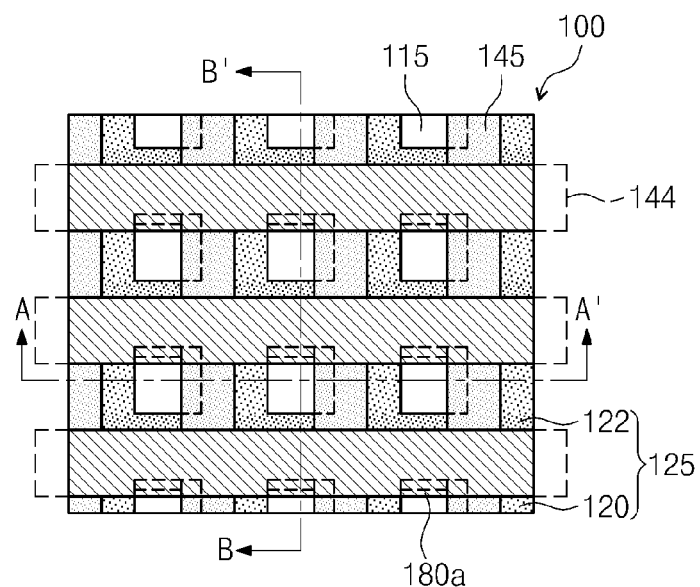
Figure 14B:
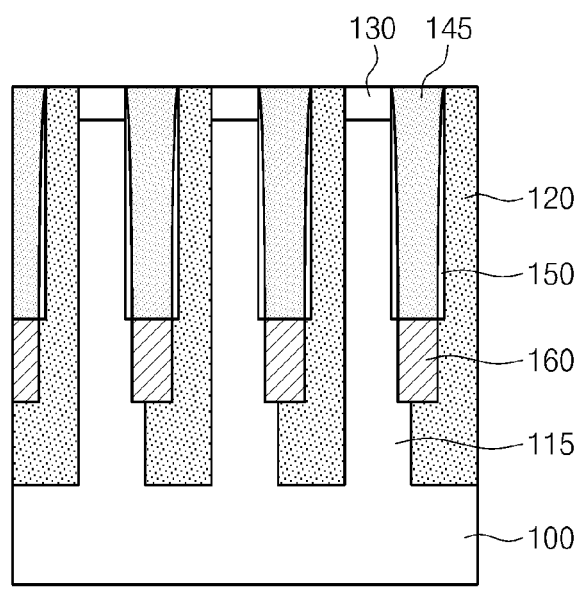
Figure 14C:
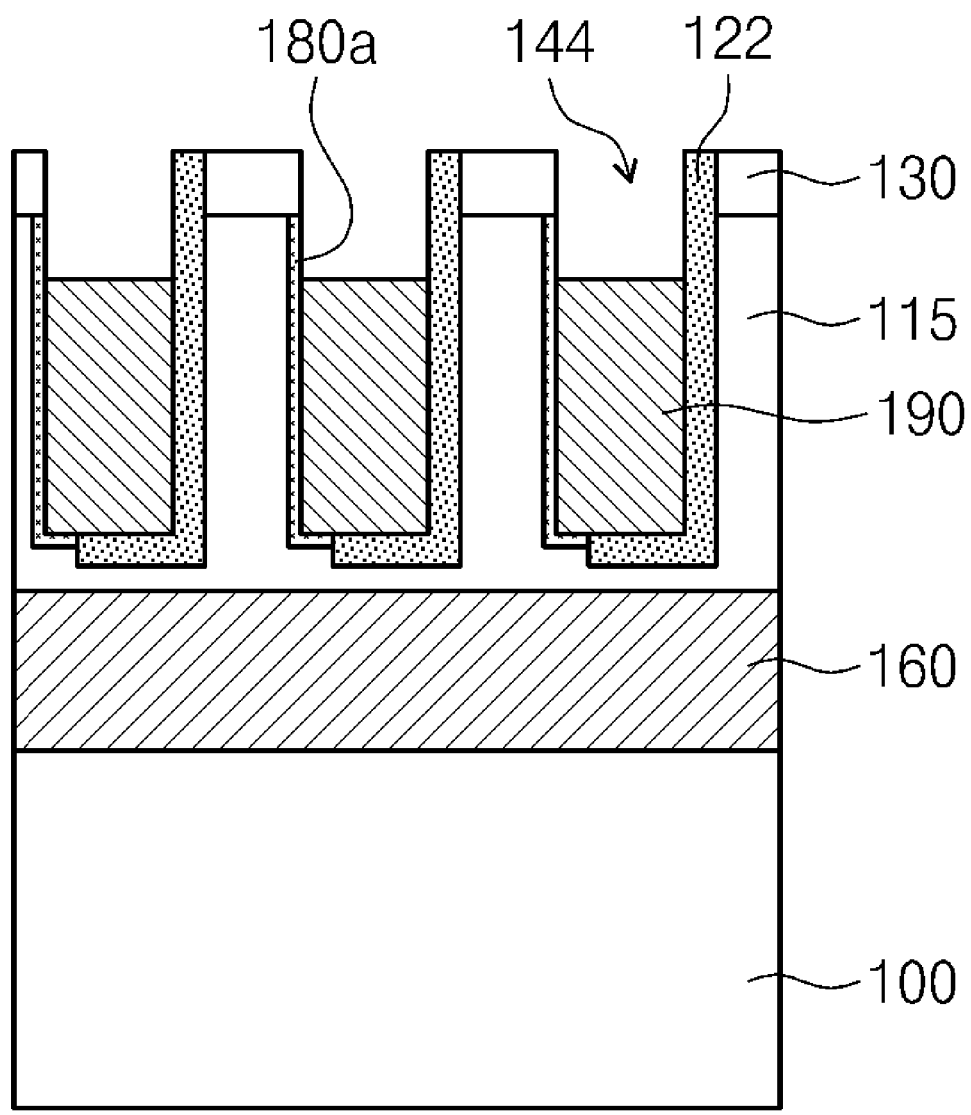
Figure 15A:
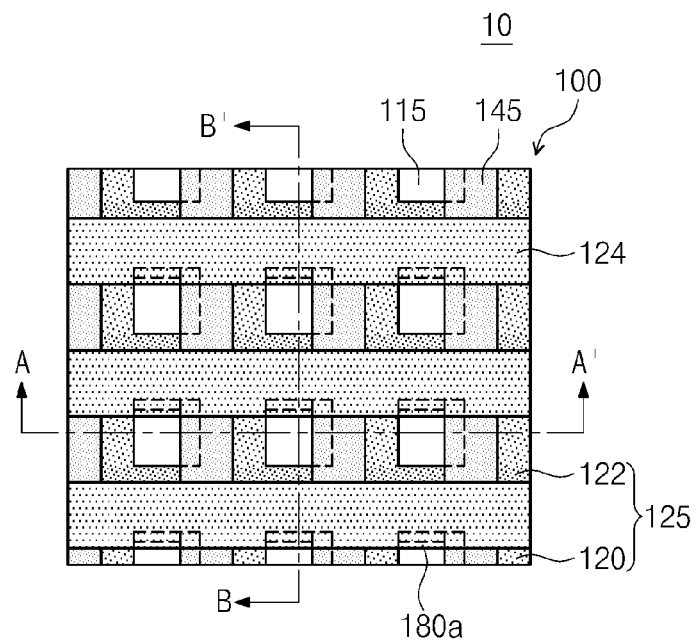
Figure 15B:
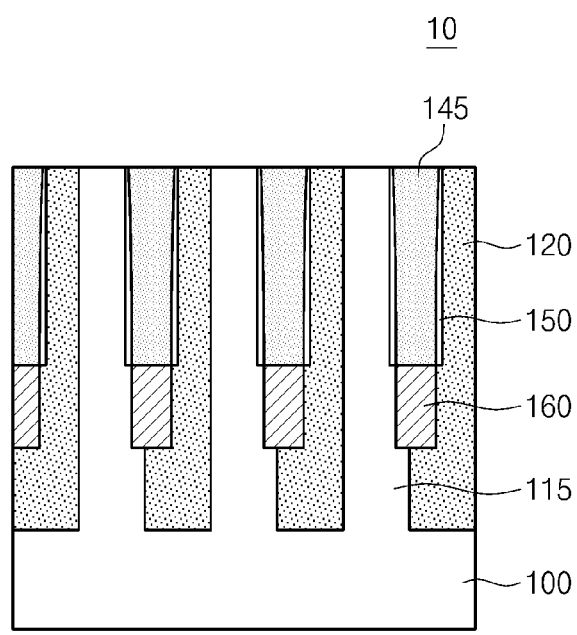
Figure 15C:
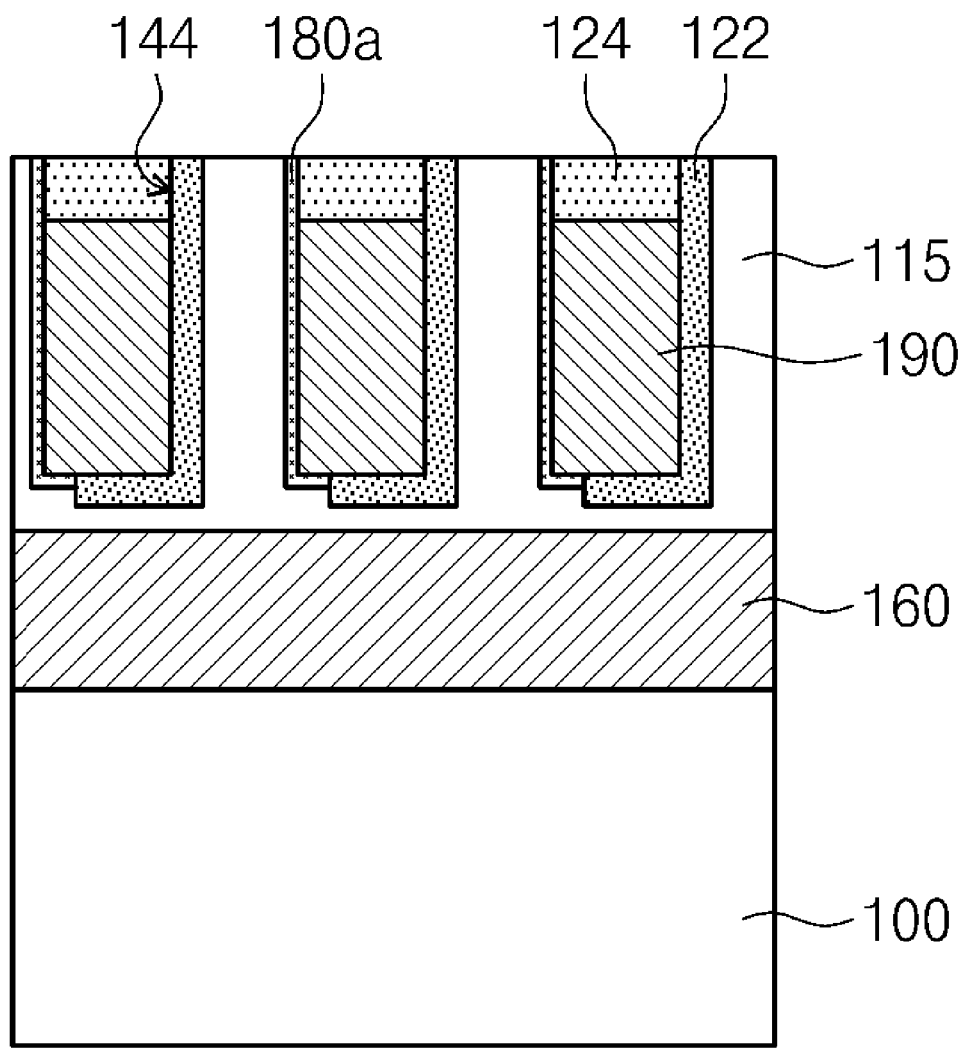

FIGS. 13A, 14A, and 15A are plan views illustrating a method for forming the gate insulating layer in the method of fabricating the vertical channel transistor with the one-channel structure according to a modified example of the embodiment of the inventive concept. FIGS. 13B, 14B, and 15B are cross-sectional views taken along the line A-A' of FIGS. 13A, 14A, and 15A, respectively. FIGS. 13C, 14C, and 15C are cross-sectional views taken along the line B-B' of FIGS. 13A, 14A, and 15A, respectively.

Referring to FIGS. 13A through 13C, the WL pattern 144 is formed in the semiconductor substrate 100 so as to extend in the X direction. A gate insulating layer 180a is formed on the side surface of the vertical channel 115 by subjecting the vertical channel 115 to thermal oxidation. In this case, since deposition of an insulating layer and etch-back are not performed, both the insulating layer 122 and the vertical channel 115 may not be damaged in the WL pattern 144. According to the modified example, the gate insulating layer 180a may not extend in the X direction, unlike the case in FIG. 8A, but may be formed restrictively one side surface of the vertical channel 115.

Referring to FIGS. 14A through 14C, the word line 190 is formed in the WL pattern 144. The word line 190 may extend in the X direction. The word line 190 may be formed by deposition of metal layer and etch-back.

Referring to FIGS. 15A through 15C, it is possible to realize the vertical channel transistor 10 with the one-channel structure by forming the third insulating layer 124 in the WL pattern 144, and then removing the hard mask 130 by CMP (Chemical Mechanical Polishing) or etch-back.

Another Example of Method of Fabricating Vertical Channel with One-Channel Structure FIGS. 16A, 17A, 18A, 19A, 20A, 21A, 22A, and 23A are plan views illustrating a method of fabricating a vertical channel transistor with the one-channel structure according to another embodiment of the inventive concept. FIGS. 16B, 17B, 18B, 19B, 20B, 21B, 22B, and 23B are cross-sectional views taken along the line A-A' of FIGS. 16A, 17A, 18A, 19A, 20A, 21A, 22A, and 23A, respectively. FIGS. 16C, 17C, 18C, 19C, 20C, 21C, 22C, and 23C are cross-sectional views taken along the line B-B' of FIGS. 16A, 17A, 18A, 19A, 20A, 21A, 22A, and 23A, respectively. To simplify this description, description of elements described in detail above will not be repeated.

Figure 16A:
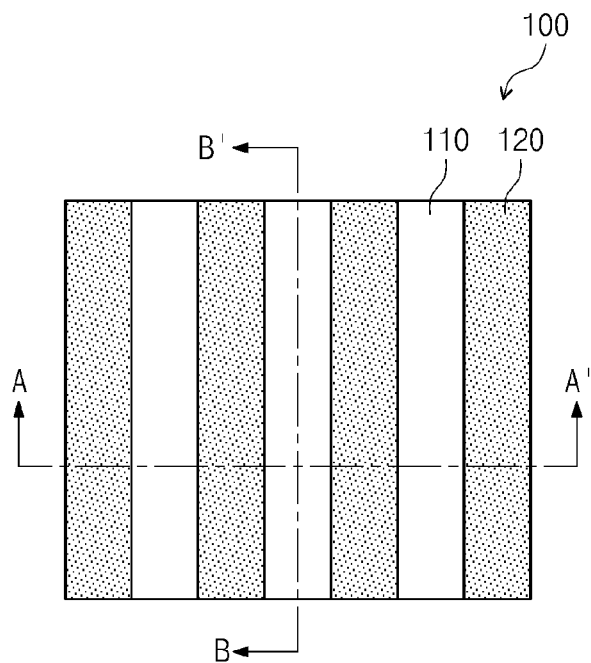
FIGS. 16A, 17A, 18A, 19A, 20A, 21A, 22A, and 23A are plan views illustrating a method of fabricating a vertical channel transistor according to another embodiment of the inventive concept.
Figure 16B:
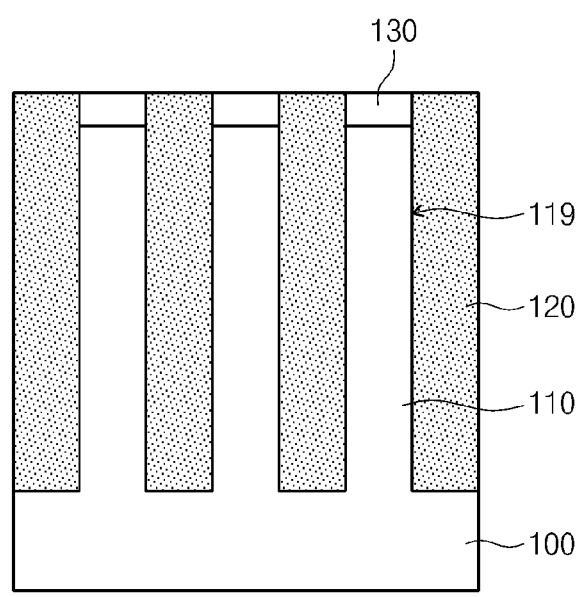
FIGS. 16B, 17B, 18B, 19B, 20B, 21B, 22B, and 23B are cross-sectional views taken along the line A-A' of FIGS. 16A, 17A, 18A, 19A, 20A, 21A, 22A, and 23A, respectively.
Figure 16C:
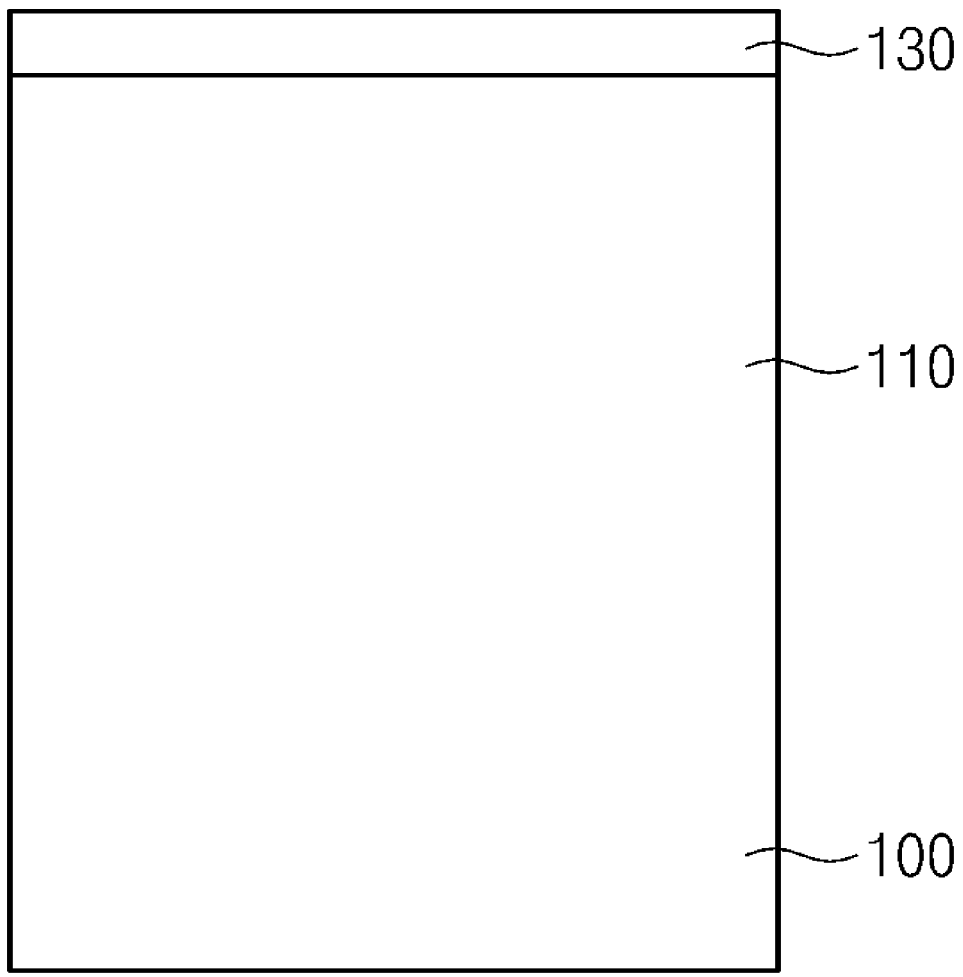
FIGS. 16C, 17C, 18C, 19C, 20C, 21C, 22C, and 23C are cross-sectional views taken along the line B-B' of FIGS. 16A, 17A, 18A, 19A, 20A, 21A, 22A, and 23A, respectively.

Referring to FIGS. 16A through 16C, the active bar 110 is formed in the Y direction by the Y cutting. In the Y cutting, dry etching may be utilized such that the hard mask 130 extending in the Y direction is formed on the semiconductor substrate 100, and then etching is performed using the hard mask 130 as an etching mask. In the Y cutting, the active bar 110 is formed and the first trench 119 is simultaneously formed so as to extend in the Y direction and isolate the active bar 110. The first trench 119 is filled with the first insulating layer 120. The first insulating layer 120 may be a silicon oxide layer.

Figure 17A:
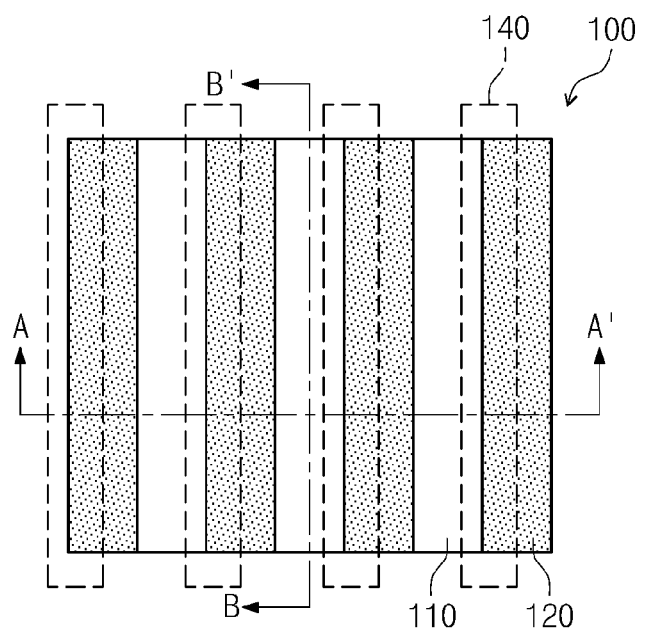
Figure 17B:
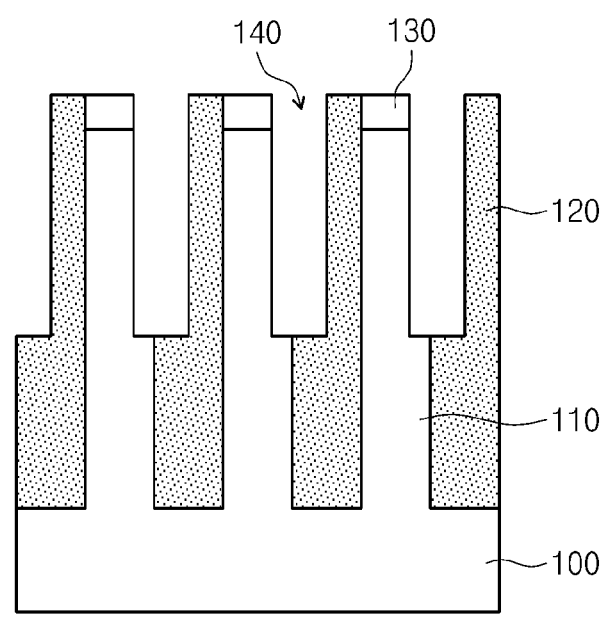
Figure 17C:
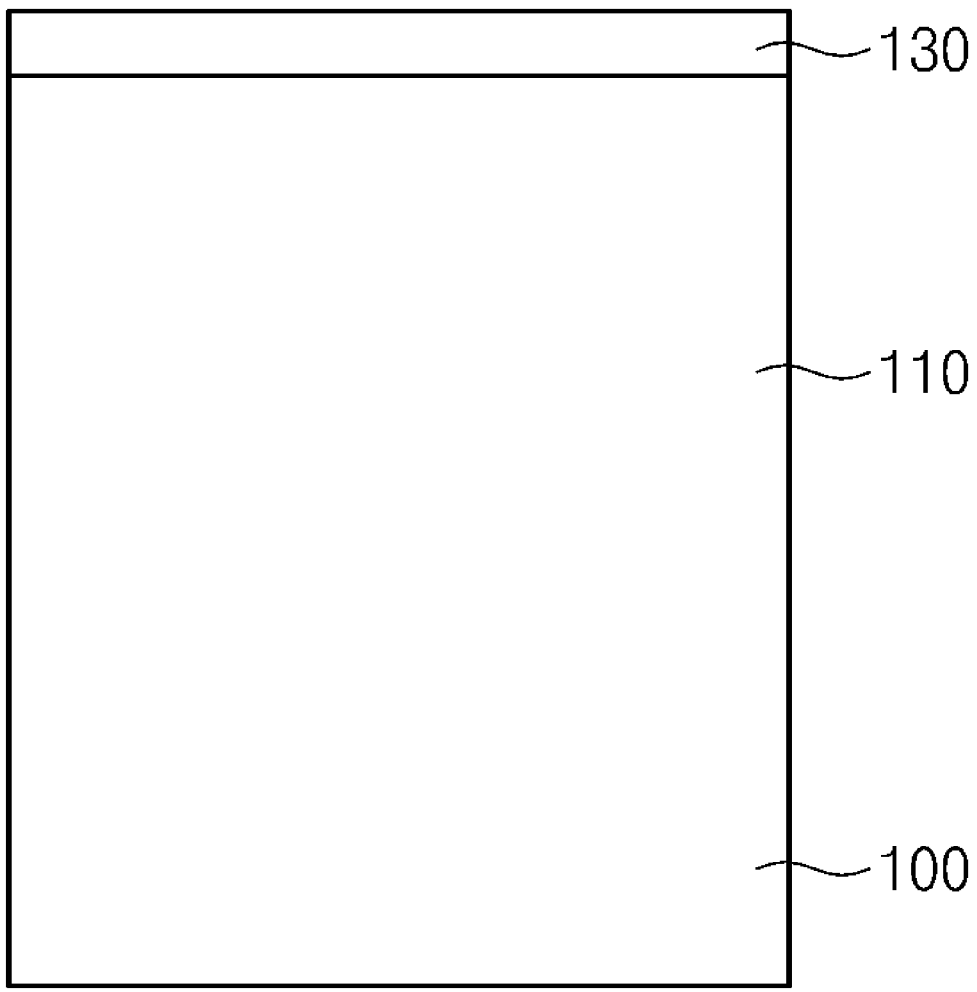

Referring to FIGS. 17A through 17C, the BBL pattern 140 is formed so as to extend in the Y direction. The BBL pattern 140 may cut the first insulating layer 120 in the Y direction and may be offset with one side surface of the active bar 110. Accordingly, one side surface of the active bar 110 offset with the BBL pattern 140 may be removed.

Figure 18A:
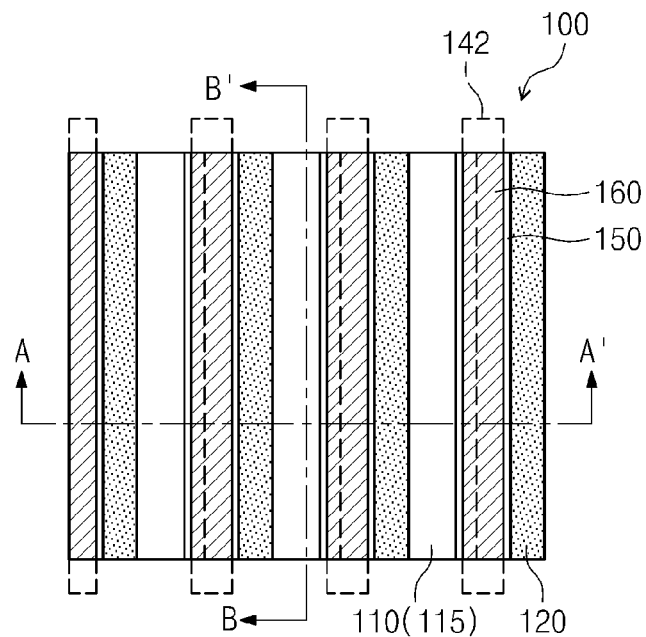
Figure 18B:
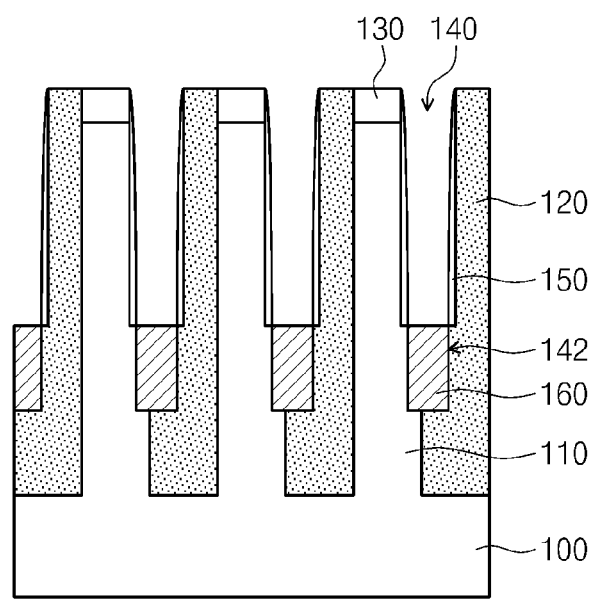
Figure 18C:
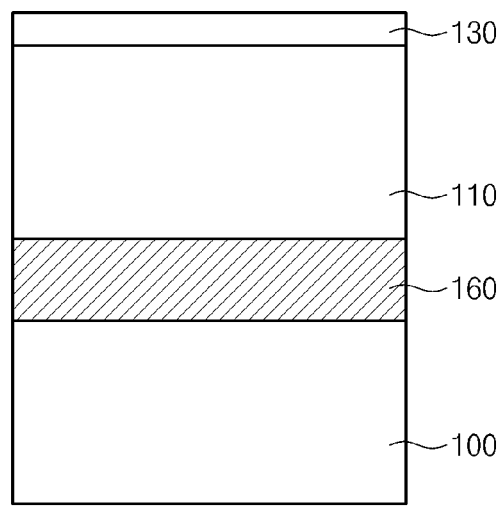
Figure 18D:
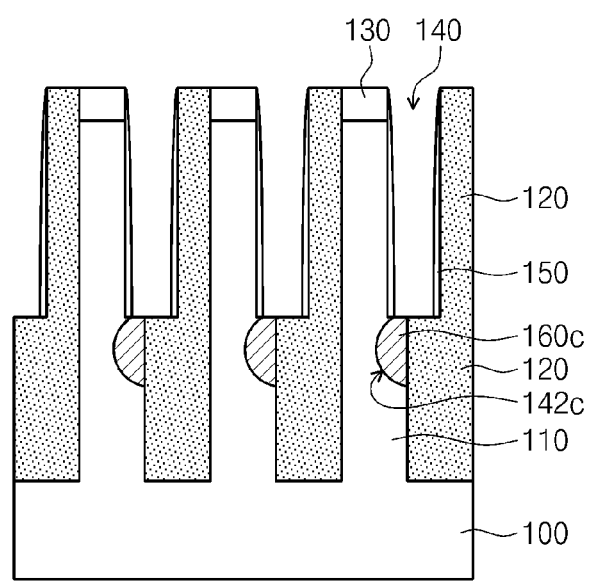
FIG. 18D is a cross-sectional view illustrating a DRAM device according to another embodiment of the inventive concept taken along the line B-B' of FIG. 18A.

Referring to FIGS. 18A through 18C, the D-BBL pattern 142 is formed below the BBL pattern 140. For example, the D-BBL pattern 142 may be formed by forming the liner 150 on the inner sidewall of the BBL pattern 140 by deposition of a silicon nitride layer, and then etching the active pattern 110, which is not protected by the liner 150, without selectivity to the first insulating layer 120 in the BBL pattern 140. The buried bit line 160 is formed in the D-BBL pattern 142. The buried bit line 160 may be connected electrically to one side surface of the active bar 110.

Figure 18E:
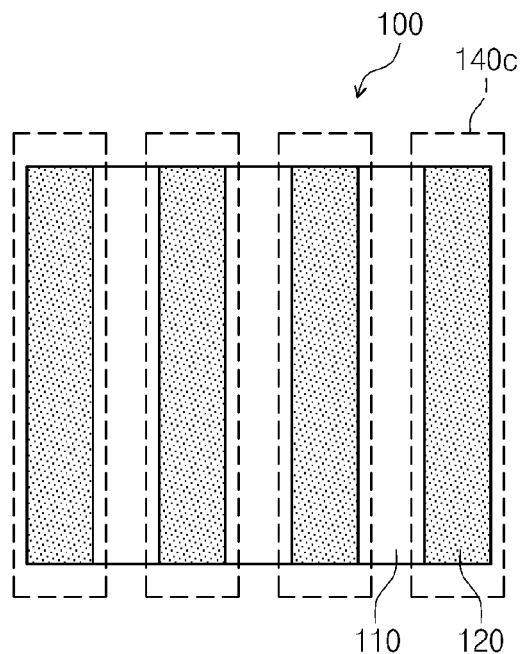
FIGS. 18E and 18F are a plan view and a cross-sectional view illustrating a DRAM device according to still another embodiment of the inventive concept.
Figure 18F:
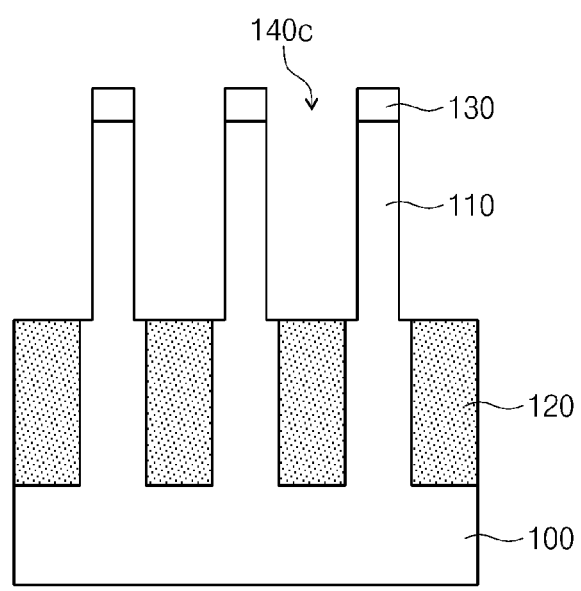
Figure 18G:
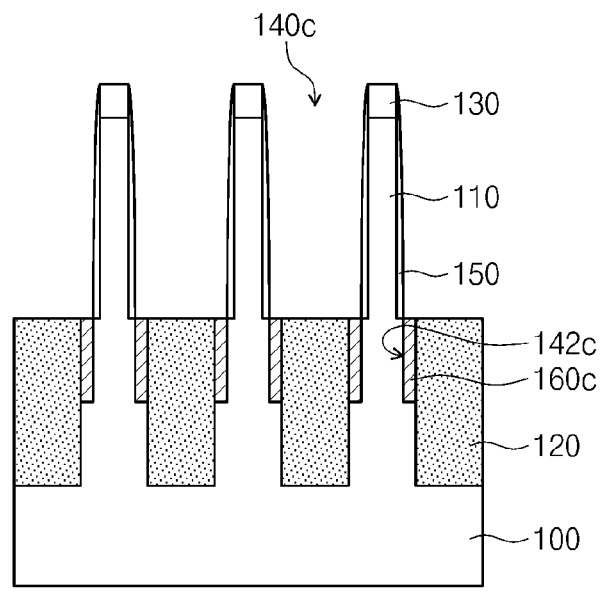
FIG. 18G is a cross-sectional view illustrating a DRAM device according to still another embodiment of the inventive concept taken along the line B-B' of FIG. 18A.
Figure 18H:
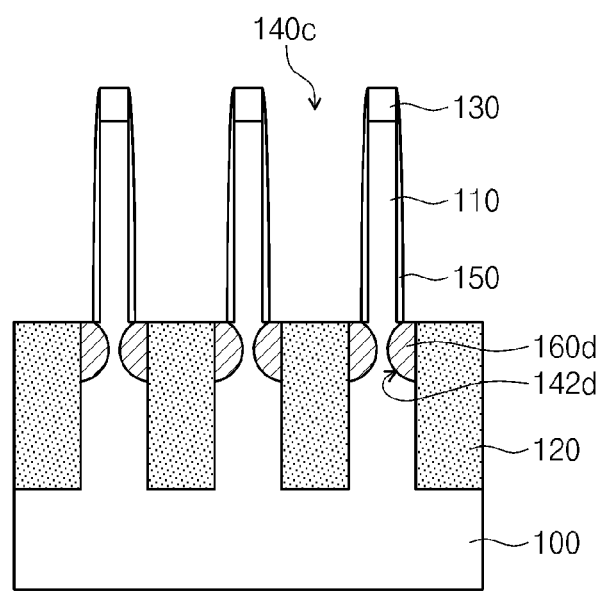
FIG. 18H is a cross-sectional view illustrating a DRAM device according to still another embodiment of the inventive concept taken along the line B-B' of FIG. 18A.

FIG. 18D is a cross-sectional view illustrating a DRAM device according to another embodiment of the inventive concept taken along the line B-B' of FIG. 18A; FIGS. 18E and 18F are a plan view and a cross-sectional view illustrating a DRAM device according to still another embodiment of the inventive concept; FIG. 18G is a cross-sectional view illustrating a DRAM device according to still another embodiment of the inventive concept taken along the line B-B' of FIG. 18A; and FIG. 18H is a cross-sectional view illustrating a DRAM device according to still another embodiment of the inventive concept taken along the line B-B' of FIG. 18A.

As another example, referring to FIG. 18D, a semicircular D-BBL pattern 142c may be formed by removing the active bar 110 by etching having selectivity to the first insulating layer 120. A semicircular buried bit line 160c is formed in the D-BBL pattern 142c. The buried bit line 160c may be formed by siliciding the active bar 110 exposed by the D-BBL pattern 142 or by depositing metal layer such as TiN and performing etch-back.

As still another example, referring to FIGS. 18E and 18F, the BBL pattern 140c may be in the semiconductor substrate 100 so as to extend in the Y direction. The BBL pattern 140c may cut the first insulating layer 120 in the Y direction and may be offset with the both sides of the active bar 110. Accordingly, both side surfaces of the active bar 110 may be removed, when the BBL pattern 140c is formed.

Referring to FIG. 18G, the D-BBL pattern 142c is formed by forming the liner 150 in the inside surface of the BBL pattern 140c, and then removing the active bar 110 by etching having selectivity to the first insulating layer 120. The buried bit line 160c is formed in the D-BBL pattern 142c. The buried bit line 160c may be formed by depositing and siliciding polysilicon layer, siliciding the active bar 110, or by depositing metal layer and performed etch-back. According to the modified example, it is possible to form two buried bit lines 160c connected electrically to the active bar 110 below the BBL pattern 140c and spaced by the first insulating layer 120.

As still another example, referring to FIG. 18H, a semicircular D-BBL pattern 142d may be formed on both sides of the first insulating layer 120, by removing the active bar 110 in the BBL pattern 140c using etching having selectivity to the first insulating layer 120. A buried bit line 160d may be formed by siliciding the active bar 110 exposed by the D-BBL pattern 142d or by depositing a metal layer such as TiN and performed etch-back.

Figure 19A:
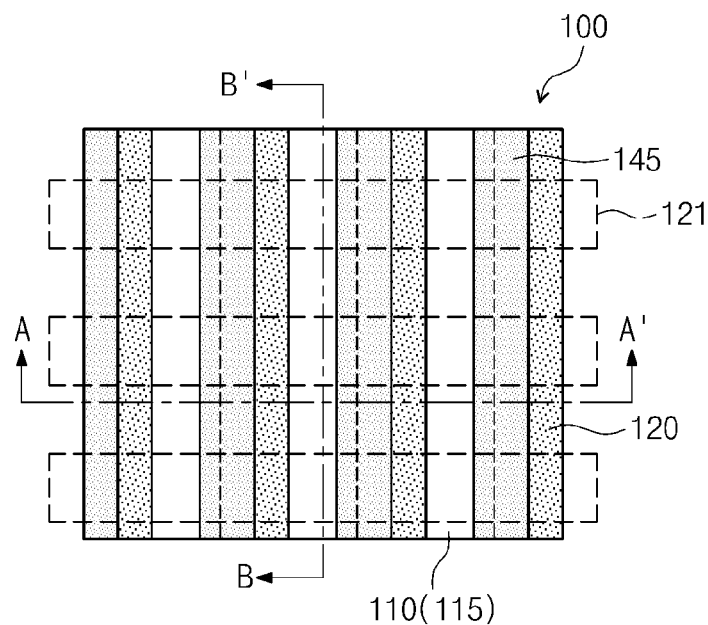
Figure 19B:
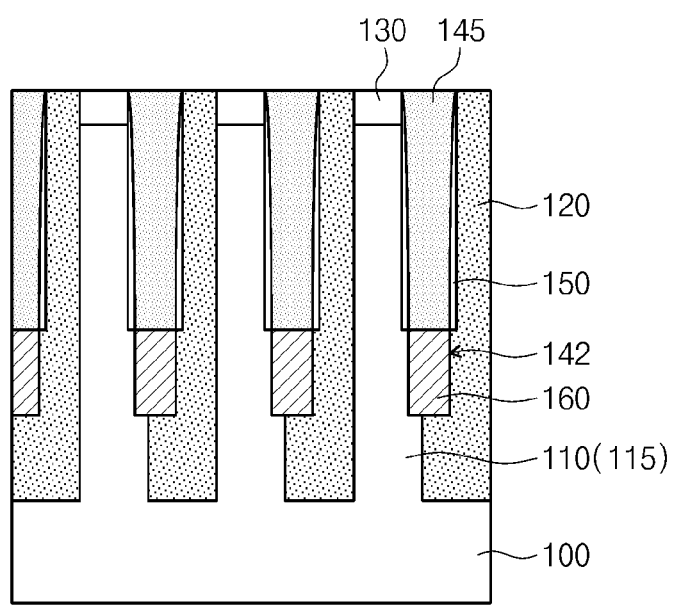
Figure 19C:
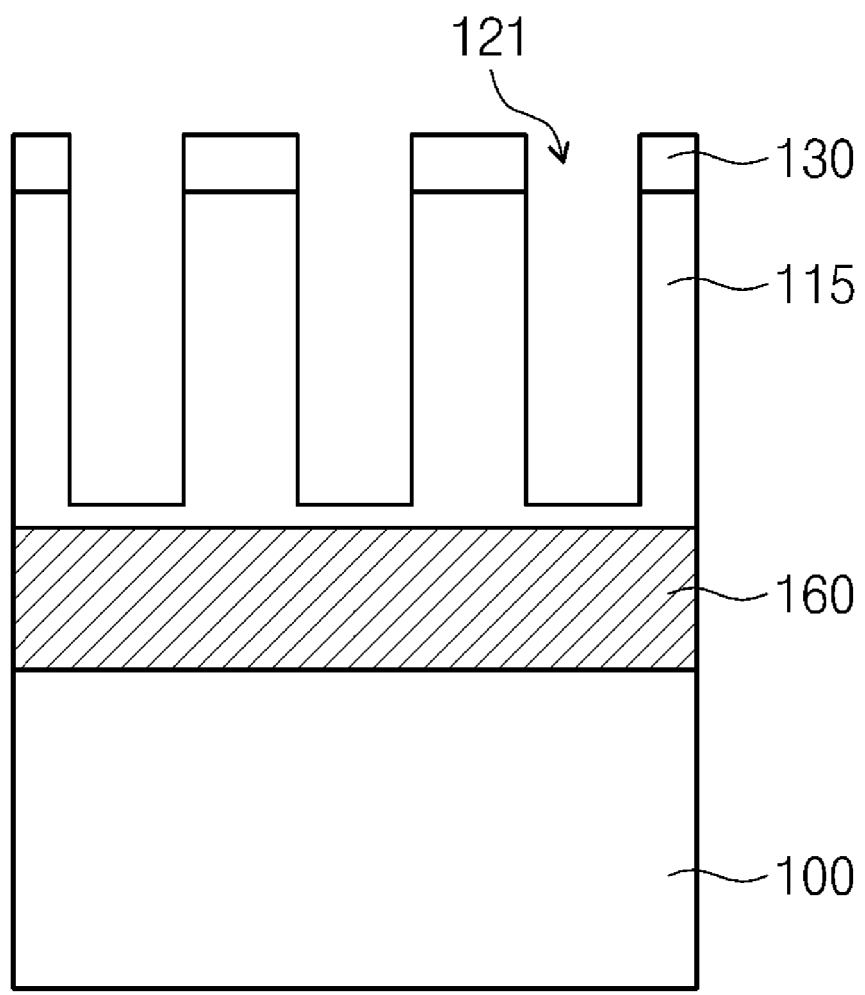

Referring to FIGS. 19A through 19C, the insulating pillar 145 is formed of a silicon nitride layer in the BBL pattern 140. The insulating pillar 145 may be formed in the shape of a wall. Subsequently, the second trench 121 is formed in the X direction by the cutting of the semiconductor substrate 100 in the X direction. In the X cutting, the active pattern 110 is isolated to be formed as the vertical channel 115. The insulating pillar 145 is also isolated to have an island shape.

Figure 20A:
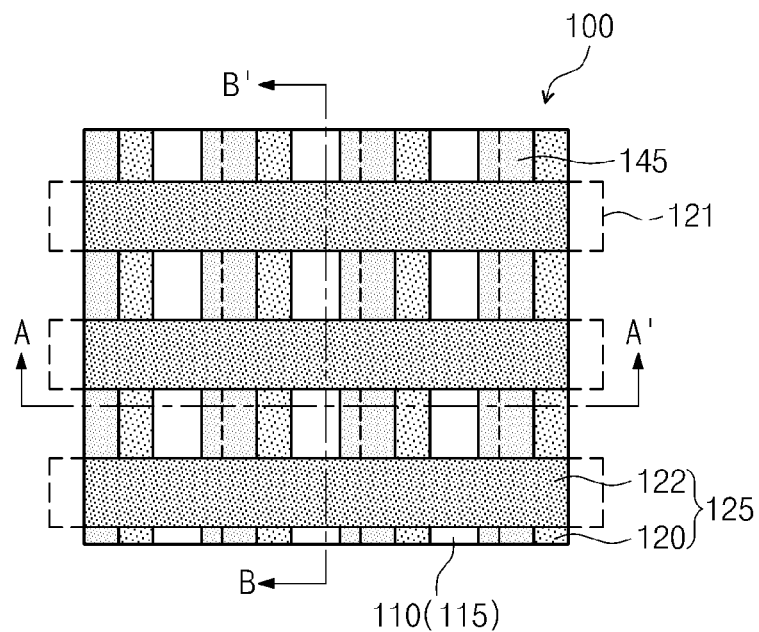
Figure 20B:
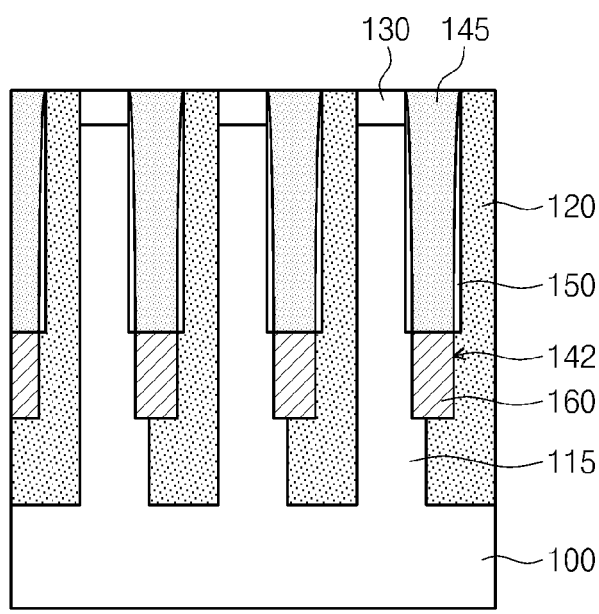
Figure 20C:
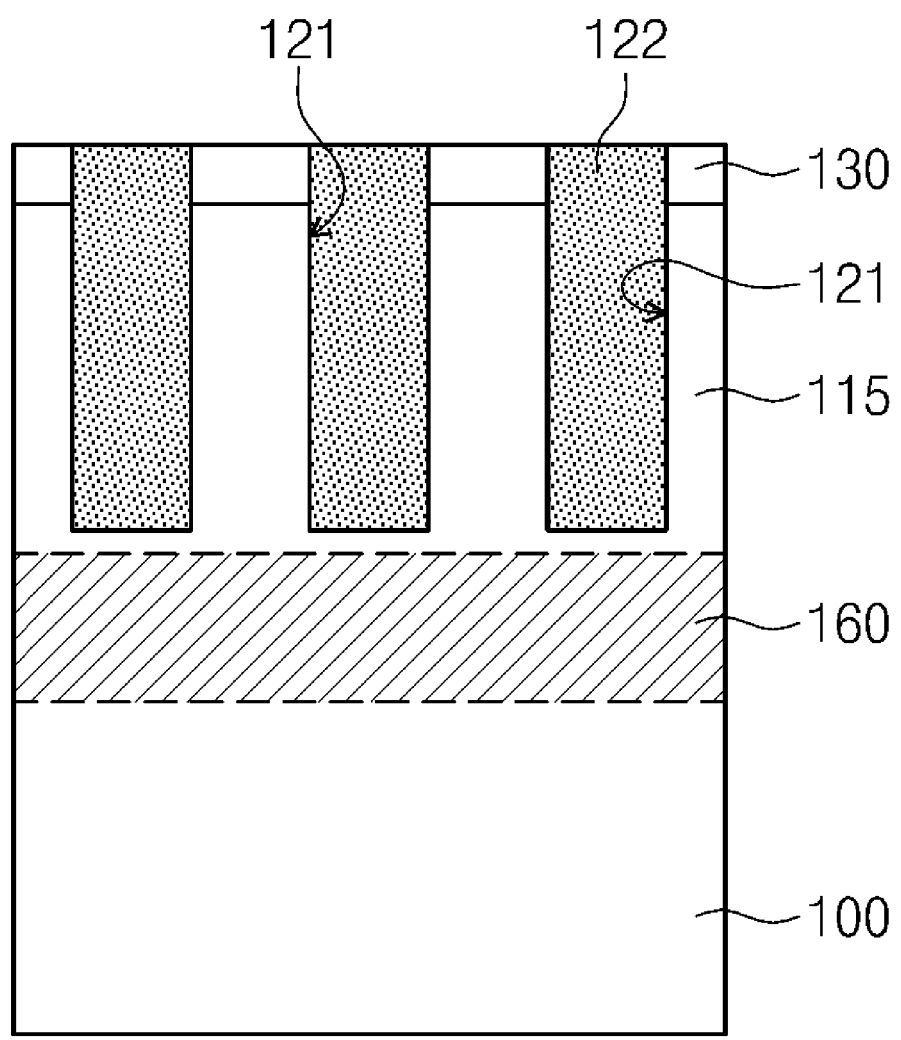

Referring to FIGS. 20A though 20C, the second trench 121 is filled with the second insulating layer 122. The first insulating layer 120 and the second insulating layer 122 form the device-isolating layer 125. The height of the second insulating layer 122 may be lower than that of the first insulating layer 120. The buried bit line 160 may be disposed below the second insulating layer 122.

Figure 21A:
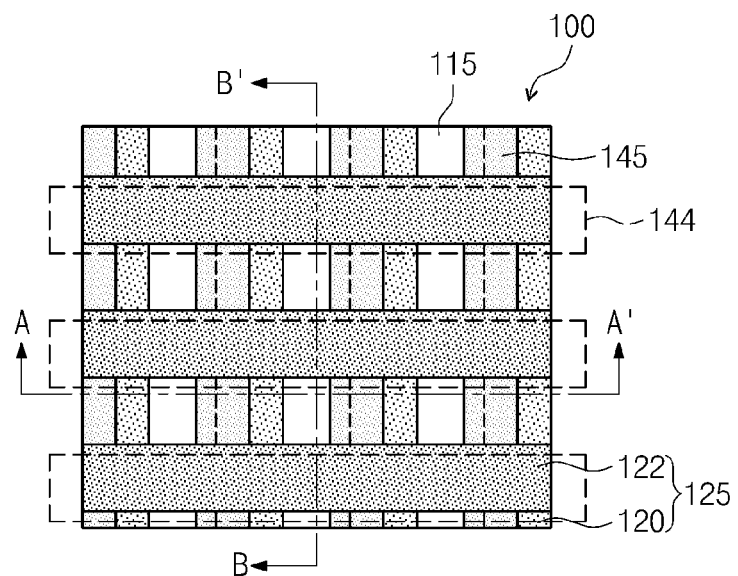
Figure 21B:
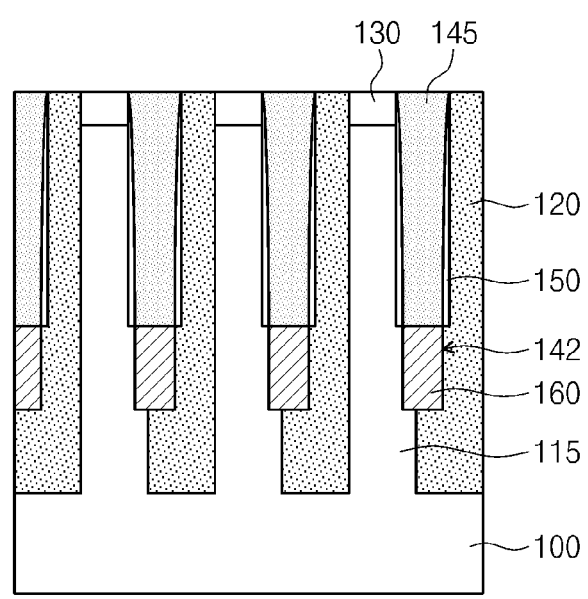
Figure 21C:
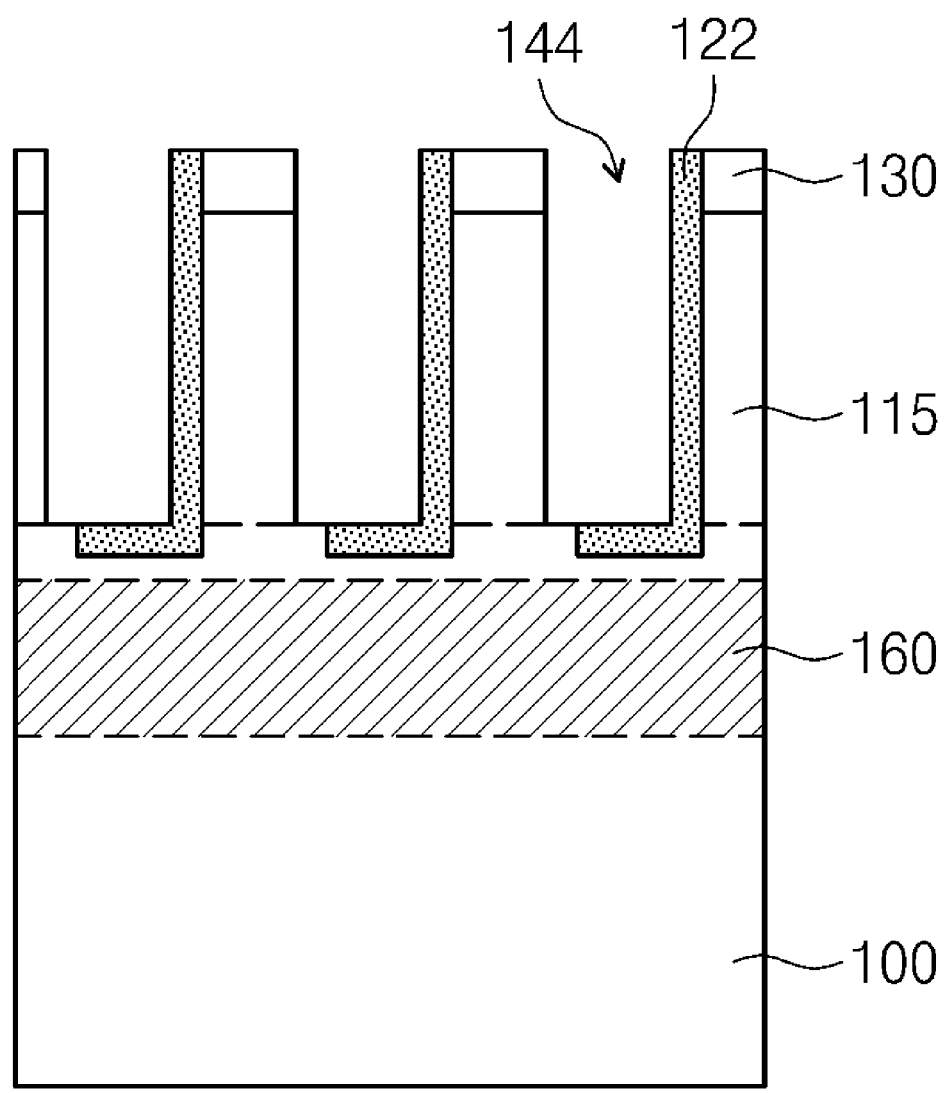

Referring to FIGS. 21A through 21C, the WL pattern 144 is formed in the semiconductor substrate 100 so as to extend in the X direction. The WL pattern 144 may cut the device-isolating layer 125 in the X direction and may be offset with one side surface of the vertical pillar 115. Accordingly, one side surface of the vertical pillar 115 may be removed in forming the WL pattern 144.

Figure 22A:
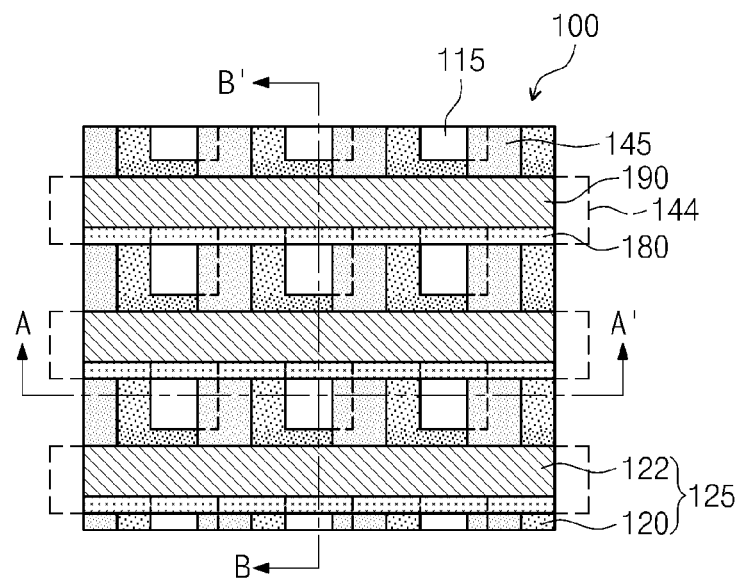
Figure 22B:
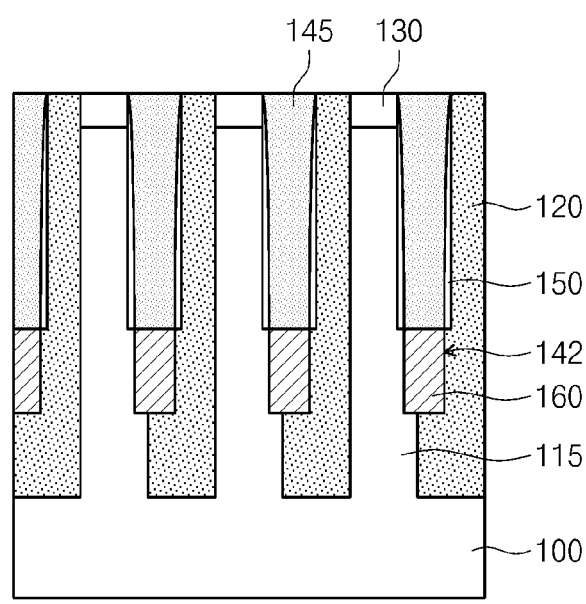
Figure 22C:
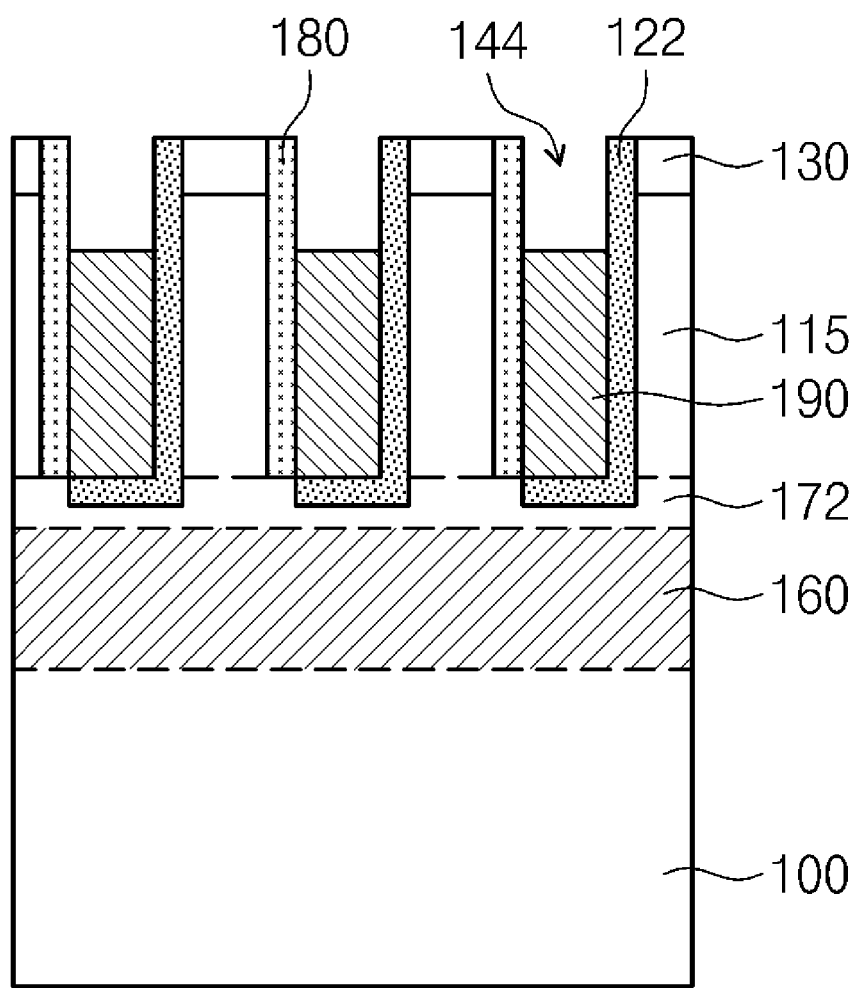

Referring to FIGS. 22A through 22C, in the WL pattern 144, the gate insulating layer 180 is formed so as to come into contact with the one side surface of the vertical channel 115, and the word line 190 is formed to fill a part of the WL pattern 144. The gate insulating layer 180 may be formed by depositing a silicon oxide layer or subjecting the vertical channel 115 to thermal oxidation. The gate insulating layer 180 may be formed so as to extend in the X direction or may be formed restrictively in the vertical channel 115, as in FIGS. 14A through 14C. The word line 190 may be formed by deposition of metal layer and etch-back.

Figure 23A:
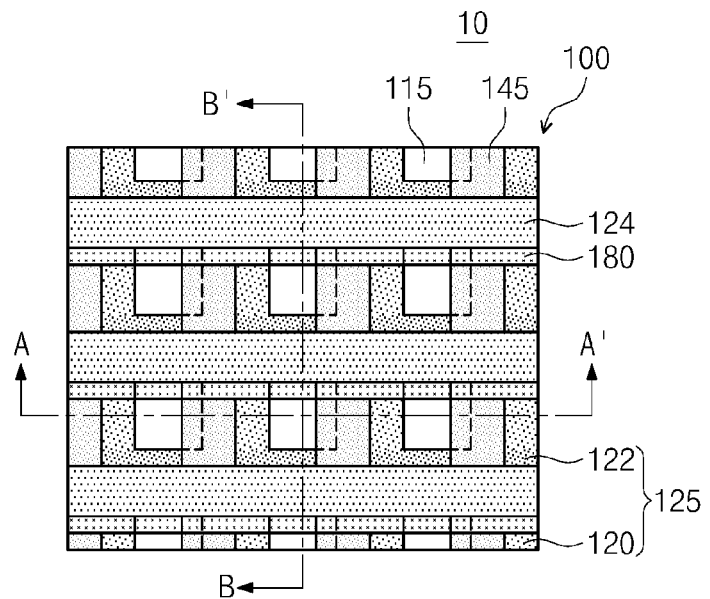
Figure 23B:
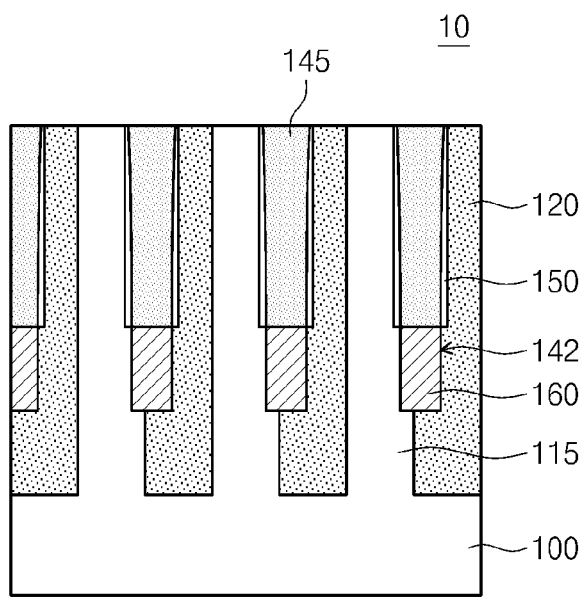
Figure 23C:
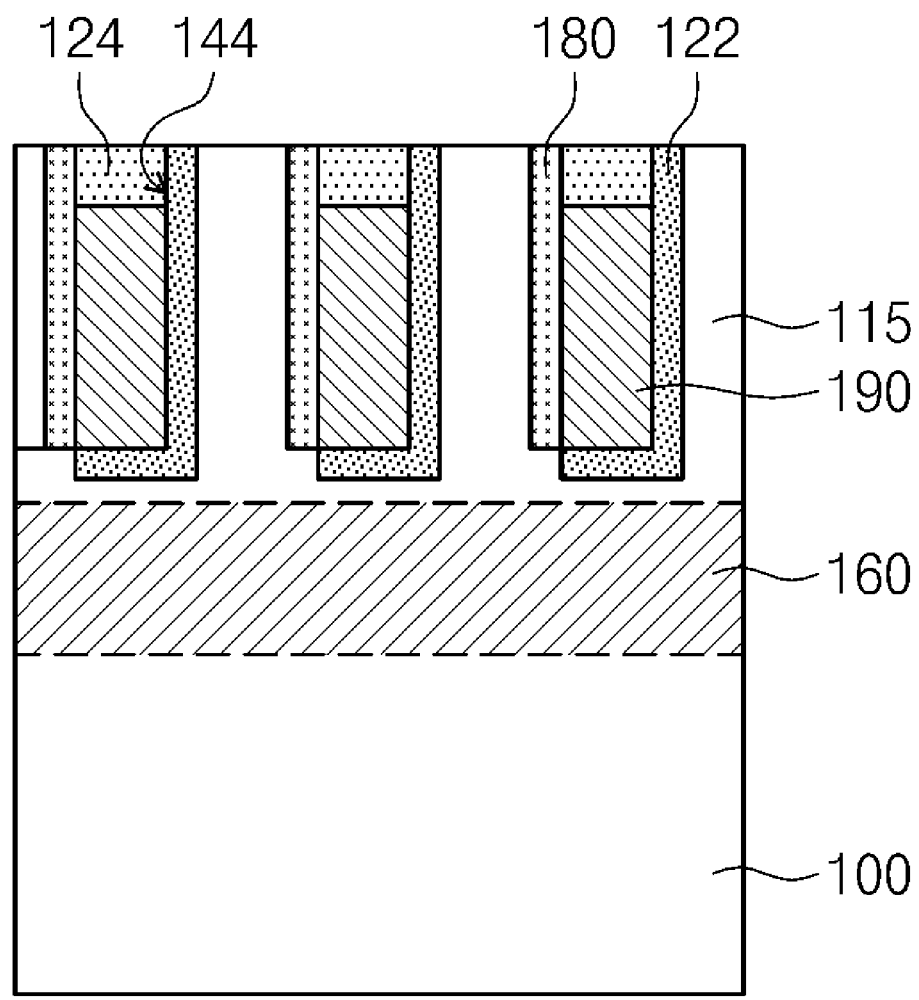

Referring to FIGS. 23A through 23C, the third insulating layer 124 is formed in the WL pattern 144 to cover the word line 190, and the hard mask 130 is removed by etch-back or CMP. According to the above-described series of steps, the active bar 110 is formed in the Y cutting, the buried bit line 160 is formed in the Y direction, the vertical channel 115 is formed in the Z direction by isolating the active bar 110 in the X cutting, and then the word line 190 is formed in the X direction. In this way, it is possible to realize the vertical channel transistor 10 with the one-channel structure illustrated in FIG. 1A.

Still Another Example of Method of Fabricating Vertical Channel Transistor with One-Channel Structure FIGS. 24A, 25A, 26A, 27A, 28A, and 29A are plan views illustrating a method of fabricating a vertical channel transistor with the one-channel structure according to still another embodiment of the inventive concept. FIGS. 24B, 25B, 26B, 27B, 28B, and 29B are cross-sectional views taken along the line A-A' of FIGS. 24A, 25A, 26A, 27A, 28A, and 29A, respectively. FIGS. 24C, 25C, 26C, 27C, 28C, and 29C are cross-sectional views taken along the line B-B' of FIGS. 24A, 25A, 26A, 27A, 28A, and 29A, respectively. To simplify this description, description of elements described in detail above will not be repeated.

Figure 24A:
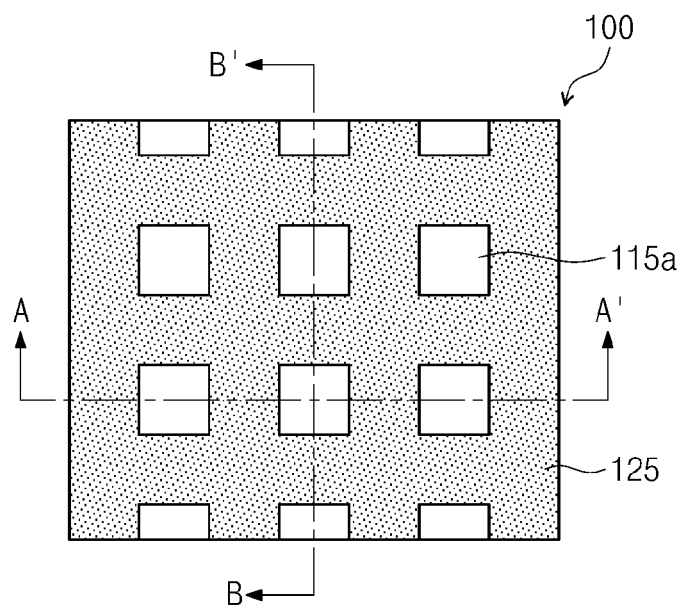
FIGS. 24A, 25A, 26A, 27A, 28A, and 29A are plan views illustrating a method of fabricating a vertical channel transistor according to still another embodiment of the inventive concept.
Figure 24B:
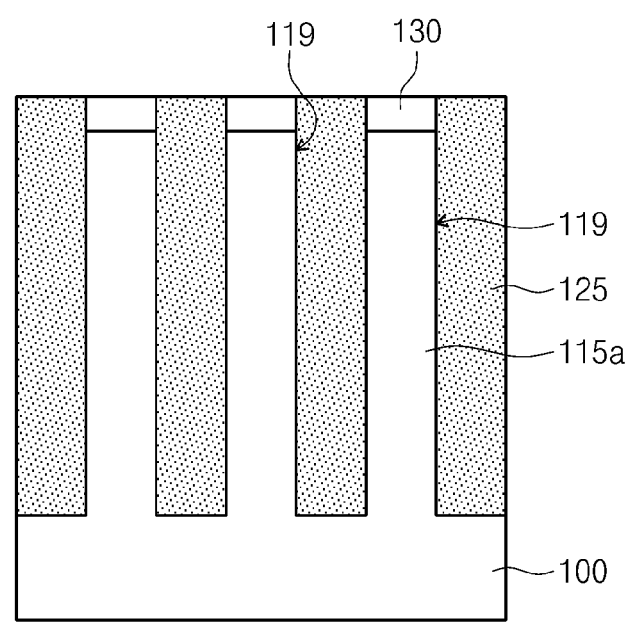
FIGS. 24B, 25B, 26B, 27B, 28B, and 29B are cross-sectional views taken along the line A-A' of FIGS. 24A, 25A, 26A, 27A, 28A, and 29A, respectively.
Figure 24C:
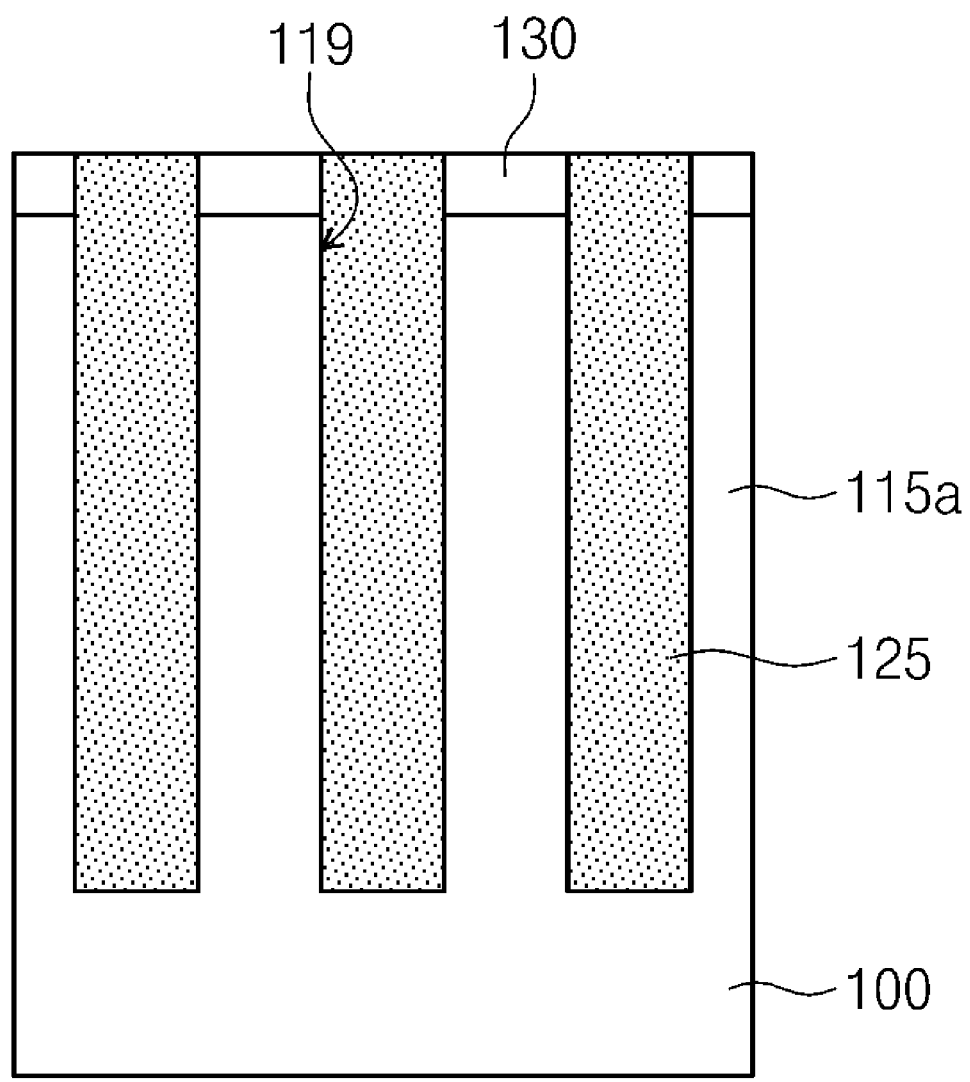
FIGS. 24C, 25C, 26C, 27C, 28C, and 29C are cross-sectional views taken along the line B-B' of FIGS. 24A, 25A, 26A, 27A, 28A, and 29A, respectively.

Referring to FIGS. 24A through 24C, the vertical channel 115a isolated by the device-isolating layer 125 is formed by simultaneously performing both the X cutting and the Y cutting. For example, the hard mask 130 with an island shape is formed on the semiconductor substrate 100. The trench 119 is formed by dry etching by using the hard mask 130 as an etching mask, and then the device-isolating layer 125 may be formed by filing the trench 119 with an insulating layer such as a silicon oxide layer.

Figure 25A:
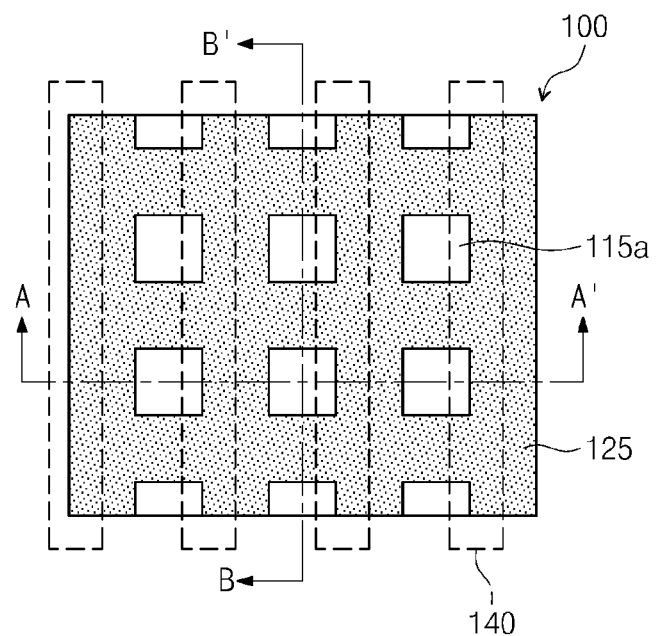
Figure 25B:
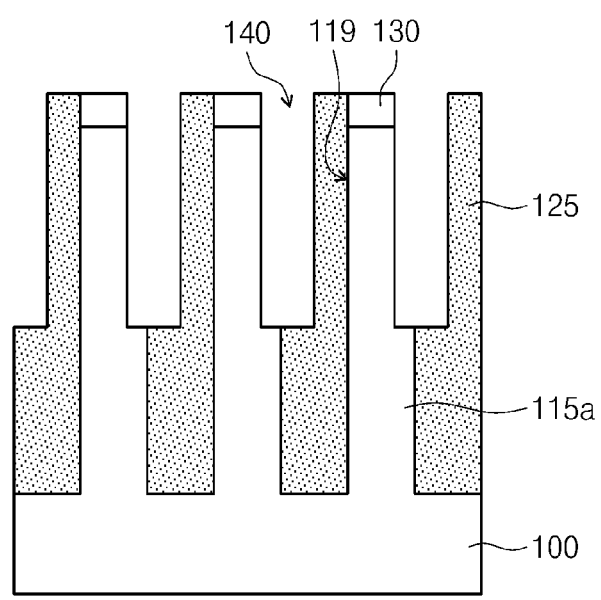
Figure 25C:
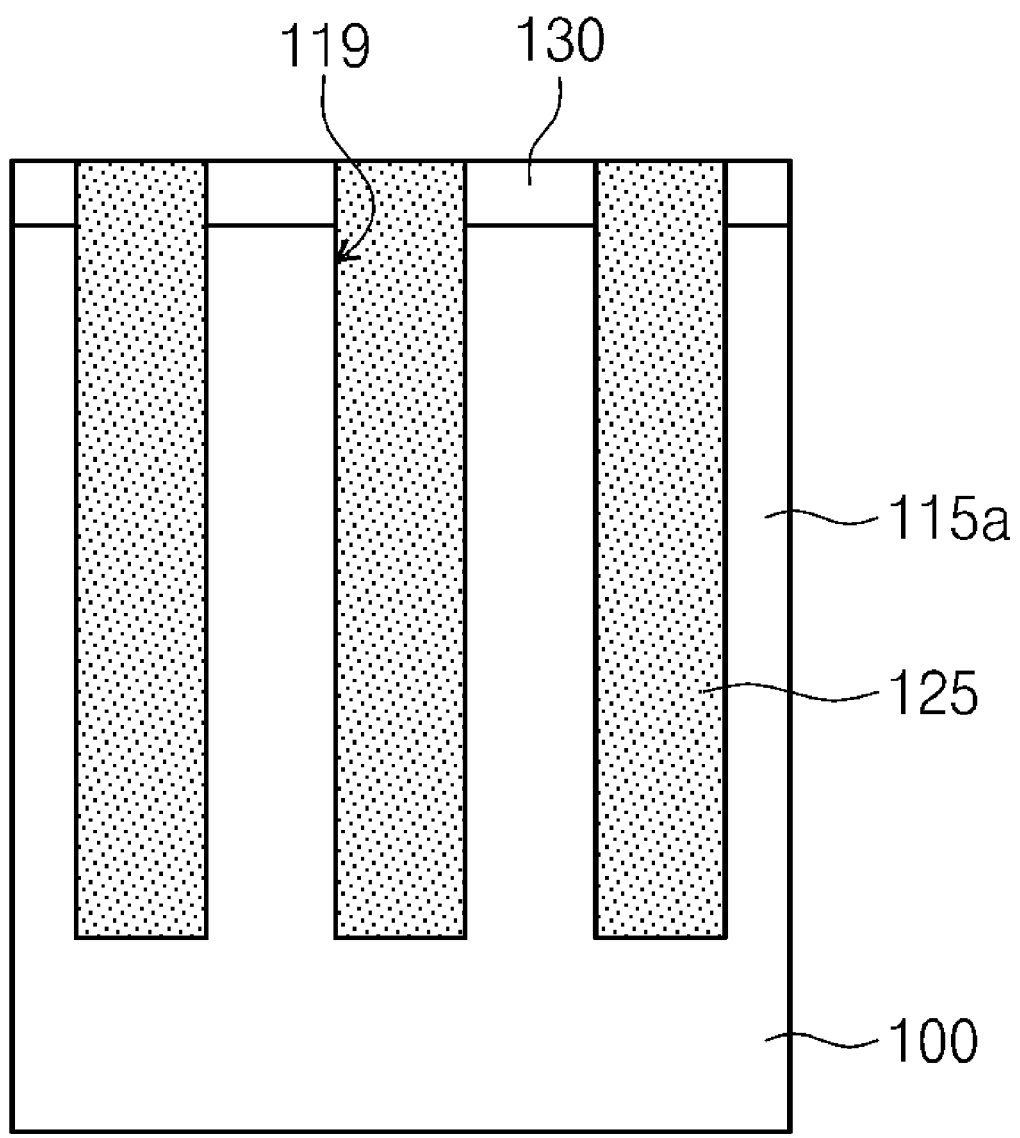

Referring to FIGS. 25A through 25C, the BBL pattern 140 is formed in the semiconductor substrate 100 so as to extend in the Y direction. The BBL pattern 140 may cut the device-isolating layer 125 in the Y direction and may be offset with one side surface of the vertical channel 115a.

Figure 26A:
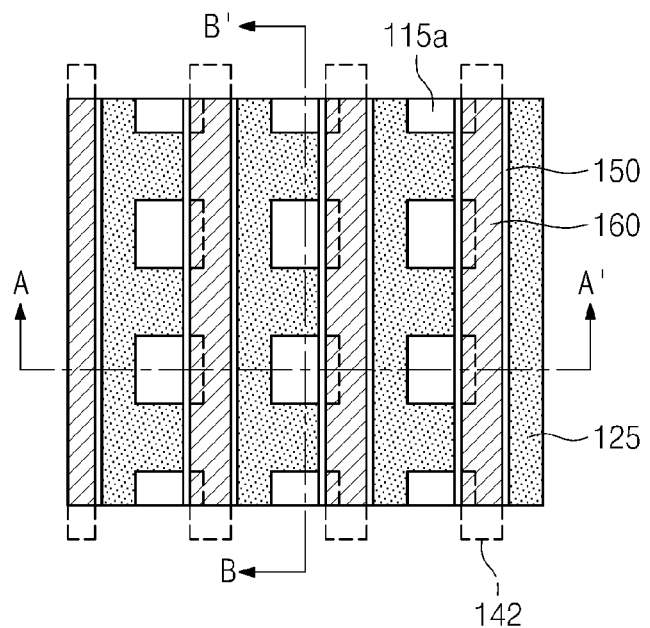
Figure 26B:
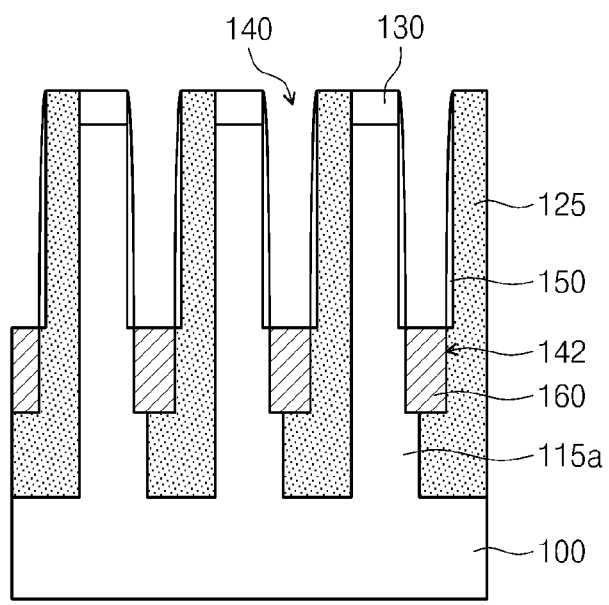
Figure 26C:
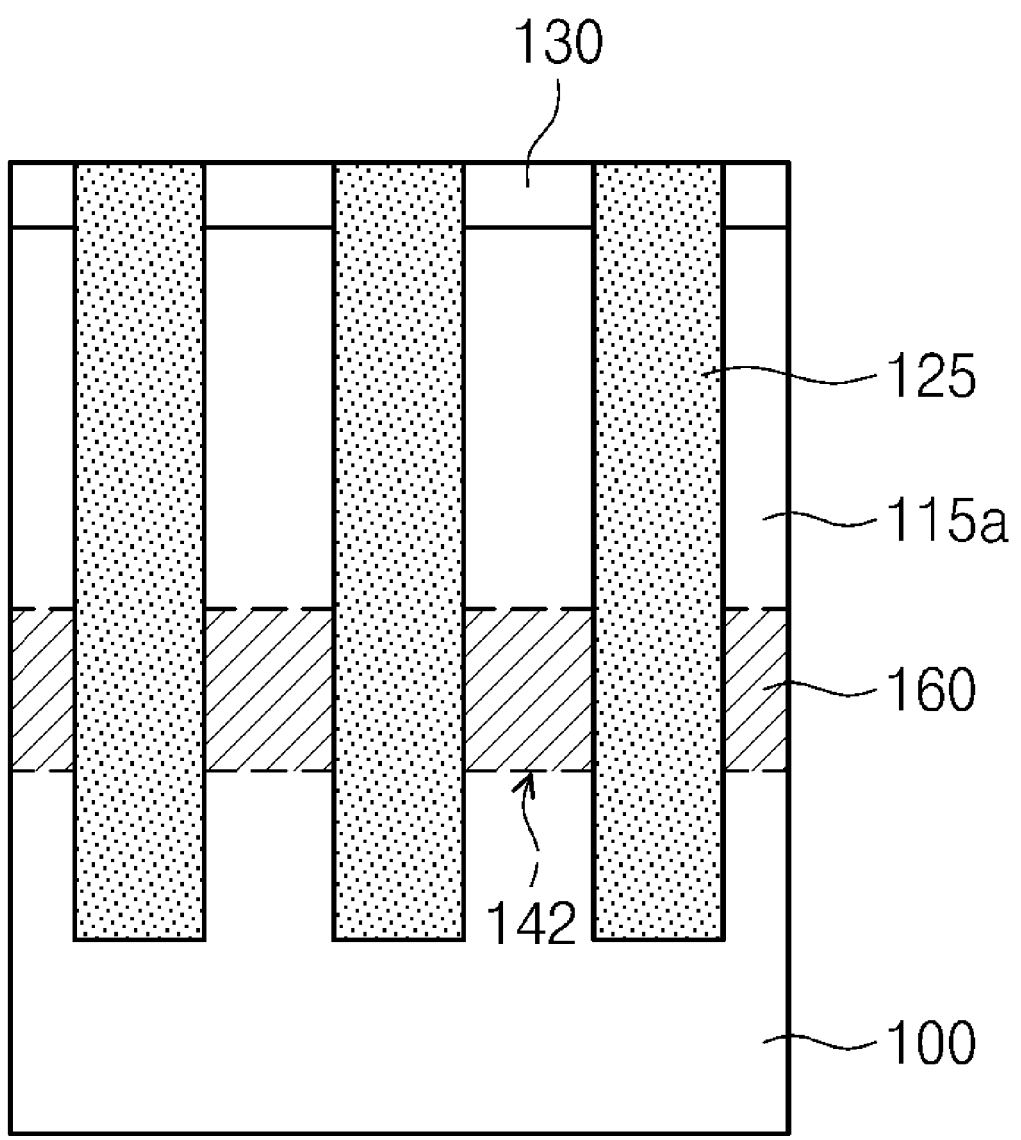

Referring to FIGS. 26A through 26C, the D-BBL pattern 142 is formed below the BBL pattern 140. The D-BBL pattern 142 may be formed by forming the liner 150 in the inside surface of the BBL pattern 140, and then removing the vertical channel 115a exposed by the BBL pattern 140 using etching having selectivity or no selectivity to the device-isolating layer 125. The buried bit line 160 is formed in filling the D-BBL pattern 142 with metal. According to the embodiment of the inventive concept, the buried bit line 160 is formed so as to extend in the Y direction and to be connected electrically to one side surface of the vertical channel 115a. The buried bit line 160 may be buried in the device-isolating layer 125.

Figure 27A:
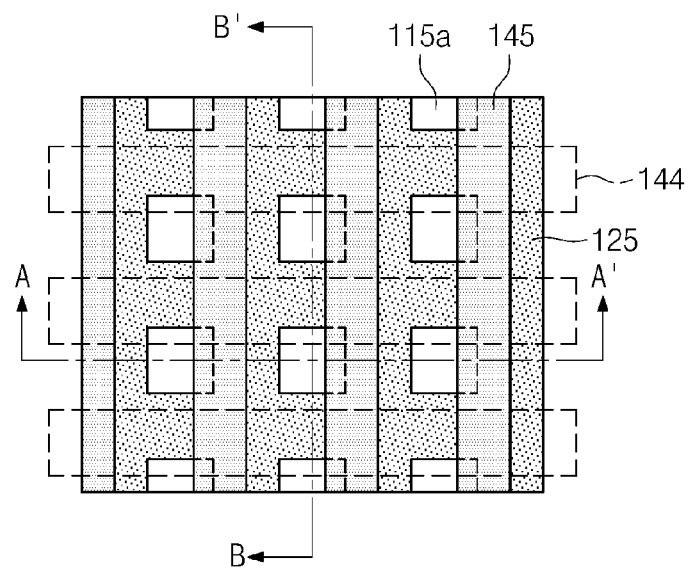
Figure 27B:
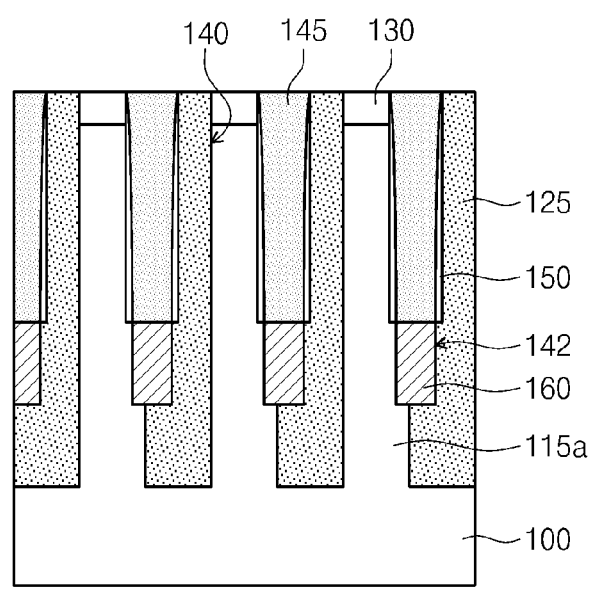
Figure 27C:
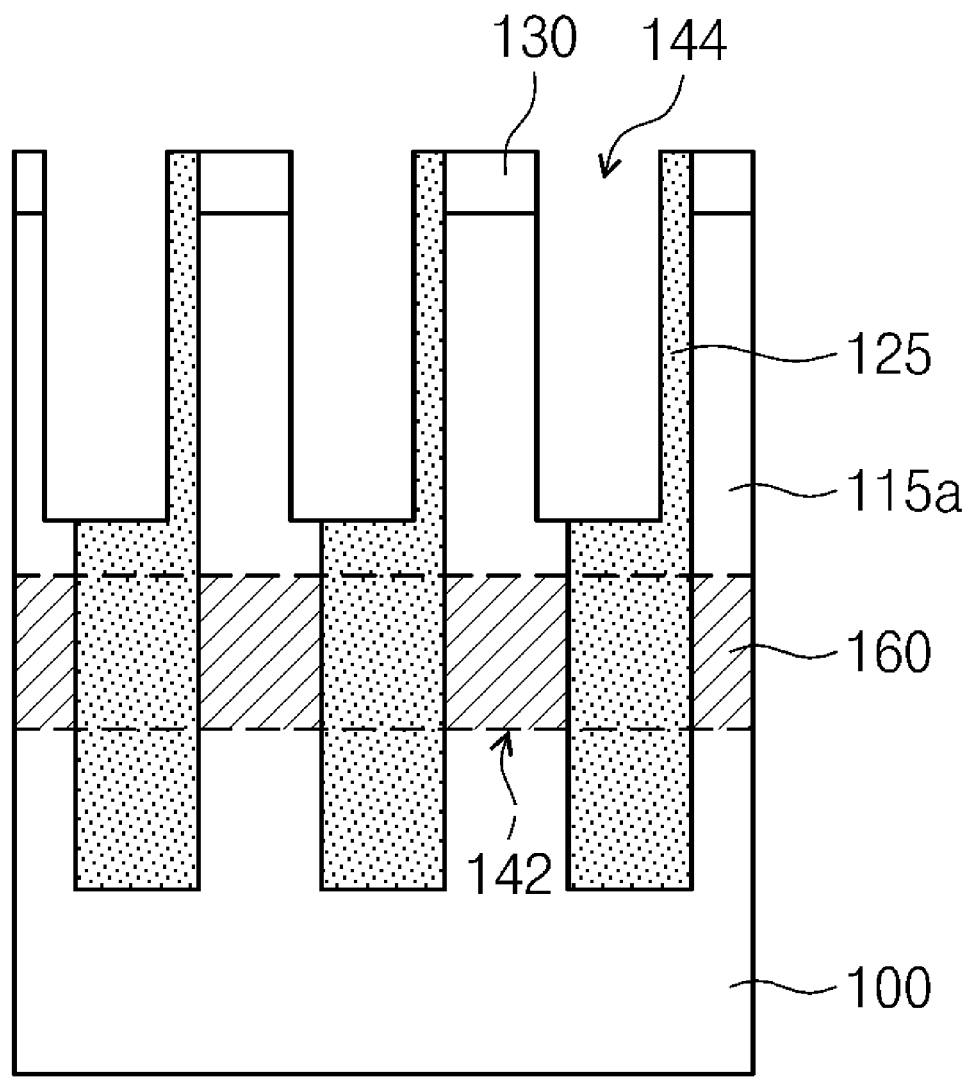

Referring to FIGS. 27A through 27C, the WL pattern 144 is formed in the semiconductor substrate 100 so as to extend in the X direction and cut the device-isolating layer 125. The WL pattern 144 may be offset with one side surface of the vertical channel 115a.

Figure 28A:
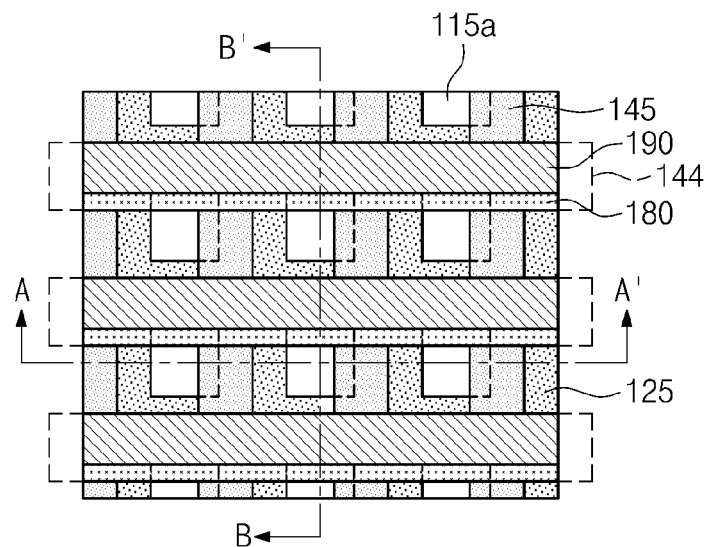
Figure 28B:
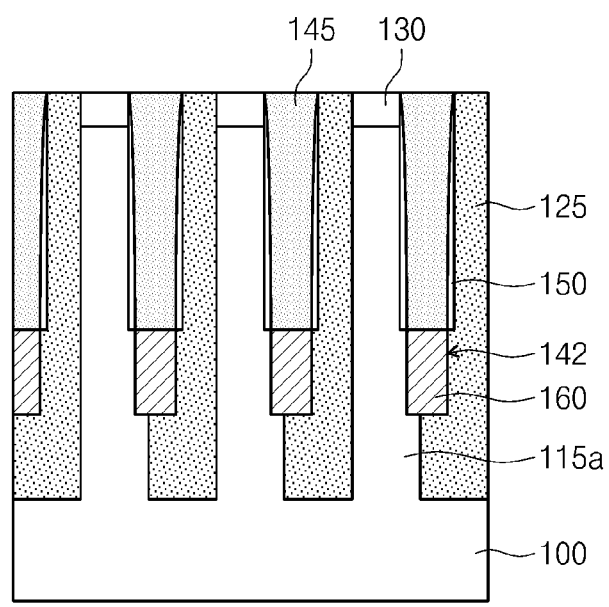
Figure 28C:
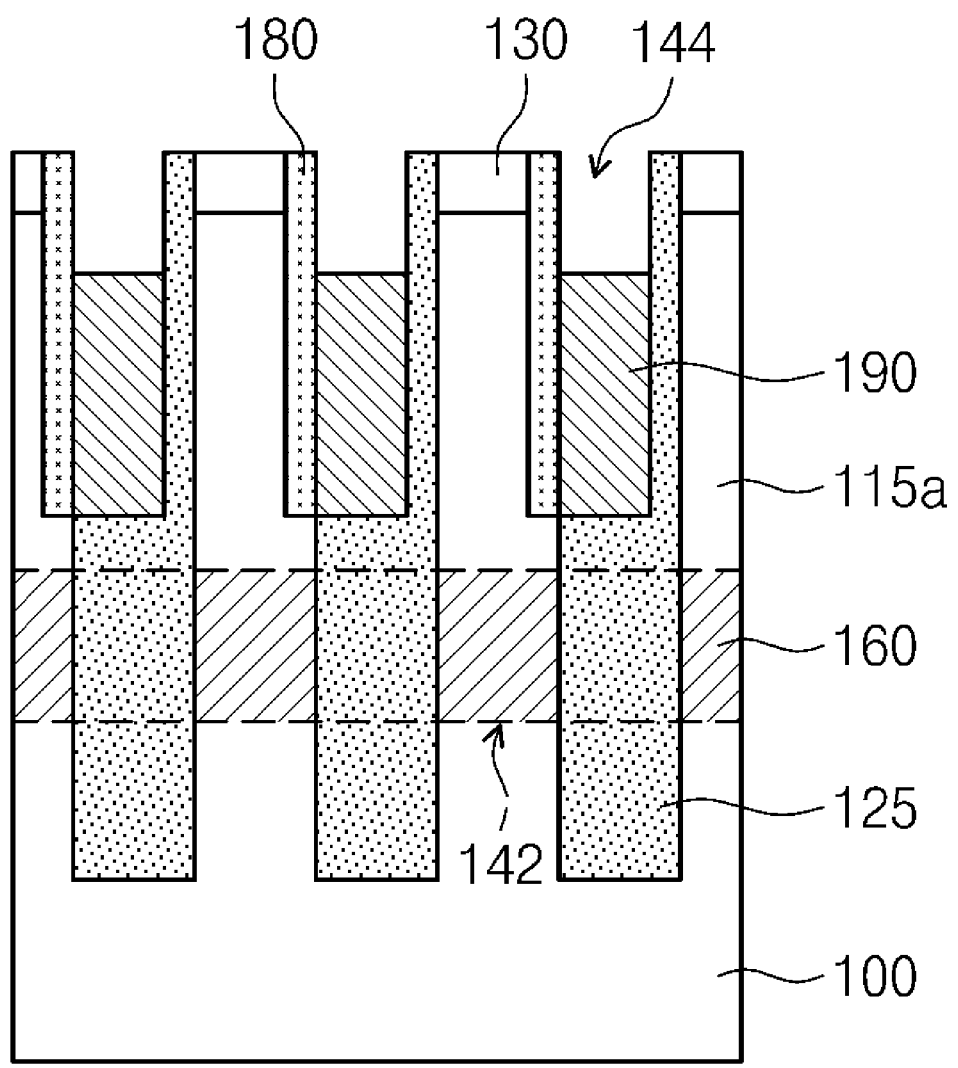

Referring to FIGS. 28A through 28C, the gate insulating layer 180 and the word line 190 are formed in the WL pattern 144 by deposition. The gate insulating layer 180 and the word line 190 may extend in the X direction. As another example, the gate insulating layer 180 may be formed restrictively on one side surface of the vertical channel 115a by subjecting the vertical channel 115a exposed by the WL pattern 144 to thermal oxidation.

Figure 29A:
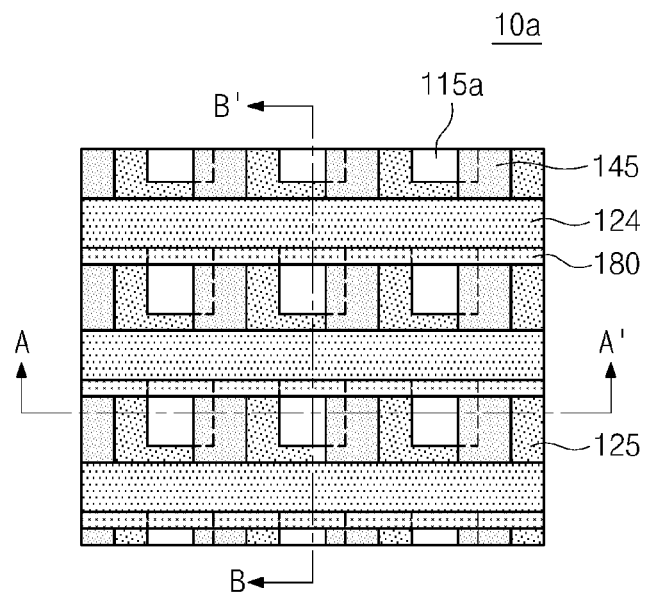
Figure 29B:
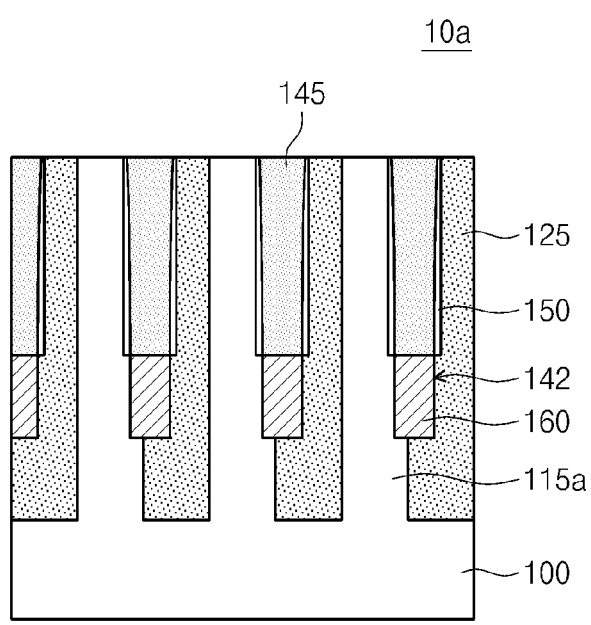
Figure 29C:
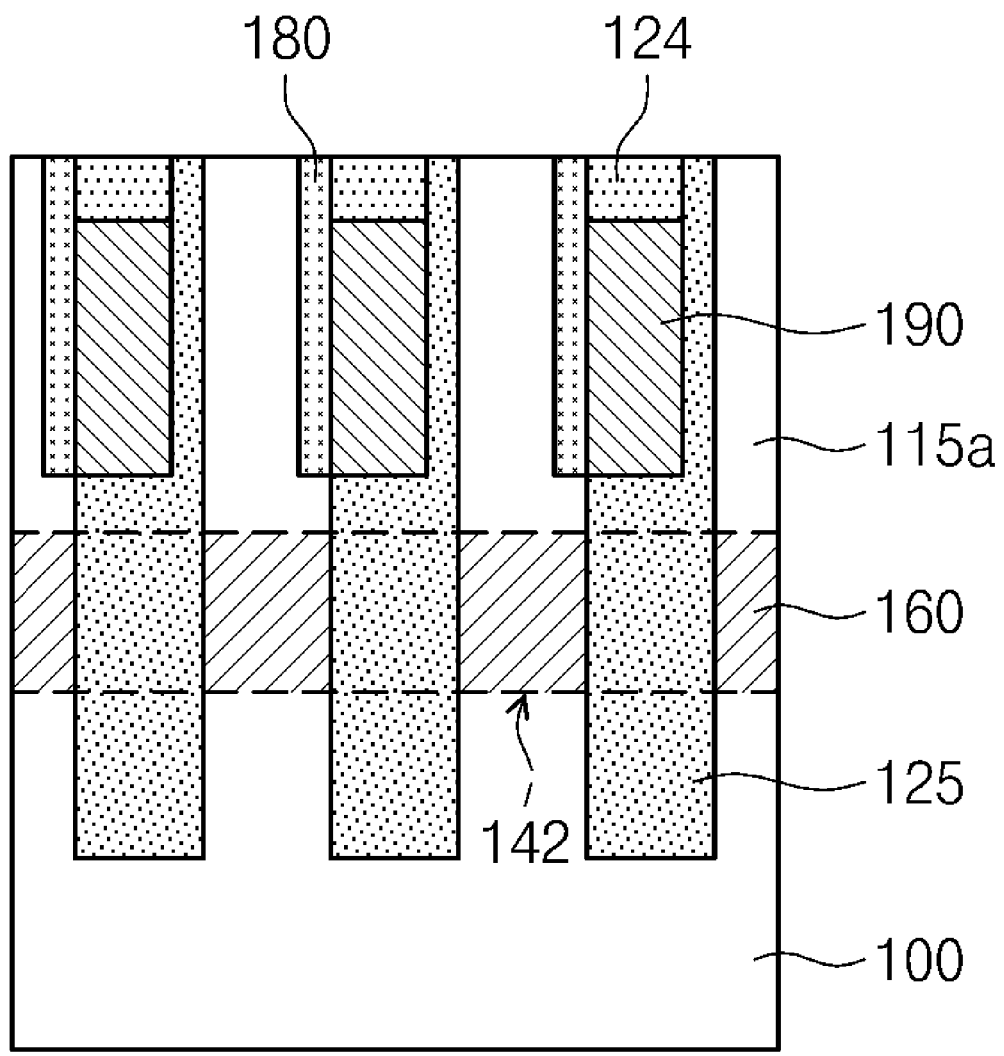

Referring to FIGS. 29A through 29C, the insulating layer 124 is formed in the WL pattern 144 so as to cover the word line 190, and then the hard mask 130 maybe removed by etch-back or CMP. According to the above-described series of steps, the vertical channel 115a may be formed so as to protrude in the Z direction on the semiconductor substrate 100 by simultaneously performing both the X cutting and the Y cutting, and then the buried bit line 160 in the Y direction and the word line 190 in the X direction are sequentially formed. In this way, it is possible to form the vertical channel transistor 10a with the one-channel structure illustrated in FIG. 1B.

Vertical Channel Transistor with Two-Channel Structure

Figure 30A:
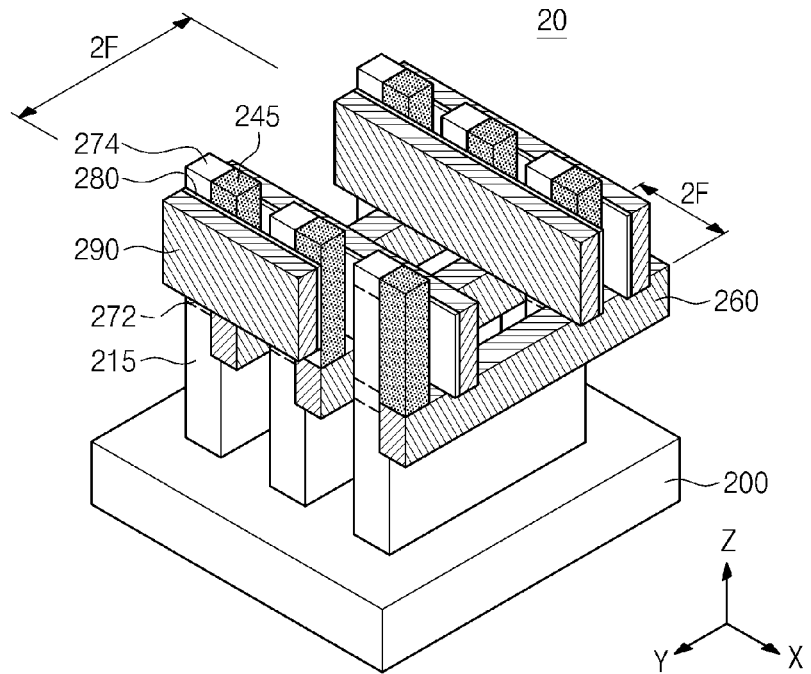
FIG. 30A is a perspective view illustrating a vertical channel transistor according to an embodiment of the inventive concept.
Figure 30B:
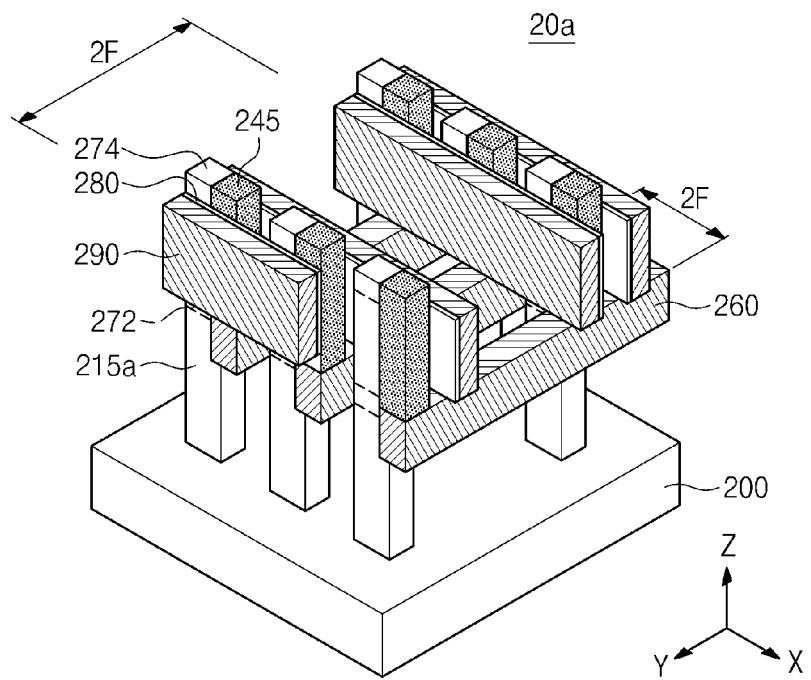
FIG. 30B is a perspective view illustrating a vertical channel transistor according to another embodiment of the inventive concept, which is a modification of the embodiment of FIG. 30A.

FIG. 30A is a perspective view illustrating a vertical channel transistor according to an embodiment of the inventive concept. FIG. 30B is a perspective view illustrating a vertical channel transistor according to another embodiment of the inventive concept, which is a modification of the embodiment of FIG. 30A.

Referring to FIG. 30A, a vertical channel transistor 20 may include a vertical channel 215 protruding in the Z direction from a semiconductor substrate 200, a word line 290 extending in the X direction, and a bit line 260 extending in the Y direction. The bit line 260 may be formed in a buried form at a position lower than the word line 290. In the vertical channel 215, portions corresponding to the lower portions of the bit line 260 may be a structure protruded in the Z direction by a pillar having a substantially tetragonal cross-section on a line connected to each other in the Y direction. A gate insulating layer 280 may be interposed between the word line 290 and the vertical channel 215. The gate insulating layer 280 may extend in the X direction or may be restricted by the vertical channel 215. In the vertical channel 215, a lower junction region 272 may be formed at the position corresponding to a lower portion of the word line 290. Moreover, an upper junction region 274 may be formed at the position corresponding to an upper portion of the word line 290. An insulating pillar 245 formed of an insulating layer may be disposed on a side surface of the vertical channel 215.

According to the embodiment of the inventive concept, the word lines 290 are disposed on both surfaces of the vertical channel 215. The two word lines 290 are connected electrically to each other. The vertical channel transistor 20 may be a vertical channel transistor with a two-channel structure in which two of four side surfaces of the vertical channel 215 facing the word line 290 are utilized as channels. Accordingly, it is possible to improve a current driving capability of the vertical channel transistor 20. In the vertical channel transistor 20 according to the embodiment of the inventive concept may, the area of one cell may be $4F^2$.

Referring to FIG. 30B, a vertical channel transistor 20a according to a modified example of the inventive concept may be similar to the vertical channel transistor 20 in FIG. 30A. Unlike the vertical channel transistor in FIG. 30A, however, the vertical channel transistor 20a may include a vertical channel 215a protruding in the Z direction from the semiconductor substrate 200 and having a substantially tetragonal cross-section.

Figure 31A:
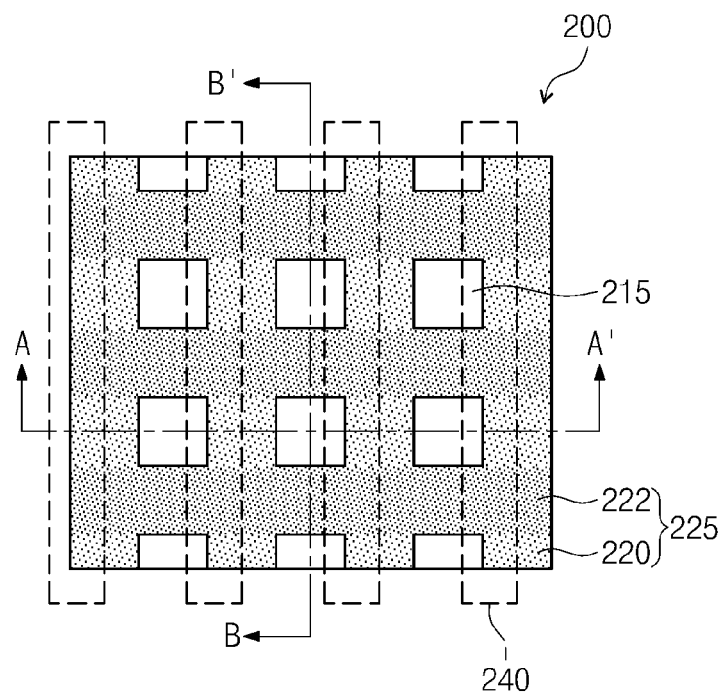
FIGS. 31A, 32A, 33A, 34A, and 35A are plan views illustrating a method of fabricating a vertical channel transistor according to still another embodiment of the inventive concept.
Figure 31B:
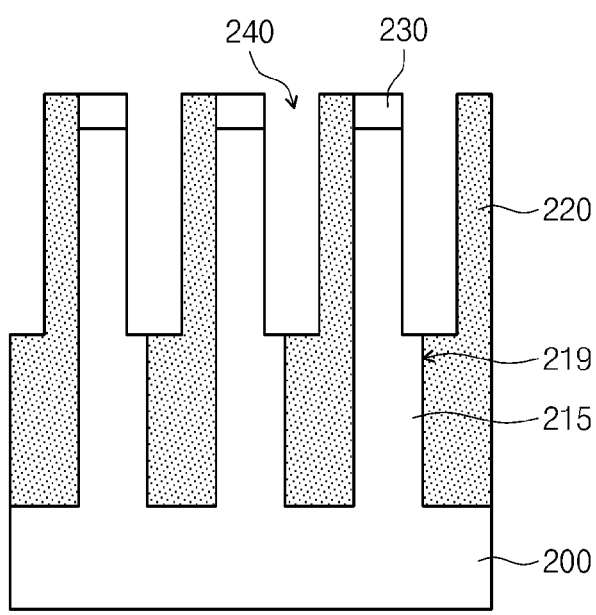
FIGS. 31B, 32B, 33B, 34B, and 35B are cross-sectional views taken along the line A-A' of FIGS. 31A, 32A, 33A, 34A, and 35A respectively.
Figure 31C:
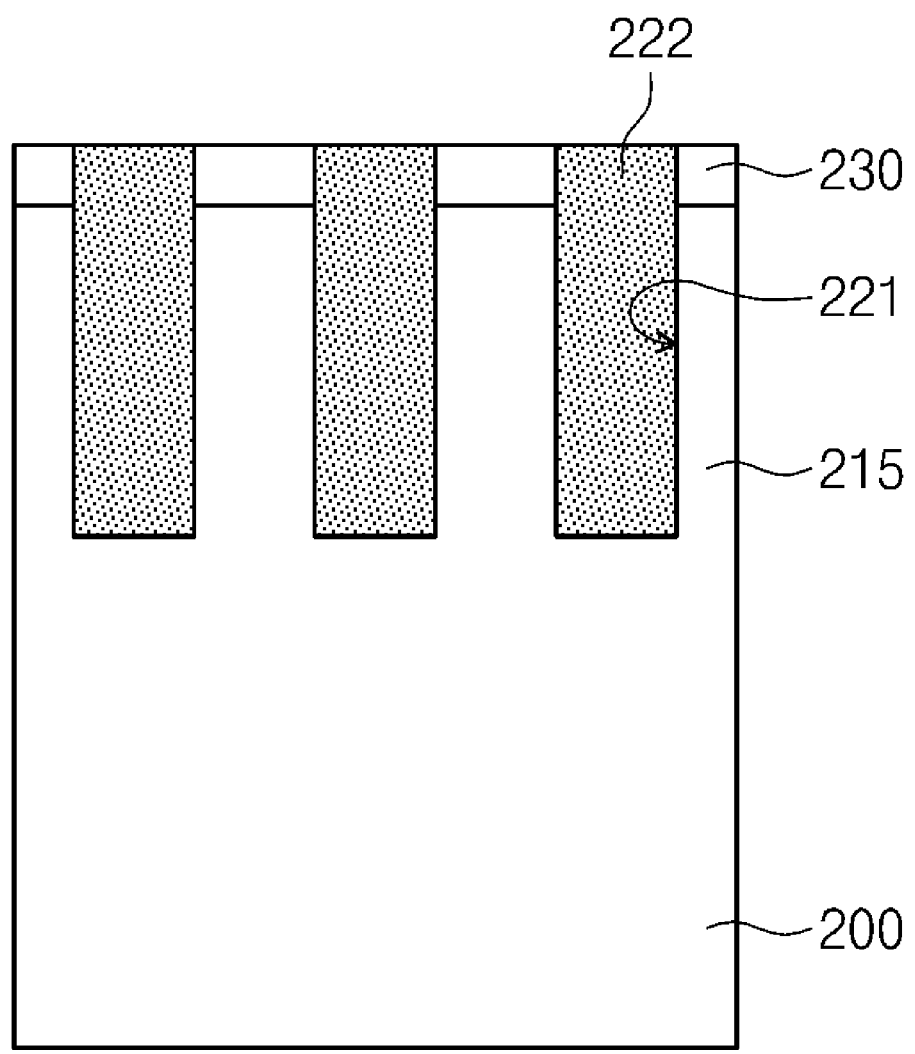
FIGS. 31C, 32C, 33C, 34C, and 35C are cross-sectional views taken along the line B-B' of FIGS. 31A, 32A, 33A, 34A, and 35A, respectively.

Example of Method of fabricating Vertical Channel Transistor with Two-Channel Structure FIGS. 31A, 32A, 33A, 34A, and 35A are plan views illustrating a method of fabricating the vertical channel transistor with the two-channel structure according to an embodiment of the inventive concept. FIGS. 31B, 32B, 33B, 34B, and 35B are cross-sectional views taken along the line A-A' of FIGS. 31A, 32A, 33A, 34A, and 35A respectively. FIGS. 31C, 32C, 33C, 34C, and 35C are cross-sectional views taken along the line B-B' of FIGS. 31A, 32A, 33A, 34A, and 35A, respectively. FIGS. 34G through 34J are plan views illustrating the method for forming a word line pad in a method of fabricating the vertical channel transistor with the two-channel structure according to an embodiment of the inventive concept. FIGS. 34K through 34P are plan views according to a modified example of the embodiment of the inventive concept. To simplify this description, description of elements described in detail above will not be repeated. Referring to FIGS. 31A through 31C, the active bar is formed in the Y cutting as in FIGS. 2A through 2C, and the active bar is isolated in the X cutting to form the vertical channel 215 as in FIGS. 3A through 3C. A first trench 219 is formed in the Y direction by the Y cutting. A second trench 221 is formed in the X direction by the X cutting. The first trench 219 is filled with a first insulating layer 220 and the second trench 221 is filled with a second insulating layer 222. The first insulating layer 220 and the second insulating layer 222 form a device-isolating layer 225. Subsequently, a BBL pattern 240 is formed so as to cut the device-isolating layer 225 extending in the Y direction and to be offset with one side surface of the vertical channel 215. For simple description, the repeated description is omitted below.

Figure 32A:
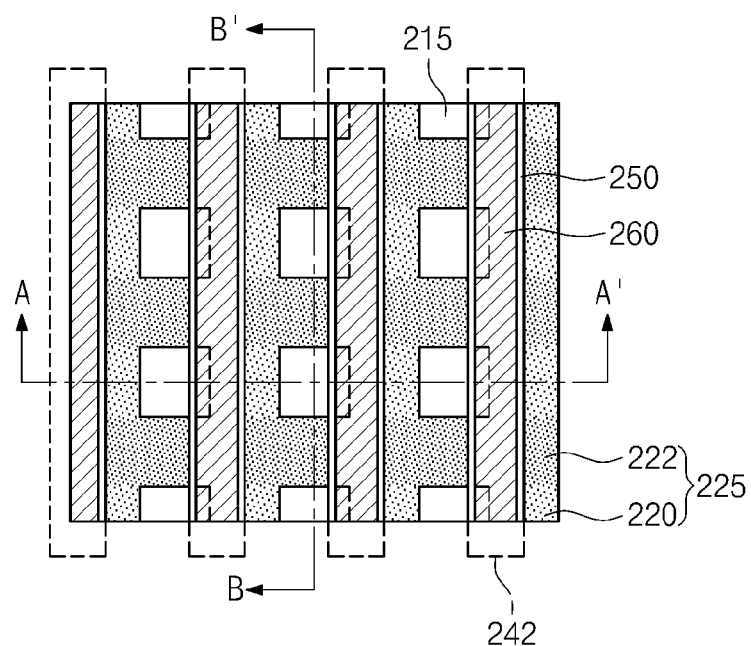
Figure 32B:
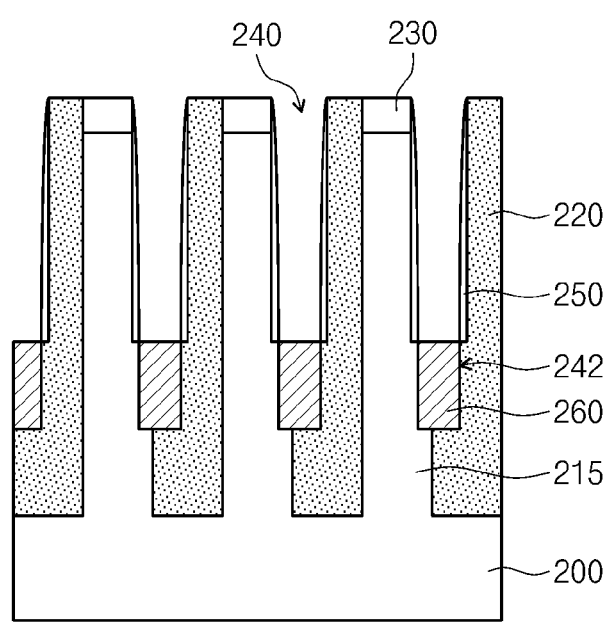
Figure 32C:
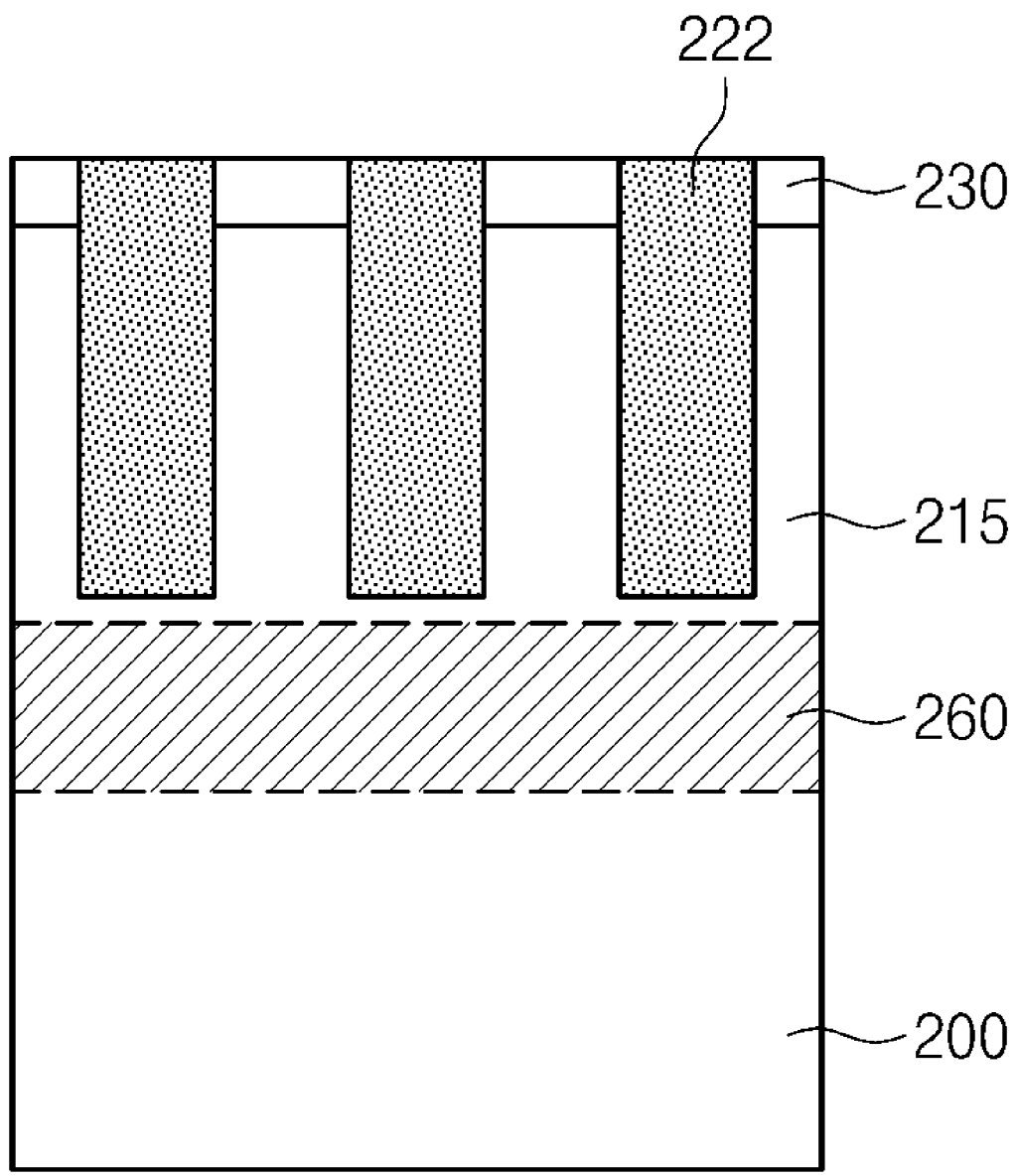

Referring to FIGS. 32A through 32C, a liner 250 is formed in the inside surface of the BBL pattern 240. The D-BBL pattern 242 is formed by removing the vertical channel 215 exposed by the BBL pattern 240 by etching having selectivity or no selectivity to the device-isolating layer 225, while protecting the vertical channel 215 by the liner 250. The D-BBL pattern 242 is filled with metal to form a buried bit line 260.

Figure 33A:
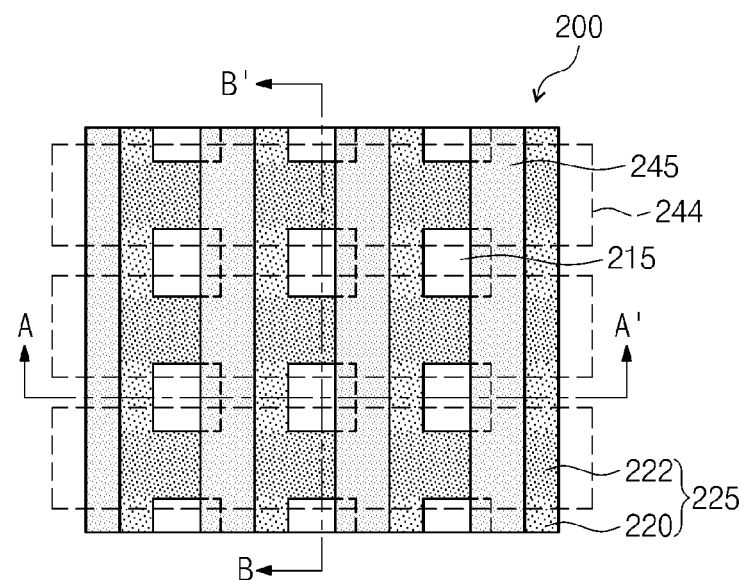
Figure 33B:
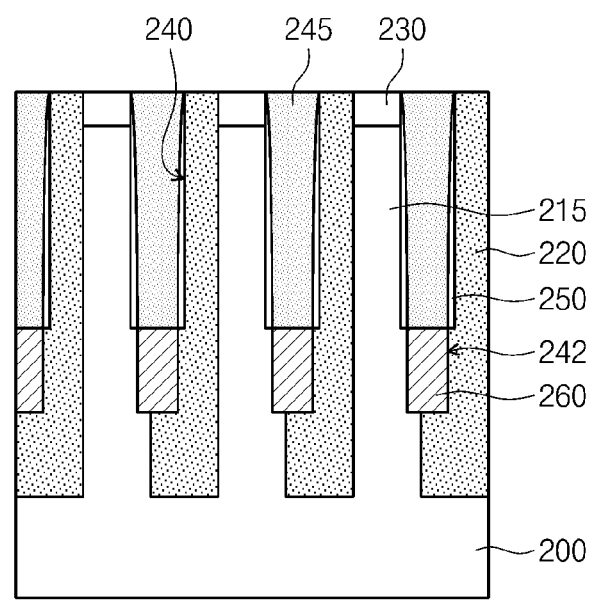
Figure 33C:
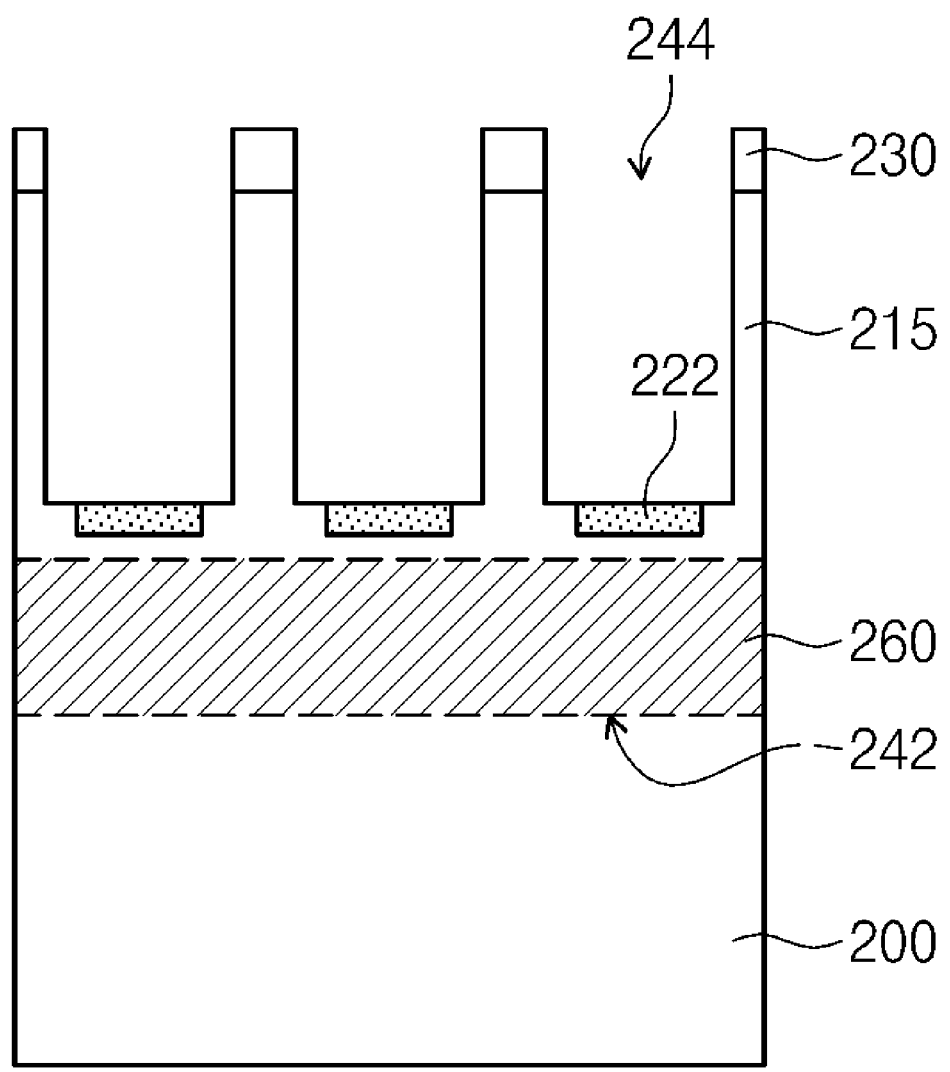

Referring to FIGS. 33A though 33C, the BBL pattern 240 is filled with a silicon nitride to form an insulating pillar 245. Subsequently, a WL pattern 244 is formed so as to cut parts of the device-isolating layer 225 and the vertical channel 215 in the X direction and to be offset with both side surfaces of the vertical channel 215. The insulating pillar 245 may be realized from the shape of a bar to the shape of an island by the WL pattern 244. The second insulating layer 222 may be exposed by the bottom surface of the WL pattern 244.

Figure 34A:
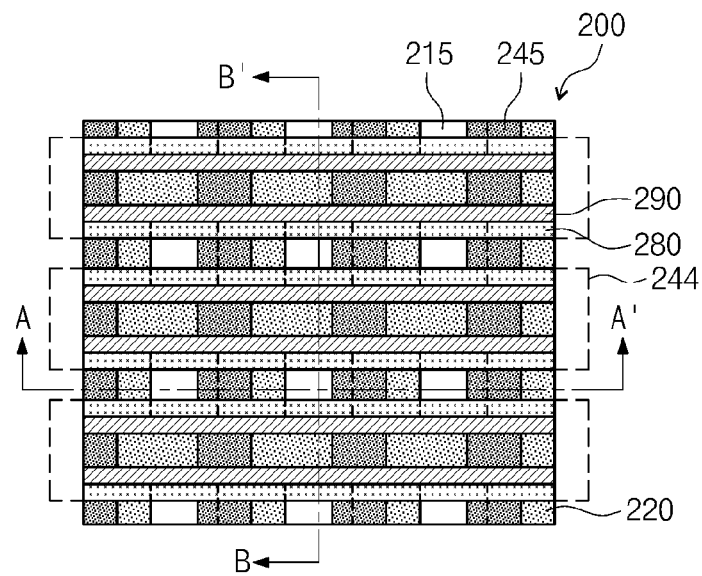
Figure 34B:
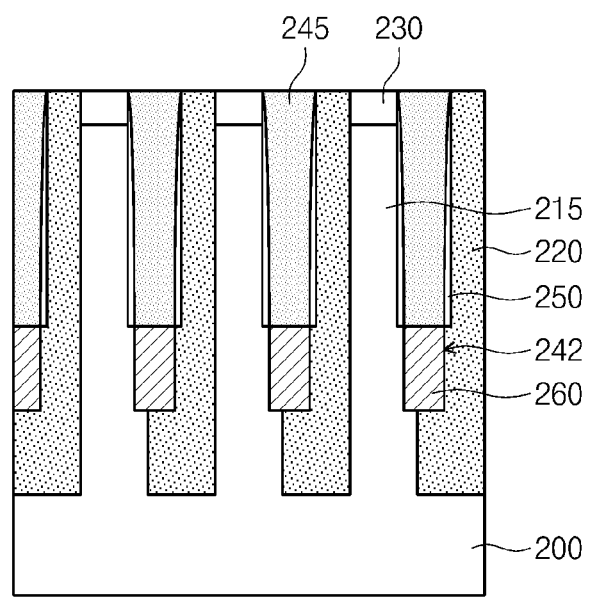
Figure 34C:
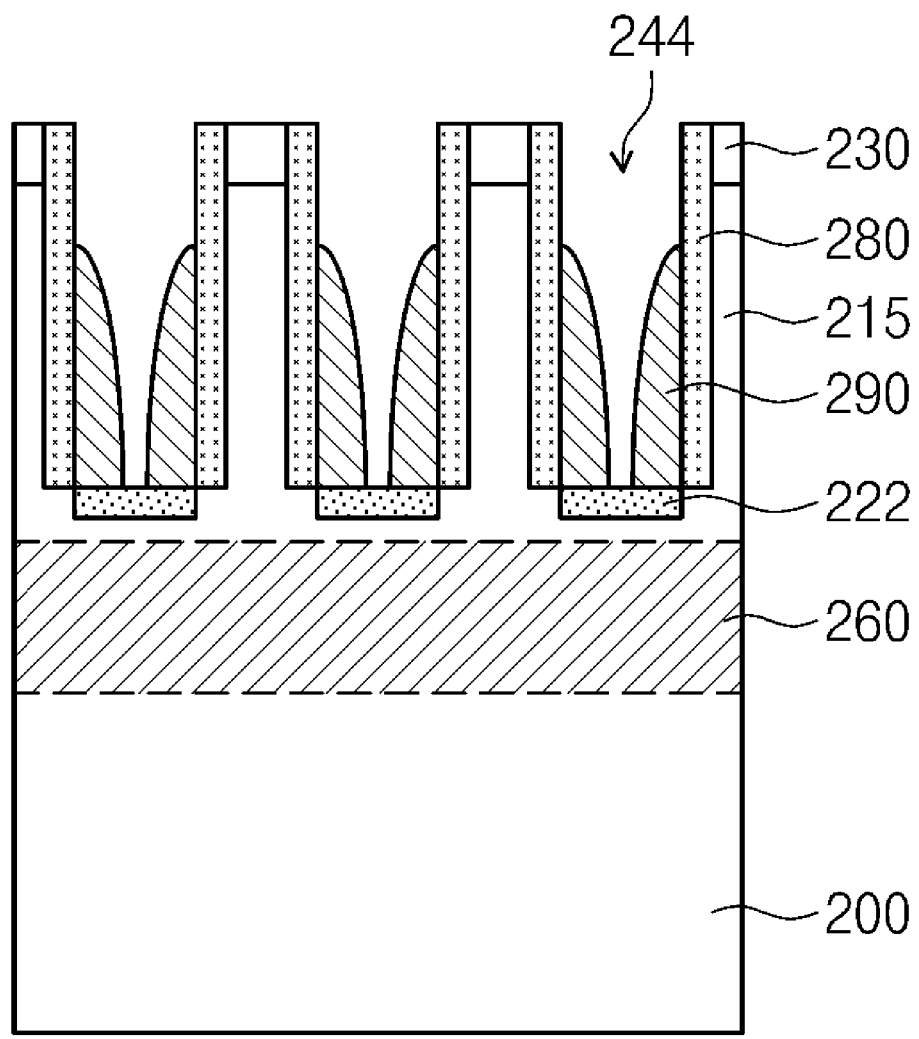

Referring to FIGS. 34A through 34C, the gate insulating layer 280 is formed in the WL pattern 244. The gate insulating layer 280 may be formed on the both sidewall of the vertical channel 215 by deposition. The word lines 290 are formed on the both sidewalls of the vertical channel 215 by deposition of metal layer and etch-back. Accordingly, the both sidewalls of the vertical channel 215 may be utilized as channels.

Figure 34D:
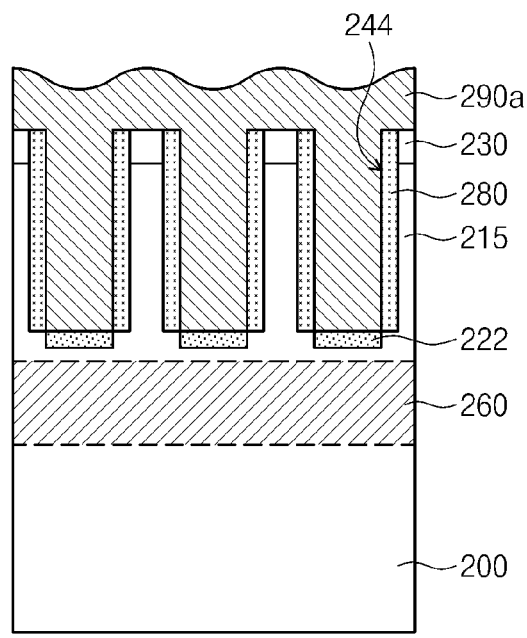
FIGS. 34D through 34F are cross-sectional views illustrating a method for forming a word line according still another embodiment of the inventive concept.
Figure 34E:
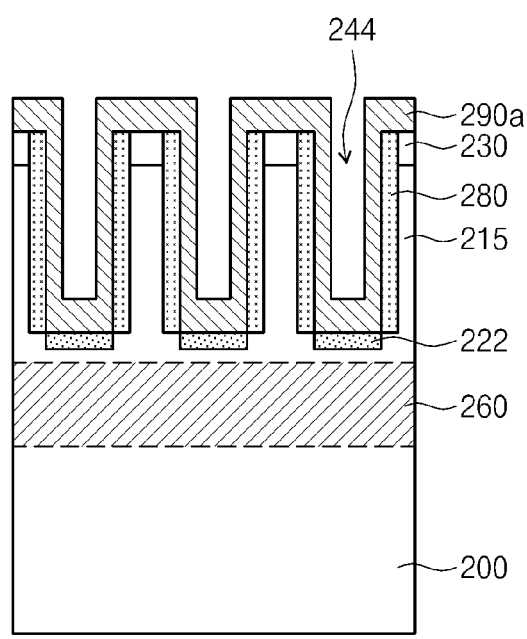
Figure 34F:
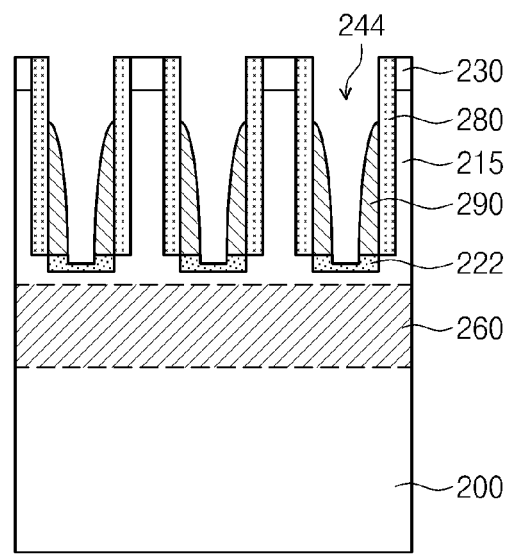

The word line 290 may be formed by depositing a conductive material layer on the semiconductor substrate 200 and patterning the conductive material layer. For example, as illustrated in FIG. 34D, a metal layer 290a such as TiN may be deposited so that the entire WL pattern 244 is buried, and then may be subjected to etch-back. As another example, as illustrated in FIG. 34E, the metal layer 290a may be deposited along the outer surface of the WL pattern 244. Referring to FIG. 34F, the word line 290 may be formed in the shape of a spacer in the WL pattern 244 by subjecting the metal layer 290a to etch-back. In this case, the second insulating layer 222 may be recessed between the word lines 290. In order to utilize the both sidewalls of the vertical channel 215 as a cell channel, the two word lines 290 formed on the both sidewalls of the vertical channel 215 are electrically connected to each other, as described below with reference to FIGS. 34G and 34J.

Figure 34G:
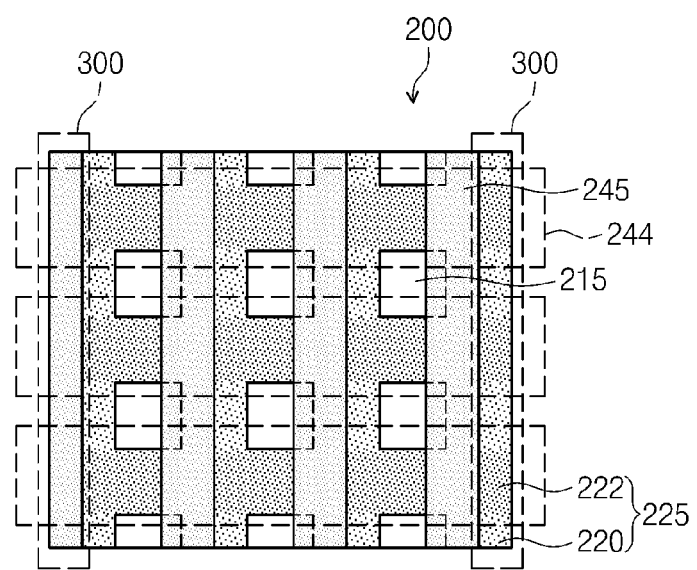
FIGS. 34G through 34J are plan views illustrating a method for forming a word line pad in a method of fabricating a vertical channel transistor with a two-channel structure according to an embodiment of the inventive concept.

Referring to FIG. 34G, a connection pattern 300 is formed to open the edge of the semiconductor substrate 200. The connection pattern 300 may be formed one edge or both edges of the semiconductor substrate 200. The connection pattern 300 may be formed to intersect the edge of the WL pattern 244.

Figure 34H:
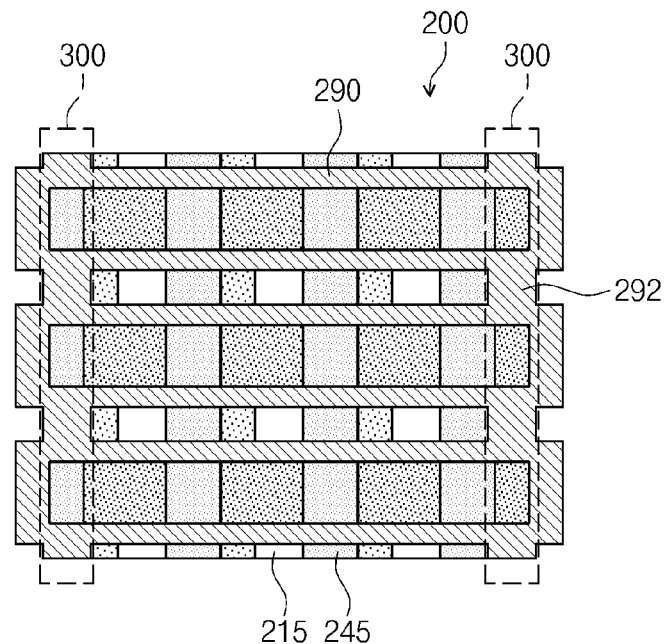

Referring to FIG. 34H, the word lines 290 are formed in the WL pattern 244. The word line 290 may also be formed in the connection pattern 300. With such a configuration, the word lines 290 formed on the both sidewalls of the vertical channel 215 may be connected to a connection portion 292 formed in the connection pattern 300.

Figure 34I:
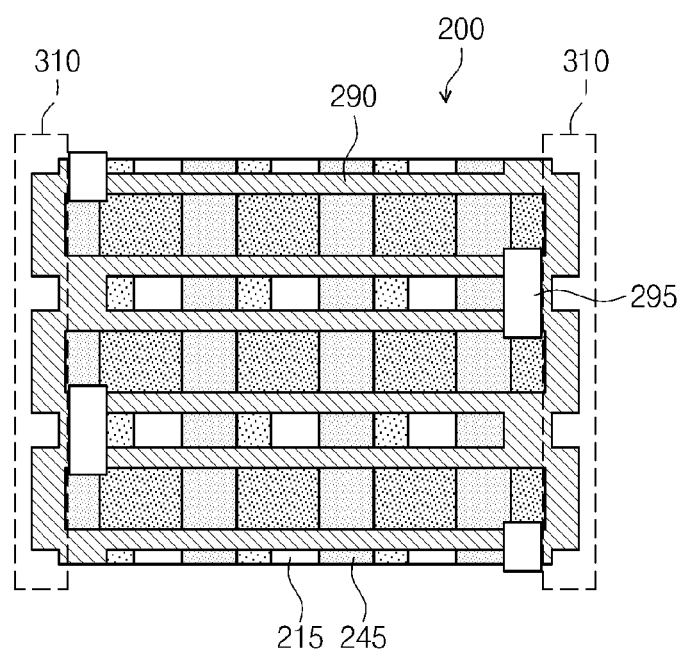

Referring to FIG. 34I, a word line pad 295 may be formed in the connection portion 292. The word line pad 295 may be formed in one end of the two word lines 290 formed on the both sidewalls of the vertical channel 215 and connected to each other. As another example, the word line pad 295 may be formed in each of the connection portions 292 formed on both ends of the two word lines 290 connected to each other. As still another example, a contact connected to the connection 292 may be formed after the word line pad 295 is formed or in a state where the word line pad 295 is not formed. A cell edge 310 is removed to isolate the word lines 290.

Figure 34J:
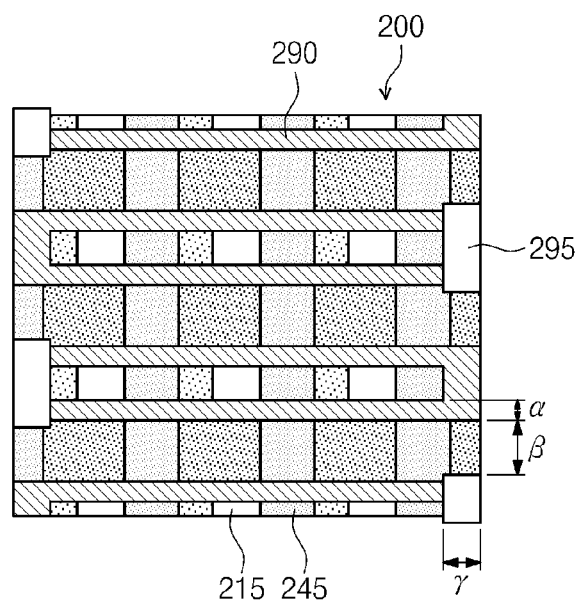
Figure 34K:
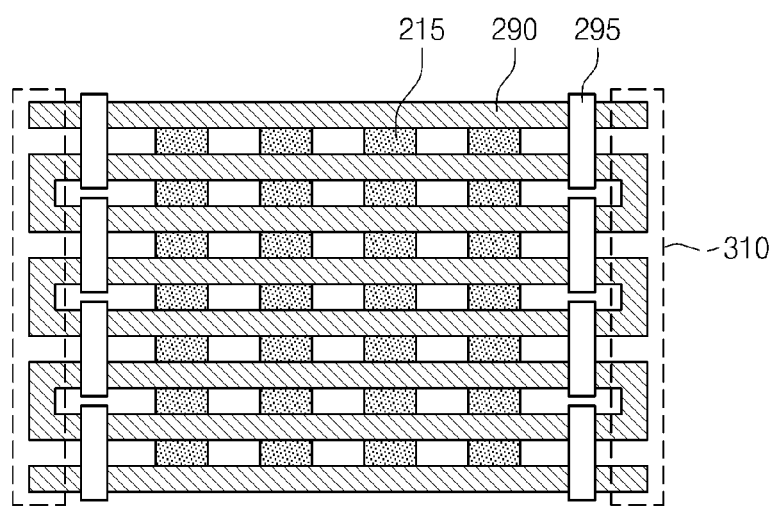
FIGS. 34K through 34P are plan views illustrating a method for forming a word line pad in the method of fabricating the vertical channel transistor with the two-channel structure according to a modified example of an embodiment of the inventive concept.
Figure 34L:
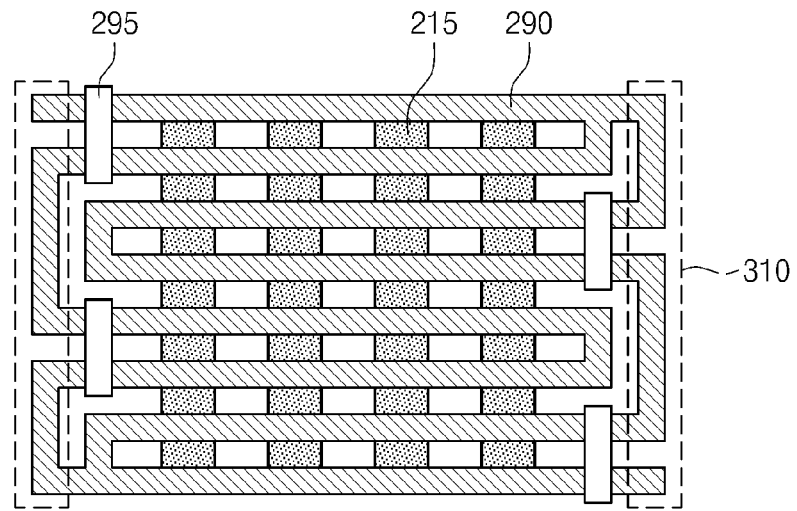
Figure 34M:
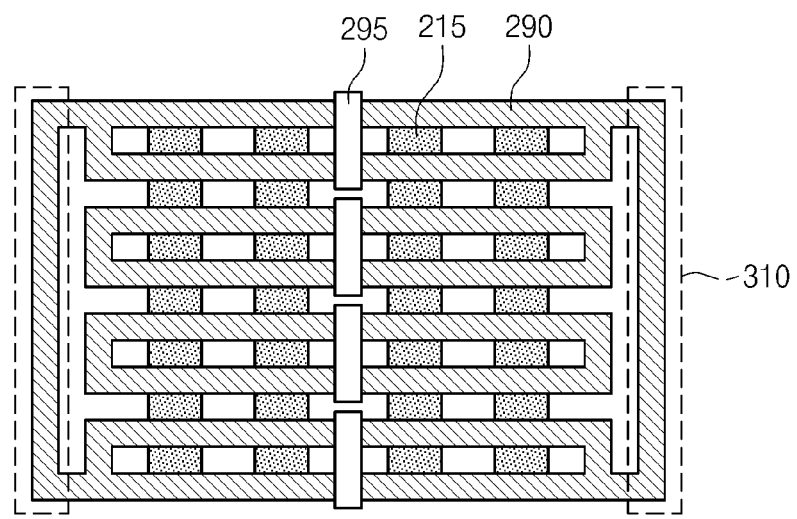
Figure 34N:
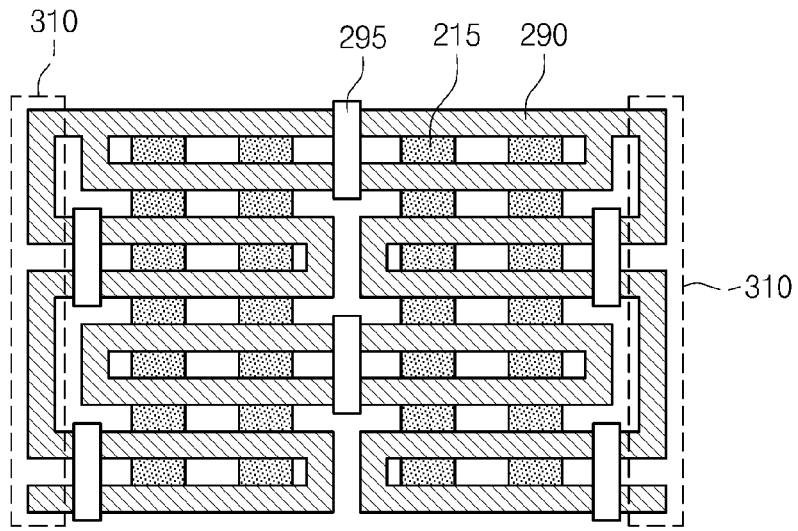
Figure 34O:
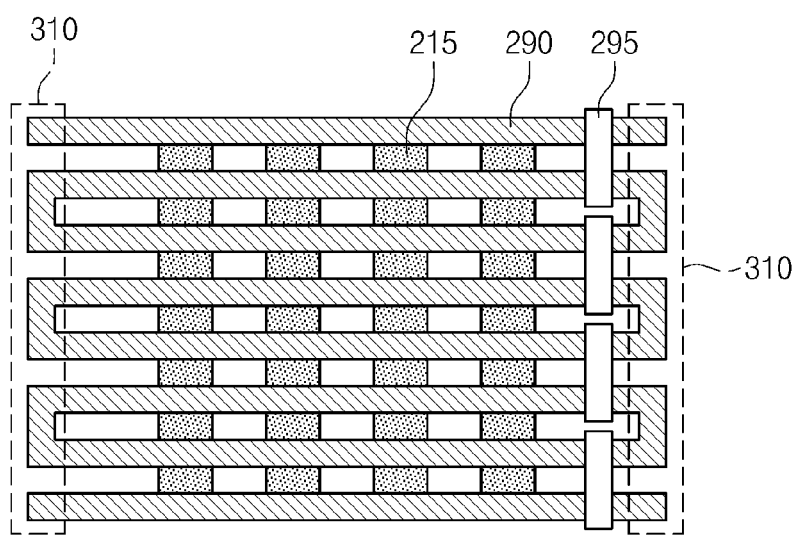
Figure 34P:
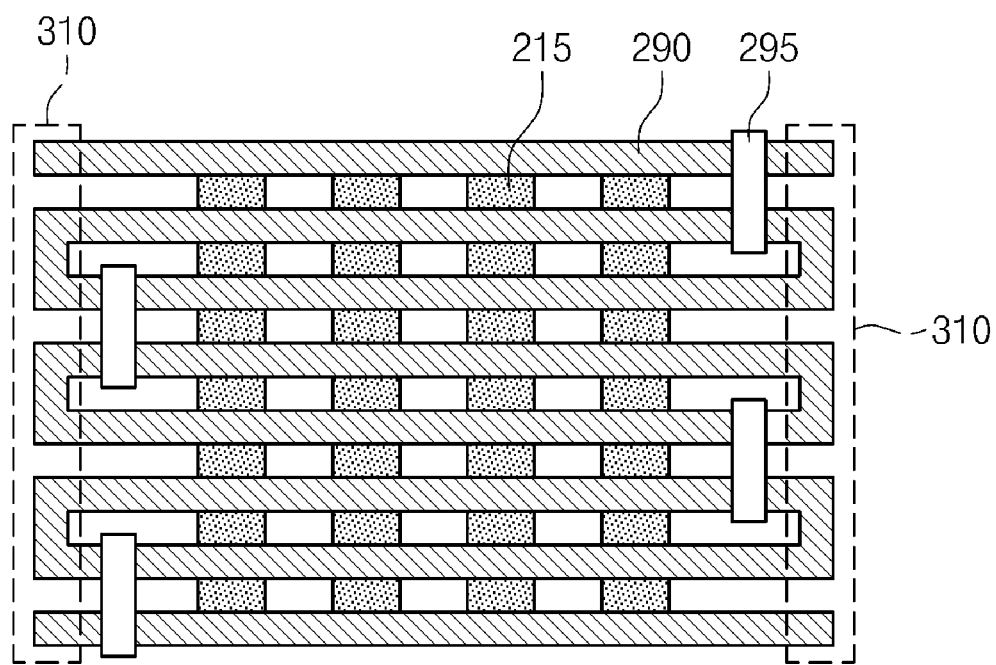

Referring to FIG. 34J, when the cell edge 310 is formed, it is possible to realize the two word lines 290 formed on the both sidewalls of one vertical channel 215, connected to each other, and connected to the word line pad 295. A distance β between the word lines 290 sharing no word line pad 295 may be smaller than about the double of a vertical length a of the word line 290. A horizontal length γ of the word line pad 295 may be nearly the double of the vertical length a of the word line 290. These numerical values are just examples, and the invention is not limited thereto. FIGS. 34K through 34P shows various examples of the shape of the word line pad 295.

Figure 35A:
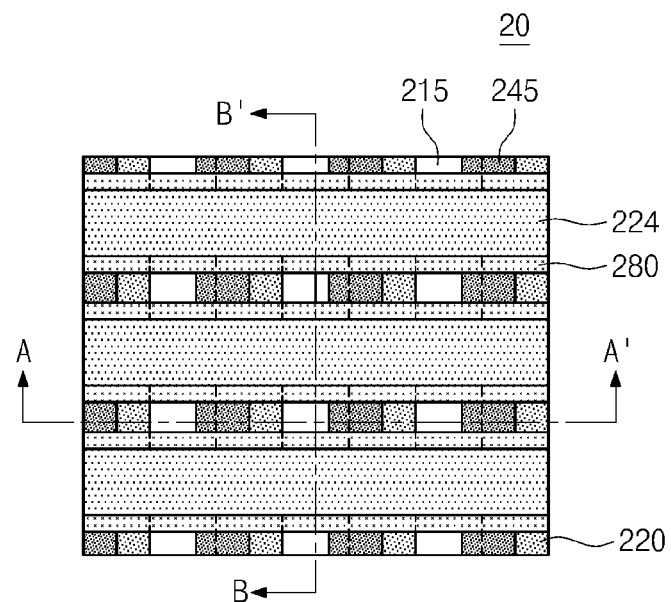
Figure 35B:
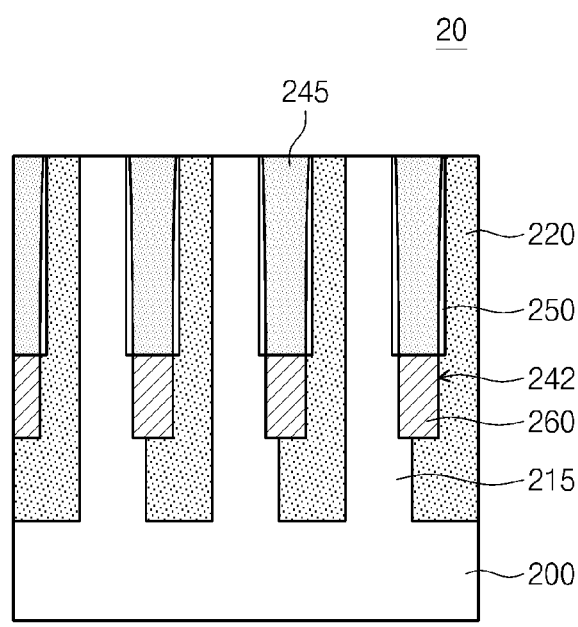
Figure 35C:
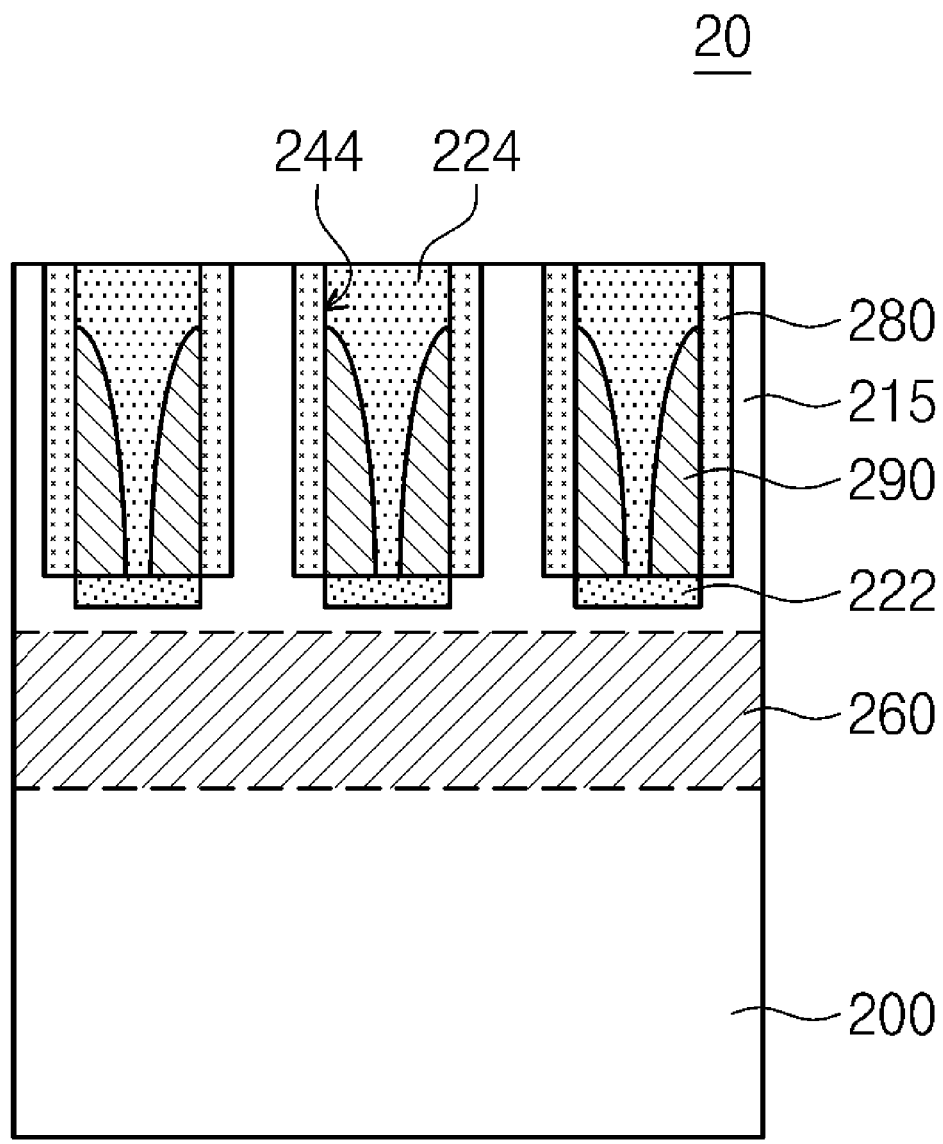

Referring to FIGS. 35A though 35C, a third insulating layer 224 is formed in the WL pattern 244, and then the hard mask 230 is removed by etch-back or CMP. According to the above-described series of steps, the active bar is formed so as to extend in the Y direction by the Y cutting, the vertical channel 215 is formed perpendicular to the active bar in the Z direction in the X cutting, the buried bit line 260 is formed so as to extend in the Y direction, and the word lines 290 are formed on the both sidewalls of the vertical channel 215 so as to extend in the X direction. In this way, it is possible to form the vertical channel transistor 20 with the two-channel structure, as illustrated in FIG. 30A.

Modified Method for Forming Gate Insulating Layer

Figure 36A:
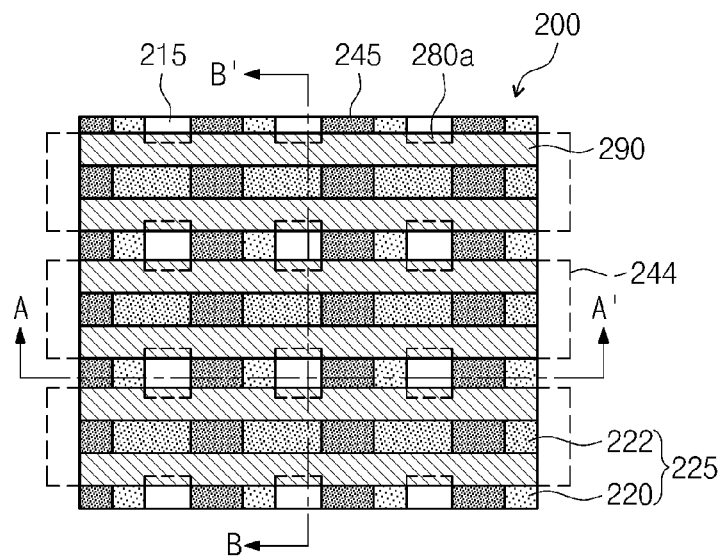
FIGS. 36A and 37A are plan views illustrating a method for forming a gate insulating layer according to a modified example of the embodiment of the inventive concept.
Figure 36B:
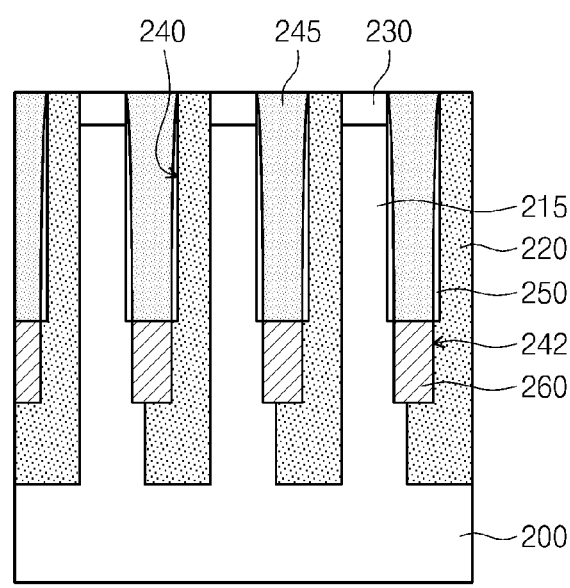
FIGS. 36B and 37B are cross-sectional views taken along the line A-A' line of FIGS. 36A and 37A, respectively.
Figure 36C:
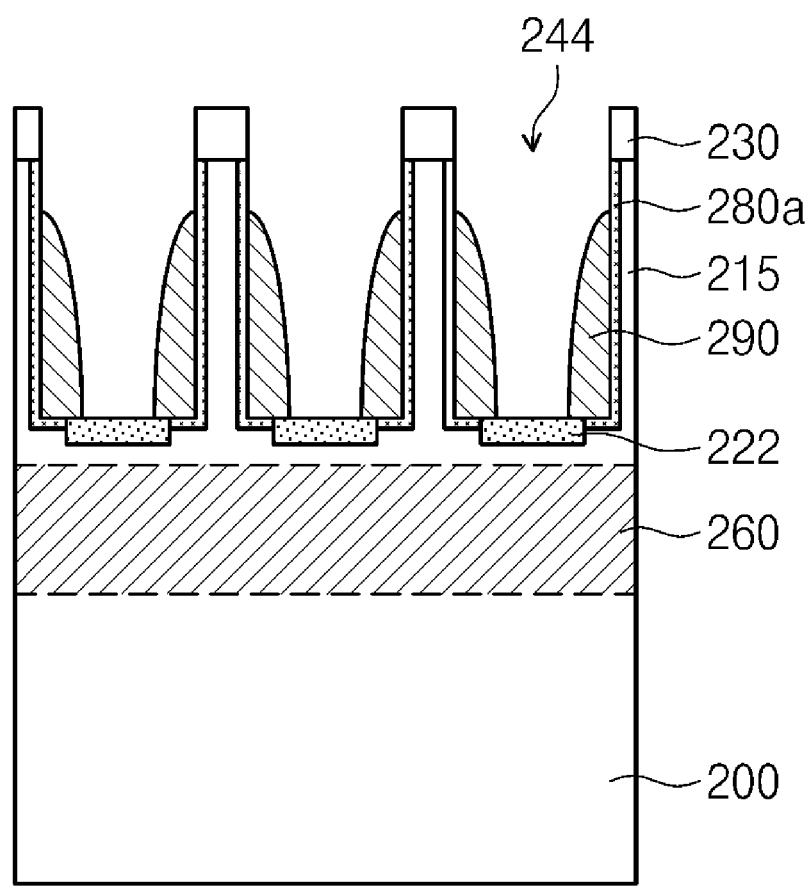
FIGS. 36C and 37C are cross-sectional views taken along the line B-B' of FIGS. 36A and 37A, respectively.
Figure 37A:
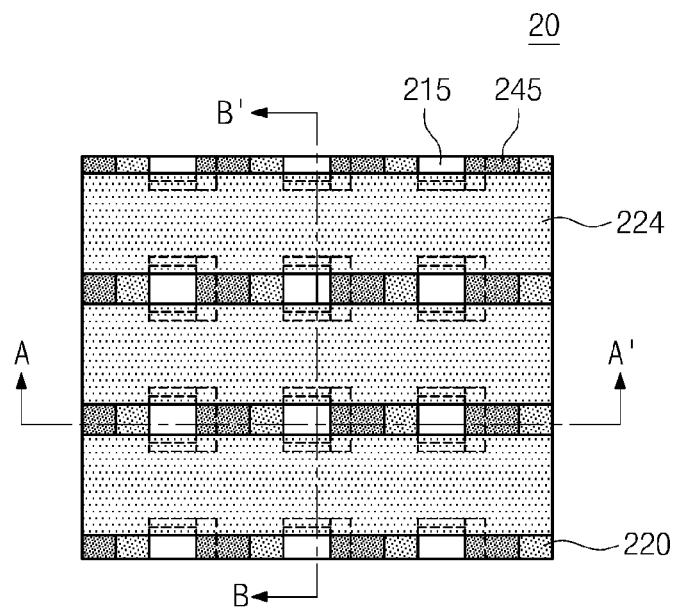
Figure 37B:
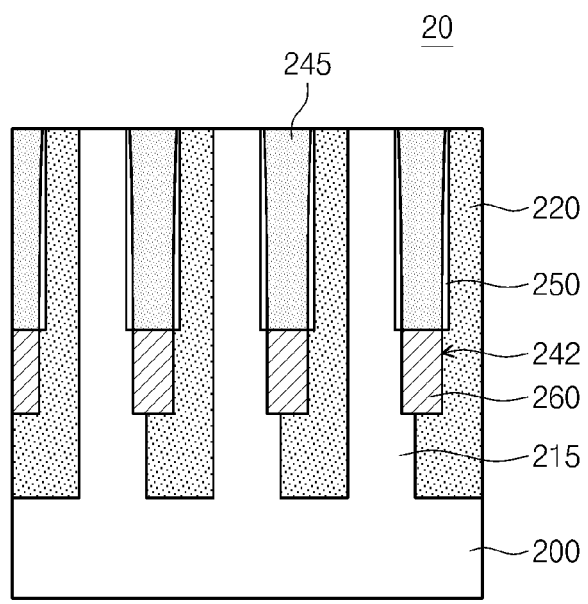
Figure 37C:
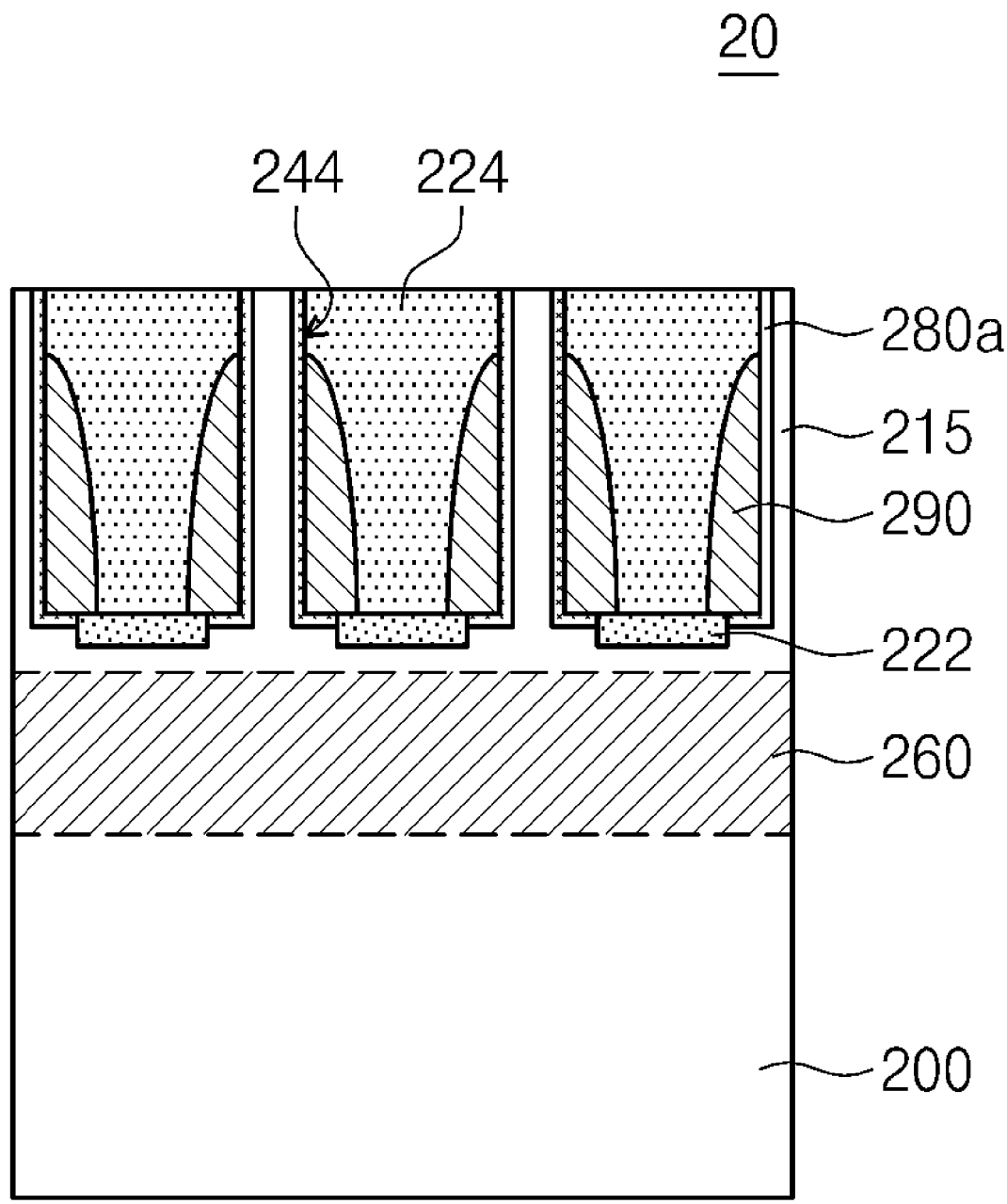

FIGS. 36A and 37A are plan views illustrating a method for forming a gate insulating layer in the method of fabricating the vertical channel transistor with the two-channel structure according to a modified example of the embodiment of the inventive concept. FIGS. 36B and 37B are cross-sectional views taken along the line A-A' line of FIGS. 36A and 37A, respectively. FIGS. 36C and 37C are cross-sectional views taken along the line B-B' of FIGS. 36A and 37A, respectively.

Referring to FIGS. 36A through 36C, the WL pattern 244 is formed in the semiconductor substrate 200 so as to extend in the X direction. Gate insulating layers 280a are formed on the both side surfaces of the vertical channel 215 by subjecting the vertical channel 215 to thermal oxidation. According to the modified example, the gate insulating layers 280a may not extend in the X direction, unlike the case in FIG. 34A, but may be formed restrictively the both side surfaces of the vertical channel 215.

Referring to FIGS. 37A through 37C, the word lines 290 are formed in the WL pattern 244. The word lines 290 may be formed on the both side surfaces of the vertical channel 215 so as to extend in the X direction. It is possible to realize the vertical channel transistor 20 with the two-channel structure by forming the third insulating layer 224 in the WL pattern 244, and then removing the hard mask 230 by CMP or etch-back.

Figure 38A:
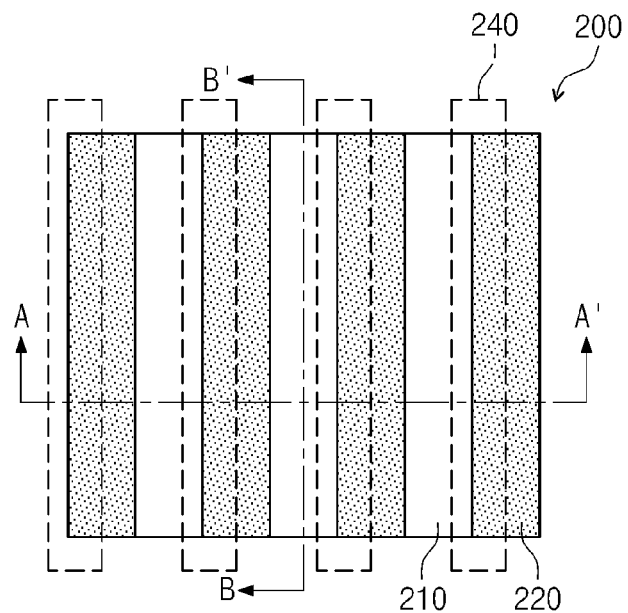
FIGS. 38A, 39A, 40A, 41A, 42A, and 43A are plan views illustrating a method of fabricating a vertical channel transistor according to another embodiment of the inventive concept.
Figure 38B:
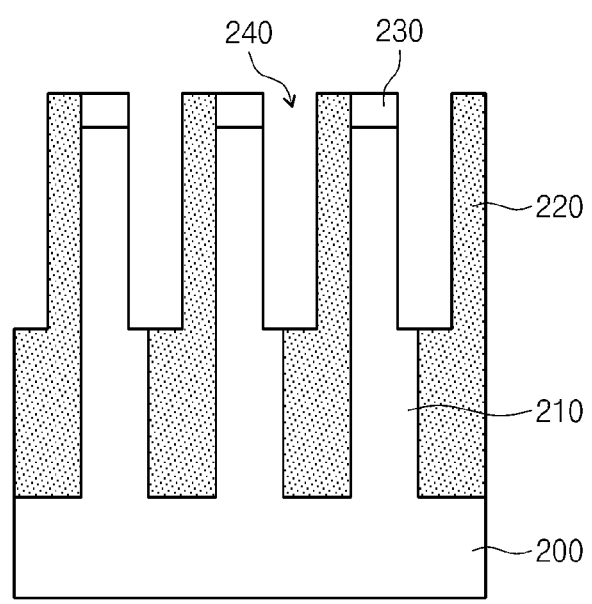
FIGS. 38B, 39B, 40B, 41B, 42B, and 43B are cross-sectional views taken along the line A-A' of FIGS. 38A, 39A, 40A, 41A, 42A, and 43A, respectively
Figure 38C:
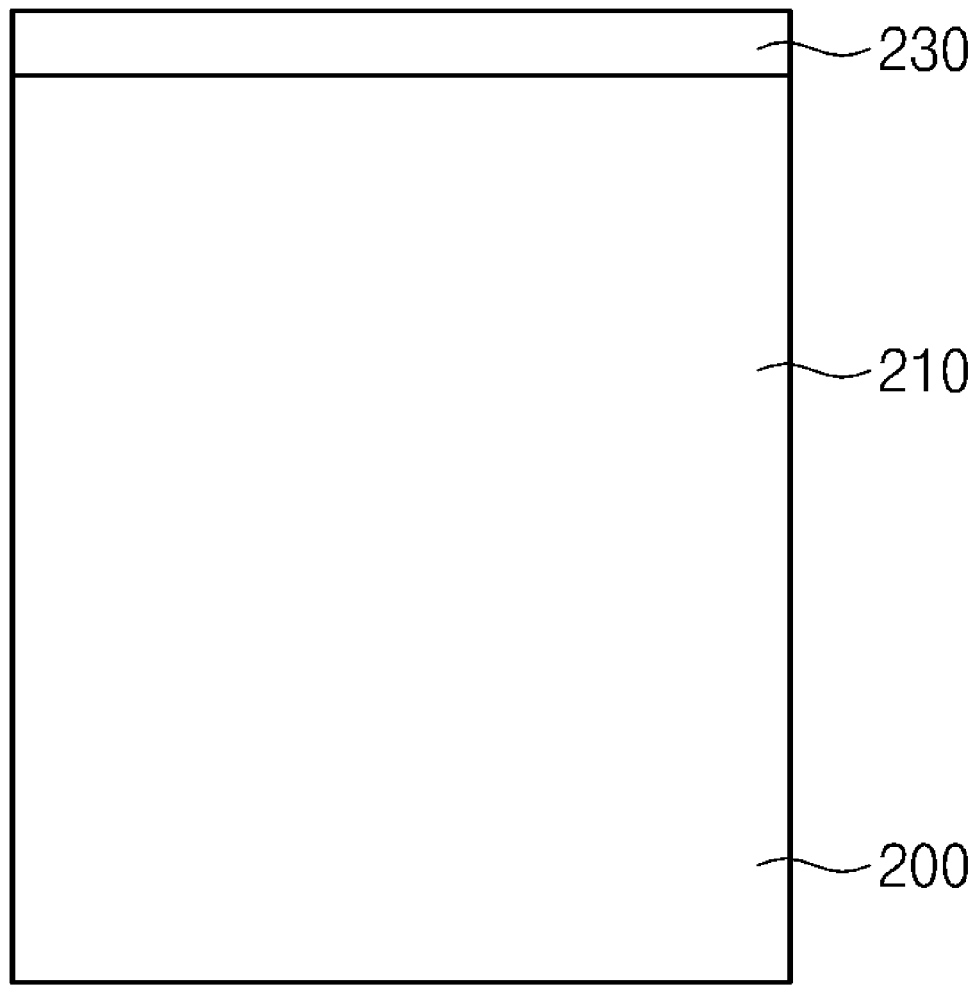
FIGS. 38C, 39C, 40C, 41C, 42C, and 43C are cross-sectional views taken along the line B-B' of FIGS. 38A, 39A, 40A, 41A, 42A, and 43A, respectively.

Another Example of Method of fabricating Vertical Channel with Two-Channel Structure FIGS. 38A, 39A, 40A, 41A, 42A, and 43A are plan views illustrating a method of fabricating a vertical channel transistor with the two-channel structure according to another embodiment of the inventive concept. FIGS. 38B, 39B, 40B, 41B, 42B, and 43B are cross-sectional views taken along the line A-A' of FIGS. 38A, 39A, 40A, 41A, 42A, and 43A, respectively. FIGS. 38C, 39C, 40C, 41C, 42C, and 43C are cross-sectional views taken along the line B-B' of FIGS. 38A, 39A, 40A, 41A, 42A, and 43A, respectively. To simplify this description, description of elements described in detail above will not be repeated. Referring to FIGS. 38A through 38C, the active bar 210 is formed so as to be isolated by the first insulating layer 220 and extend in the Y direction by the Y cutting. The BBL pattern 240 is formed so as to cut the first insulating layer 220 in the Y direction and to be offset with one side surface of the active bar 210.

Figure 39A:
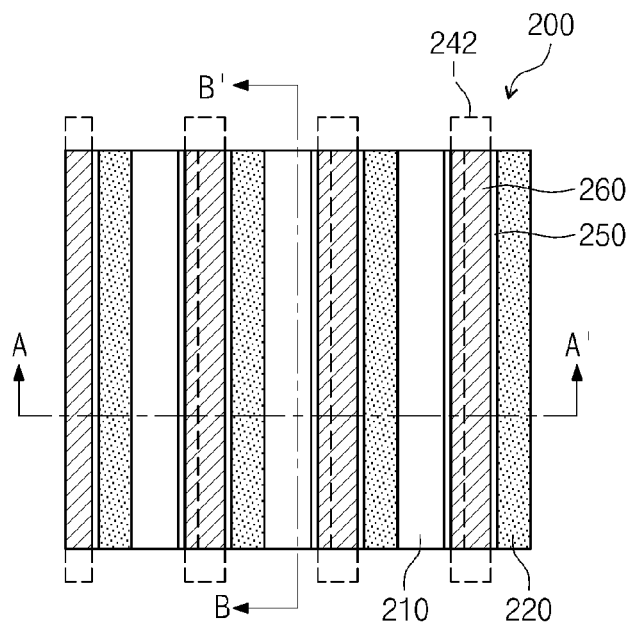
Figure 39B:
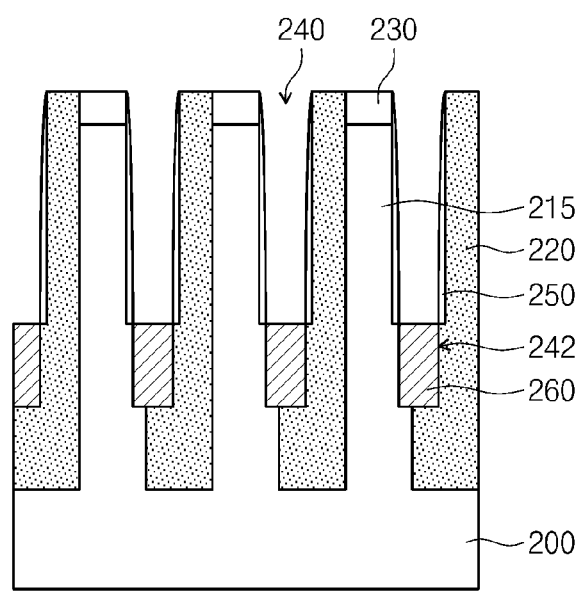
Figure 39C:
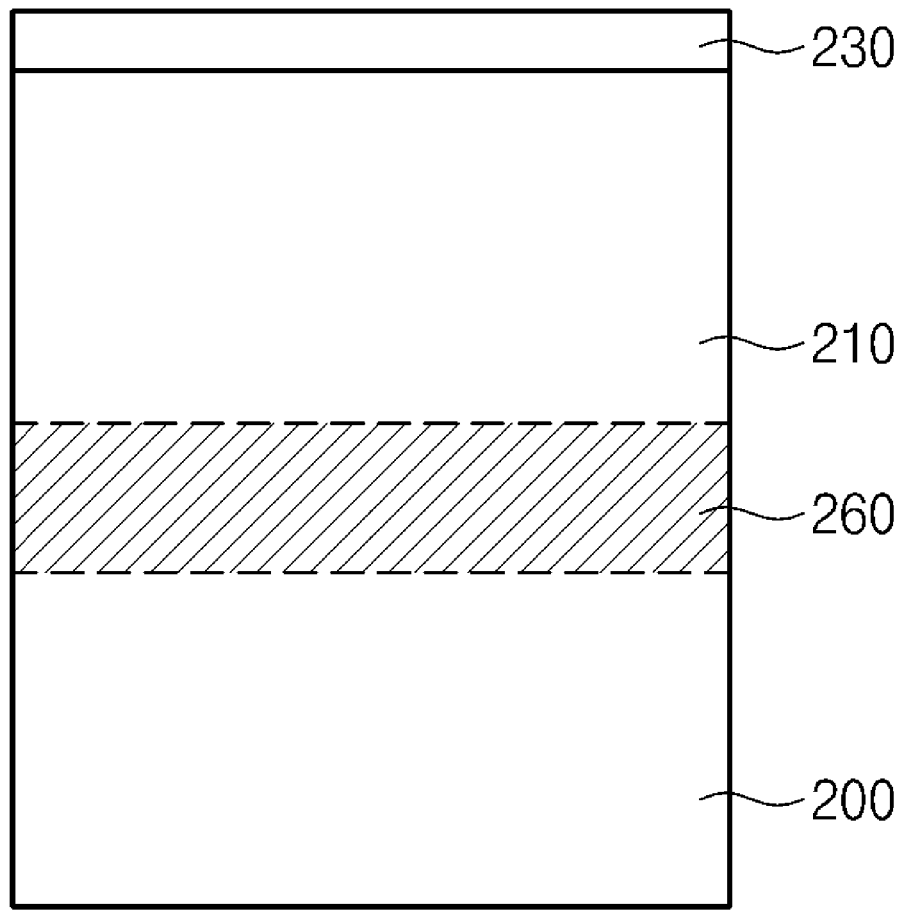

Referring to FIGS. 39A through 39C, the D-BBL pattern 242 is formed below the BBL pattern 240. The buried bit line 260 is formed by filling the D-BBL pattern 242 with metal. The buried bit line 260 may extend in the Y direction so as to be connected electrically to one side surface of the active bar 210.

Figure 40A:
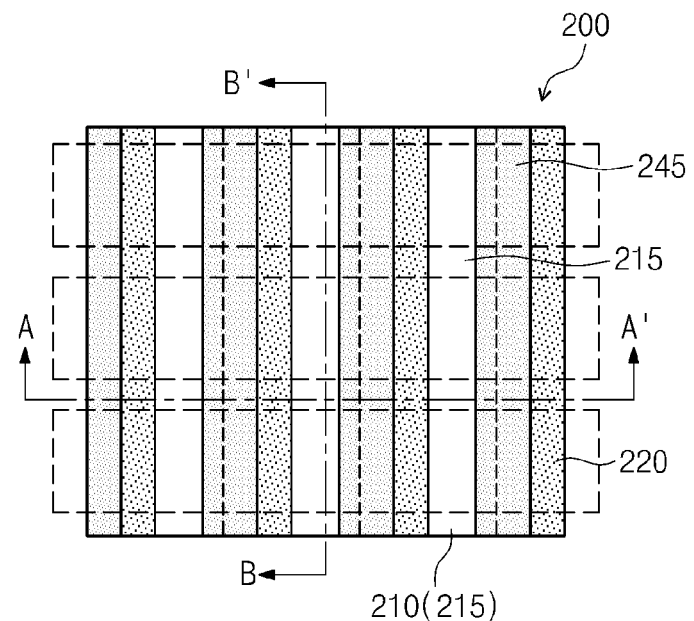
Figure 40B:
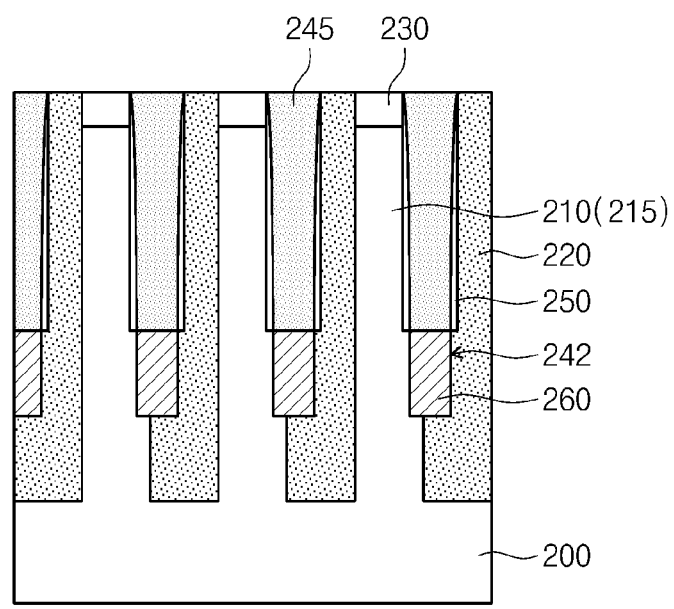
Figure 40C:
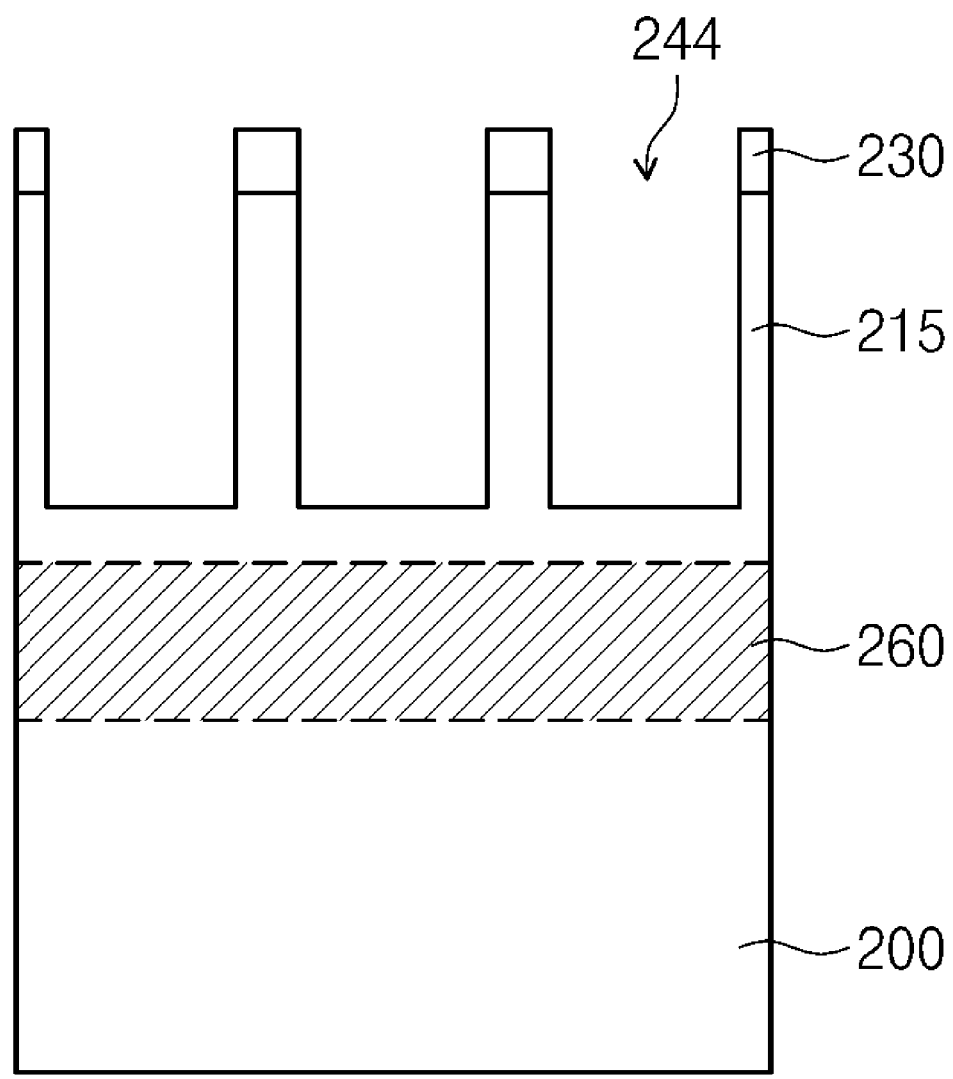

Referring to FIGS. 40A through 40C, the insulating pillar 245 is formed so as to protrude in the Z direction and extend in the Y direction by filling the BBL pattern 240 with a silicon nitride. Subsequently, the WL pattern 244 is formed so as to intersect the semiconductor substrate 200 in the X direction. The active bar 210 is isolated in the X direction by the WL pattern 244, and thus is realized as the vertical channel 215. The insulating pillar 245 is isolated in the X direction by the WL pattern 244, and thus is realized in the shape of an island. According to the embodiment of the inventive concept, there may be omitted the forming of the second insulating layer cutting the semiconductor substrate 200 in the X direction and isolating the active bar 210 from the insulating pillar 245 in the X direction.

Figure 41A:
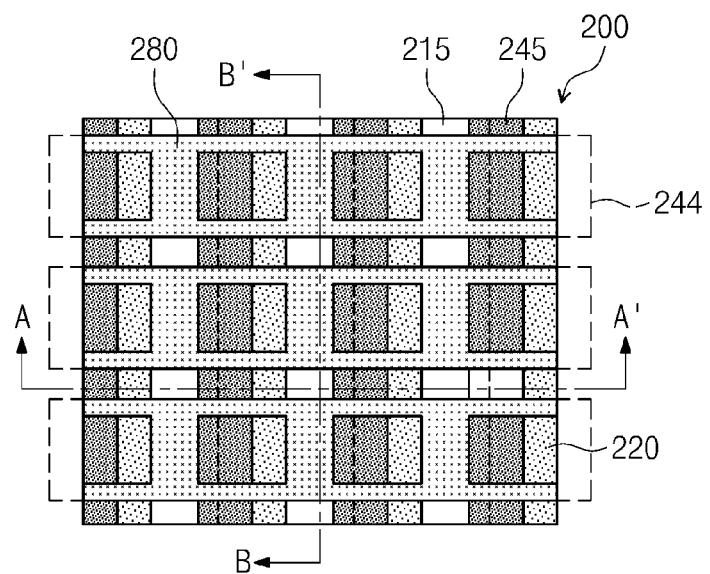
Figure 41B:
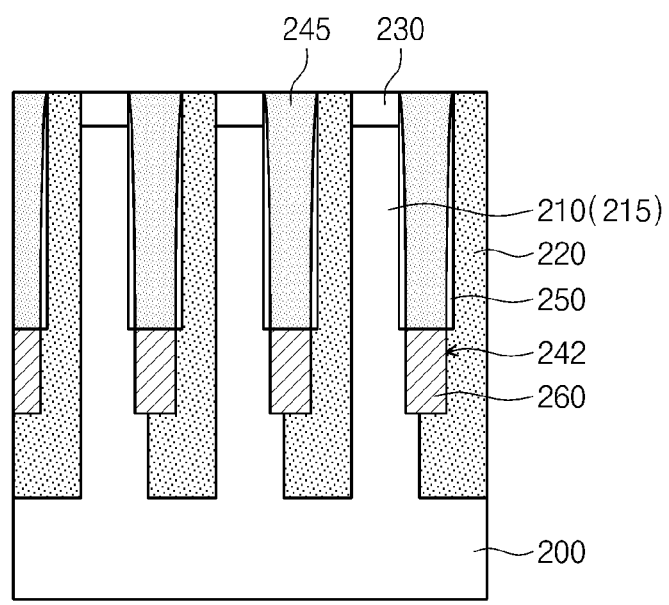
Figure 41C:
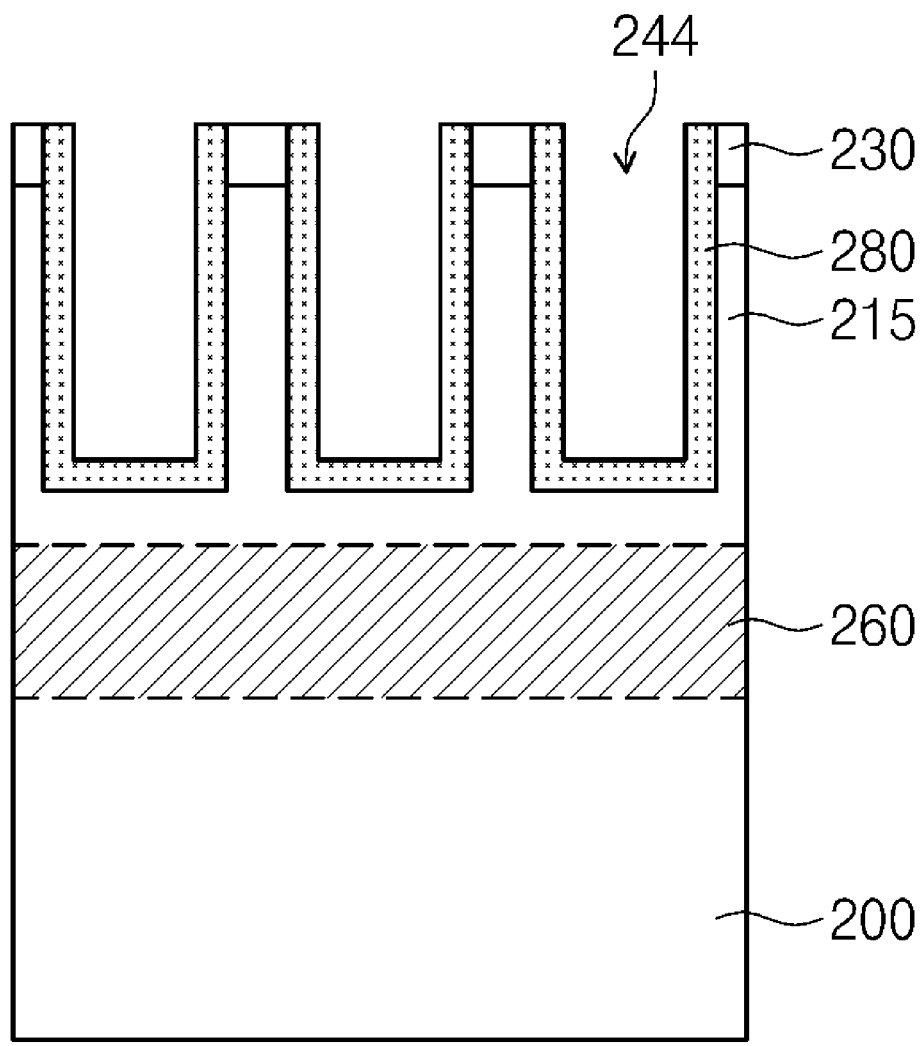

Referring to FIGS. 41A through 41C, the gate insulating layer 280 is formed in the inside surface of the WL pattern 244. The gate insulating layer 280 may be formed by depositing a silicon oxide layer using CVD, ALD, PVD, or the like. According to the embodiment of the inventive concept, the gate insulating layers 280 are formed on the both sidewalls of the vertical channel 215. As another example, the gate insulating layer 280 may be formed by thermal oxidation.

Figure 42A:
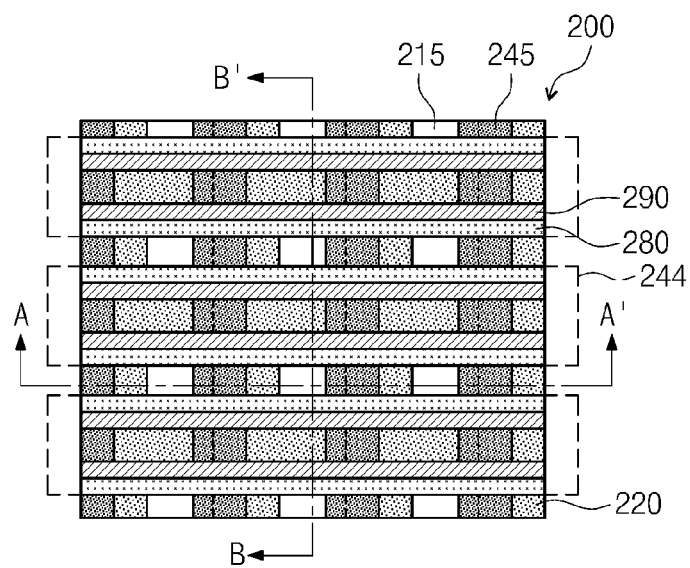
Figure 42B:
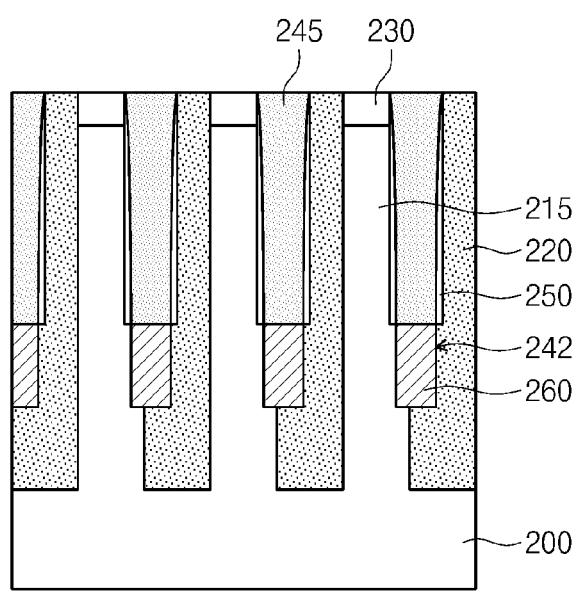
Figure 42C:
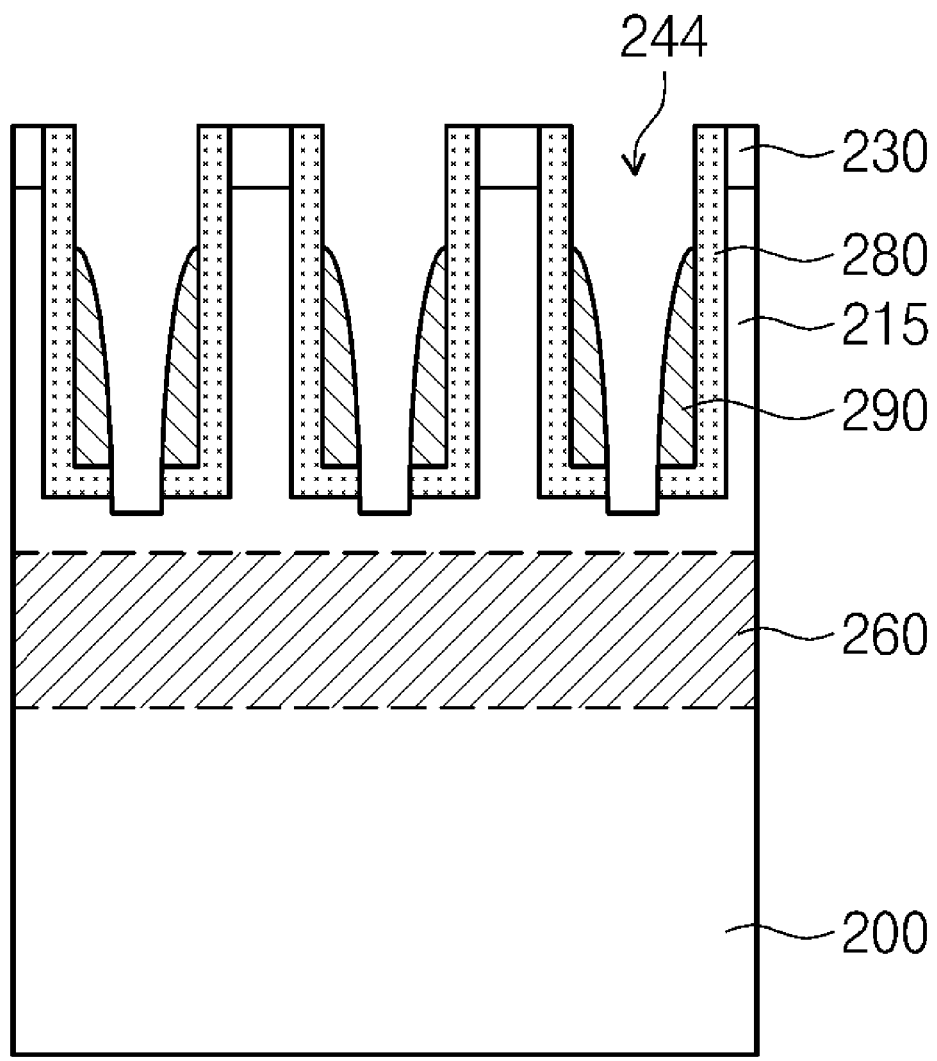

Referring to FIGS. 42A through 42C, the word lines 290 are formed in the WL pattern 244. The word lines 290 may be formed in the shape of a spacer on the both side surfaces of the vertical channel 215 by the deposition of a metal layer and etch-back. In the etch-back, the gate insulating layer 280 between the word lines 290 may be recessed. According to the embodiment of the inventive concept, the gate insulating layer 280 and the word lines 290 may be formed along the both side surfaces of the vertical channel 215 so as to extend in the X direction. The gate insulating layer 280 may be formed restrictively on the both side surfaces of the vertical channel 215 by thermal oxidation, as illustrated in FIGS. 36A through 36C.

Figure 43A:
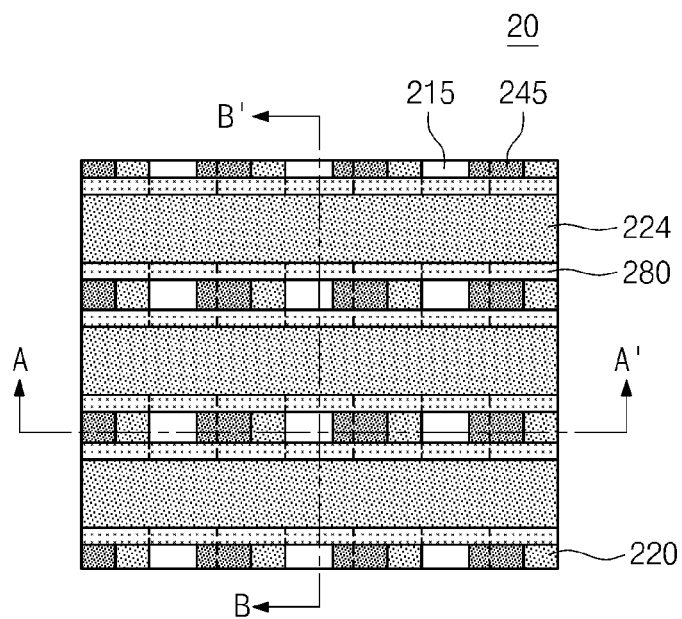
Figure 43B:
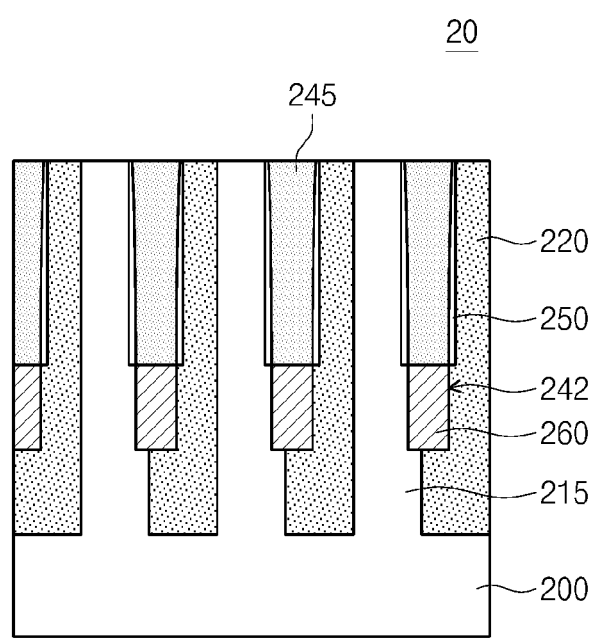
Figure 43C:
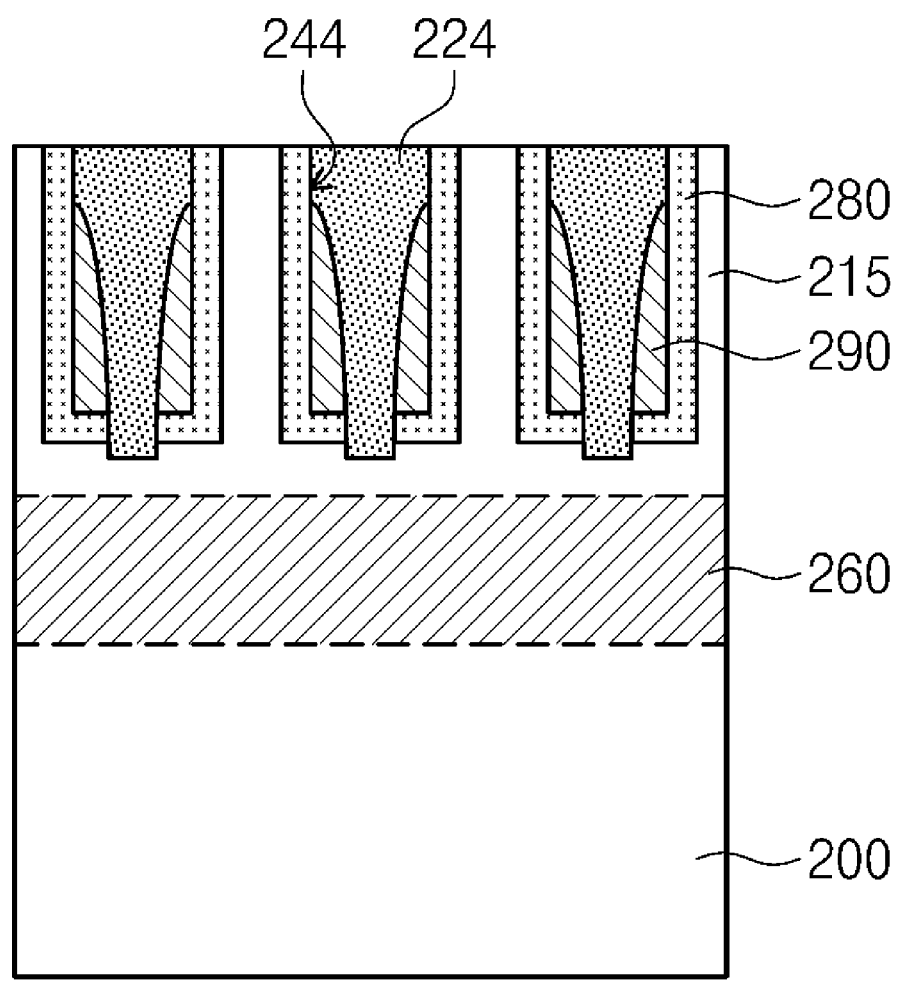

Referring to FIGS. 43A through 43C, the WL pattern 224 is filled with the third insulating layer 224, and then the hard mask 230 is removed by etch-back, CMP, or the like. According to the above-described series of steps, the active bar 210 is formed by the Y cutting, the buried bit line 260 is formed in the Y direction, the active bar 210 is isolated by the X cutting, the vertical channel 215 is formed in the Z direction, and then the word lines 290 are formed in the X direction on the both side surfaces of the vertical channel 215. In this way, it is possible to realize the vertical channel transistor 20 with the two-channel structure illustrate in FIG. 30A.

Figure 44A:
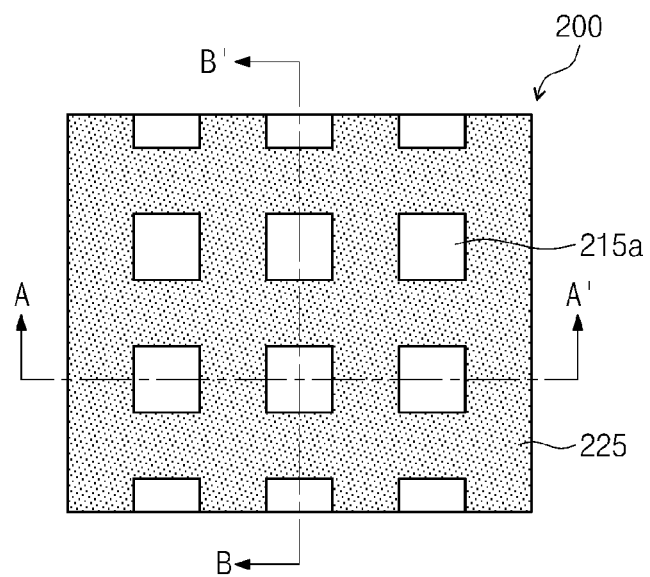
FIGS. 44A, 45A, 46A, 47A, 48A, and 49A are plan views illustrating a method of fabricating a vertical channel transistor according to still another embodiment of the inventive concept.
Figure 44B:
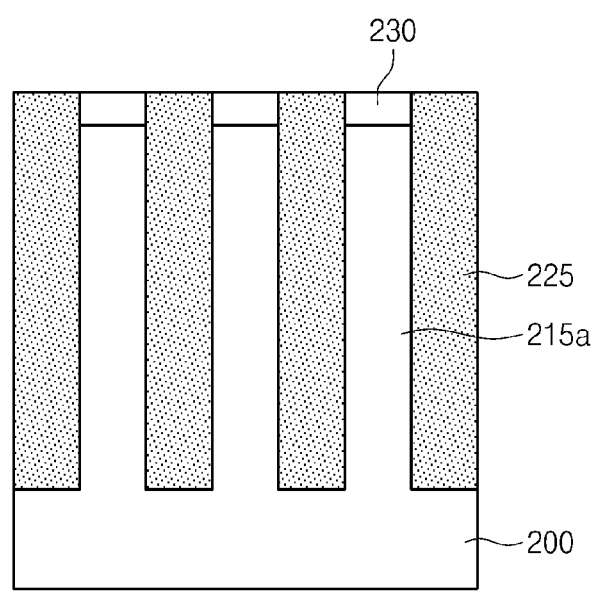
FIGS. 44B, 45B, 46B, 47B, 48B, and 49B are cross-sectional views taken along the line A-A' of FIGS. 44A, 45A, 46A, 47A, 48A, and 49A, respectively.
Figure 44C:
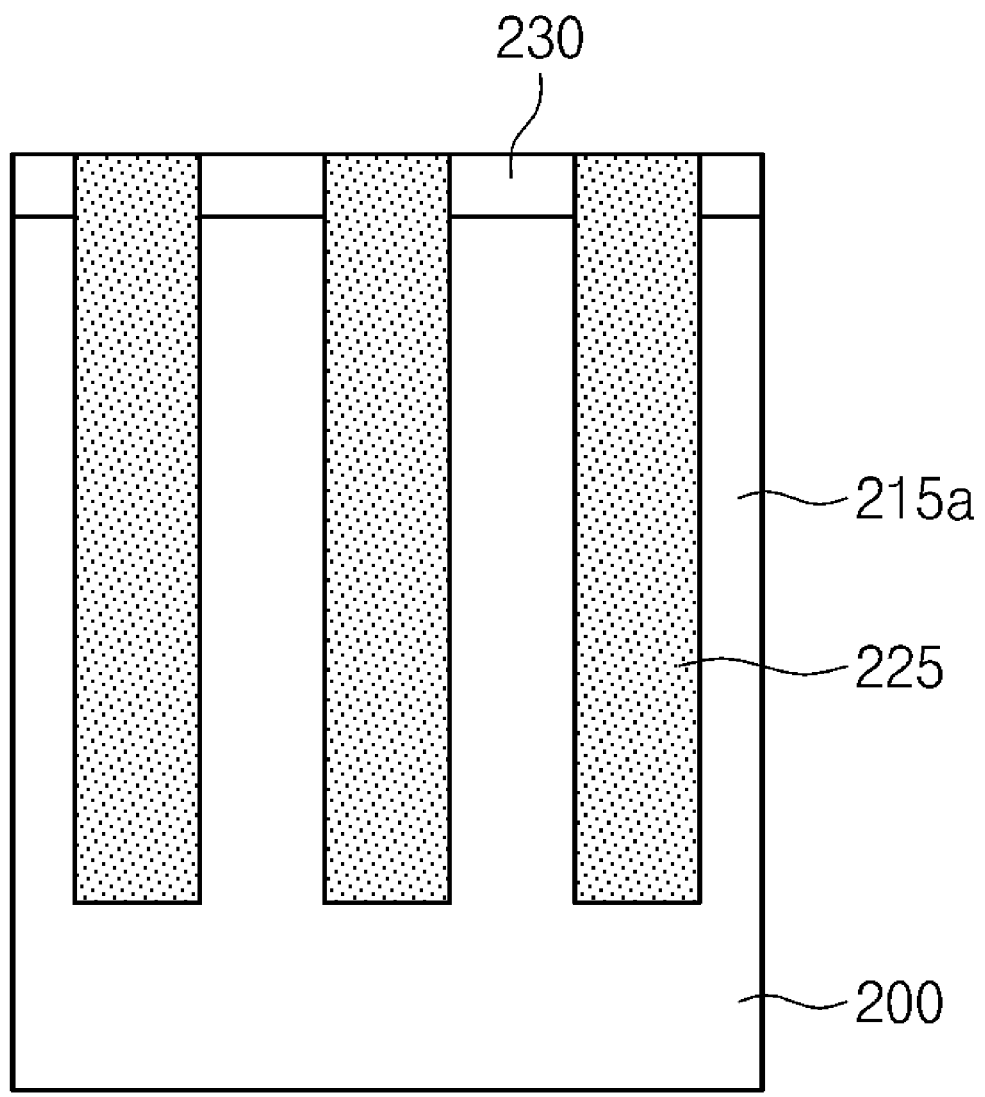
FIGS. 44C, 45C, 46C, 47C, 48C, and 49C are cross-sectional views taken along the line B-B' of FIGS. 44A, 45A, 46A, 47A, 48A, and 49A, respectively.

Still Another Example of Method of fabricating Vertical Channel Transistor with Two-Channel Structure FIGS. 44A, 45A, 46A, 47A, 48A, and 49A are plan views illustrating a method of fabricating the vertical channel transistor with the two-channel structure according to still another embodiment of the inventive concept. FIGS. 44B, 45B, 46B, 47B, 48B, and 49B are cross-sectional views taken along the line A-A' of FIGS. 44A, 45A, 46A, 47A, 48A, and 49A, respectively. FIGS. 44C, 45C, 46C, 47C, 48C, and 49C are cross-sectional views taken along the line B-B' of FIGS. 44A, 45A, 46A, 47A, 48A, and 49A, respectively. To simplify this description, description of elements described in detail above will not be repeated. Referring to FIGS. 44A through 44C, the vertical channel 215a isolated by the device-isolating layer 225 is formed by simultaneously performing both the X cutting and the Y cutting. For example, the hard mask 230 with an island shape is formed on the semiconductor substrate 200. By removing the hard mask 230 the semiconductor substrate 200 by dry etching, the vertical channel 215a may be formed in the shape of a pillar protruding in the Z direction.

Figure 45A:
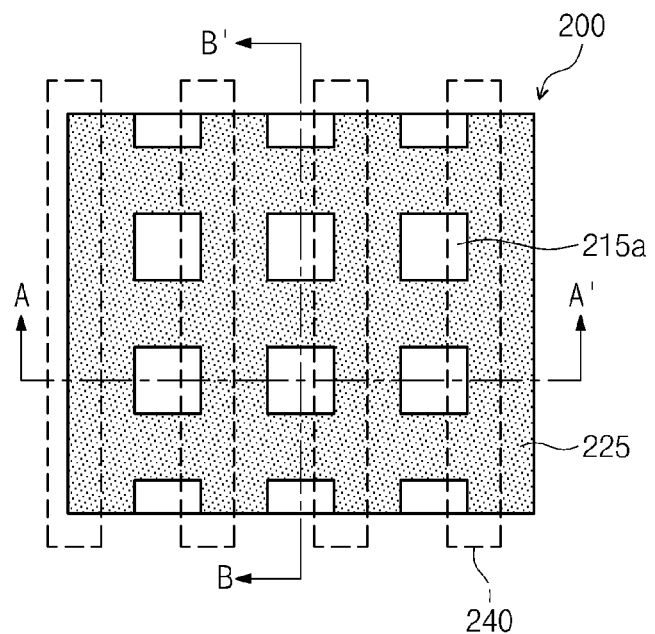
Figure 45B:
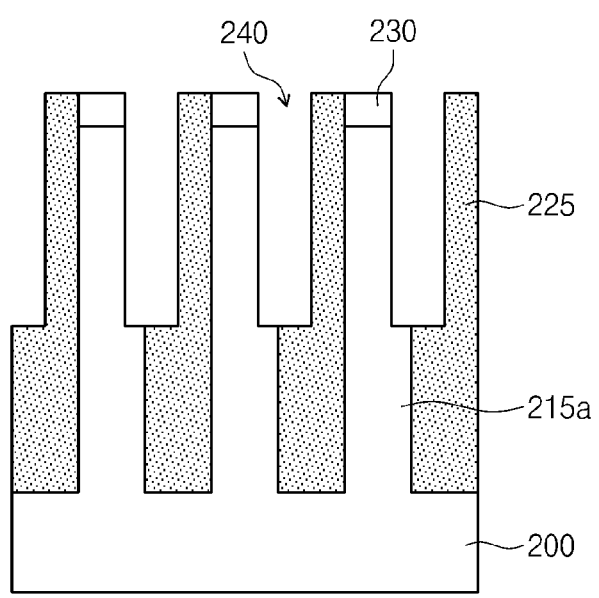
Figure 45C:
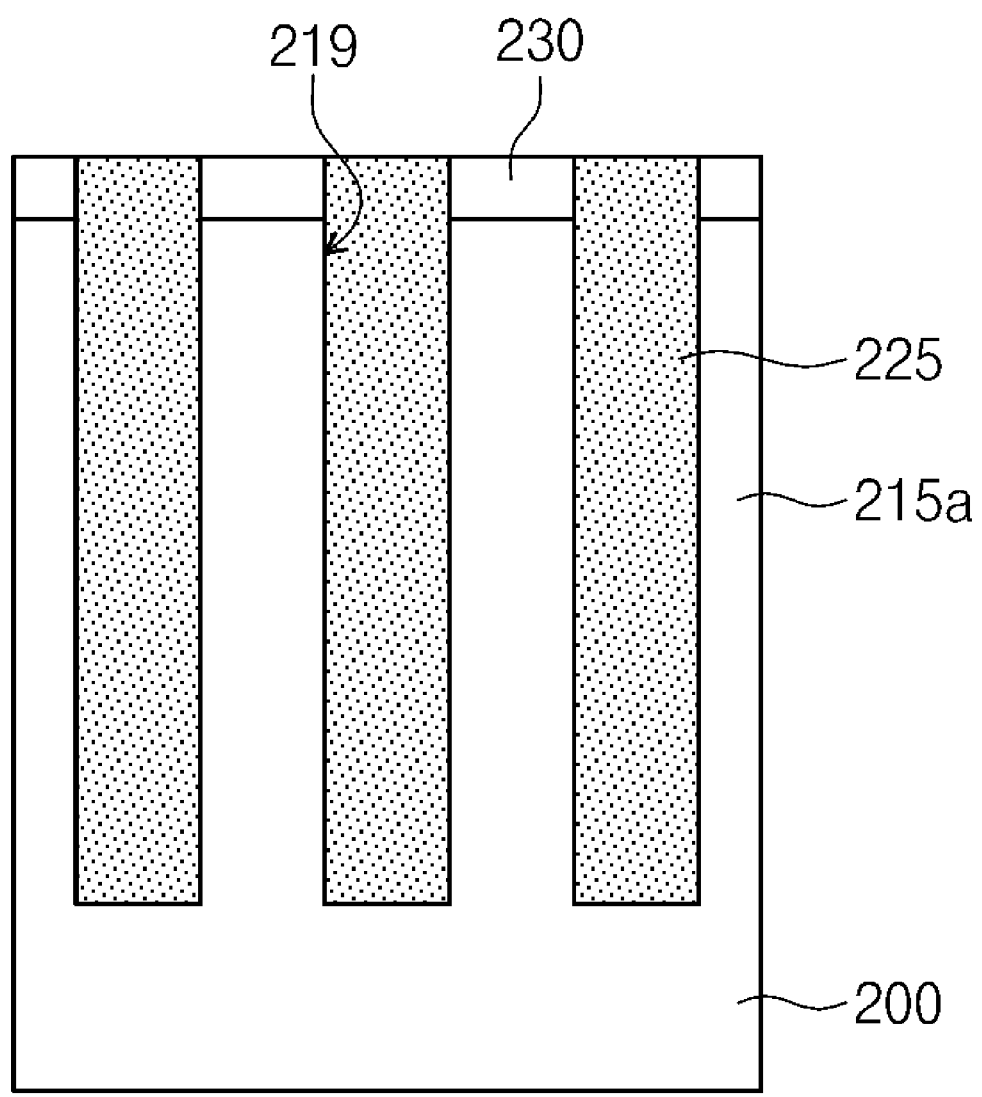

Referring to FIGS. 45A through 45C, the BBL pattern 240 is formed so as to cut the device-isolating layer 225 in the Y direction and to be offset with one side surface of the vertical channel 215a. A part of the offset one side surface of the vertical channel 215a may be removed, when the BBL pattern 240 is formed.

Figure 46A:
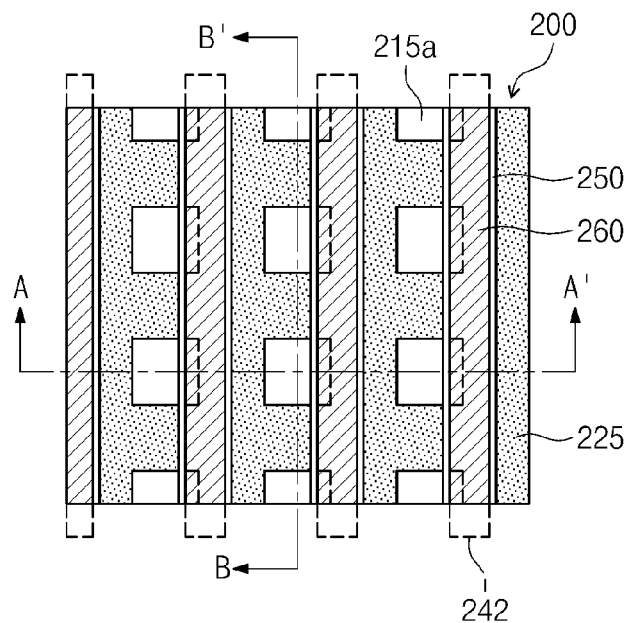
Figure 46B:
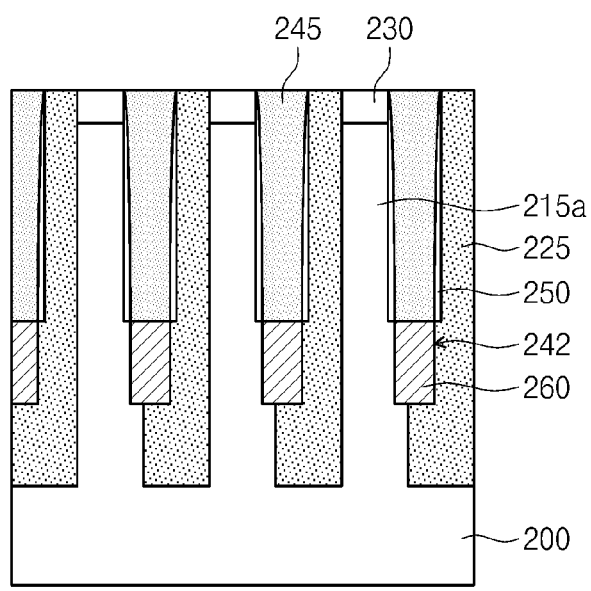
Figure 46C:
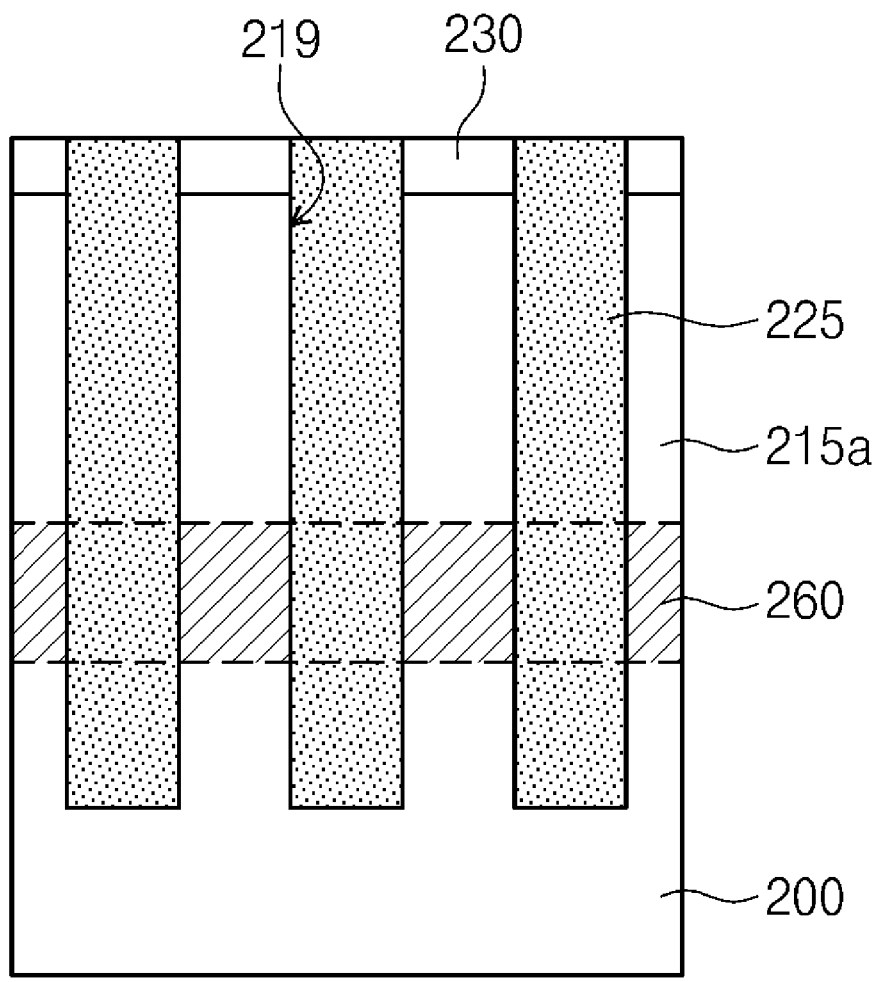

Referring to FIGS. 46A through 46C, the D-BBL pattern 242 is formed below the BBL pattern 240. The D-BBL pattern 242 may be formed by removing the vertical channel 215a exposed by the BBL pattern 240 by etching having selectivity or no selectivity to the device-isolating layer 225. The liner 250 protects the vertical channel 215a in the etching. In the D-BBL pattern 242, the buried bit line 260 is formed with metal or polysilicon containing metal, for example.

Figure 47A:
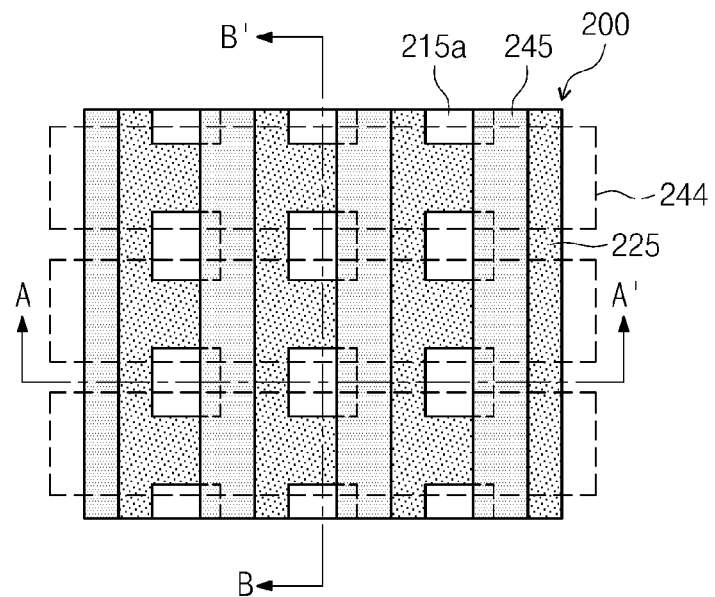
Figure 47B:
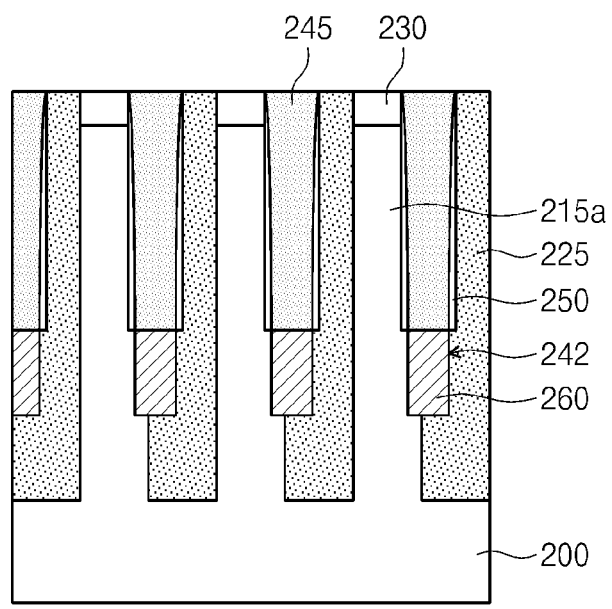
Figure 47C:
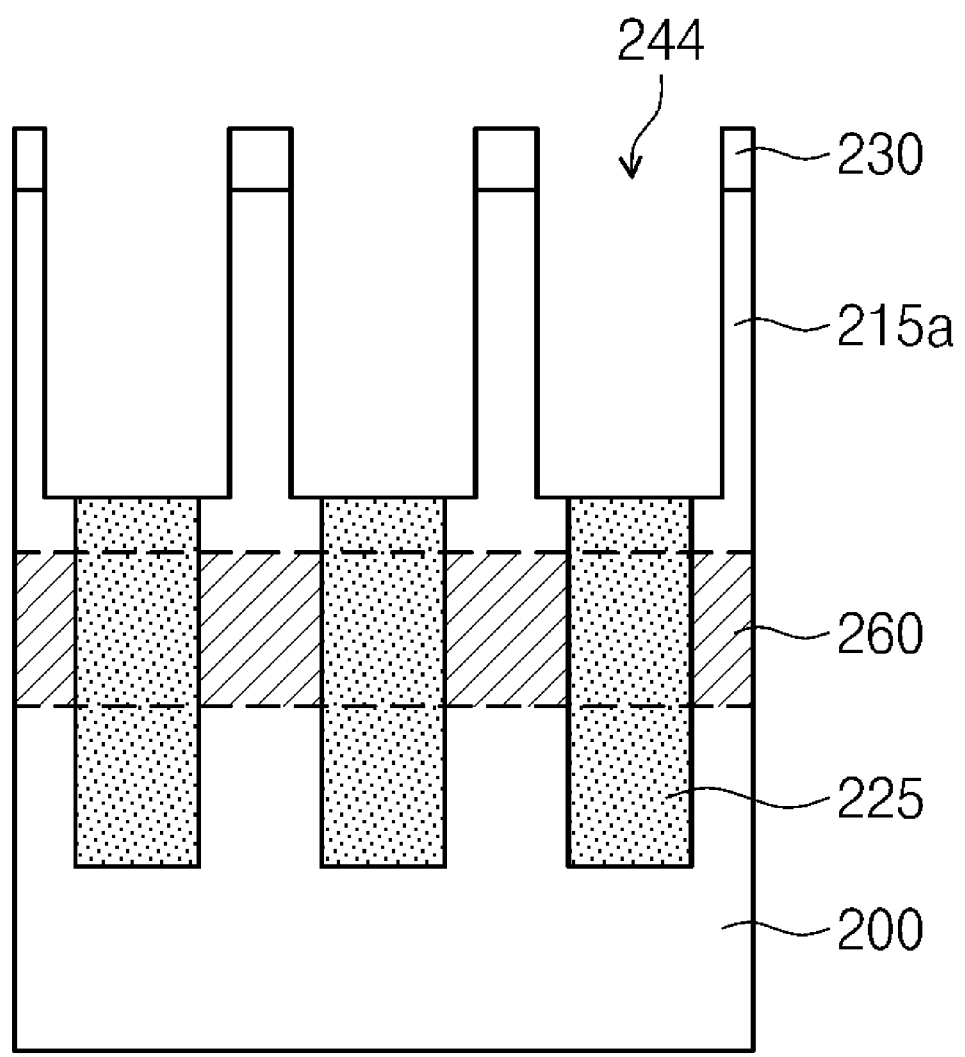

Referring to FIGS. 47A through 47C, the insulating pillar 245 is formed by filling the BBL pattern 240 with a silicon nitride layer. The WL pattern 244 is formed so as to cut the device-isolating layer 225 in the X direction and to be offset with the both side surfaces of the vertical channel 215a. When the WL pattern 244 is formed, the both side surfaces of the vertical channel 215a offset with the WL pattern 244 may be removed. The insulating pillar 245 is cut in the X direction by the WL pattern 244, and thus is realized in the shape of an island.

Figure 48A:
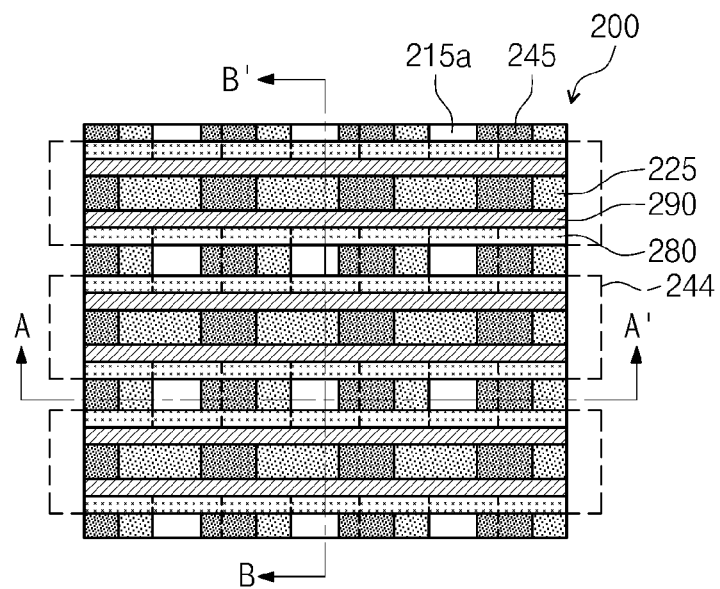
Figure 48B:
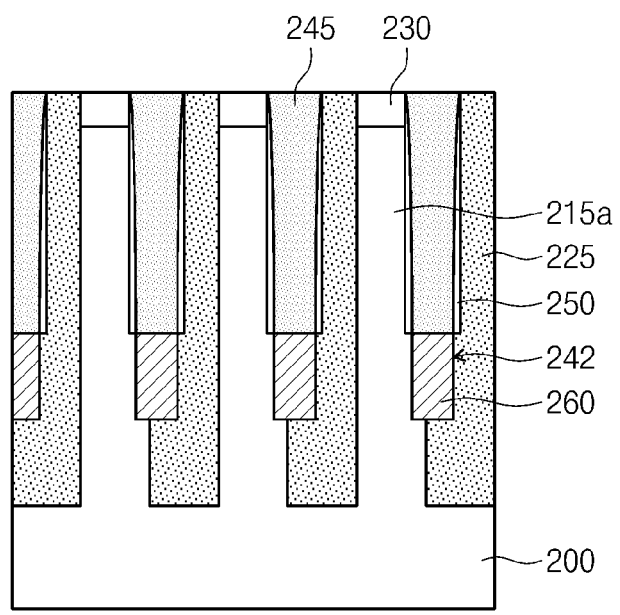
Figure 48C:
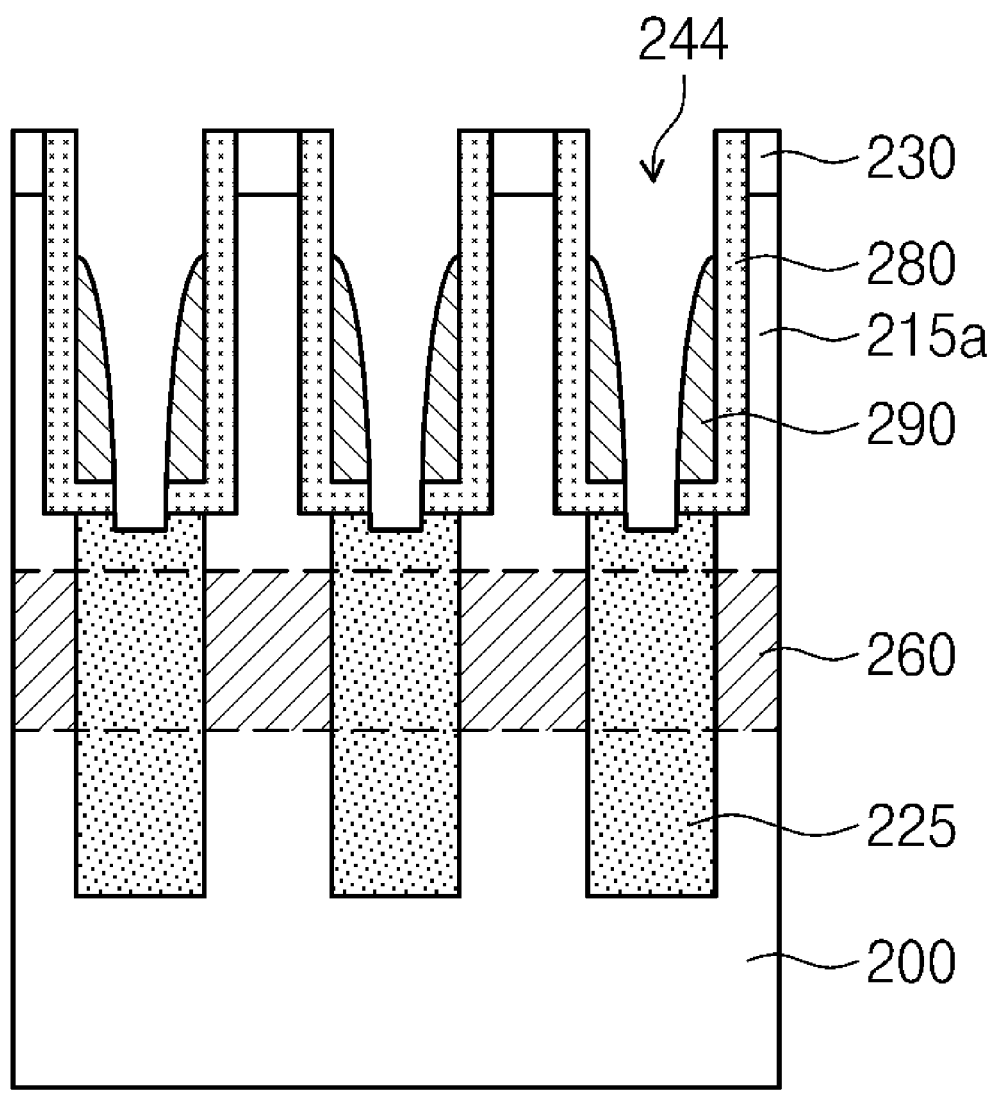

Referring to FIGS. 48A through 48C, the gate insulating layers 280 and the word lines 290 are formed on the inside surface of the WL pattern 244. The gate insulating layers 280 and the word lines 290 are formed on the both side surface of the vertical channel 215a. Therefore, the both side surfaces of the vertical channel 215a may be utilized channels. The gate insulating layers 280 may be formed by deposition of an insulating material layer or thermal oxidation of the vertical channel 215a. The word lines 290 may be formed by position of metal layer.

Figure 49A:
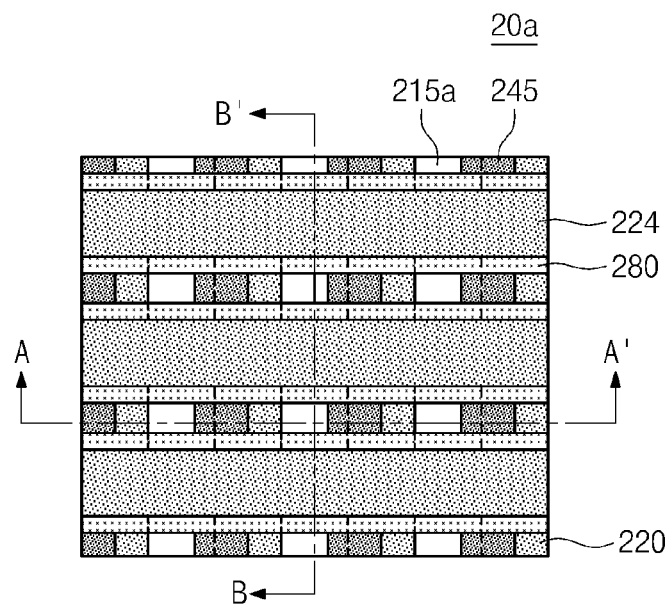
Figure 49B:
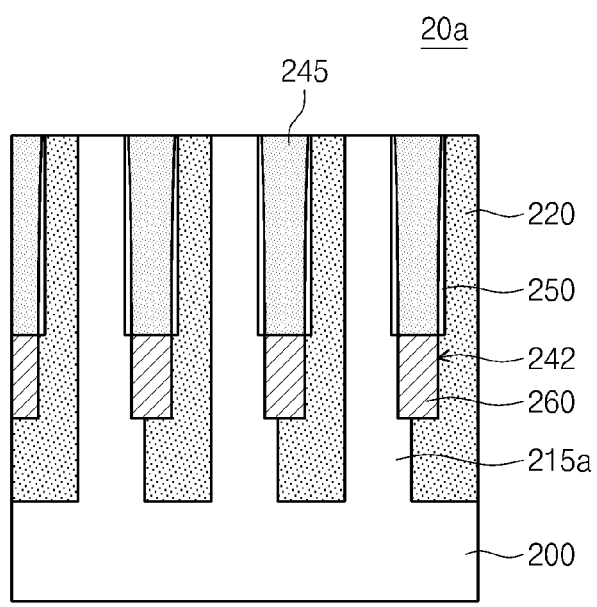
Figure 49C:
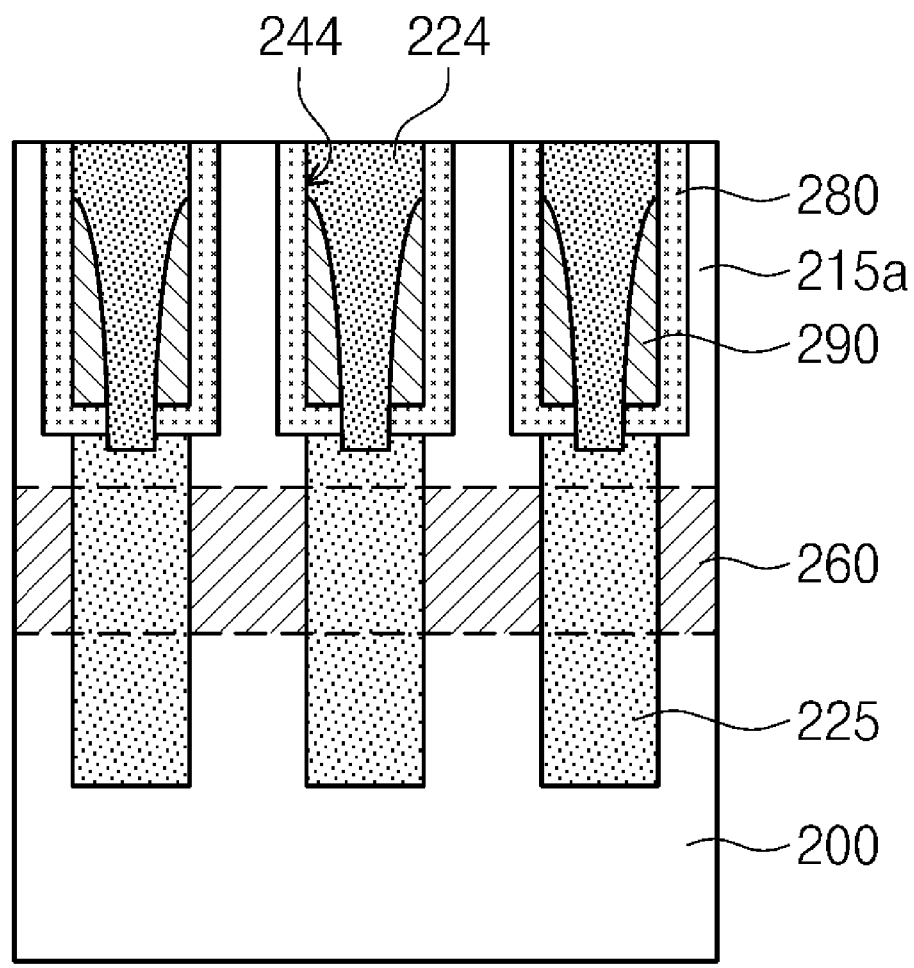

Referring to FIGS. 49A through 49C, the WL pattern 244 is filled with the insulating, and then the hard mask 230 is removed. According to the above-described series of steps, the vertical channel 215a protruding in the Z direction is formed on the semiconductor substrate 200 by simultaneously performing the X cutting and the Y cutting, the buried bit line 260 is formed in the Y direction, and then the word line 290 is formed on the both side surfaces of the vertical channel 215a so as to extend in the X direction. In this way, it is possible to realize the vertical channel transistor 20a with the two-channel structure illustrated in FIG. 30B.

Vertical Channel Transistor with Three-Channel Structure

Figure 50A:
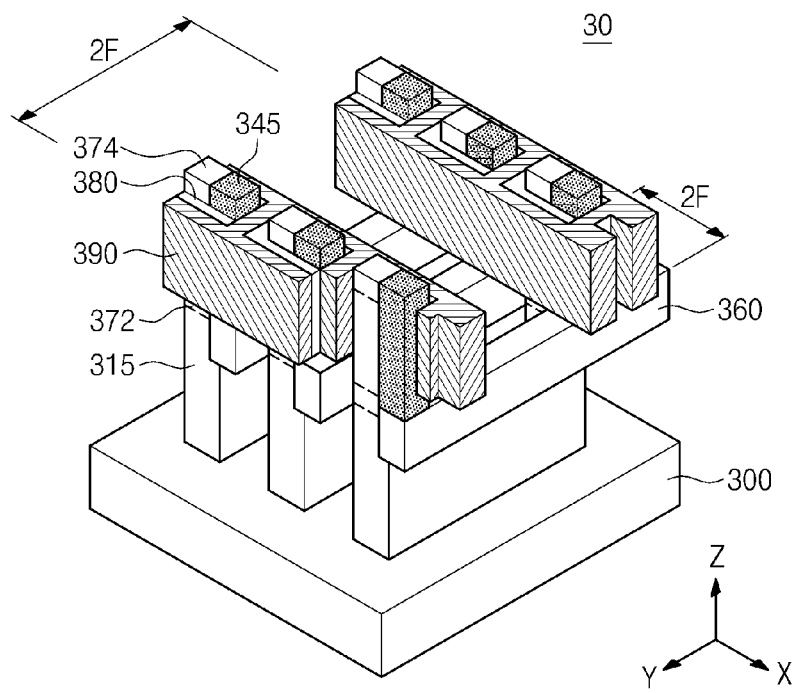
FIG. 50A is a perspective view illustrating a vertical channel transistor according to still another embodiment of the inventive concept.
Figure 50B:
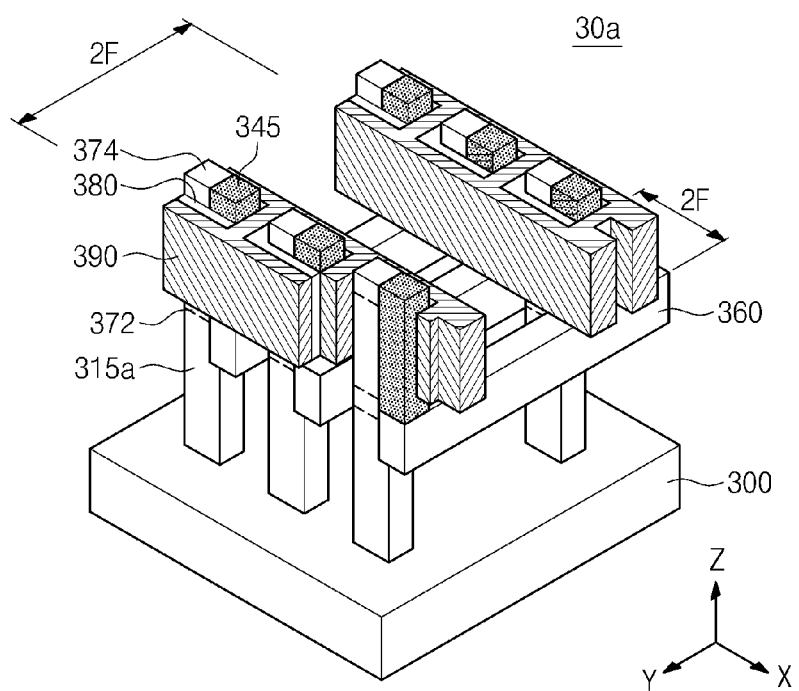
FIG. 50B is a perspective view illustrating a vertical channel transistor according to another embodiment of the inventive concept, which is a modification of the embodiment of FIG. 50A.

FIG. 50A is a perspective view illustrating a vertical channel transistor according to still another embodiment of the inventive concept. FIG. 50B is a perspective view illustrating a vertical channel transistor according to another embodiment of the inventive concept, which is a modification of the embodiment of FIG. 50A.

Referring to FIG. 50A, a vertical channel transistor 30 may include a vertical channel 315 protruding in the Z direction from a semiconductor substrate 300, a word line 390 extending in the X direction, and a bit line 360 extending in the Y direction. The bit line 360 may be formed in a buried form at a position lower than the word line 390. In the vertical channel 315, portions corresponding to the lower portions of the bit line 360 may be a structure protruded in the Z direction by a pillar having a substantially tetragonal cross-section on a line connected to each other in the Y direction. A gate insulating layer 380 may be interposed between the word line 390 and the vertical channel 315. In the vertical channel 315, a lower junction region 372 may be formed at the position corresponding to a lower portion of the word line 390. Moreover, an upper junction region 374 may be formed at the position corresponding to an upper portion of the word line 390. An insulating pillar 345 formed with an insulating may be disposed on a side surface of the vertical channel 315.

The gate insulating layer 380 may have a ladder shape extending in the X direction. The word line 390 may have a ladder shape extending in the X direction. According to the embodiment of the inventive concept, the word lines 390 come into contact with three side surfaces of the vertical channel 315 with the gate insulating layer 380 interposed therebetween. That is, the vertical channel transistor 30 has a three-channel structure in which three side surfaces among four side surfaces of the vertical channel 315 are utilized as channels. With such a configuration, it is possible to improve a current driving capability of the vertical channel transistor 30. In the vertical channel transistor 30 according to the embodiment of the inventive concept, the area of one cell is $4F^2$.

Referring to FIG. 50B, a vertical channel transistor 30a according to a modified example may be nearly similar to the vertical channel transistor 30 in FIG. 50A. Unlike the vertical channel transistor in FIG. 50A, however, the vertical channel transistor 30a may include a vertical channel 315a protruding in the Z direction from the semiconductor substrate 300 and having a substantially tetragonal cross-section.

Figure 51A:
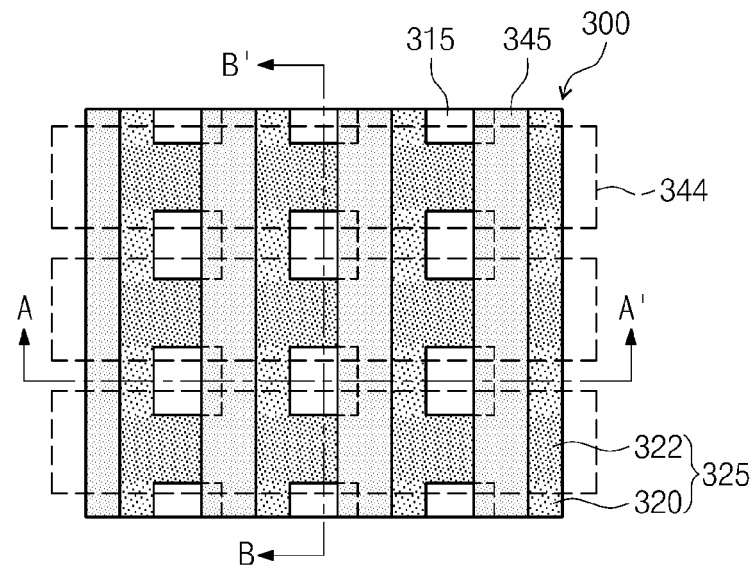
FIGS. 51A, 52A, 53A, 54A, and 55A are plan views illustrating a method of fabricating a vertical channel transistor according to still another embodiment of the inventive concept.
Figure 51B:
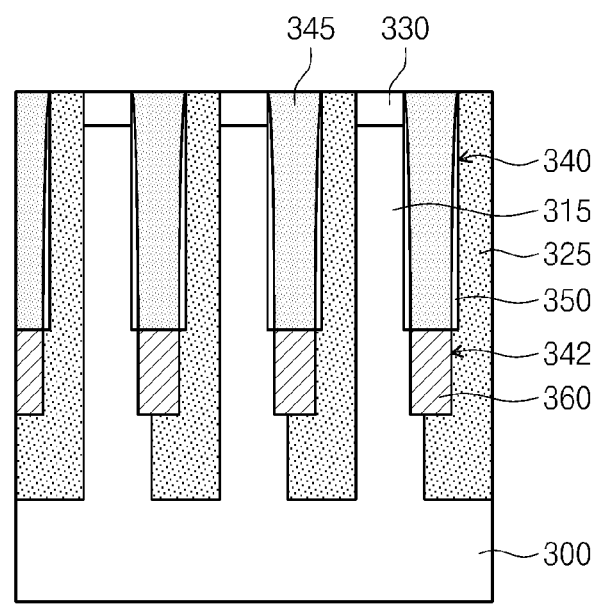
FIGS. 51B, 52B, 53B, 54B, and 55B are cross-sectional views taken along the line A-A' of FIGS. 51A, 52A, 53A, 54A, and 55A, respectively.
Figure 51C:
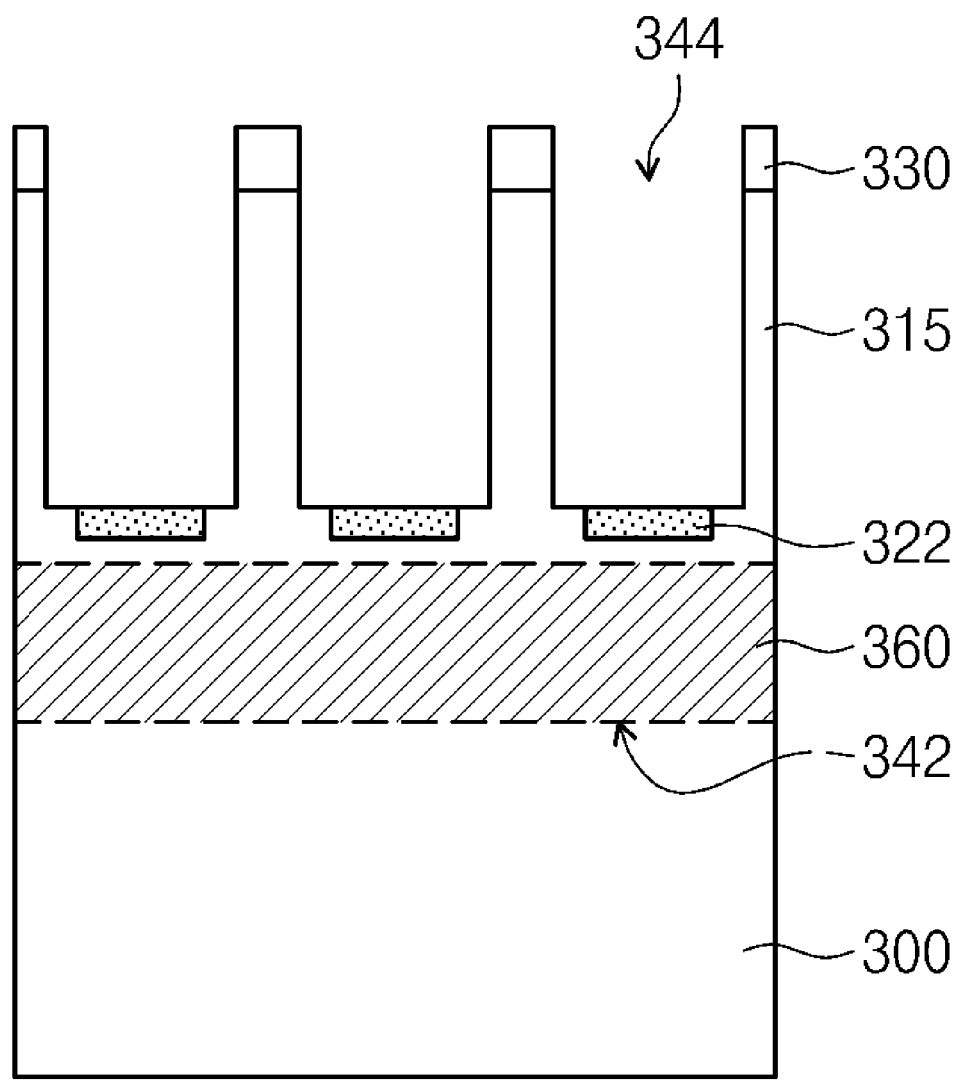
FIGS. 51C, 52C, 53C, 54C, and 55C are cross-sectional views taken along the line B-B' of FIGS. 51A, 52A, 53A, 54A, and 55A, respectively.

Example of Method of fabricating Vertical Channel Transistor with Three-Channel Structure FIGS. 51A, 52A, 53A, 54A, and 55A are plan views illustrating a method of fabricating the vertical channel transistor with the three-channel structure according to still another embodiment of the inventive concept. FIGS. 51B, 52B, 53B, 54B, and 55B are cross-sectional views taken along the line A-A' of FIGS. 51A, 52A, 53A, 54A, and 55A, respectively. FIGS. 51C, 52C, 53C, 54C, and 55C are cross-sectional views taken along the line B-B' of FIGS. 51A, 52A, 53A, 54A, and 55A, respectively. To simplify this description, description of elements described in detail above will not be repeated. Referring to FIGS. 51A through 51C, the active bar is formed in the Y cutting, and the active bar is isolated in the X cutting to form the vertical channel 315. The vertical channel 315 is isolated electrically by a device-isolating layer 325. The device-isolating layer 325 includes a first insulating layer 320 and a second insulating layer 322. A BBL pattern 340 is formed so as to extend in the X direction and is offset with the both side surfaces of the vertical channel 315. A D-BBL pattern 342 is formed below the BBL pattern 340. A buried bit line 360 is formed in the D-BBL pattern 342. The insulating pillar 345 is formed in the BBL pattern 340. The WL pattern 344 is formed so as to cut the device-isolating layer 325 in the X direction and to be offset with the both side surfaces of the vertical channel 315.

Figure 52A:
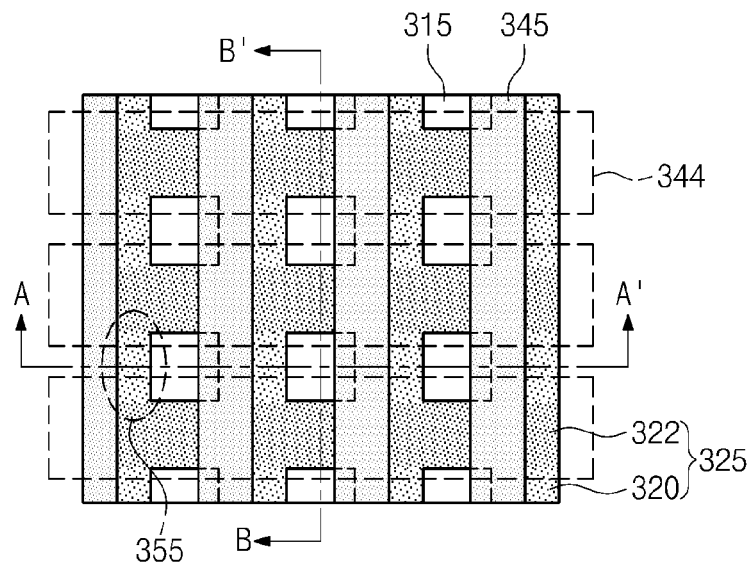
Figure 52B:
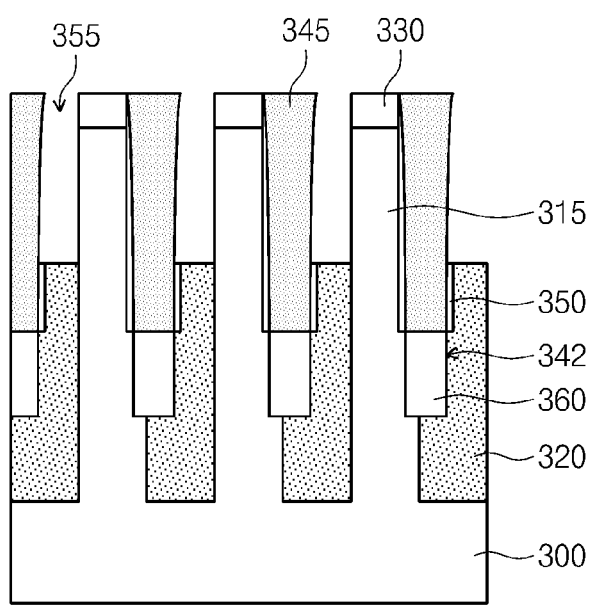
Figure 52C:
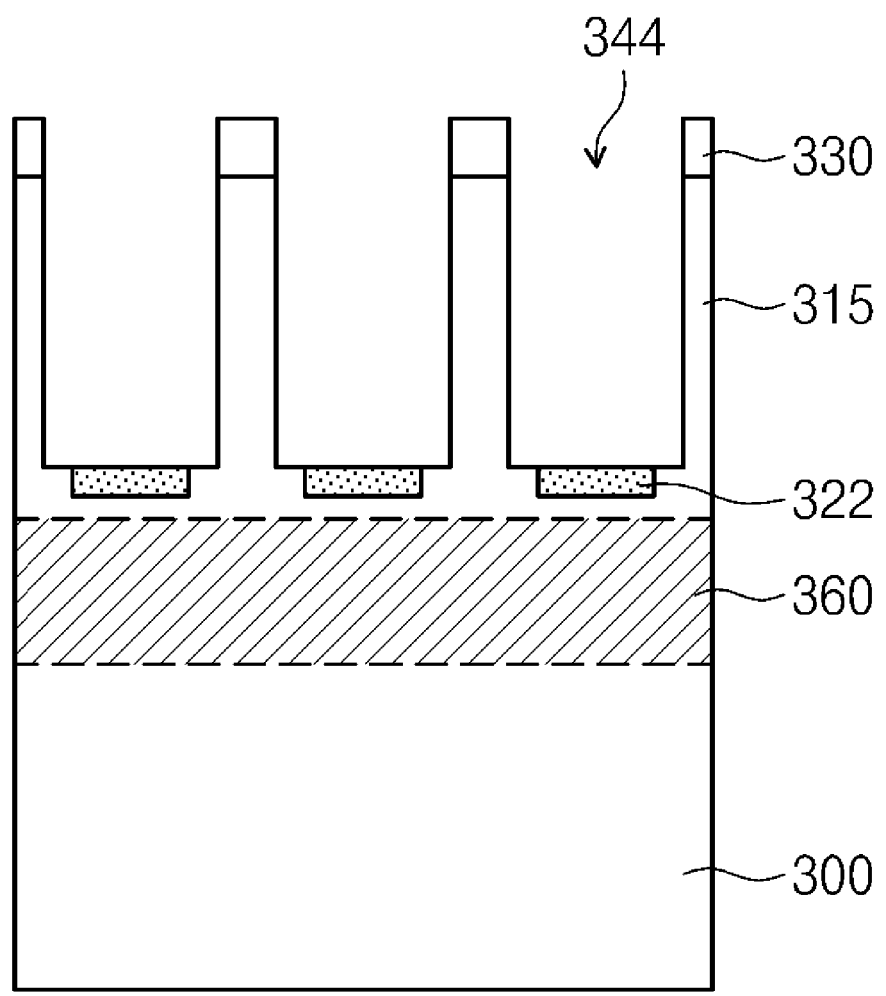

Referring to FIGS. 52A through 52C, a liner 350 and the first insulating layer 320 between the vertical channel 315 and the insulating pillar 345 are removed by a cleaning step after the WL pattern 344 is formed. Alternatively, the liner 350 and the first insulating layer 320 between the vertical channel 315 and the insulating pillar 345 may be removed by wet etching. In this way, a recess pattern 355 may be formed between the vertical channel 315 and the insulating pillar 345.

Figure 53A:
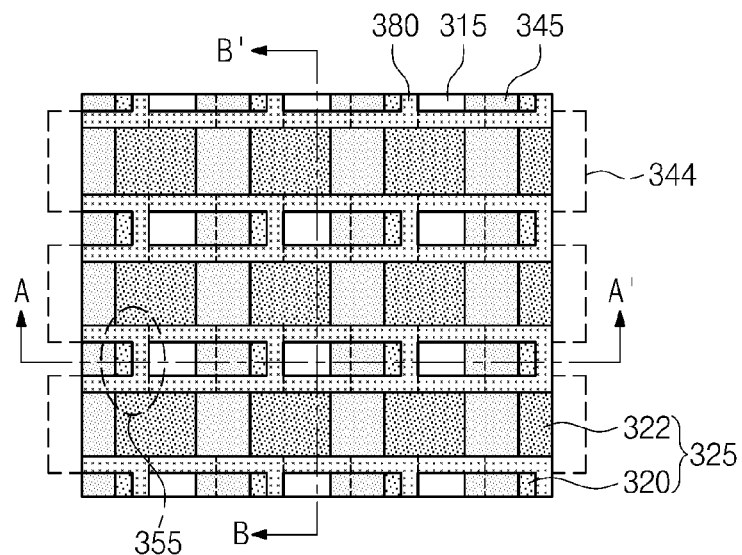
Figure 53B:
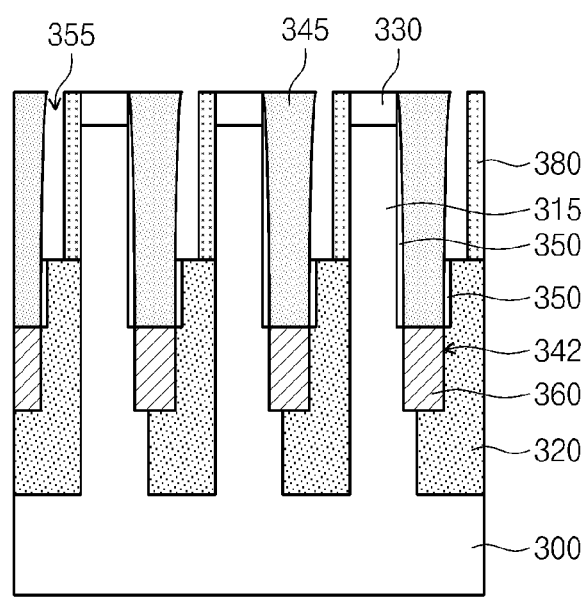
Figure 53C:
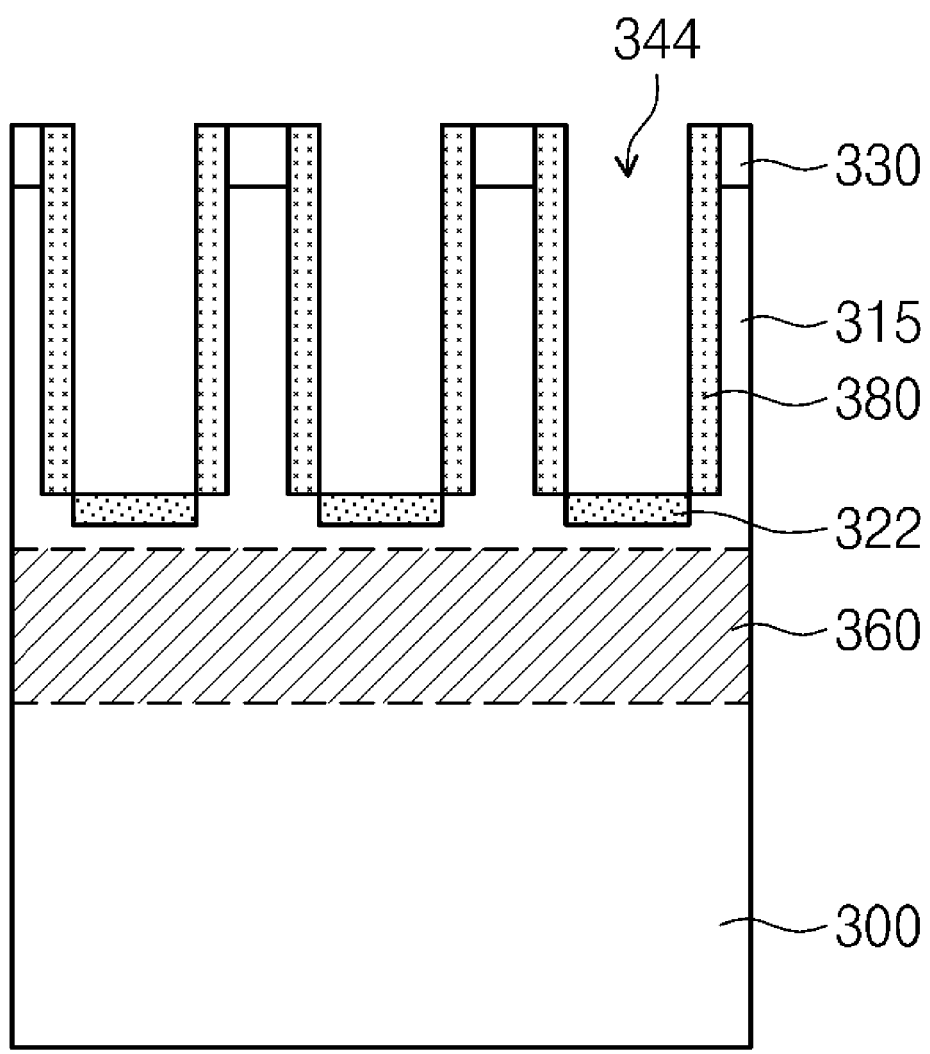

Referring to FIGS. 53A through 53C, the gate insulating layer 380 is formed in the WL pattern 344 and the recess pattern 355 by deposition or thermal oxidation. According to the embodiment of the inventive concept, since the gate insulating layer 380 is also formed in the recess pattern 355, the gate insulating layer 380 may have a ladder shape coming into contact with three side surfaces of the vertical channel 315.

Figure 54A:
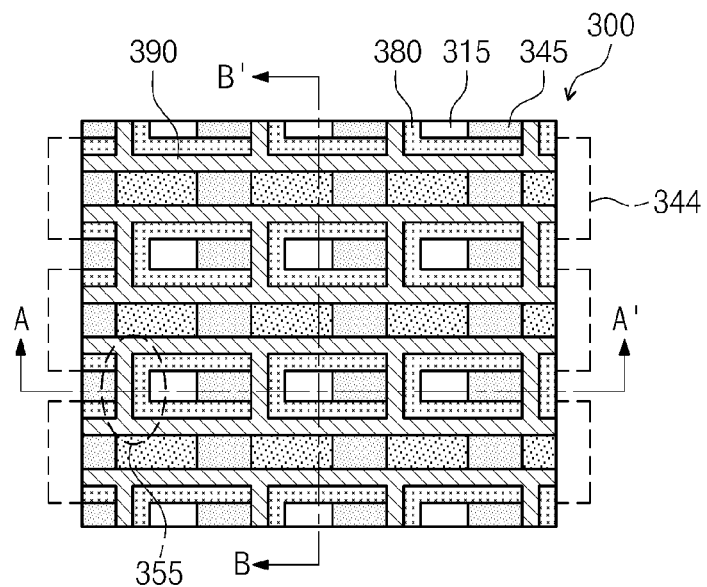
Figure 54B:
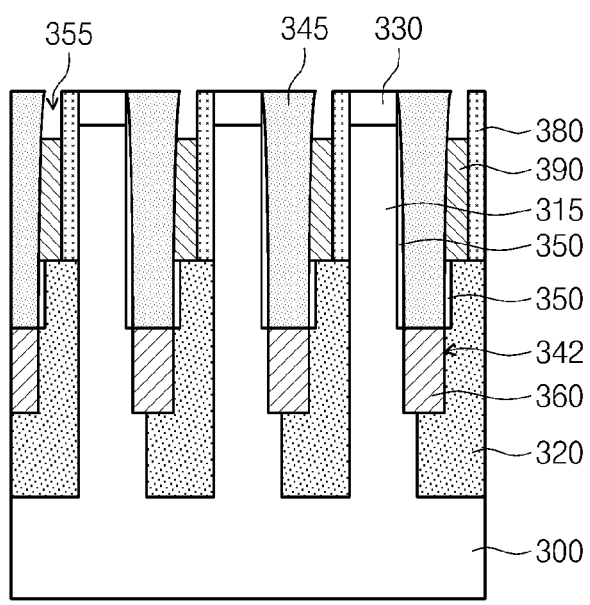
Figure 54C:
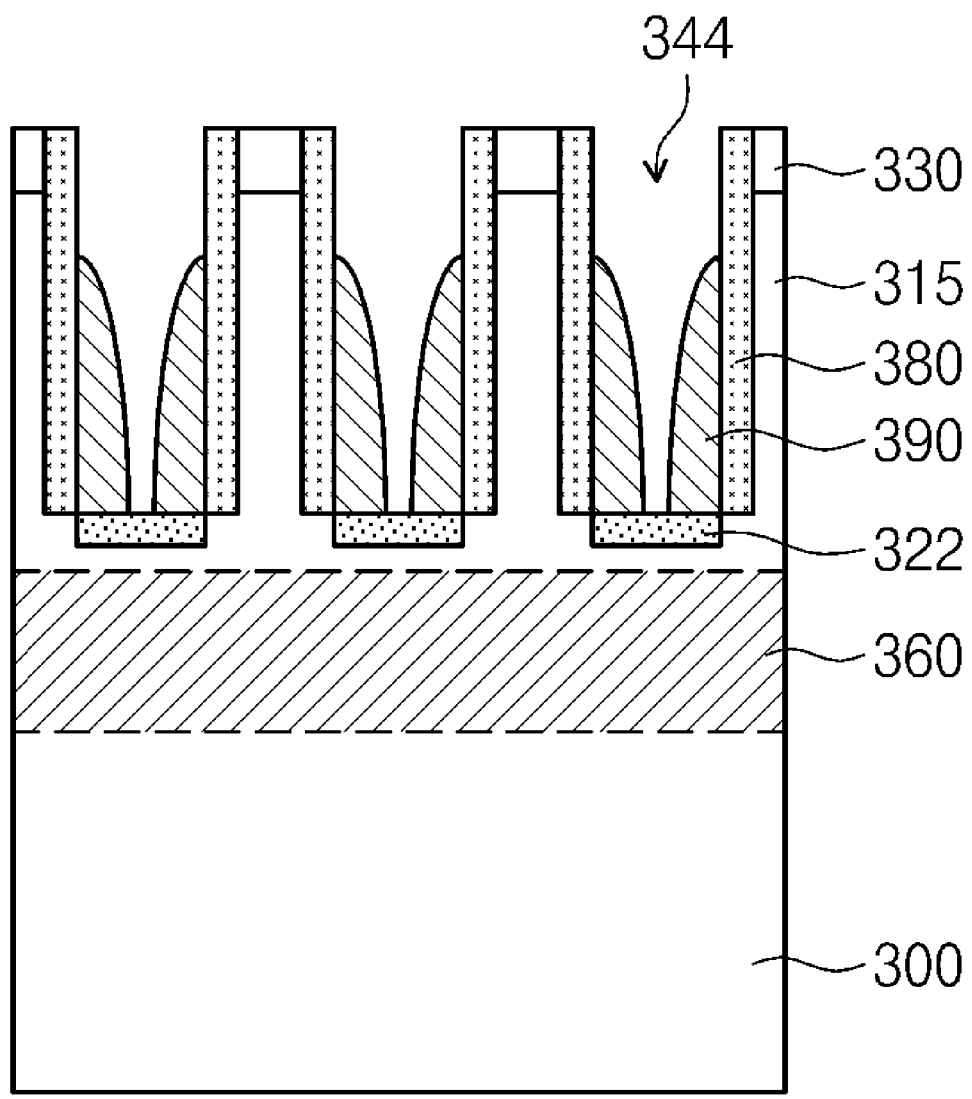

Referring to FIGS. 54A through 54C, the word line 390 is formed in the WL pattern 344 and the recess pattern 355 so as to come into contact with the gate insulating layer 380. The word line 390 may be formed by deposition of metal layer. According to the embodiment of the inventive concept, since the word line 390 is formed in the recess pattern 355, the word line 390 is formed in a ladder shape coming into contact with the three side surfaces of the vertical channel 315 with the ladder-shaped gate insulating layer 380 interposed therebetween. With such a configuration, the three side surfaces of the vertical channel 315 are used as channels.

Figure 55A:
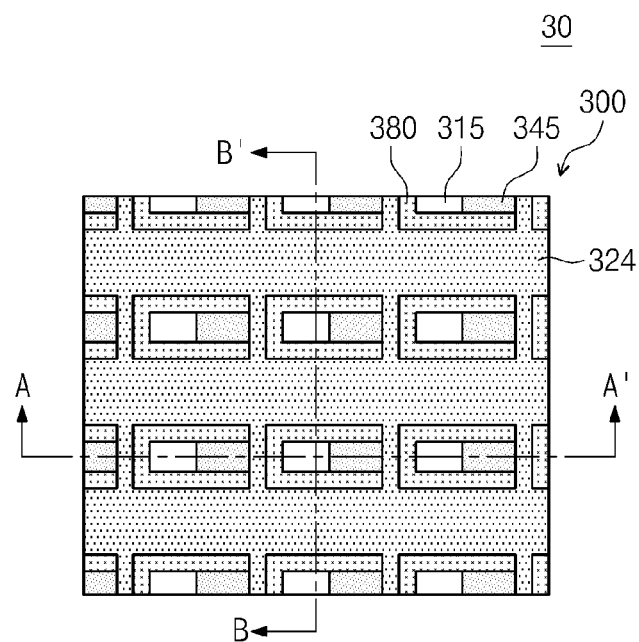
Figure 55B:
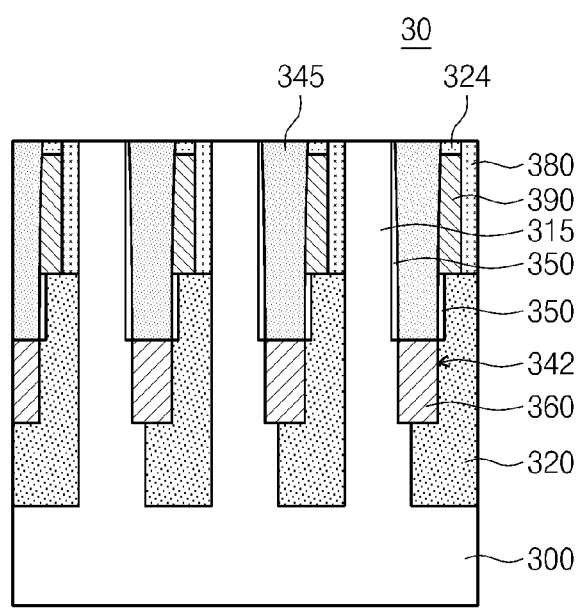
Figure 55C:
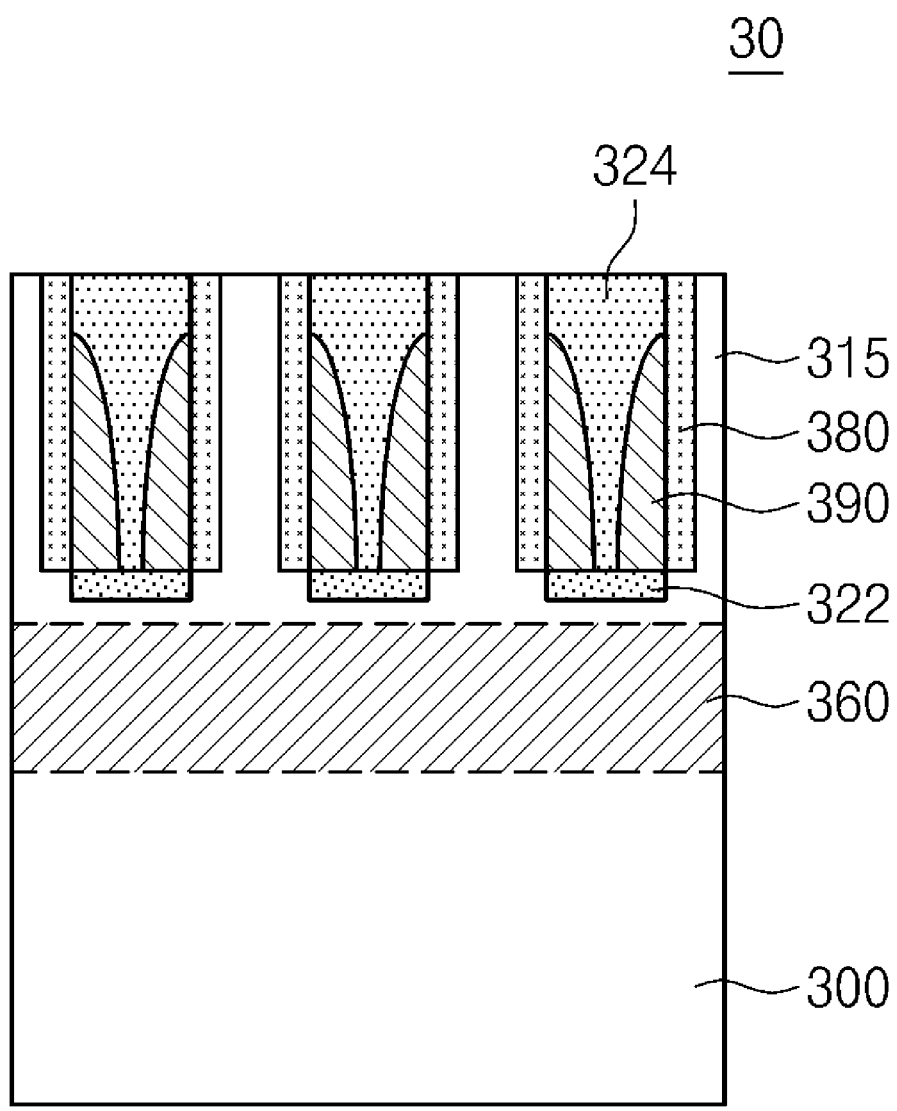

Referring to FIGS. 55A though 55C, a third insulating layer 324 is formed in the WL pattern 344 and the recess pattern 355, and then the hard mask 330 is removed by etch-back, CMP, or the like. According to the above-described series of steps, the active bar is formed by the Y cutting, the vertical channel 315 is formed so as to protrude in the Z direction by isolating the active bar in the X cutting, the buried bit line 360 is formed so as to extend in the Y direction and to be connected electrically to one side surface of the vertical channel 315, and the word lines 390 are formed so as to extend in the X direction and come into contact with the three side surfaces of the vertical channel 315. In this way, it is possible to form the vertical channel transistor 30 with the three-channel structure, as illustrated in FIG. 50A.

Figure 56A:
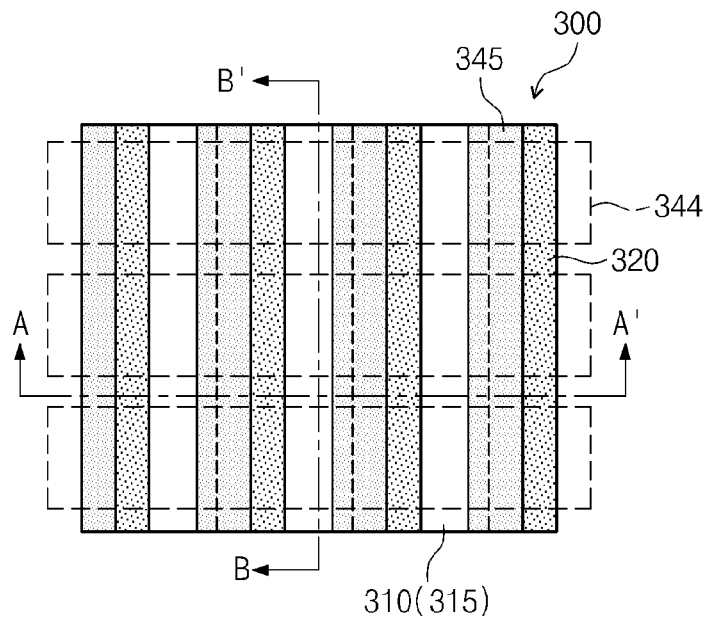
FIGS. 56A, 57A, 58A, and 59A are plan views illustrating a method of fabricating a vertical channel transistor according to still another embodiment of the inventive concept.
Figure 56B:
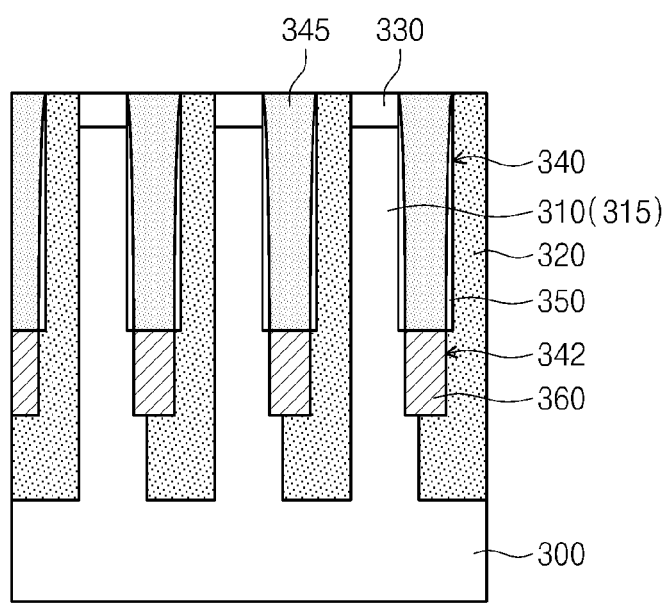
FIGS. 56B, 57B, 58B, and 59B are cross-sectional views taken along the line A-A' of FIGS. 56A, 57A, 58A, and 59A, respectively.
Figure 56C:
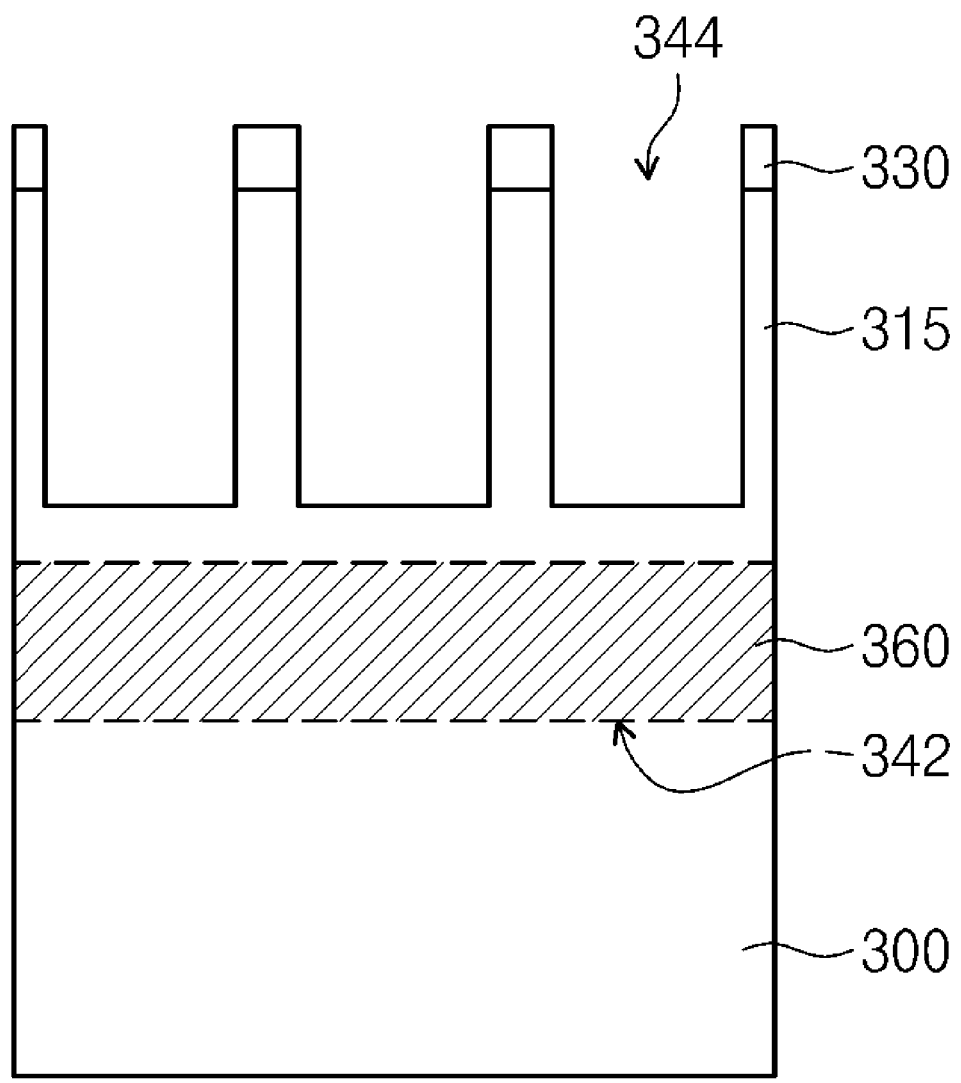
FIGS. 56C, 57C, 58C, and 59C are cross-sectional views taken along the line B-B' of FIGS. 56A, 57A, 58A, and 59A, respectively.

Another Example of Method of fabricating Vertical Channel with Three-Channel Structure FIGS. 56A, 57A, 58A, and 59A are plan views illustrating a method of fabricating a vertical channel transistor according to another embodiment of the inventive concept. FIGS. 56B, 57B, 58B, and 59B are cross-sectional views taken along the line A-A' of FIGS. 56A, 57A, 58A, and 59A, respectively. FIGS. 56C, 57C, 58C, and 59C are cross-sectional views taken along the line B-B' of FIGS. 56A, 57A, 58A, and 59A, respectively. To simplify this description, description of elements described in detail above will not be repeated. Referring to FIGS. 56A through 56C, the active bar 310 is formed to be isolated by the first insulating layer 320 by the Y cutting and extend in the Y direction. The BBL pattern 340 is formed so as to cut the first insulating layer 320 in the Y direction and to be offset with one side surface of the active bar 310, and the D-BBL pattern 342 is formed below the BBL pattern 340. By filling the D-BBL pattern 342 with metal, the buried bit line 360 is formed so as to be connected electrically to one side surface of the active bar 310. By filling the BBL pattern 340 with a silicon nitride, the insulating pillar 345 is formed so as to protrude in the Z direction and extend in the Y direction. Subsequently, the WL pattern 344 is formed so as to intersect the semiconductor substrate 300 in the X direction. The active pattern 310 is isolated in the X direction by the WL pattern 344, and thus is realized as the vertical channel 315. The insulating pillar 345 is isolated in the X direction by the WL pattern 344, and thus is realized in the shape of an island. Since the active bar 310 and the insulating pillar 345 are cut in the X cutting and isolated by the WL pattern 344, the forming of the second insulating layer may be omitted.

Figure 57A:
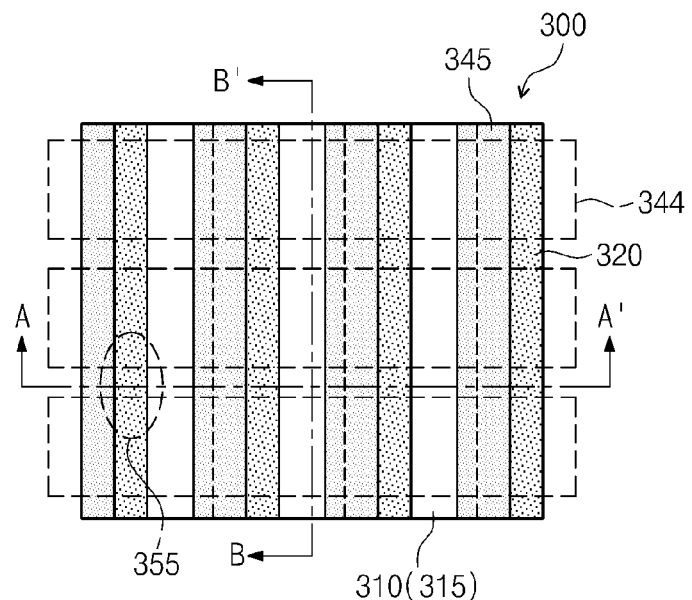
Figure 57B:
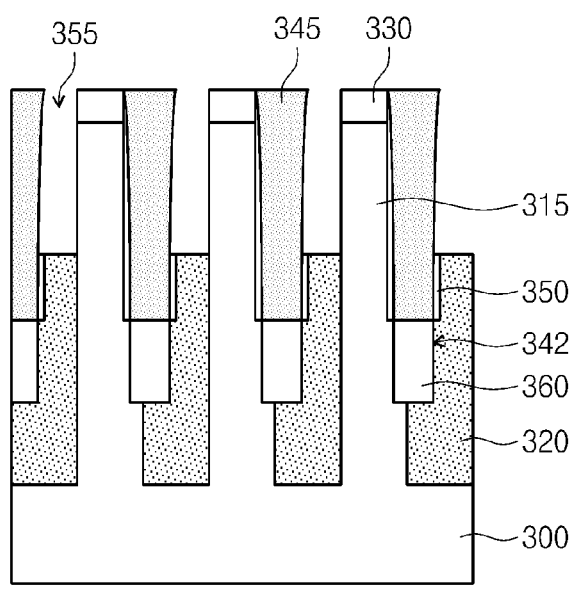
Figure 57C:
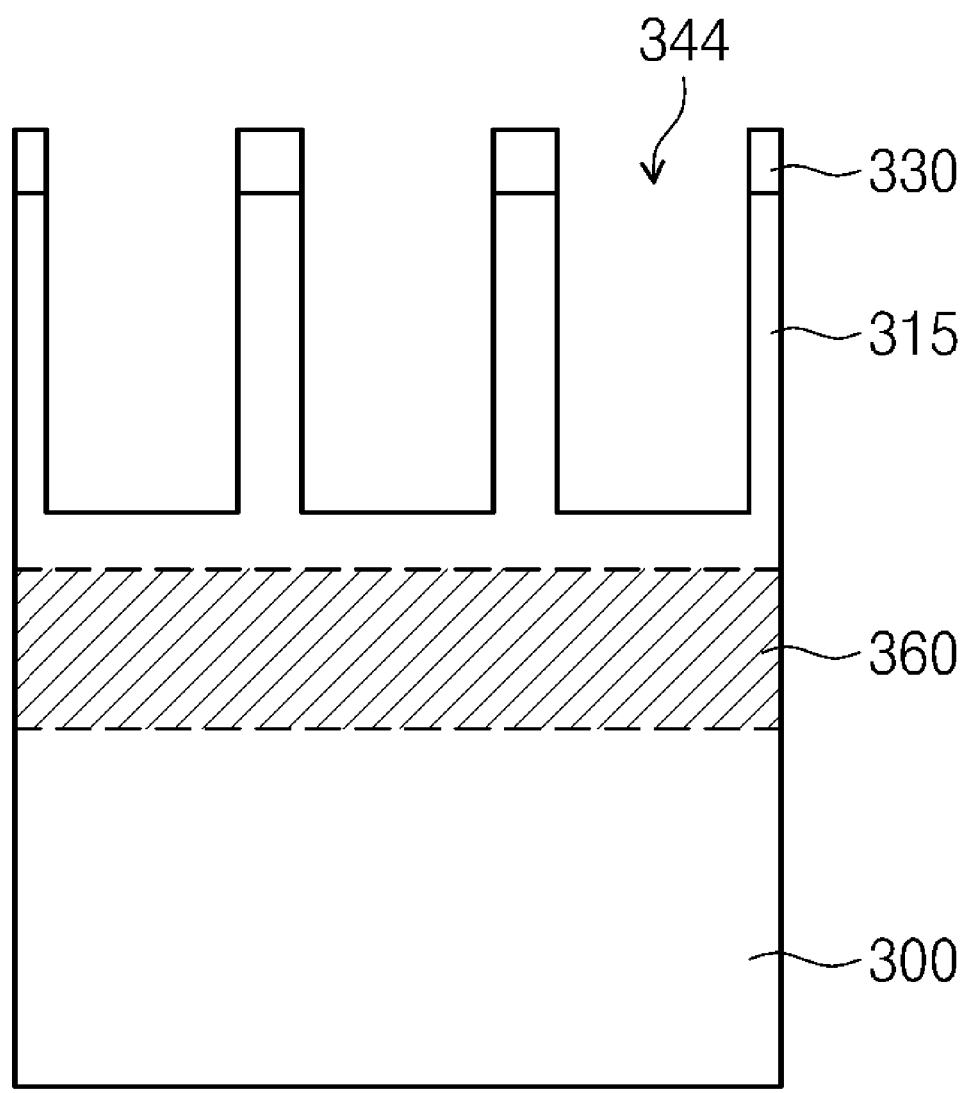

Referring to FIGS. 57A through 57C, the liner 350 and the first insulating layer 320 between the vertical channel 315 and the insulating pillar 345 are removed by the cleaning step or wet etching after the WL pattern 344 is formed. In this way, the recess pattern 355 may be formed between the vertical channel 315 and the insulating pillar 345.

Figure 58A:
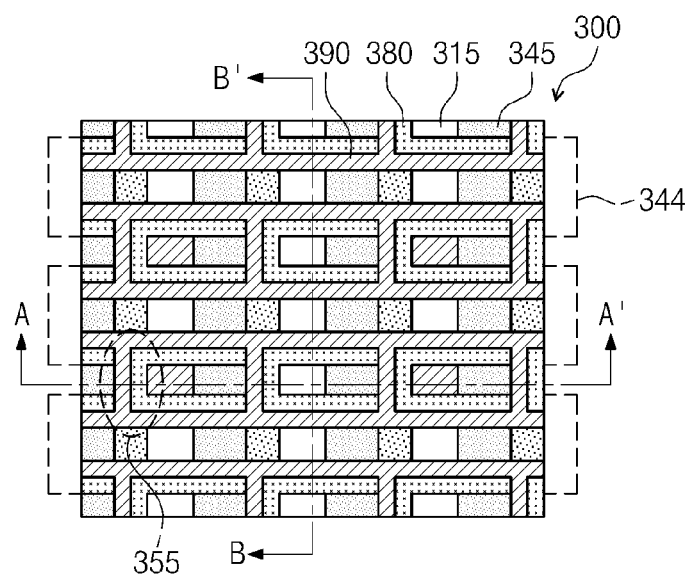
Figure 58B:
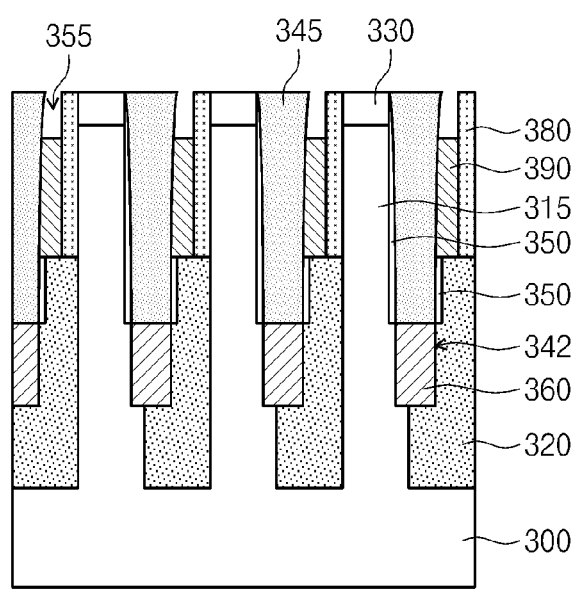
Figure 58C:
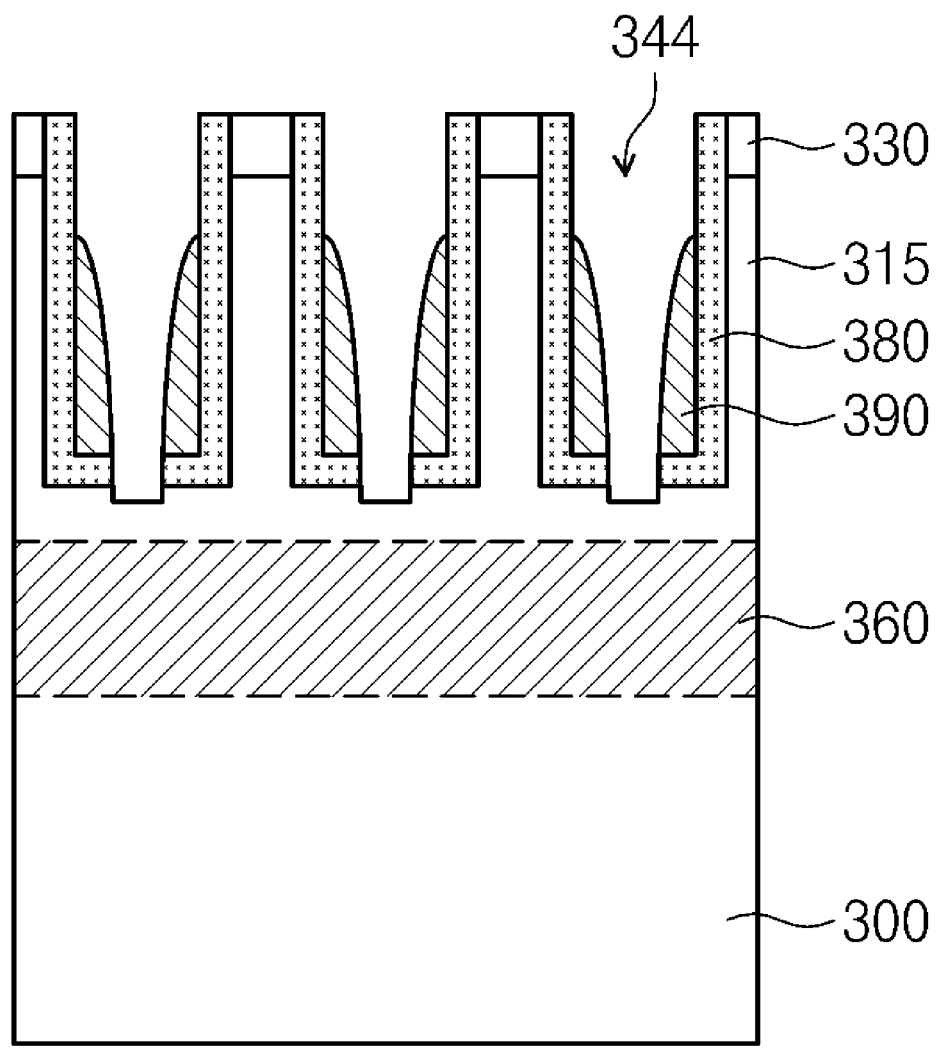

Referring to FIGS. 58A through 58C, the gate insulating layer 380 is formed on the inside surface of the WL pattern 344 and the recess pattern 355 by deposition or thermal oxidation. The gate insulating layer 380 is formed in the shape of a ladder coming into contact with three sidewalls of the vertical channel 315. Subsequently, the word lines 390 are formed in the WL pattern 344 and the recess pattern 355 so as to come into contact with the gate insulating layer 380. The word lines 390 may be formed in the shape of a ladder coming into contact with the three side surfaces of the vertical channel 315 with the ladder-shaped gate insulating layer 380 by deposition, for example. The three side surfaces of the vertical channel 315 are utilized as channels.

Figure 59A:
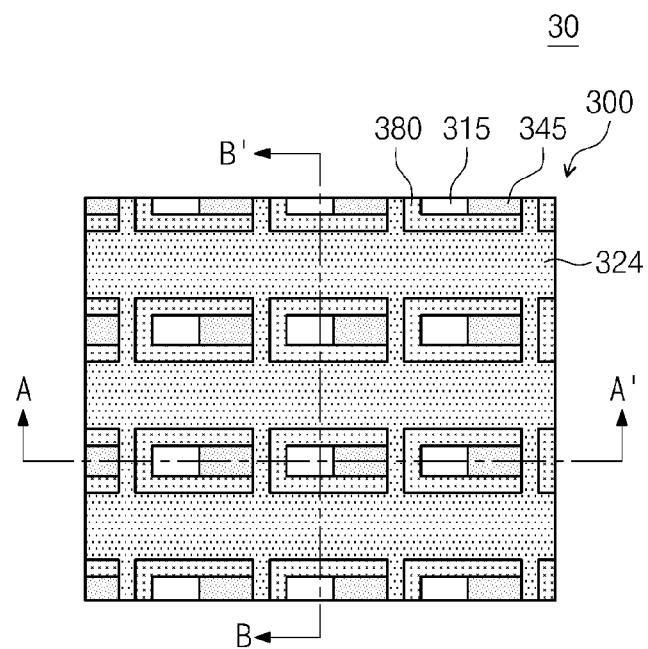
Figure 59B:
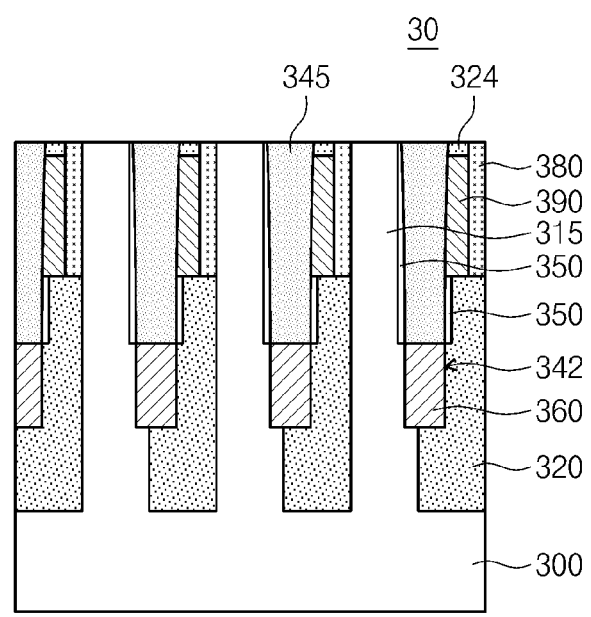
Figure 59C:
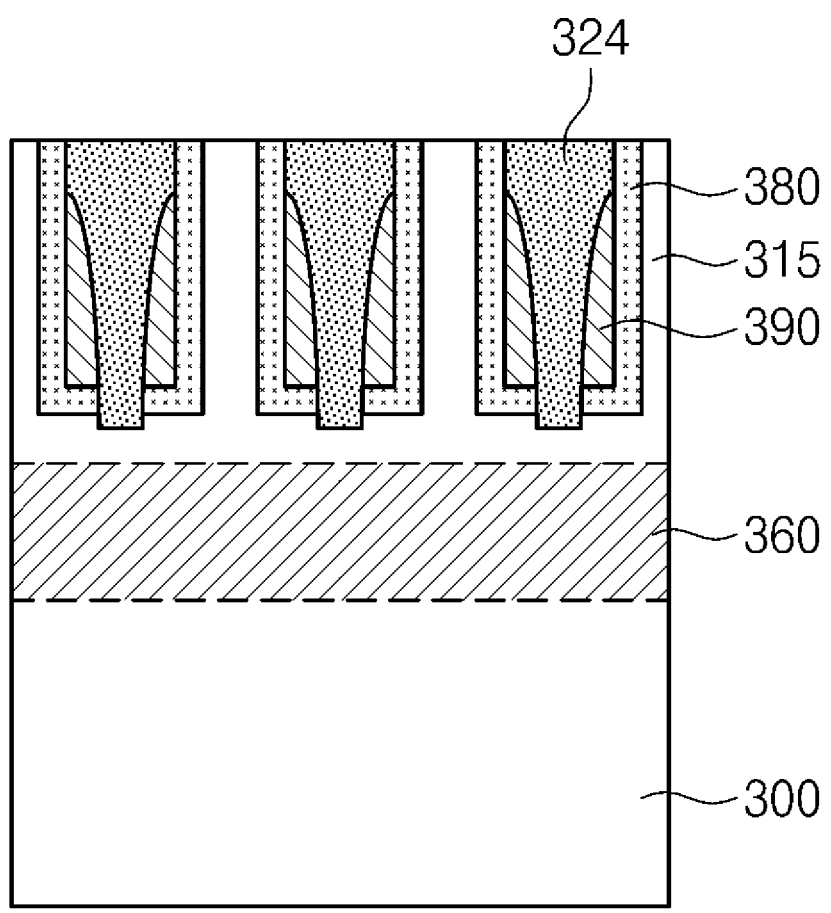

Referring to FIGS. 59A through 59C, the third insulating layer 324 is formed in the WL pattern 344 and the recess pattern 355, and the hard mask 330 is removed by etch-back, CMP, or the like. According to the above-described series of steps, the active bar 310 is formed by the Y cutting, the buried bit line 360 is formed in the Y direction, the vertical channel 315 is formed in the Z direction by isolating the active bar 310 by the X cutting, and then the word lines 390 are formed in the shape of the ladder coming into contact with the three side surfaces of the vertical channel 315 and extending in the X direction. In this way, it is possible to realize the vertical channel transistor 30 with the three-channel structure illustrated in FIG. 50A.

Figure 60A:
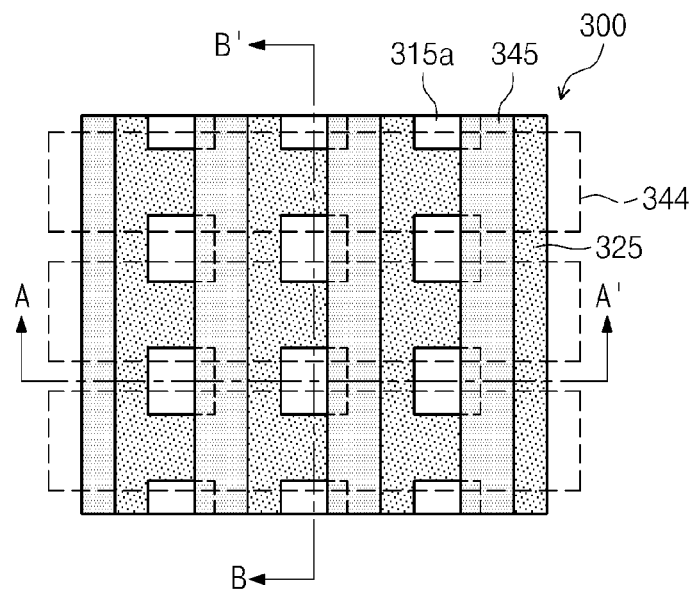
FIGS. 60A, 61A, 62A, and 63A are plan views illustrating a method of fabricating a vertical channel transistor according to still another embodiment of the inventive concept.
Figure 60B:
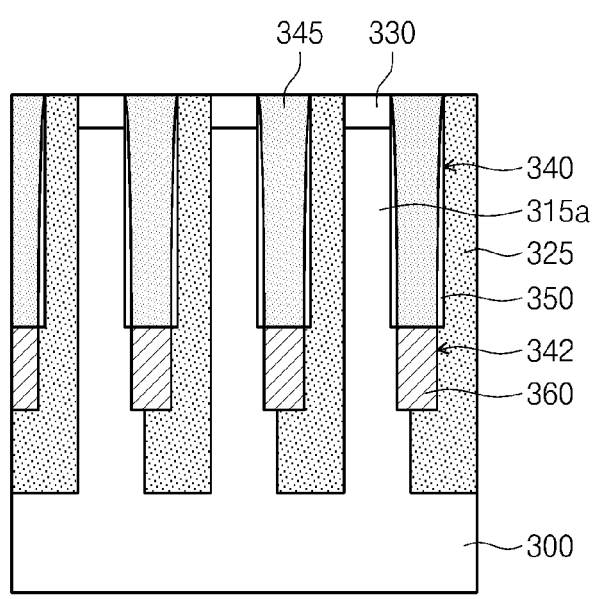
FIGS. 60B, 61B, 62B, and 63B are cross-sectional views taken along the line A-A' of FIGS. 60A, 61A, 62A, and 63A, respectively.
Figure 60C:
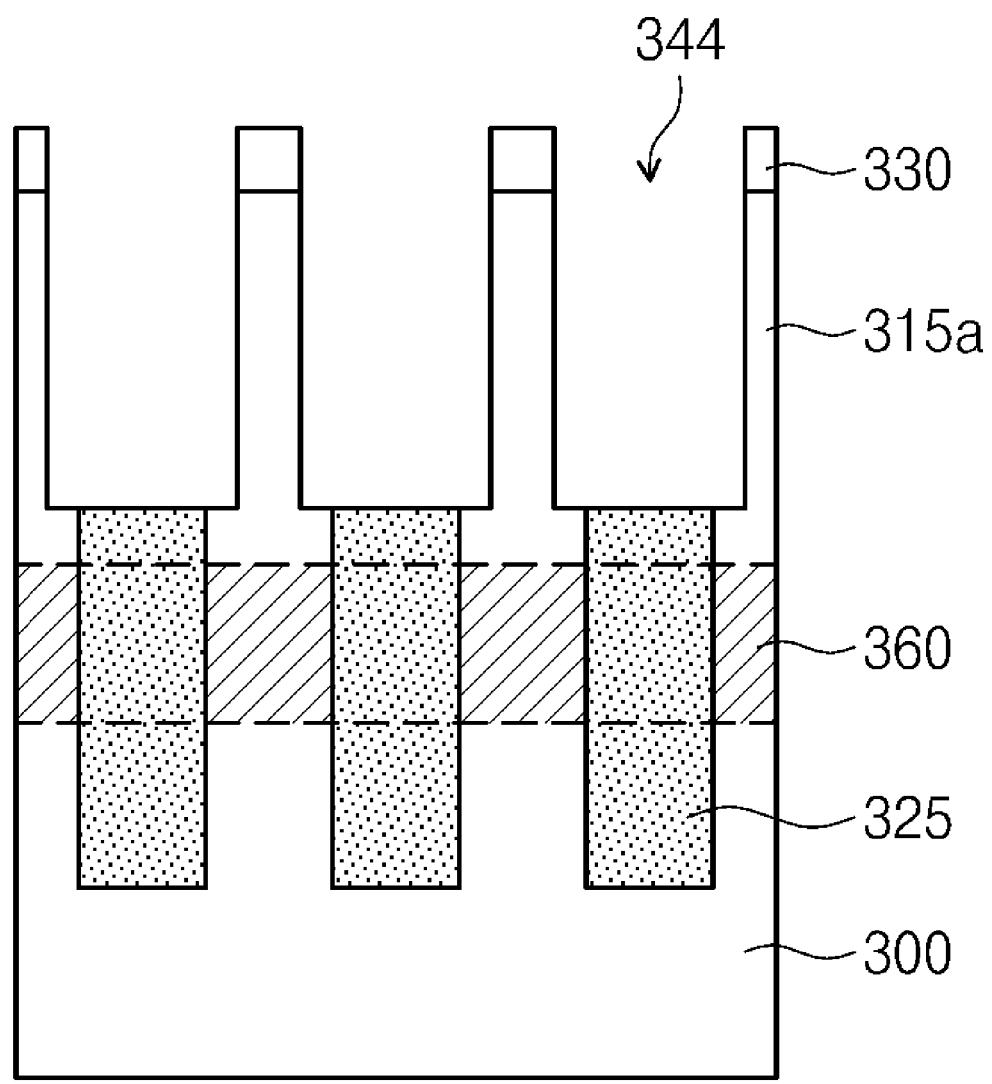
FIGS. 60C, 61C, 62C, and 63C are cross-sectional views taken along the line B-B' of FIGS. 60A, 61A, 62A, and 63A, respectively.

Still Another Example of Method of fabricating Vertical Channel Transistor with Three-Channel Structure FIGS. 60A, 61A, 62A, and 63A are plan views illustrating a method of fabricating the vertical channel transistor with the three-channel structure according to still another embodiment of the inventive concept. FIGS. 60B, 61B, 62B, and 63B are cross-sectional views taken along the line A-A' of FIGS. 60A, 61A, 62A, and 63A, respectively. FIGS. 60C, 61C, 62C, and 63C are cross-sectional views taken along the line B-B' of FIGS. 60A, 61A, 62A, and 63A, respectively. To simplify this description, description of elements described in detail above will not be repeated. Referring to FIGS. 60A through 60C, the vertical channel 315a isolated by the device-isolating layer 325 is formed by simultaneously performing both the X cutting and the Y cutting. The BBL pattern 340 is formed so as to cut the device-isolating layer 325 in the Y direction and to be offset with one side surface of the vertical channel 315a, and the D-BBL pattern 342 is formed below the BBL pattern 340. The buried bit line 360 is formed in the D-BBL pattern 342. The insulating pillar 345 is formed in the BBL pattern 340. The WL pattern 344 is formed so as to cut the device-isolating layer 325 in the X direction and to be offset with both side surfaces of the vertical channel 315. The insulating pillar 345 is cut in the X direction by the WL pattern 344, and thus is realized in the shape of an island.

Figure 61A:
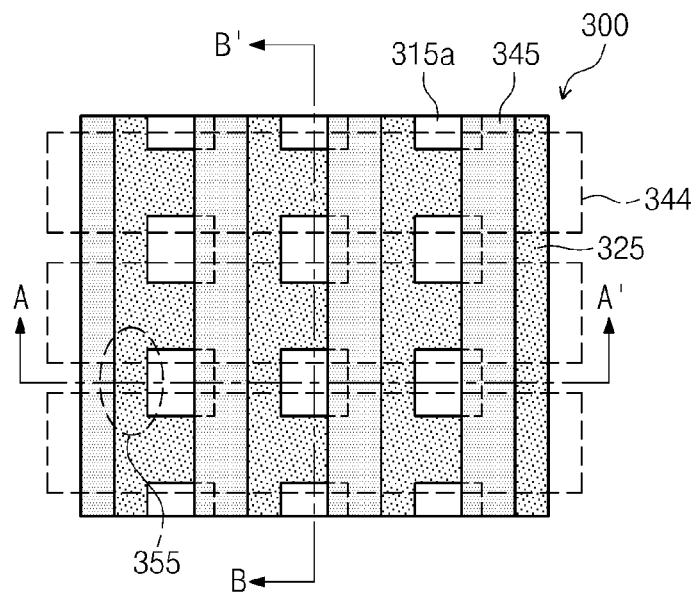
Figure 61B:
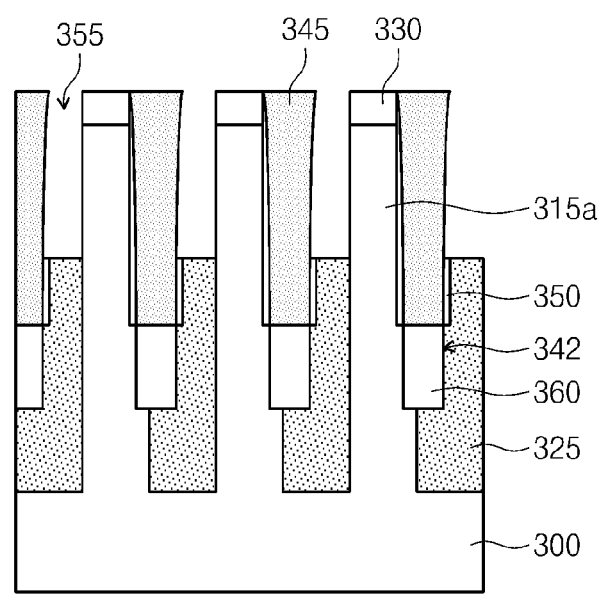
Figure 61C:
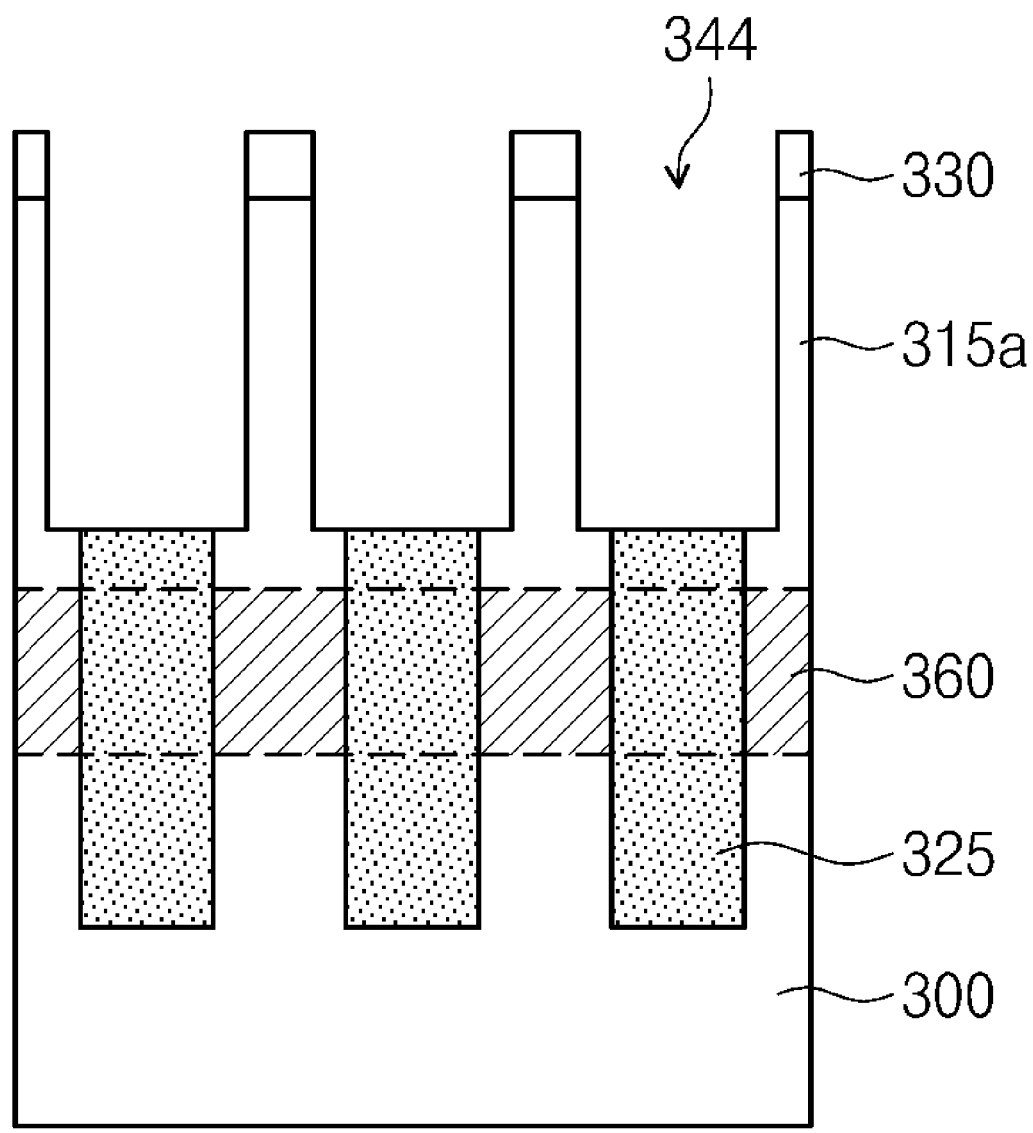

Referring to FIGS. 61A through 61C, the liner 350 and the device-isolating layer 325 between the vertical channel 315a and the insulating pillar 345 are removed by the cleaning step or wet etching after the WL pattern 344 is formed. In this way, the recess pattern 355 may be formed between the vertical channel 315a and the insulating pillar 345.

Figure 62A:
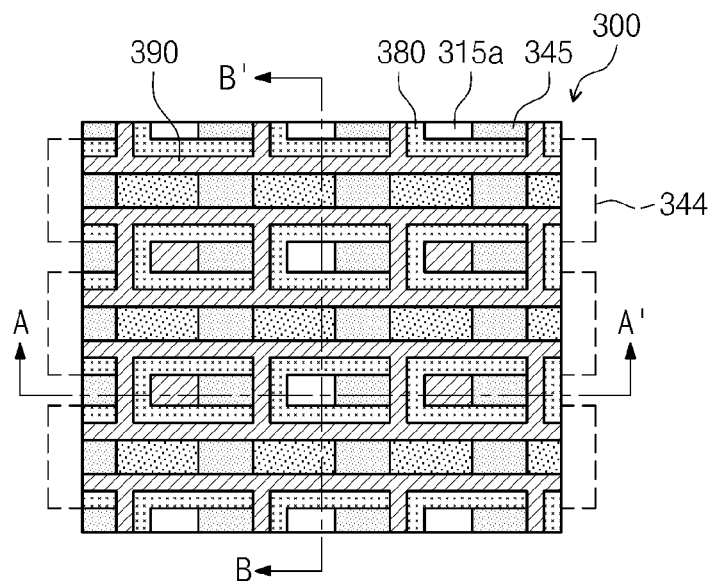
Figure 62B:
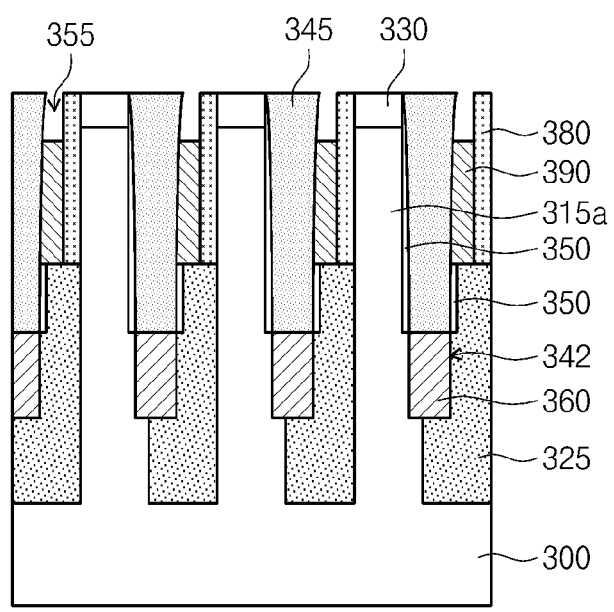
Figure 62C:
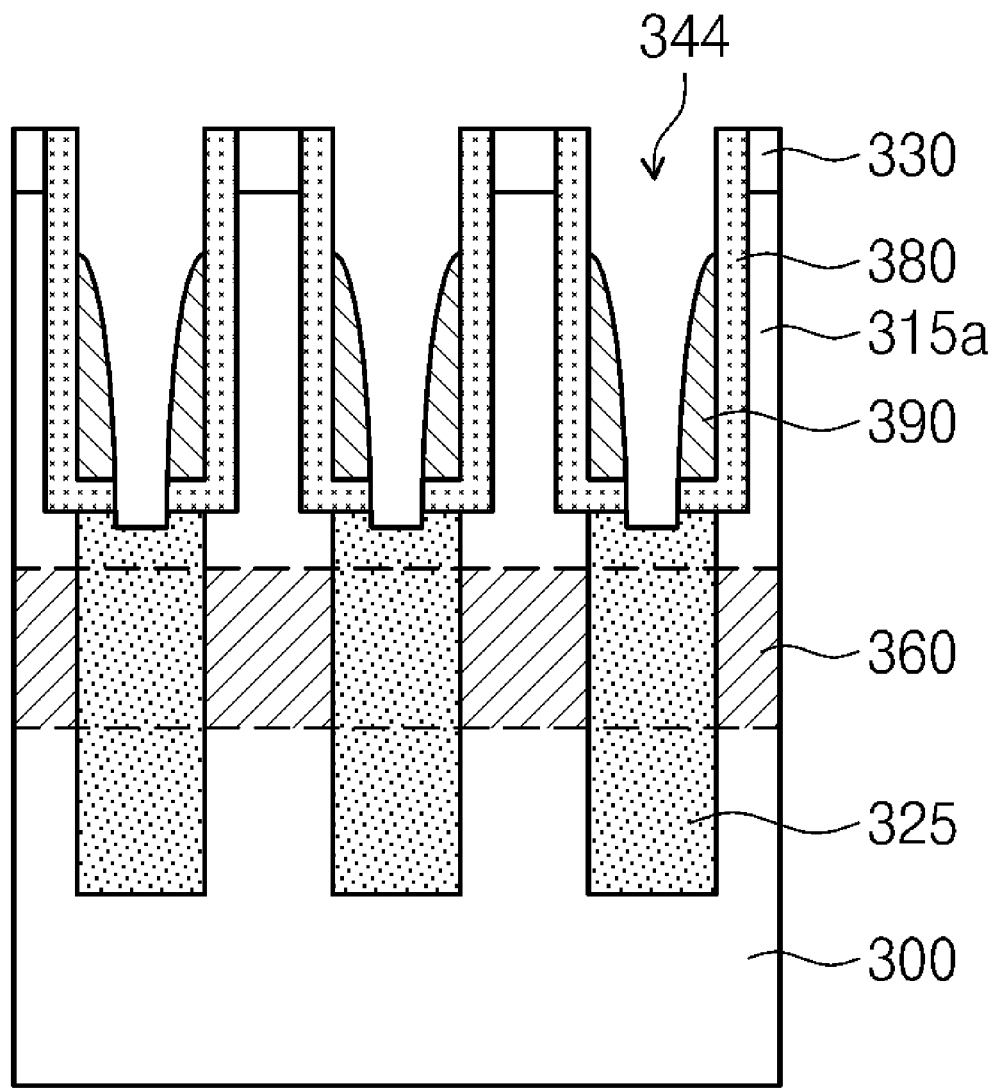

Referring to FIGS. 62A through 62C, the gate insulating layer 380 and the word line 390 are formed in the WL pattern 344 and the recess pattern 355. The gate insulating layer 380 and the word line 390 are each formed in the shape of a ladder.

Figure 63A:
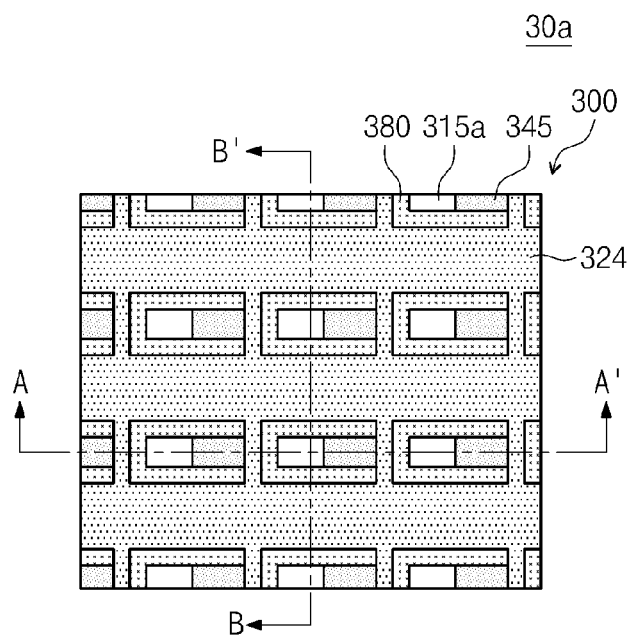
Figure 63B:
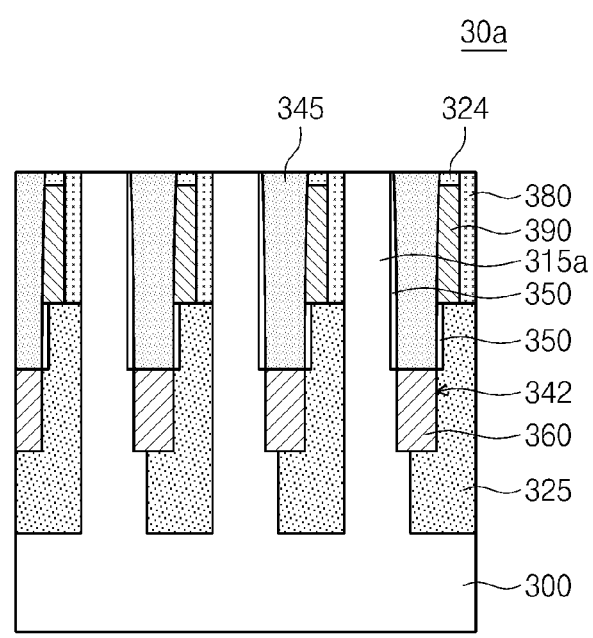
Figure 63C:
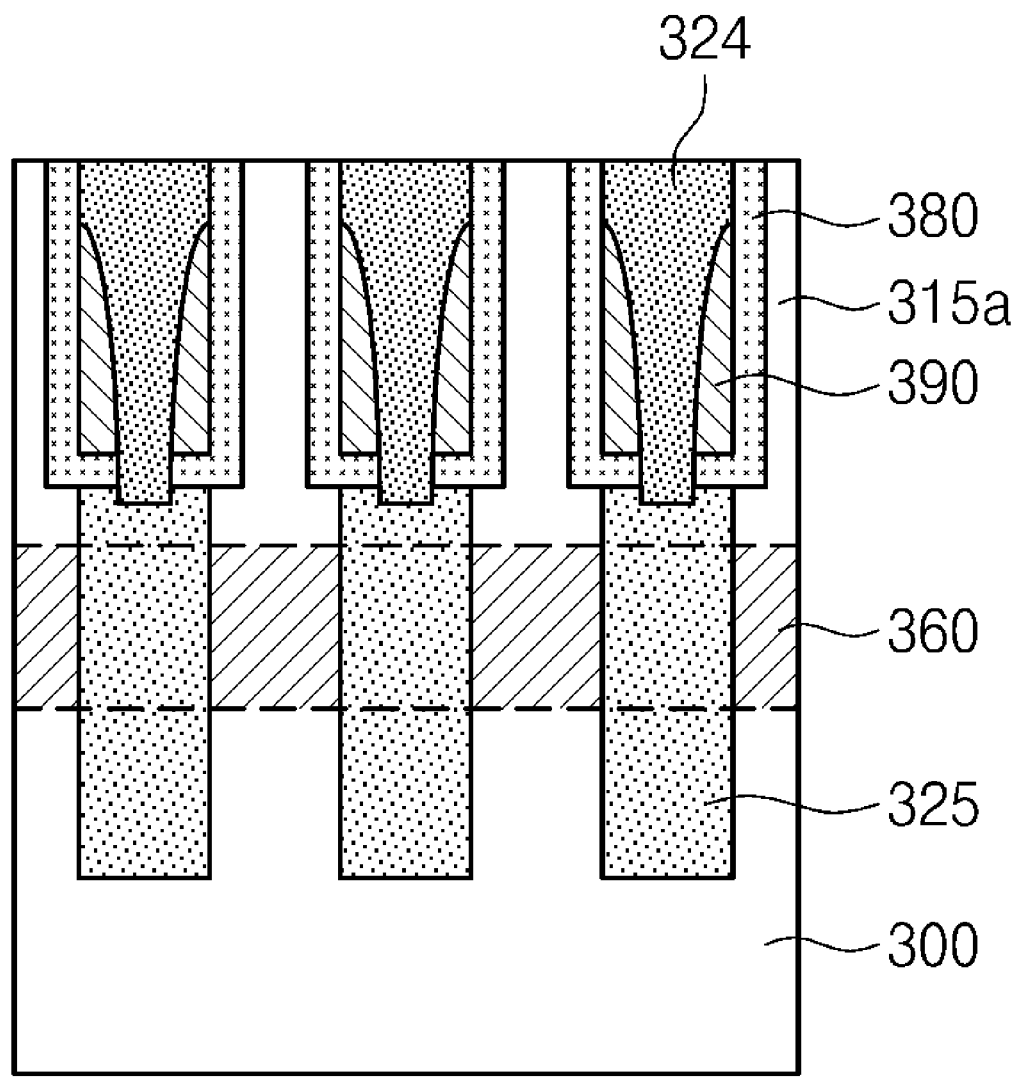

Referring to FIGS. 63A through 63C, the WL pattern 344 and the recess pattern 355 are filled with the insulating layer 344, and the hard mask 330 is removed. According to the above-described series of steps, the vertical channel 315a is formed on the semiconductor substrate 300 so as to protrude in the Z direction by simultaneously performing the X cutting and the Y cutting, the buried bit line 360 is formed in the Y direction, and word lines 390 are formed on the three side surfaces of the vertical channel 315a and in the shape of the ladder extending in the X direction. In this way, it is possible to realize the vertical channel transistor 30a with the three-channel structure illustrated in FIG. 50B.

Application Examples

Figure 64A:
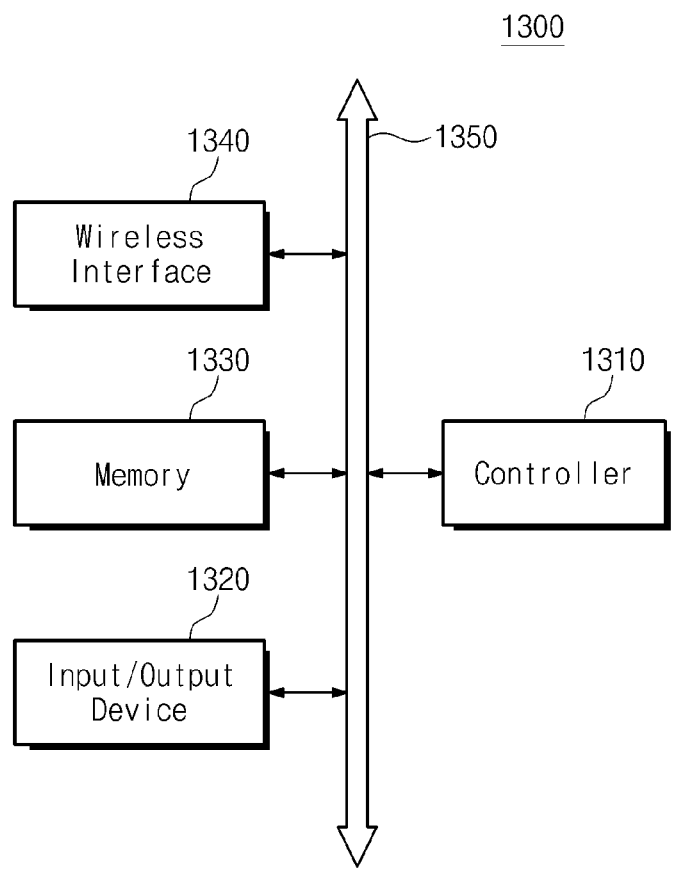
FIGS. 64A and 64B are block diagrams illustrating application examples of the vertical channel transistor according to embodiments of the inventive concept.
Figure 64B:
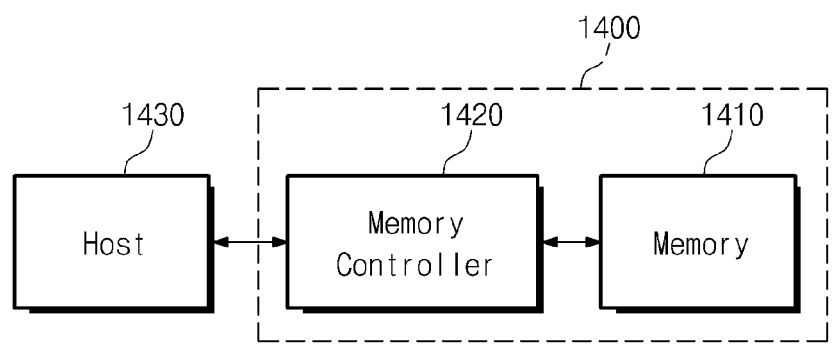

FIGS. 64A and 64B are block diagrams illustrating application examples of the vertical channel transistor according to embodiments of the inventive concept.

FIG. 64A contains a block diagram of an electronic device 1300 including the vertical channel transistor according to the embodiments of the inventive concept. The electronic device 1300 can be used in a wireless communication device such a PDA, a laptop computer, a portable computer, a web tablet, a wireless phone, a cellular phone, a digital music player, or any device capable of transmitting and/or receiving information in a wireless environment. The electronic device 1300 may include a controller 1310, an input/output device 1320 such as a keypad, a keyboard, or a display device, a memory 1330, and a wireless interface 1340 connected via a bus 1350. The controller 1310 includes at least one microprocessor, a digital signal processor, a microcontroller, or another processing unit similar thereto. The memory 1330 may be used to store commands executed by the controller 1310. The memory 1330 may be used to store user data. The memory 1330 includes the vertical channel transistor according to the embodiments of the inventive concept. The electronic device 1300 may use the wireless interface 1340 to transmit data to a wireless communication network communicating RF signals or receive data from the network. For example, the wireless interface 1340 may include a wireless transceiver. The electronic device 1300 may be used in a communication interface protocol of a three-generation communication system such as CDMA, GSM, NADC, E-TDMA, WCDMA, or CDMA2000.

FIG. 64B includes a block diagram of a memory system including a semiconductor memory device according to the embodiments of the inventive concept. A memory system 1400 may include a memory device 1410 storing large data and a memory controller 1420. The memory controller 1420 controls the memory device 1410 to read stored data from the memory device or write data in reply to a reading/writing request of a host 1430. The memory controller 1420 may form an address mapping table used to map addresses provided from the host 1430 such as a mobile device or a computer system to physical addresses. The memory device 1410 may include the vertical channel transistor according to the embodiments of the inventive concept.

According to the embodiments of the inventive concept, there are obtained the advantages of lowering the resistance of the buried bit line and realizing reproducibility of the channel length. Moreover, various side surfaces of the vertical channel may be utilized as channels, thereby improving a current driving capability.

The preferred embodiments have been described in the specification with reference to the accompanying drawings. Various modifications, alternations, and substitutions of the embodiments can be made without departing from the inventive concept. The appended claims should be construed as cover other embodiments.

What is claimed is:

1. A method of fabricating a vertical channel transistor, comprising:
   forming an active pattern having a line type on a substrate so as to extend in a first horizontal direction;
   patterning the active pattern to form a vertical channel that is spaced apart in the first horizontal direction from other vertical channels; and
   forming a buried bit line extending in the first horizontal direction on the substrate;
   wherein the forming of the active pattern includes forming a first trench extending in the first horizontal direction on the substrate, and filling the first trench with a first insulating layer to form an active bar extending in the first horizontal direction;
   wherein the forming of the buried bit line includes: before forming the vertical channel: forming a buried bit line pattern offset with at least one side surface of the active bar by cutting the first insulating layer in the first horizontal direction, forming a liner on an inner sidewall of the buried bit line pattern, forming a damascene buried bit line pattern in the buried bit line pattern by removing a part of the active bar which is not protected by the liner, and forming a metal buried bit line extending in the first horizontal direction in the damascene buried bit line pattern and connected electrically to at least one side surface of the active bar; and
   forming a word line extending in a second horizontal direction along at least one side surface of the vertical channel, the second horizontal direction intersecting the first horizontal direction.

2. The method of claim 1, wherein the forming of the word line includes:
   forming a word line pattern offset with at least one side surface of the active bar by cutting the first insulating layer in the second horizontal direction and defining the vertical channel by isolating the active bar in the second horizontal direction;
   forming a gate insulating layer coming into contact with at least one side surface of the vertical channel in the word line pattern; and
   forming the word line facing at least one side surface of the vertical channel with the gate insulating layer interposed therebetween in the word line pattern.

3. The method of claim 1, wherein the forming of the vertical channel includes: after forming the buried bit line,
   forming a second trench extending in the second horizontal direction on the substrate; and
   filling the second trench with a second insulating layer and isolating the active bar in the second horizontal direction to form the vertical channel isolated by the first and second insulating layers.

4. The method of claim 3, wherein the forming of the word line includes: after forming the vertical channel,
   forming a word line pattern offset with at least one side surface of the vertical channel by cutting the first and second insulating layers in the second horizontal direction;
   forming a gate insulating layer coming into contact with at least one side surface of the vertical channel in the word line pattern; and
   forming the word line facing at least one side surface of the vertical channel with the gate insulating layer interposed therebetween in the word line pattern.

5. A method of fabricating a vertical channel transistor, comprising:
   forming an active pattern having a line type on a substrate so as to extend in a first horizontal direction;
   patterning the active pattern to form a vertical channel spaced apart in the first horizontal direction from other vertical channels;
   forming a buried bit line extending in the first horizontal direction on the substrate; and forming a word line extending in a second horizontal along at least one side surface of the vertical channel, the second horizontal direction intersecting the first horizontal direction;

wherein the forming of the active pattern includes forming a first trench extending in the first horizontal direction on the substrate, and filling the first trench with a first insulating layer to form an active bar extending in the first horizontal direction; and wherein the forming of the vertical channels includes: before forming the buried bit line, forming a second trench extending in the second horizontal direction on the substrate, and filling the second trench with a second insulating layer and isolating the active bar in the second horizontal direction to form the vertical channel.

6. The method of claim 5, wherein the forming of the buried bit line includes: after forming the vertical channel, forming a buried bit line pattern offset with at least one side surface of the vertical channel by cutting the first and second insulating layers in the first horizontal direction;

forming a liner on an inner sidewall of the buried bit line pattern;

forming a damascene buried bit line pattern in the buried bit line pattern by removing a part of the vertical channel which is not protected by the liner; and forming a metal buried bit line extending in the first horizontal direction and connected electrically to at least one side surface of the vertical channel in the damascene buried bit line pattern.

7. The method of claim 5 wherein the forming of the word line includes:

forming a word line pattern offset with at least one side surface of the active bar by cutting the first insulating layer in the second horizontal direction and defining the vertical channel by isolating the active bar in the second horizontal direction;

forming a gate insulating layer coming into contact with at least one side surface of the vertical channel in the word line pattern; and forming the word line facing at least one side surface of the vertical channel with the gate insulating layer interposed therebetween in the word line pattern.

8. A method of fabricating a vertical channel transistor, comprising:

forming an active pattern having a line type on a substrate so as to extend in a first horizontal direction;

patterning the active pattern to form a vertical channel spaced apart in the first horizontal direction from other vertical channels;

forming a buried bit line extending in the first horizontal direction on the substrate;

forming a word line extending in a second horizontal direction along at least one side surface of the vertical channel, the second horizontal direction intersecting the first horizontal direction; and forming, in the vertical channel, an upper junction region and a lower junction region, which are vertically spaced from each other by the word line wherein the lower junction region is formed simultaneously with the buried bit line.

9. The method of claim 8 wherein the forming of the word line includes:

forming a word line pattern offset with at least one side surface of the active bar by cutting the first insulating layer in the second horizontal direction and defining the vertical channel by isolating the active bar in the second horizontal direction;

forming a gate insulating layer coming into contact with at least one side surface of the vertical channel in the word line pattern; and forming the word line facing at least one side surface of the vertical channel with the gate insulating layer interposed therebetween in the word line pattern.

10. The method of claim 8, wherein the forming of the vertical channel includes: after forming the buried bit line, forming a second trench extending in the second horizontal direction on the substrate; and filling the second trench with a second insulating layer and isolating the active bar in the second horizontal direction to form the vertical channel isolated by the first and second insulating layers; and, wherein the forming of the word line includes: after forming the vertical channel, forming a word line pattern offset with at least one side surface of the vertical channel by cutting the first and second insulating layers in the second horizontal direction;

forming a gate insulating layer coming into contact with at least one side surface of the vertical channel in the word line pattern; and forming the word line facing at least one side surface of the vertical channel with the gate insulating layer interposed therebetween in the word line pattern.

11. A method of fabricating a vertical channel transistor, comprising:

forming an active bar by cutting a semiconductor substrate in a first horizontal direction and extending in the first horizontal direction;

cutting the semiconductor substrate in a second horizontal direction intersecting the first horizontal direction to isolate the active bar as a vertical channel;

forming a buried bit line pattern offset with at least one side surface of the vertical channel and extending in the first horizontal direction on the semiconductor substrate;

forming a damascene buried bit line pattern extending in the first horizontal direction by removing a part of the vertical channel exposed by the buried bit line pattern;

forming a buried bit line extending in the first horizontal direction by filling the damascene buried bit line pattern with metal;

forming a word line pattern offset with at least one side surface of the vertical channel by cutting the semiconductor substrate in the second horizontal direction to extend in the second horizontal direction; and forming a gate insulating layer and a word line on at least one side surface of the vertical channel exposed by the word line pattern.

12. The method of claim 11, wherein the forming of the active bar includes:

forming a first trench extending in the first horizontal direction with a first depth in the semiconductor substrate; and burying the first trench with a first insulating layer to isolate the active bar.

13. The method of claim 12, wherein the forming of the vertical channel includes:

forming a second trench with a second depth, which is the same as or smaller than the first depth, in the semiconductor substrate so as to extend in the second horizontal direction; and burying the second trench with a second insulating layer to form a device-isolating layer by the first and second insulating layers, and wherein the active bar is isolated into the vertical channel by the second insulating layer.

14. The method of claim 11, wherein the forming of the bit line includes: one of
   siliciding the vertical channel exposed by the damascene buried bit line pattern;
   depositing a polysilicon layer doped with impurities on the damascene buried bit line pattern and siliciding the polysilicon layer; and
   depositing metal on the damascene buried bit line pattern.

15. The method of claim 14, further comprising: forming an upper junction region and a lower junction region vertically spaced from each other by the word line in upper and lower portions of the vertical channel, respectively,
   wherein the lower junction region is formed simultaneously with the buried bit line by siliciding the polysilicon layer.

16. The method of claim 11, wherein the forming of the gate insulating layer includes:
   depositing an insulating layer on at least one side surface of the vertical channel exposed by the word line pattern; or
   subjecting at least one side surface of the vertical channel exposed by the word line pattern to thermal oxidation.

17. A method of fabricating a vertical channel transistor, comprising:
   forming an active bar by cutting a semiconductor substrate in a first horizontal direction to extend in the first horizontal direction;
   forming a buried bit line pattern offset with at least one side surface of the active bar and extending in the first horizontal direction on the semiconductor substrate;
   forming a damascene buried bit line pattern extending in the first horizontal direction by removing a part of the active bar exposed by the buried bit line pattern;
   forming a buried bit line extending in the first horizontal direction by filling the damascene buried bit line with metal;
   forming a word line pattern by cutting the semiconductor substrate in a second horizontal direction intersecting the first horizontal direction to isolate the active bar as a vertical channel and extending in a second horizontal direction; and
   forming a gate insulating layer and a word line on both side surfaces of the vertical channel exposed by the word line pattern to utilize both side surfaces of the vertical channel as channels.

18. The method of claim 17, wherein the forming of the word line includes forming a word line pad electrically connecting two word lines formed in the word line pattern to each other.

19. The method of claim 17, further comprising forming an insulating pillar covering the buried bit line and coming into contact with the side surface of the vertical channel by forming an insulating layer in the buried bit line pattern.

20. The method of claim 19, further comprising: after forming the word line pattern,
   forming a recess pattern between the insulating pillar and the vertical channel; and
   forming a gate insulating layer and a word line in the recess pattern to utilize three side surfaces of the vertical channel as channels.

* * * * *